US006728827B2

(12) United States Patent
Yamauchi et al.

(10) Patent No.: US 6,728,827 B2
(45) Date of Patent: Apr. 27, 2004

(54) SIMPLY INTERFACED SEMICONDUCTOR INTEGRATED CIRCUIT DEVICE INCLUDING LOGIC CIRCUITRY AND EMBEDDED MEMORY CIRCUITRY OPERATIVE WITH A REDUCED NUMBER OF PIN TERMINALS

(75) Inventors: Tadaaki Yamauchi, Hyogo (JP); Kunihiko Kozaru, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 116 days.

(21) Appl. No.: 09/897,978

(22) Filed: Jul. 5, 2001

(65) Prior Publication Data

US 2002/0040420 A1 Apr. 4, 2002

(30) Foreign Application Priority Data

Sep. 29, 2000 (JP) .................................. 2000-299384
Dec. 8, 2000 (JP) .................................. 2000-374153

(51) Int. Cl.[7] .............................................. G06F 13/00
(52) U.S. Cl. ..................... 711/104; 380/30; 713/168
(58) Field of Search ................... 711/104; 380/30; 713/168

(56) References Cited

U.S. PATENT DOCUMENTS

| 4,835,733 | A | | 5/1989 | Powell | |
|---|---|---|---|---|---|
| 5,598,372 | A | | 1/1997 | Matsumoto et al. | |
| 5,701,438 | A | * | 12/1997 | Bains | 711/211 |
| 5,721,860 | A | * | 2/1998 | Stolt et al. | 711/105 |
| 5,862,396 | A | | 1/1999 | Motomura | |
| 5,910,181 | A | * | 6/1999 | Hatakenaka et al. | 714/718 |
| 5,953,243 | A | * | 9/1999 | Capps et al. | 365/52 |
| 5,953,738 | A | | 9/1999 | Rao | |
| 6,049,844 | A | * | 4/2000 | Matsui et al. | 710/104 |
| 6,088,761 | A | * | 7/2000 | Aybay | 711/105 |
| 6,366,521 | B1 | * | 4/2002 | Roohparvar | 365/226 |
| 6,473,831 | B1 | * | 10/2002 | Schade | 711/115 |
| 2002/0040437 | A1 | * | 4/2002 | Yamauchi et al. | 713/193 |

FOREIGN PATENT DOCUMENTS

| JP | 10-269768 | 10/1998 |
|---|---|---|
| JP | 11-213665 | 8/1999 |
| JP | 11-250657 | 9/1999 |

* cited by examiner

Primary Examiner—Reba I. Elmore
(74) Attorney, Agent, or Firm—McDermott, Will & Emery

(57) ABSTRACT

An interface circuit performs supply/reception of data with a register instead of supply/reception of data with DRAM when an area specified by an address signal is a logic control area. Data signals in the case are a control command for a logic circuit held in a register and input data to be processed. The logic circuit takes charge of a critical path in processing time such as cryptographic processing and image processing. A processing result is held in the register. The register circuit switches between storage data stored in DRAM and data given from a terminal group to select data to be processed according to a control signal.

26 Claims, 93 Drawing Sheets

FIG.4 NORMAL MODE WRITE ACCESS

FIG.9

| SUPPORTED CRYPTOSYSTEMS | | |
|---|---|---|
| PUBLIC KEY CRYPTOSYSTEM | SECRET KEY CRYPTOSYSTEM | |
| RSA | DES<br>Triple DES | BLOCK ENCRYPTION MODES<br>ECB:Electric Code Book<br>CBC:Cipher Block Chaining<br>OFB:Output Feed Back<br>CFB:Cipher Feed Back |

⟨ENCRYPTION FUNDAMENTAL UNIT⟩

DES-56

Triple DES-112

Triple DES-168

DES-56

Triple DES-112

Triple DES-168

FIG.24 NORMAL MODE READ ACCESS (ON DIFFERENT PAGE: Ext. CLK=100MHz)

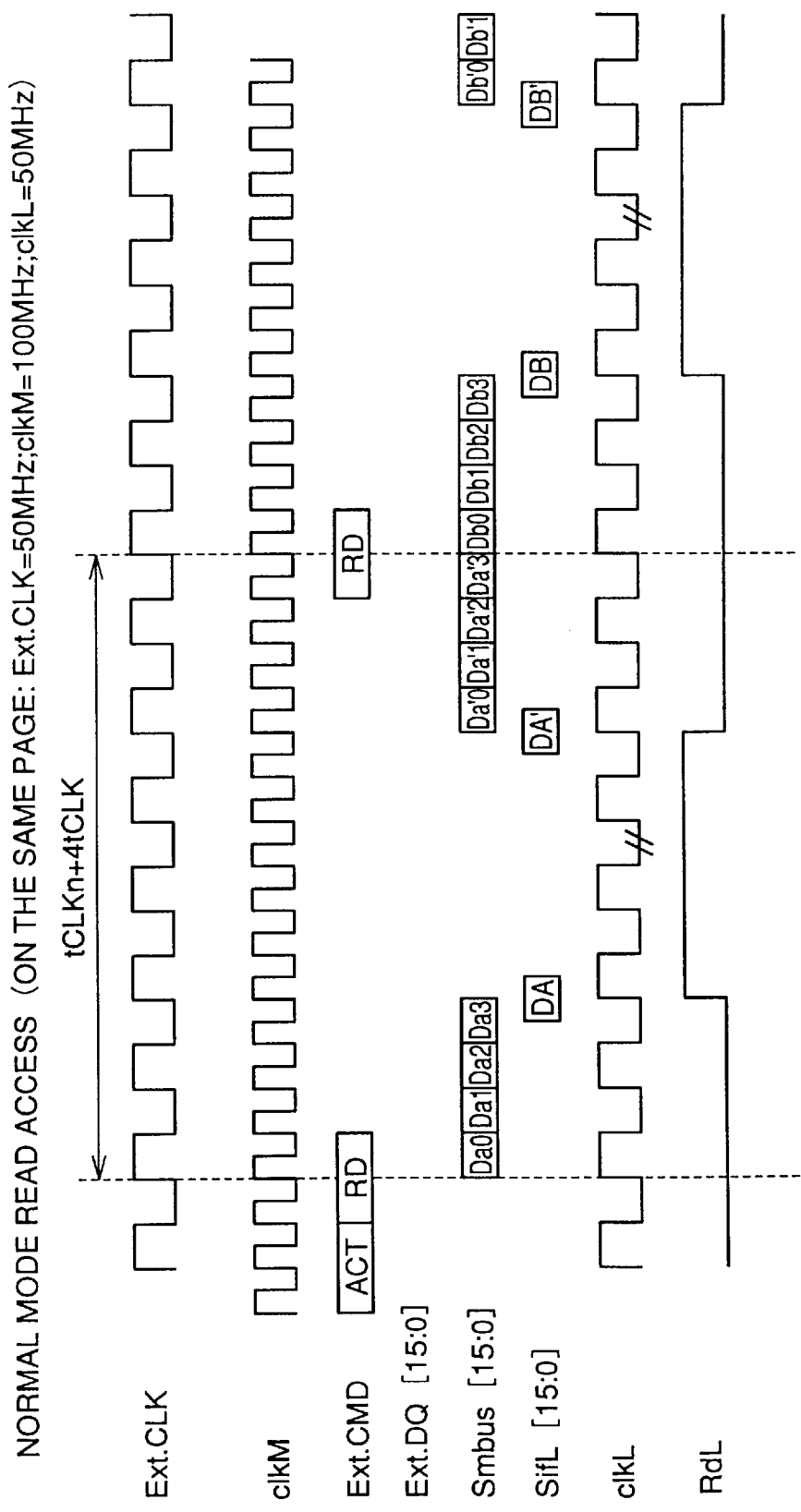

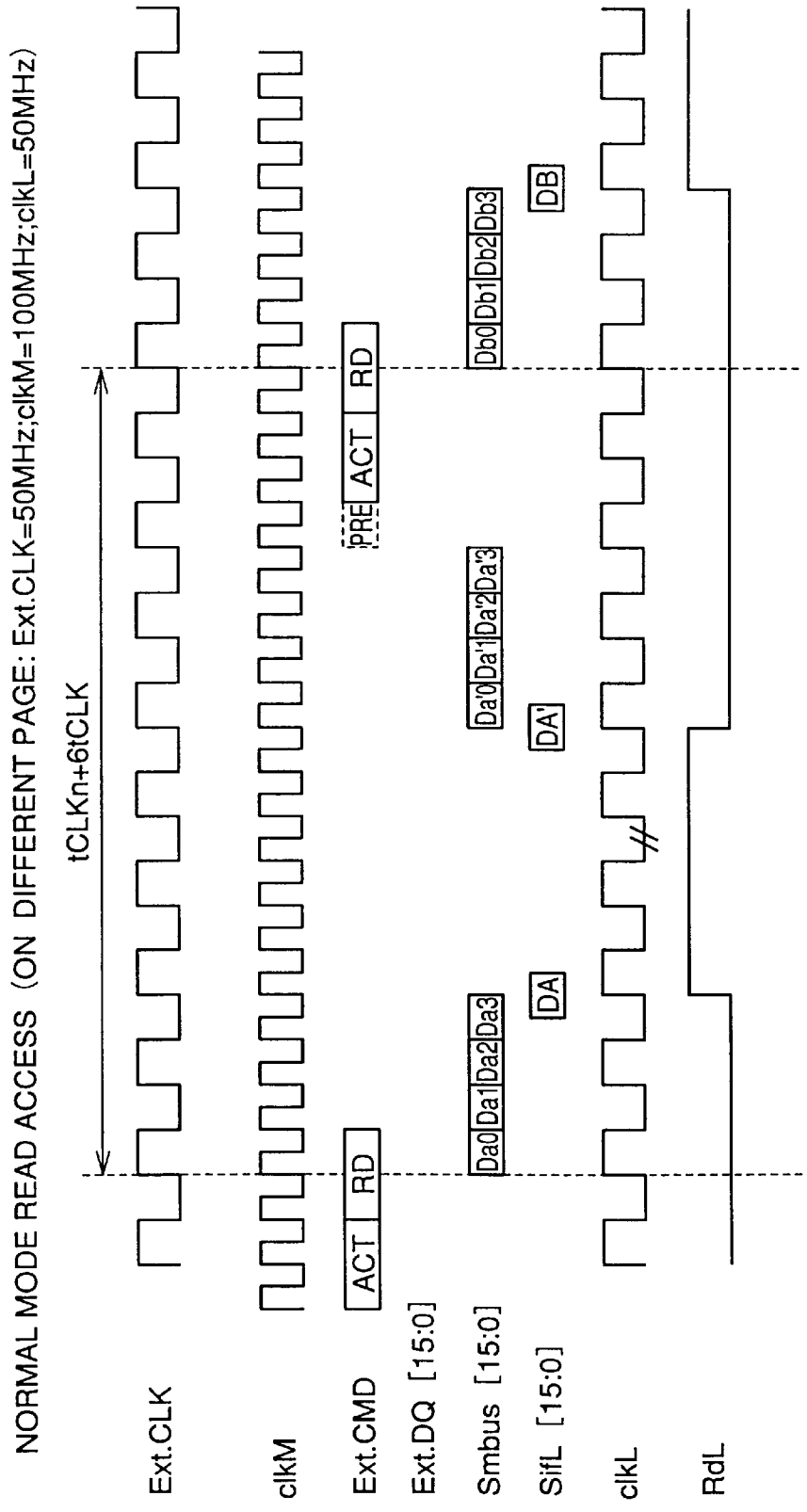

FIG.29 NORMAL MODE WRITE ACCESS (ON THE SAME PAGE: Ext.CLK=25MHz;clkM=100MHz;clkL=50MHz)

tCLKn/2+4tCLK

Ext.CLK clkM

Ext.CMD    ACT                                              WT

Ext.DQ [15:0]    Da0                                        Db0

Smbus [15:0]    Da0    Da1    Da2    Da3

SifL [15:0]            Da1    Da2    Da3                    Da'0 Da'1 Da'2 Da'3 Db0 clkL

DA              DA'

RdL

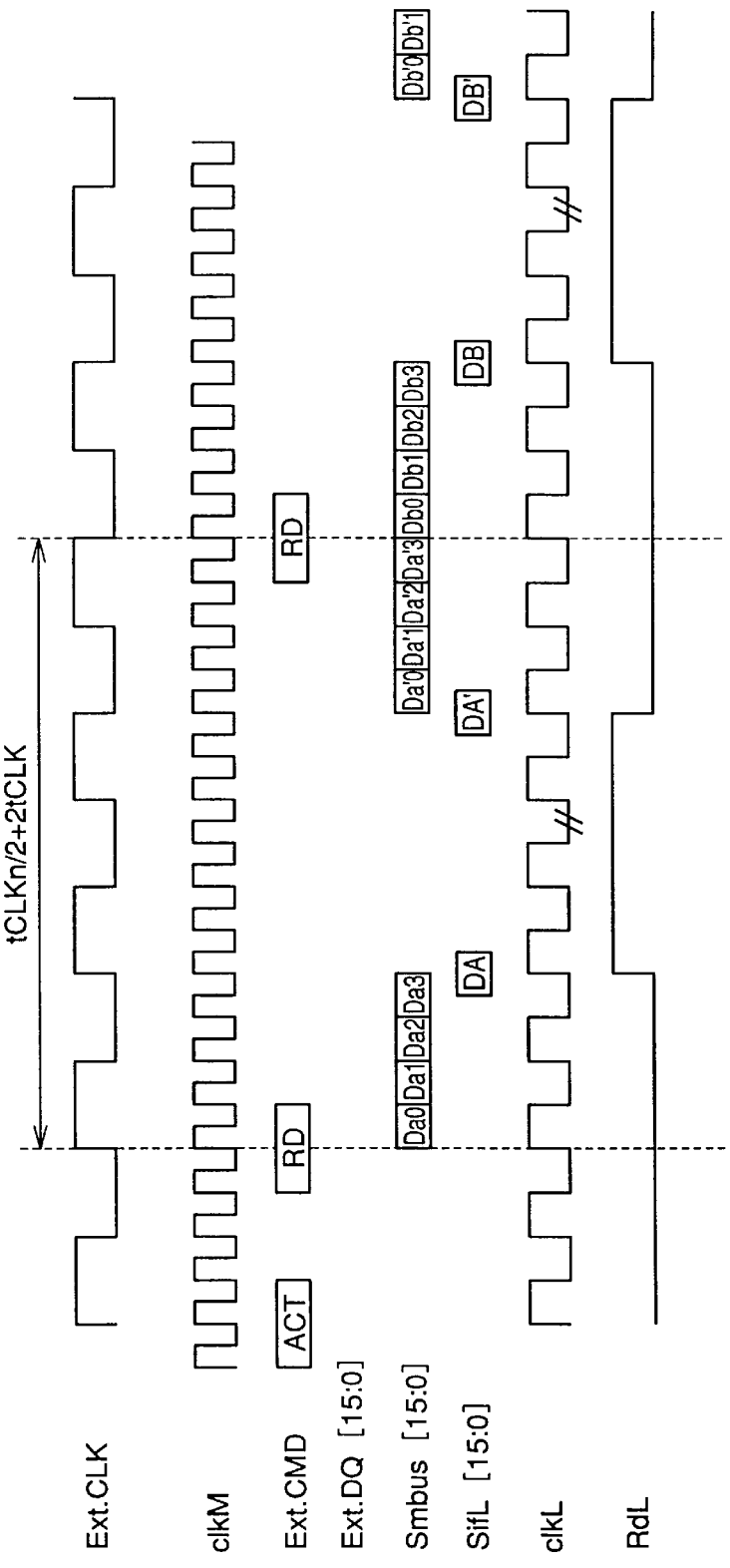

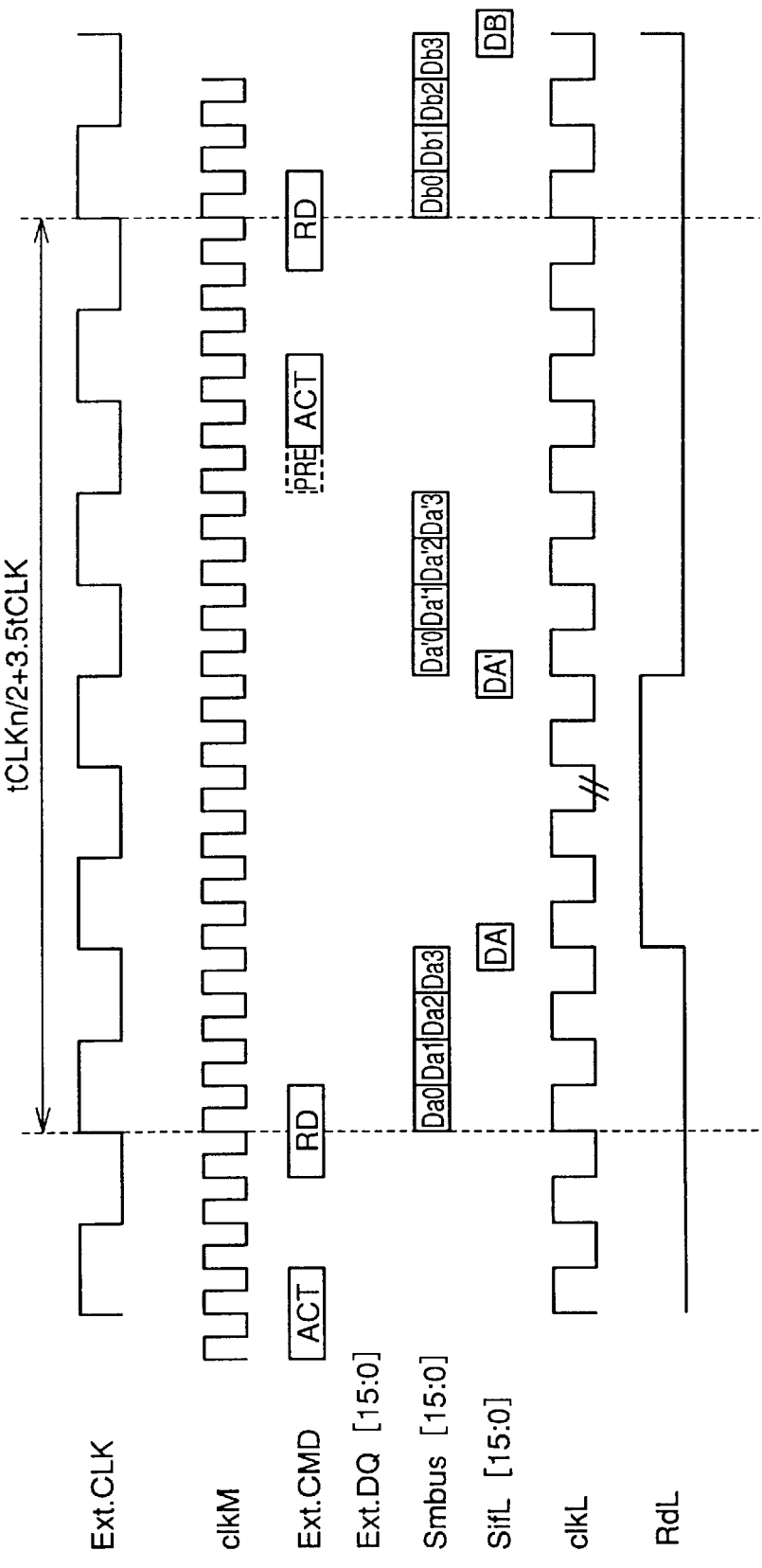

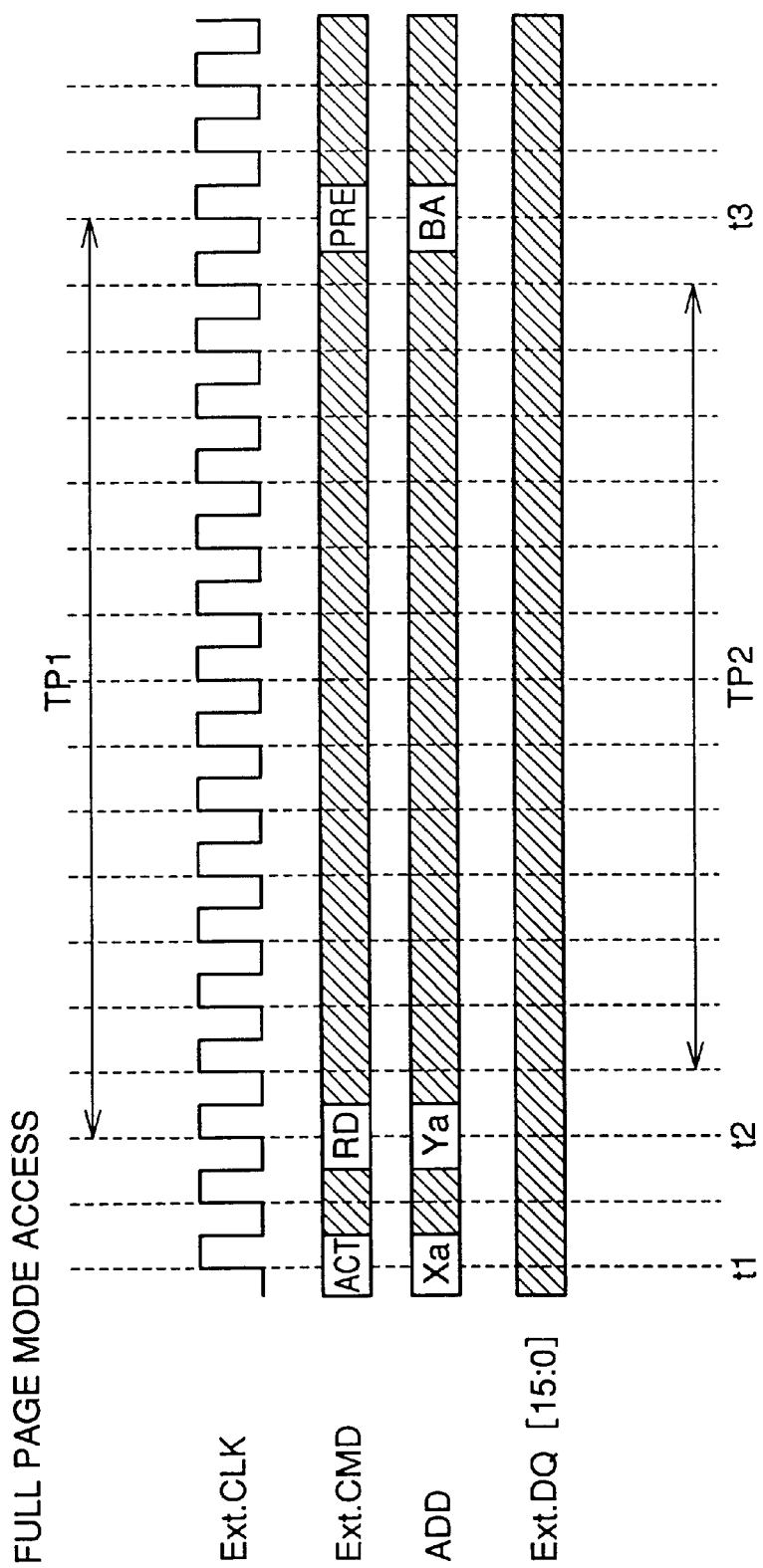

FIG.54

| Address | D15 ... D0 |
|---|---|
| x=#3FFF, y=#00 | SOFT RESET, FLAG |
| x=#3FFF, y=#01 | MODE, SETTING OF CRYPTOGRAPHIC AREA |
| x=#3FFF, y=#02 | SELECTION ON INITIAL INPUT, ENCRYPTION/DECRYPTION |
| x=#3FFF, y=#03 | WRITE TO Reg1 (ADDRESS FROM COUNTER) |
| x=#3FFF, y=#04 | READ FROM Reg1 (ADDRESS FROM COUNTER) |
| x=#3FFF, y=#05 | Reg-DRAM TRANSFER MODE CONTROL |
| x=#3FFF, y=#06 | PARTIAL REFRESH CONTROL |
| x=#3FFF, y=#10 | LSB |
| x=#3FFF, y=#11 | CRYPTOGRAPHIC KEY 1 |
| x=#3FFF, y=#12 | |
| x=#3FFF, y=#13 | USB |
| x=#3FFF, y=#14 | LSB |
| x=#3FFF, y=#15 | CRYPTOGRAPHIC KEY 2 |
| x=#3FFF, y=#16 | |
| x=#3FFF, y=#17 | USB |
| x=#3FFF, y=#18 | LSB |
| x=#3FFF, y=#19 | CRYPTOGRAPHIC KEY 3 |
| x=#3FFF, y=#1A | |
| x=#3FFF, y=#1B | USB |
| x=#3FFF, y=#1C | LSB |
| x=#3FFF, y=#1D | IV |
| x=#3FFF, y=#1E | |
| x=#3FFF, y=#1F | USB |
| x=#3FFF, y=#20 ... x=#3FFF, y=#5F | RESERVED FOR PUBLIC KEY |

FIG.55

| y | D0 |
|---|---|
| y=#00 | D0 =1: CRYPTOGRAPHIC FUNCTION RESET<br>D1 =1: FLAG INDICATING "IN CRYPTOGRAPHIC PROCESSING" |
| y=#01 | D1, 0=01/10/11/00: DES-56/Triple DES-112/Triple DES-168/HOLD<br>    (SELECTION ON CRYPTOSYSTEM,-xx INDICATES Key LENGTH)<br>D5-2=0001/0010/0100/1000/0000: ECB/CBC/OFB/CFB64/HOLD<br>    (SELECTION OF BLOCK ENCRYPTION MODE,OTHER COMBINATIONS PROHIBITED)<br>D15-11=10001/10010/10100/11000/00000:Bank0/Bank1/Bank2/Bank3/HOLD<br>    (IN Reg TRANSFER MODE,BANK DIRECTLY DATA-TRANSFERABLE WITH INTERNAL Reg)<br>WHEN D15 = 1,Bank 0 CAN BE SET TO CRYPTOGRAPHIC PROCESSING BUFFER AT D11 = 1,<br>Bank 1 CAN BE SET TO CRYPTOGRAPHIC PROCESSING BUFFER AT D12 = 1,<br>Bank 2 CAN BE SET TO CRYPTOGRAPHIC PROCESSING BUFFER AT D13 = 1,<br>Bank 3 CAN BE SET TO CRYPTOGRAPHIC PROCESSING BUFFER AT D14 = 1 |
| y=#02 | |
| y=#03 | |
| y=#04 | |
| y=#05 | D1, 0=01/10/00: ENCRYPTION/ DECRYPTION/HOLD (WHERE 11 IS PROHIBITED)<br>D3, 2=01/10/00: INPUT START /STOP/HOLD/ OF PLAIN TEXT OR CIPHER TEXT (WHERE 11 IS PROHIBITED)<br>D4=1: ADDRESS COUNTER OF Register 1 (FOR DATA INPUT) IS RESET<br>D5=1: ADDRESS COUNTER OF Register 2 (FOR DATA OUTPUT) IS RESET<br>D6=1/0: IV SELECTION/ PRECEDING DATA SELECTION (IN A CASE OF BEING IN CRYPTOGRAPHIC PROCESSING)<br>{D7=1/0: PROCESSING OF DRAM→Reg1/ PROCESSING OF Ext→Reg1} UNNECESSARY ?<br>D11-8=1000-0001/0000: A TEXT LENGTH (IN BYTE UNIT) IN ONE BLOCK OF OFB,CFB/HOLD |
| y=#06 | |
| y=#10 | |
| y=#11 | D15-0:Register 1 WRITE (FROM EXTERNAL TERMINAL) WHEN DATA OF 8 Bytes IS ACCUMULATED PROCESSING STARTED |
| y=#12 | D15-0:Register 2 READ (TO EXTERNAL TERMINAL) AFTER FLAG 0 IS CONFIRMED READ STARTED |
| y=#13 | D0=1: ENTRY TO Reg-DRAM DIRECT TRANSFER MODE, D1=1: EXIT FROM Reg-DRAM DIRECT TRANSFER MODE<br>D4=1: Reg1 ADDRESS COUNTER RESET, D5=1: Reg2 ADDRESS COUNTER RESET |
| y=#14 | D5=1 PARTIAL SELF-REFRESH ENABLE<br>D0=1 Bank #0 REFRESHED AT D0 = 1 : Bank #1 REFRESHED AT<br>D1 = 1 : Bank #2 REFRESHED AT D2 = 1 : Bank #3 REFRESHED AT D3 = 1 |
| y=#15 | KEY 1 (LONGEST 64 BITS) : KEY FOR DES-56,KEY FOR E OF EDE OF Triple DES-112<br>KEY FOR FIRST E OF EDE OF Triple DES-168 |
| y=#16 | KEY 2 (LONGEST 64 BITS): KEY FOR D OF EDE OF Triple DES-112,-168 |
| y=#17 | KEY 3 (LONGEST 64 BITS): KEY FOR LAST E OF EDE OF Triple DES-168 |
| y=#18 | IV(Initial Vector) ; INITIAL VECTOR |
| y=#19 | |
| y=#1A | |
| y=#1B | |
| y=#1C | |
| y=#1D | |
| y=#1E | |
| y=#1F | |
| y=#20 | |
| y=#5F | |

• BL = 1 WHEN ACCESSED TO CONTROL COMMAND AREA

REFERENCE POTENTIAL
GENERATING CIRCUIT

INTERNAL STEP-DOWN CIRCUIT

FIG.101  PRIOR ART

| Left | Pin | Pin | Right |
|---|---|---|---|
| $V_{DD}$ | 1 | 54 | $V_{SS}$ |
| $DQ_0$ | 2 | 53 | $DQ_{15}$ |
| $V_{DDQ}$ | 3 | 52 | $V_{SSQ}$ |
| $DQ_1$ | 4 | 51 | $DQ_{14}$ |
| $DQ_2$ | 5 | 50 | $DQ_{13}$ |
| $V_{SSQ}$ | 6 | 49 | $V_{DDQ}$ |
| $DQ_3$ | 7 | 48 | $DQ_{12}$ |
| $DQ_4$ | 8 | 47 | $DQ_{11}$ |
| $V_{DDQ}$ | 9 | 46 | $V_{SSQ}$ |
| $DQ_5$ | 10 | 45 | $DQ_{10}$ |
| $DQ_6$ | 11 | 44 | $DQ_9$ |
| $V_{SSQ}$ | 12 | 43 | $V_{DDQ}$ |
| $DQ_7$ | 13 | 42 | $DQ_8$ |
| $V_{DD}$ | 14 | 41 | $V_{SS}$ |
| DQML | 15 | 40 | NC |
| /WE | 16 | 39 | DQMU |
| /CAS | 17 | 38 | CLK |
| /RAS | 18 | 37 | CKE |
| /CS | 19 | 36 | NC |
| $BA_0(A_{13})$ | 20 | 35 | $A_{11}$ |
| $BA_1(A_{12})$ | 21 | 34 | $A_9$ |
| $A_{10}$ | 22 | 33 | $A_8$ |
| $A_0$ | 23 | 32 | $A_7$ |
| $A_1$ | 24 | 31 | $A_6$ |
| $A_2$ | 25 | 30 | $A_5$ |
| $A_3$ | 26 | 29 | $A_4$ |
| $V_{DD}$ | 27 | 28 | $V_{SS}$ |

| TERMINAL NAMES | FUNCTION |
|---|---|
| CLK | MASTER CLOCK |
| CKE | CLOCK ENABLE |
| /CS | CHIP SELECT |
| /RAS | ROW ADDRESS STROBE |
| /CAS | COLUMN ADDRESS STROBE |
| /WE | WRITE ENABLE |
| $DQ_{0\sim15}$ | DATA I/O |
| DQM(U/L) | OUTPUT DISABLE/WRITE MASK |
| $A_{0\sim11}$ | ADDRESS INPUT |
| $BA_{0,1}(A_{12,13})$ | BANK ADDRESS |
| $V_{DD}$ | POWER SOURCE |
| $V_{DDQ}$ | OUTPUT POWER SOURCE |
| $V_{SS}$ | GROUND |
| $V_{SSQ}$ | OUTPUT GROUND |

SIMPLY INTERFACED SEMICONDUCTOR INTEGRATED CIRCUIT DEVICE INCLUDING LOGIC CIRCUITRY AND EMBEDDED MEMORY CIRCUITRY OPERATIVE WITH A REDUCED NUMBER OF PIN TERMINALS

BACKGROUND OF THE INVENTION

1. Field of the Invention

The present invention relates to a semiconductor memory device, and particularly, to a semiconductor memory device having logic circuitry integrated therewith and a control method therefor.

2. Description of the Background Art

FIG. 101 is a plan view representing a pin configuration of a 64 Mbit synchronous dynamic random access memory (SDRAM) with a 16 bit word configuration.

FIG. 102 is a table representing terminal names of SDRAM and their functions.

Referring to FIGS. 101 and 102, a prior art SDRAM is housed in, for example, a package with 54 pin terminals including a terminal CLK to which a master clock is inputted, a terminal CKE to which a clock enable signal is inputted, a terminal/CS to which a chip select signal is inputted, a terminal/RAS to which a row address strobe signal is inputted, a terminal/CAS to which a column address strobe signal is inputted and a terminal/WE to which a write enable signal is inputted.

A prior art SDRAM further has terminals DQ0 to DQ15 supplying/receiving a data I/O signal, a terminal DQM (U/L) through which an output disable signal/a write mask signal are inputted/outputted, terminals A0 to A11 to which an address is inputted, terminals BA0 and BA1 to which a bank address is inputted, a terminal VDD supplied with a power source, a terminal VDDQ supplied with an output power source, a terminal VSS provided with a ground potential and a terminal VSSQ provided with an output ground potential.

The terminals are configured such that as shown in FIG. 101, the data I/O terminals and power sources are disposed between the first and thirteenth pins, and between the forty-second and fifty-fourth terminals; the control signals and the clock signal are disposed between the fifteenth and nineteenth pins, and between the thirty-seventh and thirty-ninth pins; and the address pins are disposed between the twentieth and thirty-fifth pins. Such a terminal configuration is at a level of general versatility and also well used in a substrate on which a system including a memory is mounted.

FIG. 103 is a block diagram representing a configuration of a prior art logic integrated dynamic random access memory hereinafter referred to as DRAM).

Referring to FIG. 103, a DRAM 504 and a logic 508 are integrated on a chip 501 and provided with terminals for inputting or outputting control signals /RAS, /CAS, . . . , /CS for access to the DRAM, an address signal ADD and a data signal DATA.

In the chip 501, further included are control pins CTR0 and CTR1 unique to a logic, a terminal to which inputted is a request signal REQ requesting access to the logic, and a terminal for outputting a strobe signal STRB for notifying the outside that the logic completes a processing.

Since in the prior art, pins unique to the logic 508 were provided in order to control the logic 508, the number of pins increased compared with a general purpose DRAM as shown in FIG. 101; or in order to compose a system on a board, a dedicated controller for controlling a logic integrated DRAM had to be provided. Hence, a general versatility such as to be connected to an ordinary microcomputer was lost, or specific commands were required in a microcomputer for controlling the system.

SUMMARY OF THE INVENTION

It is accordingly an object to provide a semiconductor integrated circuit device on which integrated are memory circuitry and logic circuitry that can be controlled by a control method similar to that of a general purpose DRAM.

It is another object to provide a semiconductor integrated circuit device, on which integrated are memory circuitry such as DRAM and logic circuitry, capable of supplying/receiving a result of a prescribed logical operation performed on data stored in the memory circuitry through an interface easy to be externally handled.

The present invention will be summarized: The present invention is a semiconductor integrated circuit device and includes a terminal group, a memory cell array and logic circuitry.

The terminal group receives extremely supplied control signal, address signal and data. The memory cell array, according to the control signal, stores storage data in an area specified by the address signal. When the address signal specifies a predetermined area, the logic circuitry performs an logic operation according to at least one of the control signal, the address signal and the data supplied from the terminal group. The logic circuitry switching data to be processed in the logic operation according to the control signal between the storage data already stored in the memory cell array and data supplied from the terminal group.

In another aspect of the present invention, a semiconductor integrated circuit device comprises a terminal group, a memory cell array, and logic circuitry.

The terminal group has a predetermined number of pin terminals and receives externally supplied control signal, address signal and data.

The memory cell array, according to the control signal, stores storage data in an area specified by the address signal.

The logic circuitry performs a logic operation according to at least one of the control signal, the address signal and the data supplied from the terminal group when the address signal specifies a predetermined area, The logic circuitry switches data to be processed in the logic operation according to the control signal between the storage data already stored in the memory cell array and data supplied from the terminal group, The predetermined number is identical with the number of pin terminals of an available DRAM.

Hence, an advantage of the present invention is that the logic circuitry integrated can be controlled according to a sequence similar to that according to which data, an address and a control signal are given to a general purpose memory, and the system can be obtained without altering an existing system greatly and easy to be controlled. Furthermore, an advantage of the present invention is that a semiconductor integrated circuit on which integrated are memory circuitry and logic circuitry can supplies/receives a result of a prescribed logical operation on data stored in the memory circuitry at a high speed through an interface easy to be externally handled.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a table representing examples of cryptosystems that a logic circuit 8 can perform;

FIG. 27 is a timing chart for describing an operation when read access is performed on the same page in the normal mode;

FIG. 28 is a timing chart for describing an operation when read access is performed on a different page in the normal mode;

FIG. 29 is a timing chart for describing an operation when an internal clock signal clkL given to the logic circuit 8 is converted to 50 MHz;

FIG. 30 is a timing chart for describing an operation when read access is performed on the same page in the normal mode;

FIG. 31 is a timing chart for describing an operation when read access is performed on a different page in the normal mode;

FIG. 53 is a timing chart representing an operation of a full page mode in a register-DRAM transfer mode;

FIG. 54 is a drawing representing assignment of addresses for a register 0, a first data register 84 and a second data register 86;

FIG. 55 is a drawing representing an example of data held in the registers;

FIG. 101 a plan view representing a pin configuration of a prior art synchronous dynamic random access memory (SDRAM);

DESCRIPTION OF THE PREFERRED EMBODIMENTS

Figure 1:
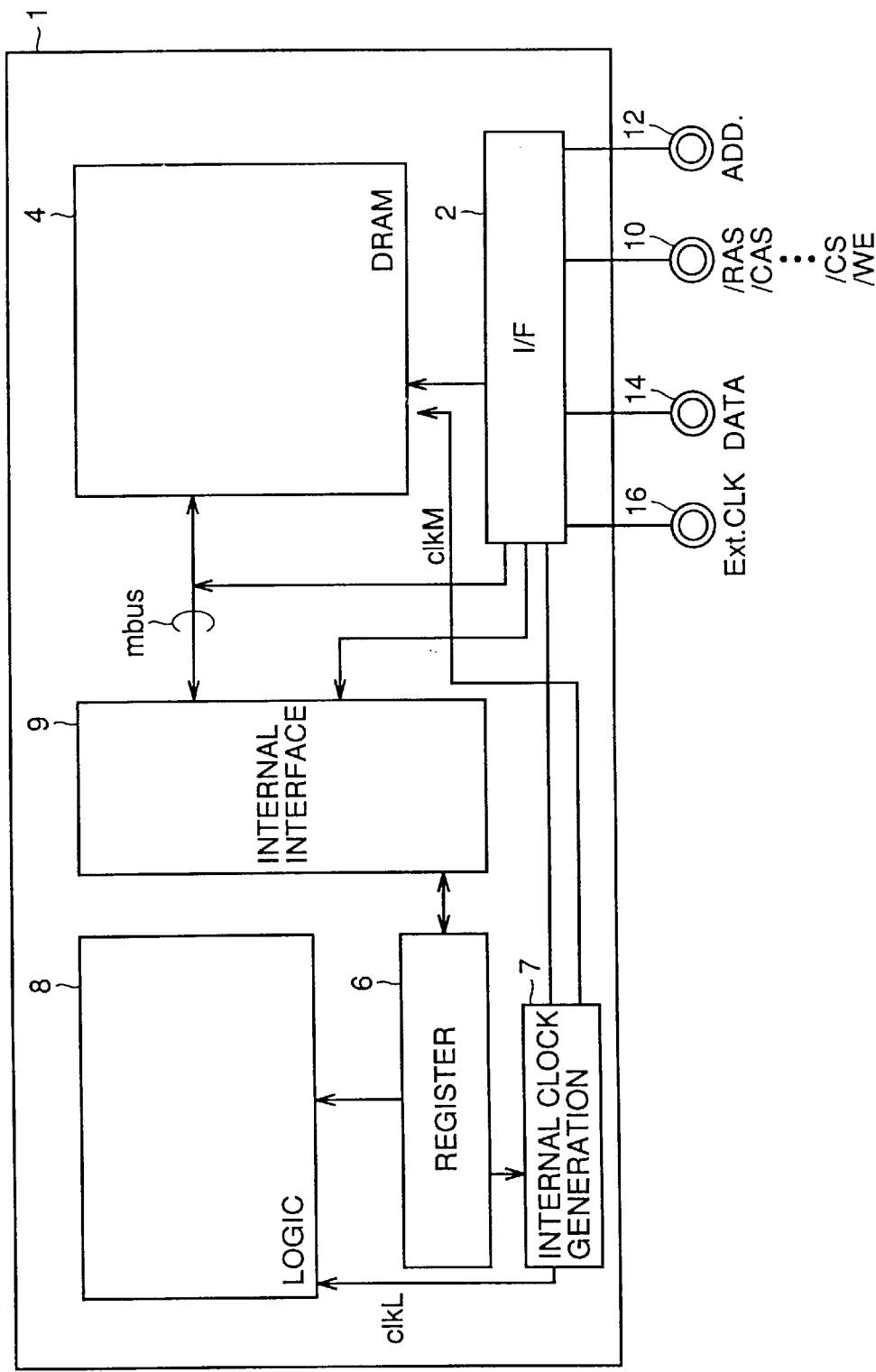
FIG. 1 is a block diagram representing a configuration of a semiconductor integrated circuit device 1 of an first example of the present invention.

Detailed description will be given of embodiments of the present invention below with reference to the accompanying drawings, where the same symbols in the drawings indicate the same or similar constituents.

First Example

FIG. 1 is a block diagram representing a configuration of a semiconductor integrated circuit device 1 of an first example of the present invention;

Referring to FIG. 1, a semiconductor integrated circuit device 1 includes: a terminal 10 receiving a control signal such as a control signal /RAS, /CAS, . . . , /CS or /WE; a terminal 12 receiving an address signal ADD; a terminal 14 receiving a data signal DATA; a terminal 16 receiving an external clock signal Ext. CLK; an interface section 2 outputting control signals to the interior according to the control signals /RAS, /CAS, . . . , /CS or /WE, the address signal ADD, and the data signal DATA; a memory section (DRAM) 4 receiving an output of the interface section 2 to operate; a register 6 holding data and a command given from the interface section 2 or a logic operation result; a logic circuit 8 performing an operation such as signal processing according to outputs from the register 6 and the interface section 2; an internal clock generating circuit 7 for generating an internal clock signal clkM for the memory section (DRAM) 4 and an internal clock signal clkL for the logic circuit 8 according to the external clock signal Ext. CLK; and an interface section 9 for, as an intermediate, enabling data supply/reception between the register 6,and either of the memory section 4 and the interface section 2. Data supply/reception between the interface section 2, the memory section 4 and the interface section 9 is performed through an internal bus mbus.

Terminals of a chip 1 are the same as terminals used in a general purpose DRAM. Hence, the same package as in which a general purpose DRAM chip is housed can be employed. For example, a package in which the semiconductor integrated circuit device 1 is housed is one having a pin configuration as shown in FIG. 101.

For this reason, when a semiconductor integrated circuit device 1 of the present invention is adopted in an existing application, an existing general purpose DRAM is simply replaced with the semiconductor integrated circuit device 1, so no necessity arises to redesign a board or to develop a dedicated control LSI. That is, since the semiconductor integrated circuit device 1 is pin-compatible with a general purpose DRAM, a new function can be added only by altering a software. As new functions, for example, conceivable are addition of a circuit for use in a high speed image processing and a logic circuit performing processing taking a long time on a microcomputer such as a cryptographic processing. Furthermore, it is allowed that control signals may be inputted by use of several non-use terminals, for example a NC (non-connection) pin such as the thirty-sixth pin and the fortieth pin of FIG. 101, in a package housing a general purpose DRAM.

Next, description will be given of a concrete control method. A so-called memory mapped IO method is applied in control of an integrated logic circuit 8.

Figure 2:
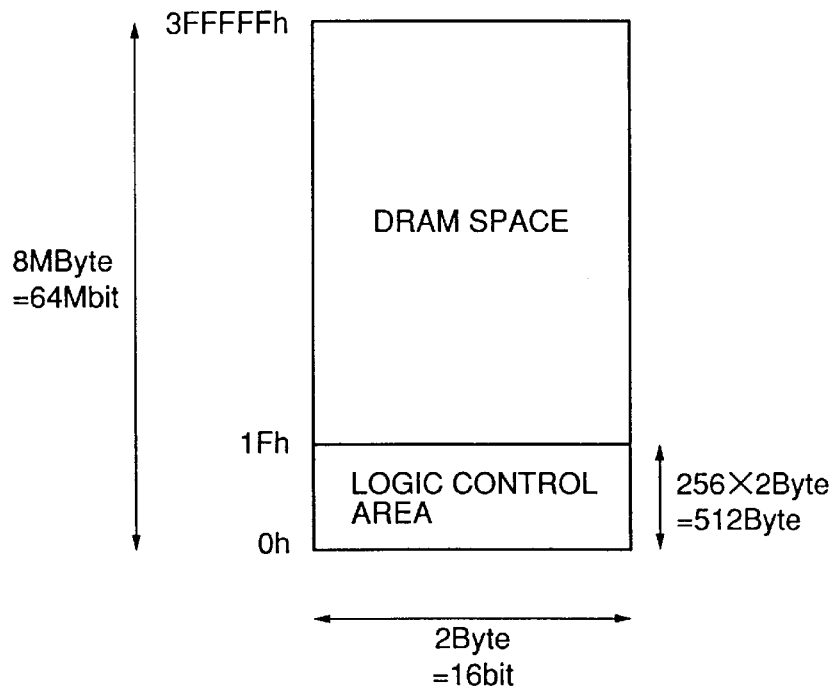
FIG. 2 is a drawing representing a memory map of a logic integrated semiconductor memory device of the first example.

FIG. 2 represents a memory map of a logic integrated semiconductor memory device of the first example.

Referring to FIG. 2, it is assumed that a capacity of a DRAM fabricated on a chip is 64 Mbits and a word configuration is of 16 bits. Addresses of DRAM include an X address ranging from X0 to X13, and a Y address ranging from Y0 to Y7. Therefore, memory addresses controlling 8 Mbytes are 0h to 3FFFFFh.

In a general purpose DRAM, data can be written and read out in all of the address space. Such a space as in which data can be written and read out is called a DRAM space as definition. In the present invention, a special area in the address space is assigned to a logic control area for the logic circuit integrated. For example, a space from 0h to 1Fh in address is assigned to the logic control area. A capacity of the logic control area is, for example, 256×2 bytes=512 bytes. A command and a mode controlling the logic can be selected according to data written in the address space.

While in FIG. 2, an area is secured in the lowest address side, the logic control area may be assigned in the highest side (3FFFFFh to 3FFFE0h). It is also allowed that when SDRAM is conceived as a DRAM integrated on a chip, an area in which an address is assigned can be selected on setting of a mode register. Furthermore, unless the logic control area is assigned on the setting of a mode register, the SDRAM can also be used as a normal 64 Mbit SDRAM.

Figure 3:
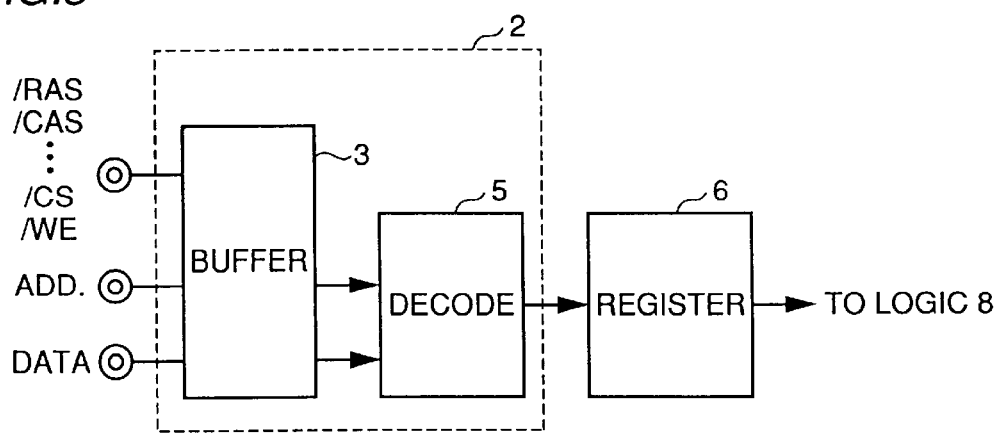
FIG. 3 is a block diagram for describing a way how a signal inputted externally is transmitted to a logic circuit.

FIG. 3 is a block diagram for describing a way how a signal inputted externally is transmitted to a logic circuit.

Referring to FIG. 3, an interface section 2 includes: a buffer 3 receiving the control signals /RAS, /CAS, . . . /CS and /WE, the address ADD and, the data signal DATA; and a decode circuit 5 receiving an output of the buffer 3 to decode the output, wherein the register 6 holds information such as a mode and a command in response to an output of the decode circuit 5 and the logic circuit 8 is controlled according to the information held by the register 6.

While the decode circuit 5 decodes the address signal ADD and the data signal DATA, a case occurs where data written in the logic control area specified by an address signal is held as is originally in the register 6.

When the register is constituted of SRAM (static random access memory) or the like, a case occurs where data is held in an area of the SRAM specified according to the address signal ADD. Furthermore, it is also allowed that an area, a part of DRAM, is used as a holding circuit instead of the register 6 and data for control of the logic circuit is held in the area.

That is, a configuration can be adopted in which an address area itself in which the above described logic control region is assigned is assigned in the memory section 4. Alternatively, a configuration can also be adopted in which the highest bits are virtually added to an address space of the memory section 4 and an address area in which a logic control area is assigned becomes an area, a part of the virtual address space, other than an address space of a memory cell array.

However, in the following description, though specifically not limited, for simplicity of description, it is assumed that an address assigned to such a logic control area is to be assigned to the register 6 of FIG. 1.

Furthermore, in the following description, for convenience of description, a logic operation in the logic circuit 8 is encryption, though specifically not limited.

It is assumed that the semiconductor integrated circuit device 1 shown in FIG. 1 has three kinds of operating modes as described below and one of the three kinds of operating modes is selected according to a combination of control signals given externally.

As will be clear in description given below, in the semiconductor memory device 1 having the operating modes as described below, by selecting a proper processing mode in conformity with an embedded system including no data cache, a system in which a data cache is included or a system in which MMU (Memory Management Unit) is supported and which is programmed in a virtual address space, for example, a processing efficiency of encryption can be improved.

Figure 4:
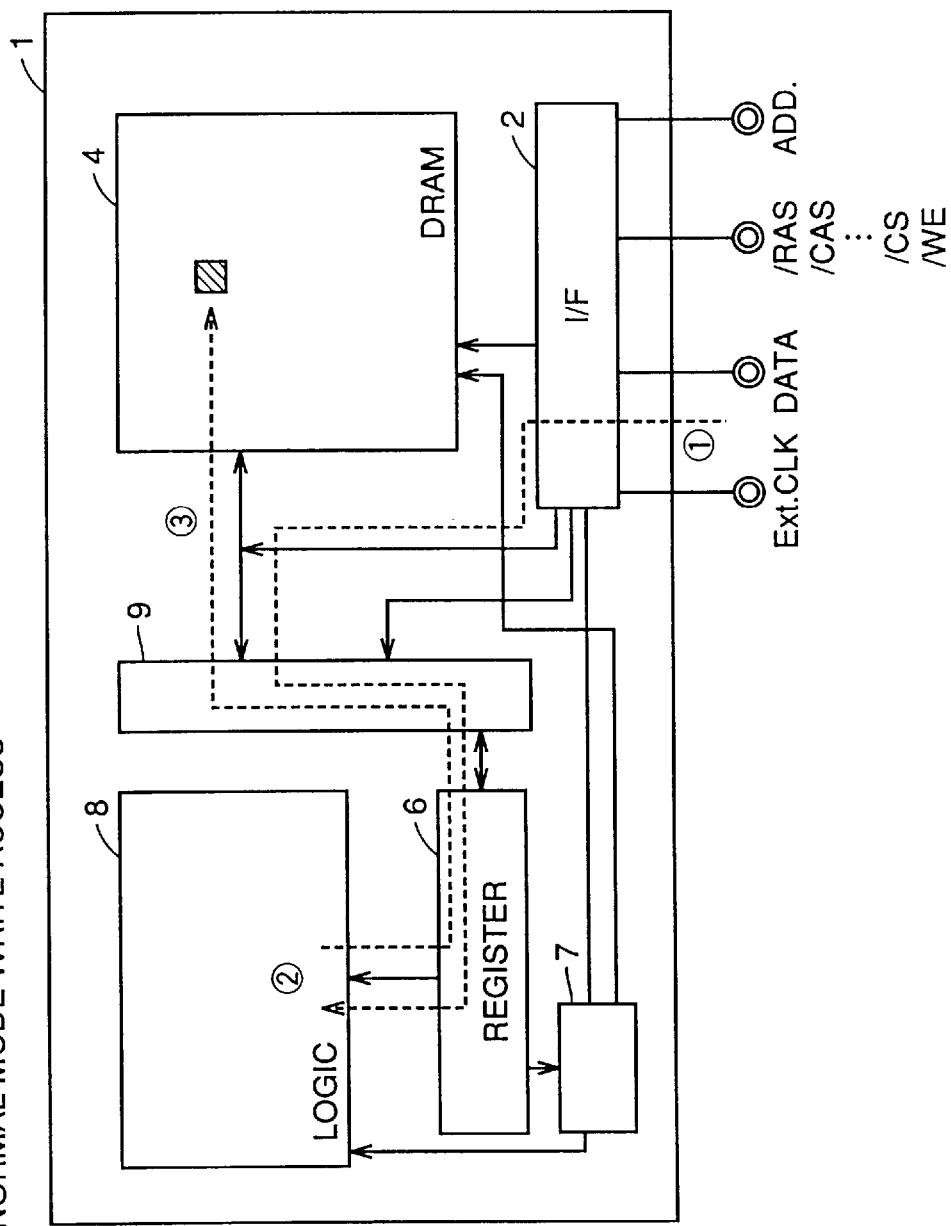
FIG. 4 is a block diagram for describing an operation in a normal mode, one of operating modes, of the semiconductor integrated circuit device 1.

FIG. 4 is a block diagram for describing an operation in a normal mode, one of the operating modes, of the semiconductor integrated circuit device 1.

In FIG. 4, description will be given of an operation of write access in the normal mode.

When write access is performed to the semiconductor integrated circuit device 1 during entry to an encryption mode according to a combination of control signals, write data is enciphered and a result thereof is automatically held at a address specified in write. That is when data desired to be enciphered is inputted ([1]), encryption is performed in the logic circuit 8 ([2]) and an encryption result is transferred to an address in the write access ([3]).

Figure 5:
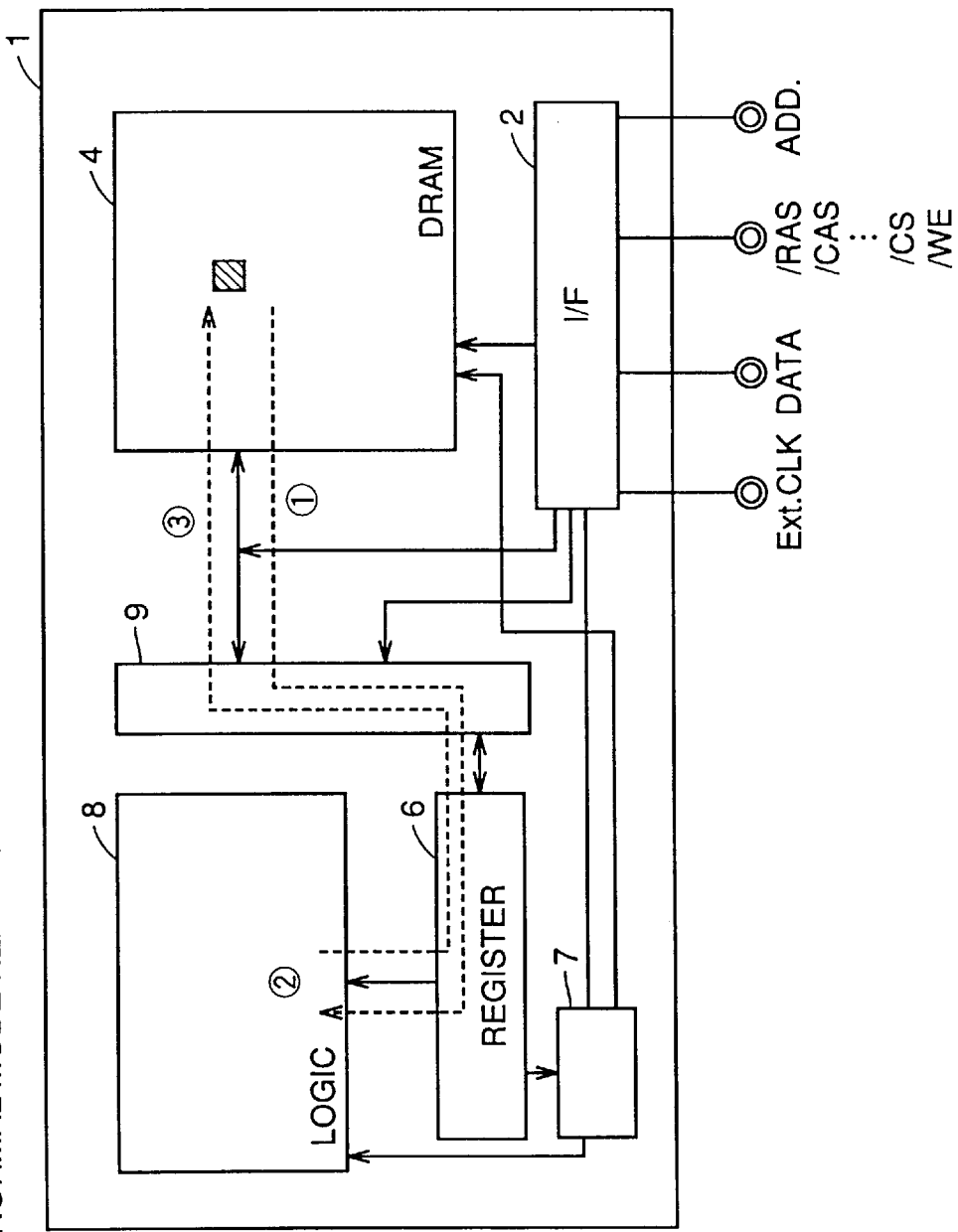
FIG. 5 is a block diagram for describing an operation of read access in the normal mode.

FIG. 5 is a block diagram for describing an operation of read access in the normal mode.

When read access is performed to the semiconductor integrated circuit device 1 during entry to an encryption mode according to a combination of control signals, data at an accessed address is transferred to the logic circuit 8 from the memory section 4 ([1]), encryption is performed in the logic circuit 8 ([2]) and an encryption result is transferred to the same address as an address in the read access ([3]).

Figure 6:
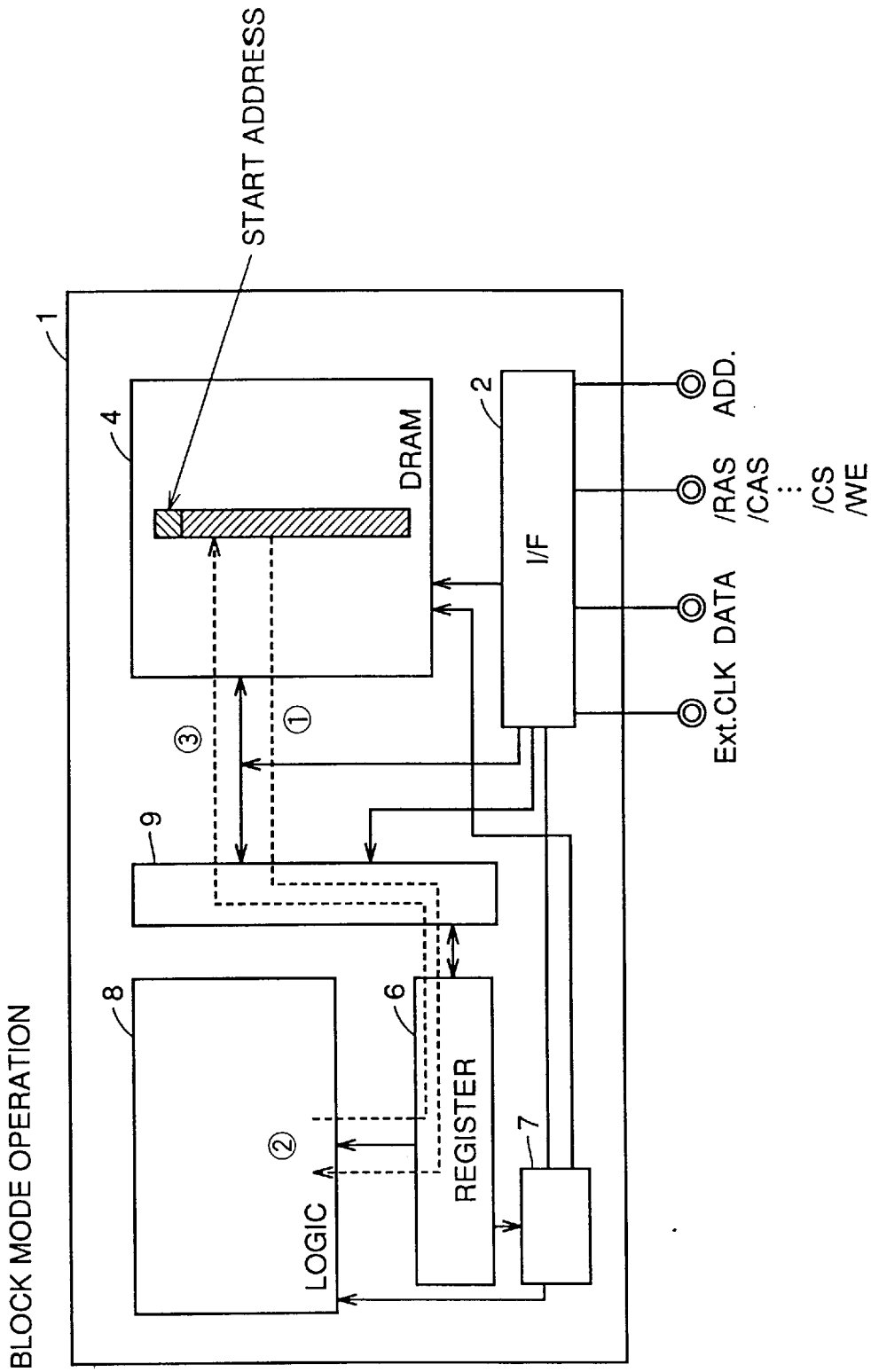
FIG. 6 is a block diagram for describing an operation in a block mode, another of the operating modes, of the semiconductor integrated circuit device 1.

FIG. 6 is a block diagram for describing an operation in a block mode, another of the operating modes, of the semiconductor integrated circuit device 1.

In the block mode, a block length (a processing unit of encryption) of data is set according to a combination of a control signal, an address signal and others during setting of an encryption mode.

Thereafter, setting of a start address for the processing is performed by effecting dummy write (or dummy read) to an address. Data of the block length set is automatically transferred to the logic circuit 8 from the memory section 4([1]) with the start address as a start point, encryption is performed ([2]) and thereafter, data of a processed result again is automatically rewritten to addresses over a block length from the start address as a start point ([3]). An address counter circuit (not shown) is provided for data transfer of data of such a block length. The address counter circuit can be functionally replaced with an address counter used when a self-refresh operation is performed in DRAM.

Figure 7:
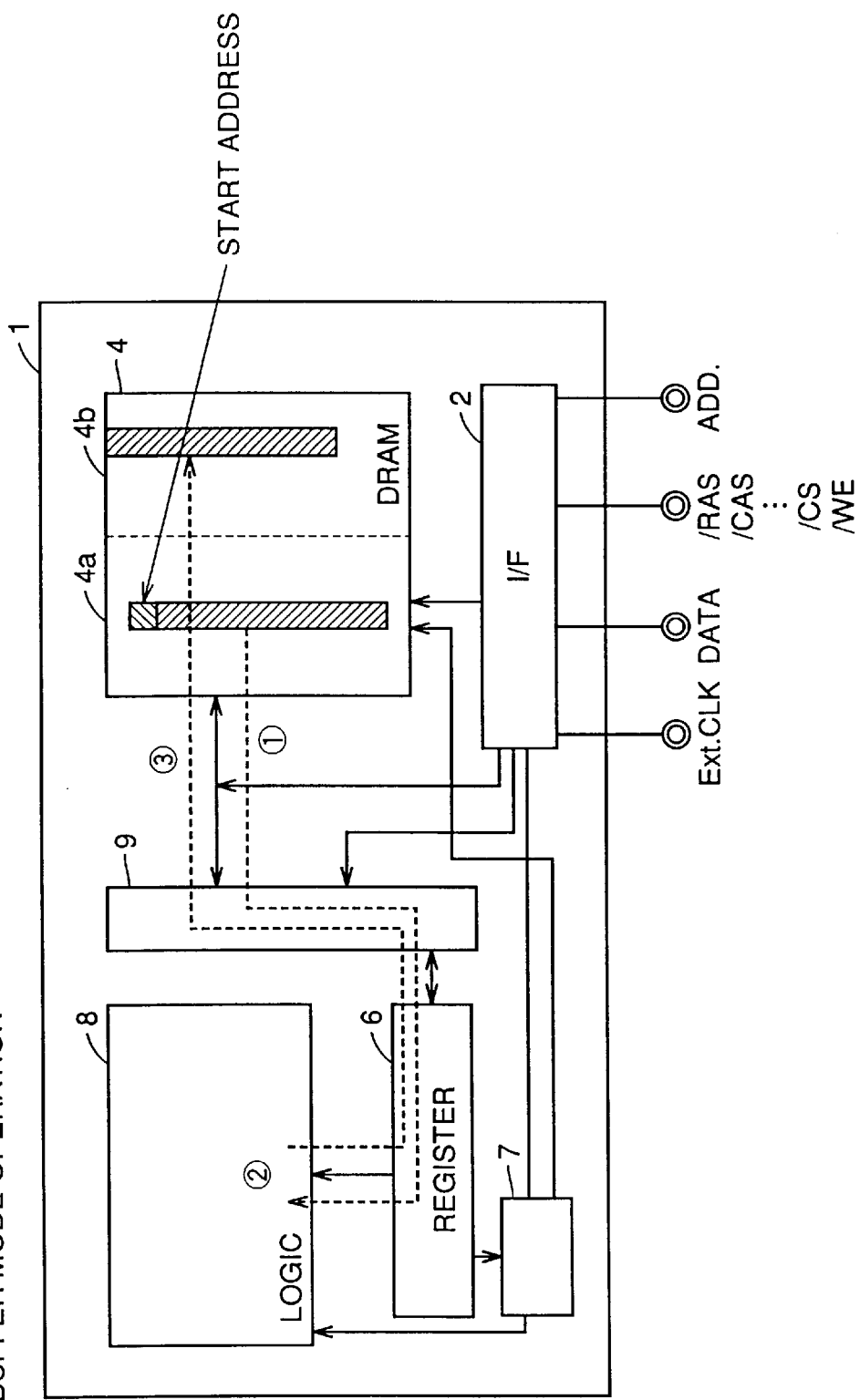
FIG. 7 is a block diagram for describing an operation in a buffer mode, still another of the operating modes, of the semiconductor integrated circuit device 1.

FIG. 7 is a block diagram for describing an operation in a buffer mode, still another of the operating modes, of the semiconductor integrated circuit device 1.

In a buffer mode, a block length of data to be enciphered is set during setting of the encryption mode. In the buffer mode, a prescribed address area of the memory section 4 is secured as a buffer address area 4b. In the buffer address area 4b, a plurality of buffer areas are set and buffer IDs are assigned to the respective buffer areas for discrimination. Hence, in the buffer mode, setting of a buffer ID of a transfer destination of an encryption result is performed after setting of a block length of data to be enciphered.

Thereafter, setting of a start address for processing is performed by effecting dummy write (or dummy read) at an address in a processing address area 4a.

Data of the block length set is automatically transferred to the logic circuit 8 from the memory section 4 with the start address as a start point ([1]), encryption is performed ([2]) and thereafter data of a processing result is automatically transferred to a buffer area of a buffer ID specified ([3]).

Note that in a case where the memory section 4 is constituted of a plurality of banks, no conflict between read and write on a bank arises, thereby enabling efficient processing if buffer areas are uniformly assigned to the banks, and a bank to which the processing address area 4a belongs and a bank to which a buffer area of a transfer destination belongs are different from each other.

Figure 8:
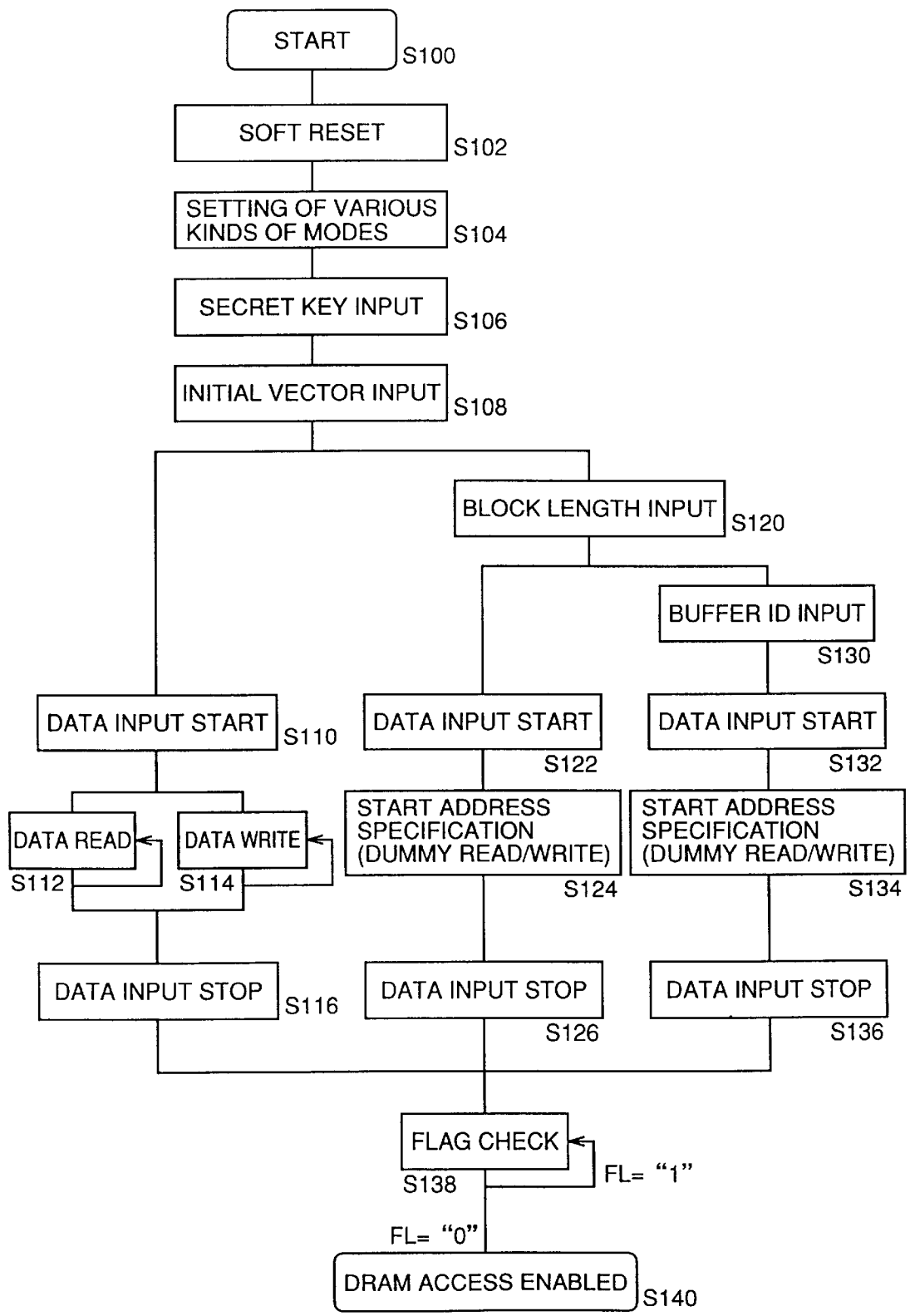
FIG. 8 is a flow chart for describing operations in the three modes.

FIG. 8 is a flow chart for describing operations in the three modes as described above.

Referring to FIG. 8, when the processing gets started (step S100), the logic circuit 8 is reset by soft resetting if an encryption function is used for the first time after power-on (step S102).

In succession, as detailed later, performed is setting of various kinds of modes for encryption (step S104): for example, selection of a secrete key cryptosystem, selection of one of the three kinds of encryption modes described above, designation of the number of buffers if in the buffer mode.

Furthermore, a secrete key is inputted (step S106). Herein, when a Triple DES (Data Encryption Standard) system is selected, input of two kinds of keys are required.

When a block cipher in chain is used, an initial vector IV is inputted (step S108).

In succession, in a state where the normal mode is selected, when data input is started by a data input command (step S110), data read over an encryption block length and its encryption are performed in normal read access (step S112), while on the other hand, data encryption over the encryption block length and write of a processing result thereof are performed in normal write access (step S114). That is, in a period while a data input command is inputted and data input is being performed in the normal read and normal write, a plurality of memory accesses of the encryption block length are accepted and encryption thereof is sequentially performed in the logic circuit 8.

When a command of data input stop is given, data input is ceased (step S116) and subsequent to this, a flag check in the register 6 is externally performed (step S138). As long as the flag FL="1" indicating "in encryption," no access to DRAM can be performed and access to DRAM is enabled for the first time after it is established FL="0" (step S140).

On the other hand when the block mode or the buffer mode has been specified, input of a block length is performed following step S108 (step S120).

Subsequently, in a case of the block mode, when a data input command is given (step S122), then dummy read or dummy write is performed for specifying a start address (step S124), and processing in the block mode is performed. When a data input stop command is inputted (step S126), then the processing moves to step S138.

In the buffer mode, a buffer ID is first inputted (step S130). When a data input command is given (step S132), then effected is dummy read or dummy write in order to specify a start address (step S134) and processing in the buffer mode follows. When a data input stop command is inputted (step S136), then the processing moves to step S138.

By performing the processing as described above, it is possible to control the three kinds of operating modes.

In the above processing, a specific mode exists during a period from a time when a data input start command is inputted till a data input stop command is inputted. Accordingly, if access is externally performed on a memory space of DRAM, one of the three kinds of processings as described above is performed on data to be processed.

Furthermore, even if the data input stop command is inputted, information on a mode itself is held in the register 6; therefore, when the data input start command is inputted, it is possible to perform processing in the same processing mode.

In a case where an interrupt instructing a refresh operation is given from a memory controller of a system during encryption in the logic circuit 8, processing as described below may be adopted.

Counting is performed of the number of refresh commands inputted during the processing in the logic circuit 8 and the information is held in the register 6, for example. When encryption in the logic circuit 8 is completed, refresh processings on the memory section 4 are performed in times equal to the number of the counts. The flag FL stays in a state of "1" during the refresh period similar to a processing period of the logic circuit 8 regarding the refresh period as one of no DRAM access. After the refresh operation is completed, the flag FL is transitioned to a state of "0."

Furthermore, in FIG. 8, after inputting of a data input start command, the semiconductor integrated circuit 1 accepts only either a stop command or a softwear reset command.

It is assumed that in the memory section 4, a mode register is provided for specifying a operating mode thereof, for example a burst length or latency. It is further assumed that a configuration is adopted in which the processing can exit out of a control mode of the logic circuit 8 such that the semiconductor integrated circuit 1 can continues a normal operation in whatever state the semiconductor integrated circuit 1 is on power-on: not only when a softwear reset command is given but also when a mode register set command is given to the memory section 4.

[Contents of Encryption]

Simple description will subsequently be given of encryption performed by the logic circuit 8.

FIG. 9 is a table representing examples of cryptosystems that a logic circuit 8 can perform.

Referring to FIG. 9, the logic circuit 8 supports RSA (Rivest-Shamir-Adelman) encryption as a public key cryptosystem, and DES system and Triple-DES system as a secrete key cryptosystem.

Furthermore, in the secrete key cryptosystem, supported are modes such as ECB (Electric Code Book), CBC (Cipher Block Chaining), OFB (Output Feed Back), CFB (Cipher Feed Back), which are major block encryption modes. The logic circuit 8 is assigned with a critical processing in encryption in order to enhance suitablity of application, and the other processings are subjected to softwear centric operations on the microcomputer side of the system controlling the semiconductor integrated circuit device 1. The greatest feature thereof is that cryptographic control can be realized in a manner compatible with a general purpose SDRAM.

For example, in an electronic commerce market, establishment of such a cryptosystem as described above will come to be important. Even in wireless application protocol (WAP) whose application is expected to a portable telephone, the above described cryptosystems are supported.

For example, in security processing in such a network, processings such as hash, data encoding and padding are processed on the microcomputer side of the system. In contrast to this, the semiconductor integrated circuit device 1 can perform processings to be said a major part of softwear centric processing in a prior art practice, such as a power residue operation performed in electronic authentication according to RSA, a Montgomery multiplication residue operation and other residue operations. Hence, with a semiconductor integrated circuit device 1 performing only critical processings in the system, high speed processing can be realized while enhancing a degree of freedom on the application side.

[Secrete Key Cryptosystem]

In the above described electronic commerce or the like, electronic authentication is performed in a public key cryptosystem, while encryption of data transmission/reception after the authentication is in general performed using a secrete key cryptosystem: using a so-called hybrid system.

Figure 10:
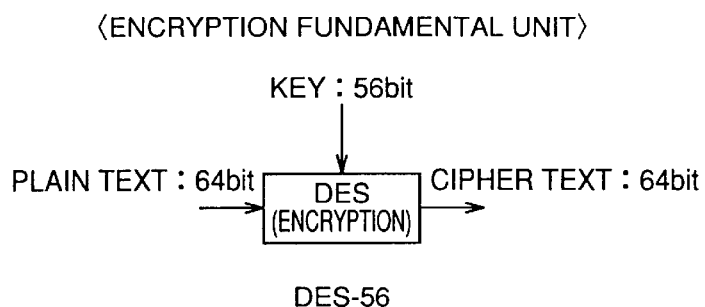
FIG. 10 is a conceptual drawing representing a fundamental unit for DES encryption used as a secrete key cryptosystem.

FIG. 10 is a conceptual drawing representing a fundamental unit for DES encryption used as a secrete key cryptosystem.

A key length of DES is 56 bits and 14 bits of a plain text is outputted as 14 bits of a cipher text.

Figure 11:
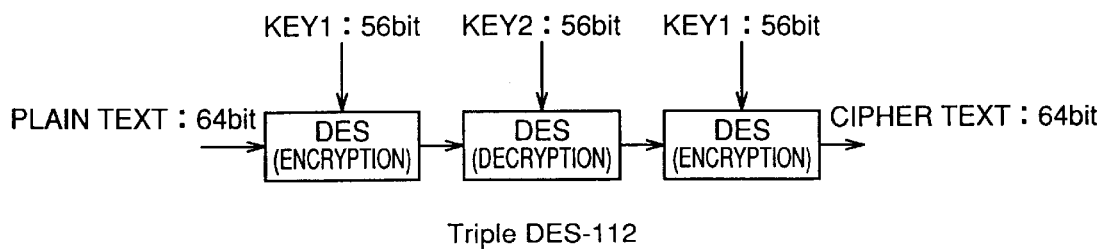
FIG. 11 is a first conceptual drawing representing a Triple DES processing system.
Figure 12:
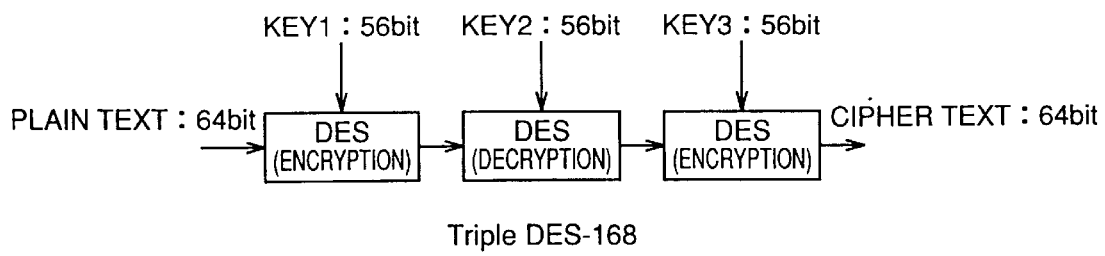
FIG. 12 is a second conceptual drawing representing the Triple DES processing system.

On the other hand, FIGS. 11 and 12 are conceptual drawings representing a so called Triple DES processing system.

The Triple DES includes a cryptosystem of 112 bits in key length as shown in FIG. 11 and a cryptosystem of 168 bits in key length as shown in FIG. 12.

In the Triple DES-112 shown in FIG. 11, a plain text of 64 bits is enciphered with a first 56 bit key, thereafter deciphered with a second 56 bit key, then further enciphered with the first 56 bit key and a result enciphered is outputted as a cipher text of 64 bits.

In the Triple DES-168 shown in FIG. 12, a plain text of 64 bits is enciphered with a first 56 bit key, subsequent to this deciphered with a second 56 bit key, then further enciphered with a third 56 bit key and a result enciphered is outputted as a cipher text of 64 bits.

Figure 13:
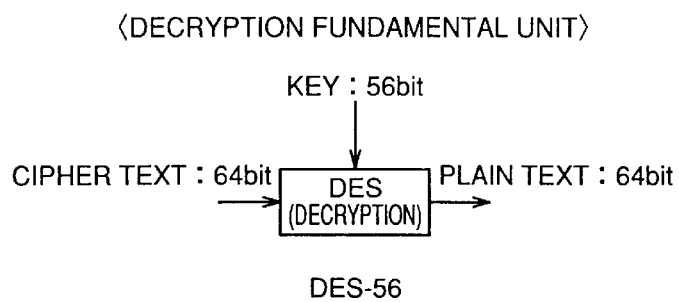
FIG. 13 is a conceptual drawing representing decryption performed correspondingly to FIG. 10.
Figure 14:
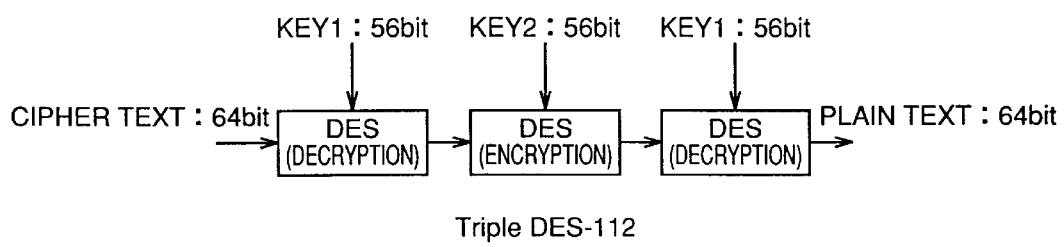
FIG. 14 is a conceptual drawing representing decryption performed correspondingly to FIG. 11.
Figure 15:
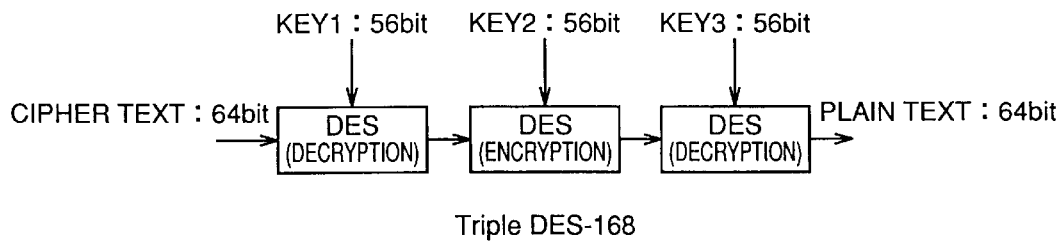
FIG. 15 is a conceptual drawing representing decryption performed correspondingly to FIG. 12.

FIGS. 13 to 15 are conceptual drawings representing decryption performed correspondingly to FIGS. 10 to 12, respectively.

As shown in FIGS. 13 to 15, decryption from a cipher text to a plain text in DES can be performed using absolutely the same algorithm as that of the encryption from a plain text to a cipher text.

[EBC Mode]

Figure 16:
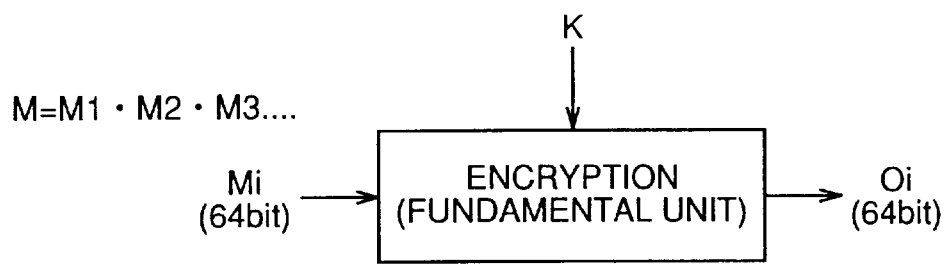
FIG. 16 is a conceptual drawing for describing encryption in an EBC mode.
Figure 17:
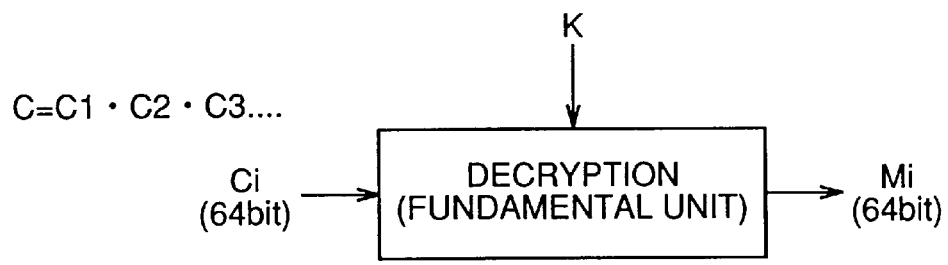
FIG. 17 is a conceptual drawing for representing decryption in the EBC mode.

FIG. 16 is a conceptual drawing for describing encryption in the EBC mode. FIG. 17 is a conceptual drawing for representing decryption in the EBC mode.

In encryption, an ordinary data (plain text) is divided into 64 bit blocks Mi (M=M1, M2, M3, . . . ) and encryption is performed on each block with a secrete key data K owned commonly by a transmitter and a receiver. By doing so, cipher texts Ci (C=C1, C2, C3 . . . ) of each 64 bits are generated.

As shown in FIG. 17, in decryption, a cipher text Ci is deciphered with the same key as used the encryption, whereby plain texts Mi (M=M1, M2, M3, . . . ) are generated.

[CBC Mode]

Simple description will be given of the CBC mode as a block mode in chain below.

In the CBC mode, a block Mi obtained by dividing a plain text into 64 bit blocks is enciphered to obtain a cipher text block Ci similar to in the EBC mode described above and furthermore, an exclusive logical sum between the cipher text block Ci and the next plain text block Mi+1 is used as an input in the next encryption. Such a process is repeated and a chain is extended adding one after another, whereby a cipher hard to break can be attained.

On the other hand, decryption is performed such that a cipher text block Ci is deciphered similar to in the EBC mode to attain a result Mi, an exclusive logical sum between Ci and a deciphered result of the next cipher text block Ci+1 is generated as an output plain text block Mi+1 and such a process is repeated and a chain is extended adding one after another, whereby a decryption can be performed.

When a plain text block is indicated by Mi, a cipher text block is indicated by Ci (i=1, 2, . . . ), encryption using a cryptographic key K is indicated by Ek and decryption is indicated by Dk by definition, the CBC mode can be performed by the logical expressions shown below:

$C1=Ek(M1+IV)$ $Ci=Ek(Mi+Ci-1) \; (i:2,3,\ldots)$ $Mi=Dk(C1)+M1$ $Mi=Dk(Ci)+Ci-1 \; (i:2,3,\ldots)$ wherein IV is an initial value and used in a first step of either of encryption and decryption; a symbol + means an exclusive logical sum operation; and a function Ek ( . . . ) indicates encryption and a function Dk ( . . . ) indicates decryption.

The initial value (initial vector) IV is of the same value on both of the encryption side and the decryption side. Since a value of the initial value IV is allowed to be known to a third party, it is not required that the initial value IV is sent between a transmitter and a receiver in secrecy. At this time, if a value of the initial value IV is altered, a different cipher text is generated from the same message.

Figure 18:
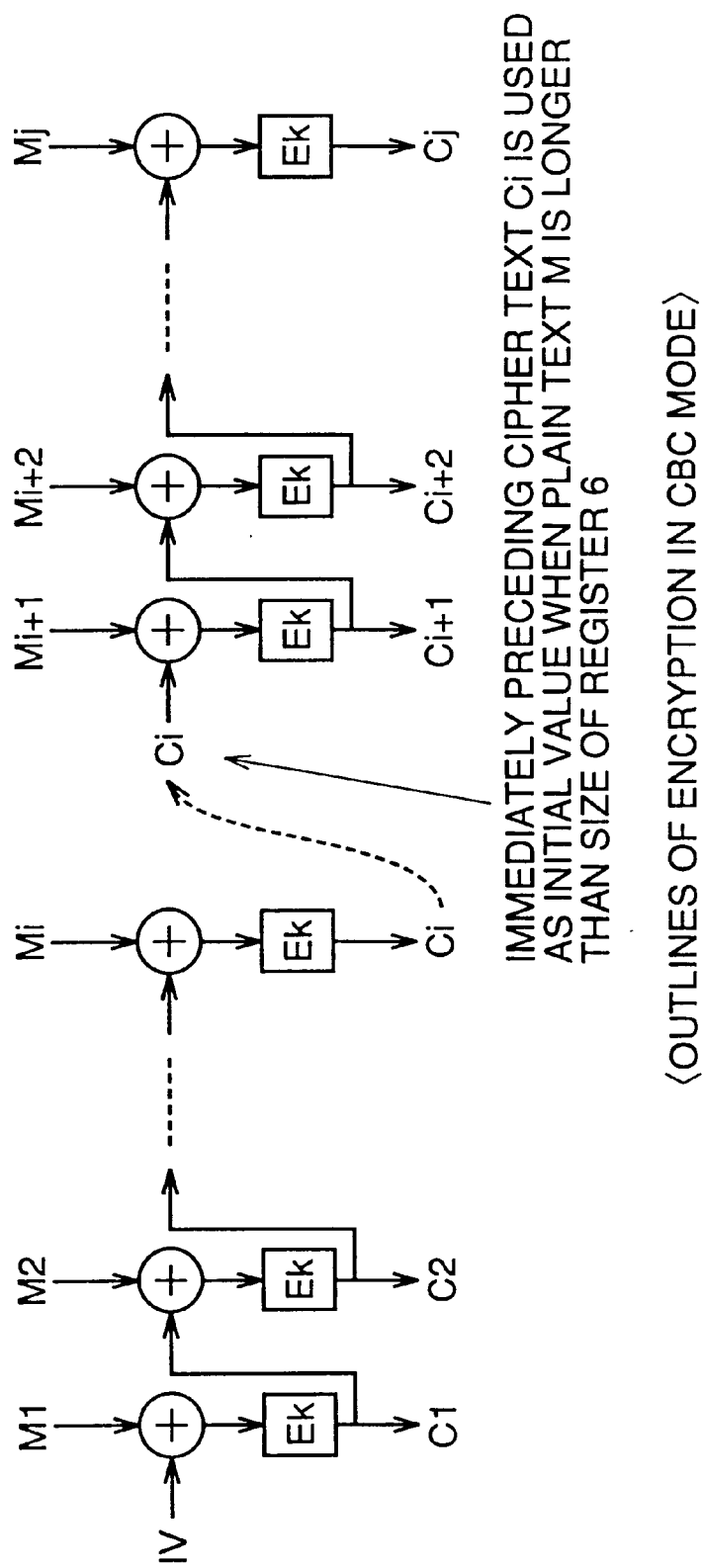
FIG. 18 is a conceptual drawing for describing encryption in a CBC mode.

FIG. 18 is a conceptual drawing for describing encryption in the CBC mode.

By performing encryption of an exclusive logical sum between the initial value IV and a plain text block M1, a deciphered block C1 is generated and such a process is sequentially repeated in chain thereafter.

However, a plain text block length that can be inputted at a time to the semiconductor integrated circuit device 1 is determined by a size of the register 6.

Therefore, when a plain text having a length longer than the size of the register 6, a next plain text block is enciphered with the immediately preceding cipher text block (Ci in FIG. 18) as an initial value.

Figure 19:
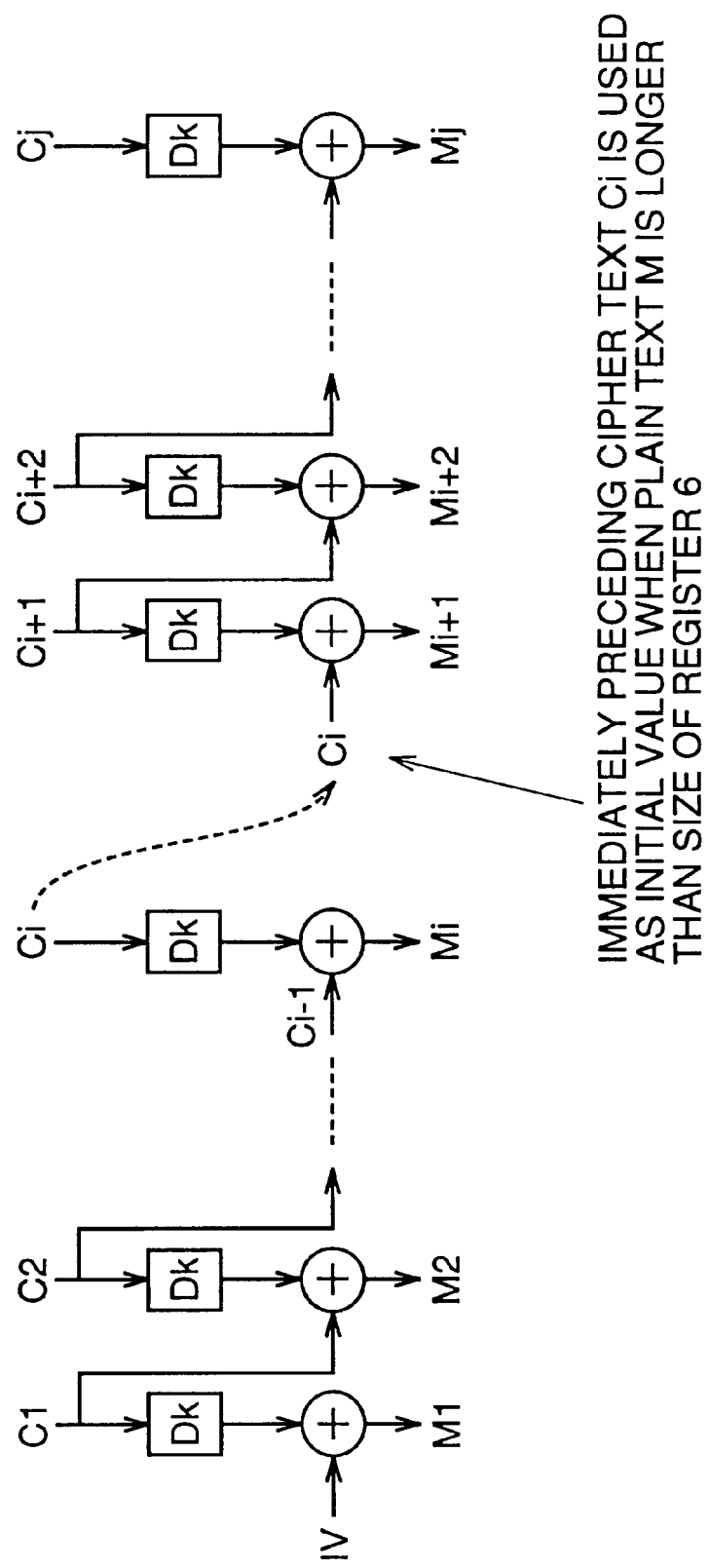
FIG. 19 is a conceptual drawing representing processing for deciphering an cipher text enciphered in a way as shown in FIG. 18.

FIG. 19 is a conceptual drawing representing processing for deciphering an cipher text enciphered in a way as shown in FIG. 18.

A processing in this case is performed basically in reverse from the processing of FIG. 18. Furthermore, in a case where a cipher text C is longer than a size of the register 6, a processing is chained with a immediately preceding cipher text block Ci as an initial value at a time point when the cipher text C exceeds the size of the register 6.

Figure 20:
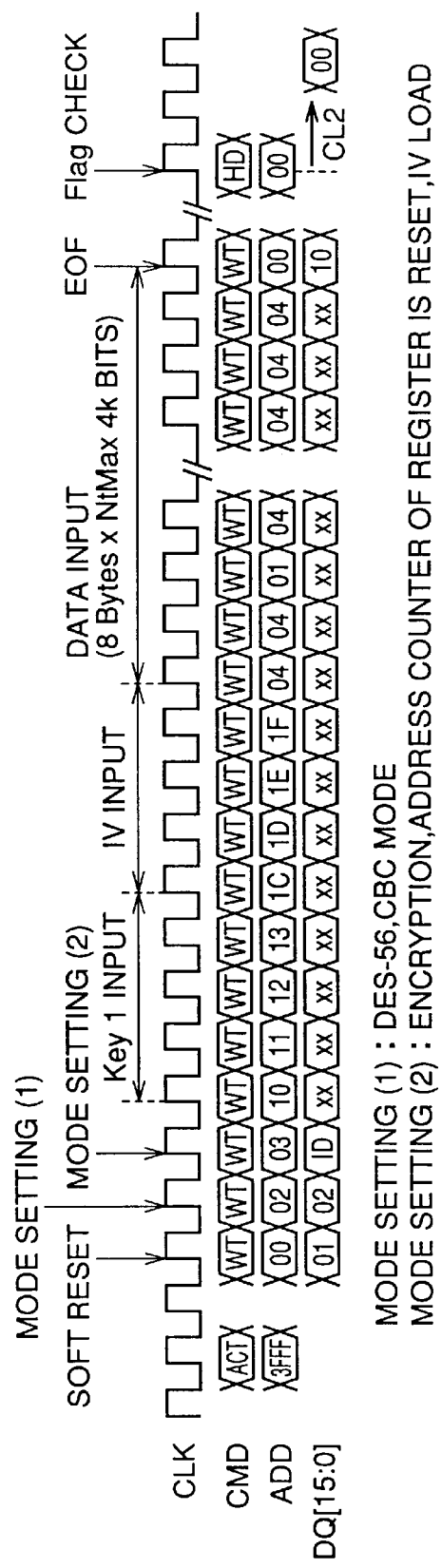
FIG. 20 is a timing chart for describing the processing described in FIG. 8 when various kinds of encryption modes exist.

FIG. 20 is a timing chart for describing the processing described in FIG. 8 when various kinds of encryption modes exist.

A characteristic point in FIG. 20, which is different from an ordinary DRAM in access to the register 6, is that a processing is performed, provided that a bus length is 1, without regard to setting in mode register set of the memory section 4.

In connection with the other points, access to a register can be performed in the same timing and the same sequence as in DRAM.

In the example shown in FIG. 20, a case is shown where an address space for access to the control register 6 is X=h3FFF.

In such a way, after an address to be accessed is specified, soft reset is firstly performed. Subsequently, setting is performed on whether DES-56 or CBC mode is selected, for example, as a secrete key cryptosystem in a first mode setting.

In succession, an operation is performed as a second mode setting, such as setting of an encryption mode, reset of an address counter of a register, or designation on whether or not loading of an initial value is performed or others.

Further in succession, a cryptographic key Key1 is inputted and an initial value IV is inputted.

Still further in succession, a plain text is inputted with 8 bytes as a unit and when data input is finished, an end-of-file signal EOF is inputted. Then the flag is checked to confirm whether or not the logic circuit 8 is during processing.

[Details of Normal Operation]

Figure 21:
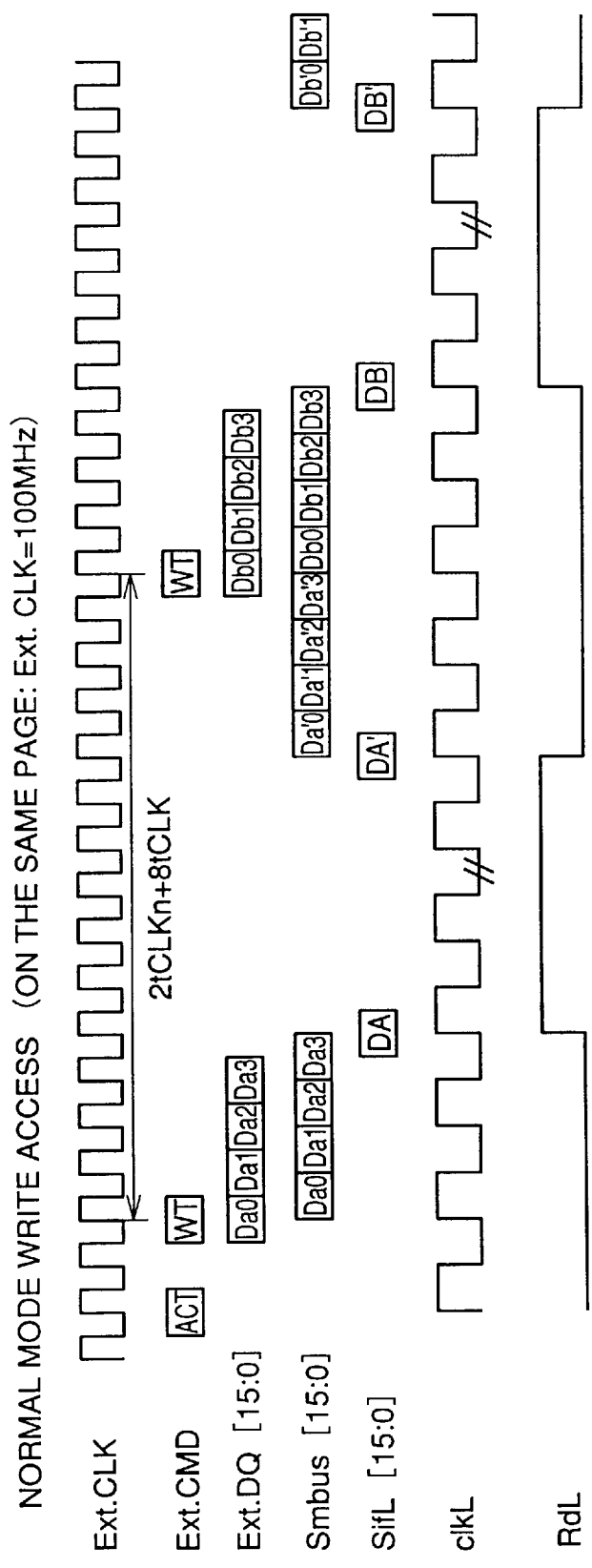
FIG. 21 is a timing chart for describing an operation when data is written on the same page in write access of the normal mode.

FIG. 21 is a timing chart for describing operation when data is written on the same page in write access of the normal mode.

It is assumed that in FIG. 21, an external clock signal Ext. CLK is of, for example, 100 MHz.

Hence, an internal clock clkM for use in operating the memory section 4 is of 100 MHz in synchronism with the external clock signal Ext. CLK.

On the other hand, a clock signal clkL supplied to the logic circuit 8 is generated by frequency dividing the external clock signal Ext. CLK by 2 in the internal clock generating circuit 7.

Therefore, it is assumed that a frequency of the internal clock signal clkL is, for example, 50 MHz.

FIG. 21 represents a case where continuously given write commands WT are issued to addresses on the same page in the normal write.

In FIG. 21, a signal Ext. DQ [15:0] is data of a 16 bit word configuration and given to a data I/O terminal 14 of the memory section 4.

A signal Smbus [15:0] is data on internal memory data bus connecting the memory section 4 and the logic circuit 8 therebetween as shown in FIG. 1.

A signal SifL [15:0] indicates data in the internal interface 9 and the register 6 in order to perform inputting/outputting of data on an internal bus mpus or on the logic circuit 8.

That is, 16 bit datas given from the data I/O terminal 14 by the register 6 and the internal interface 9 are given to the logic circuit 8 after serial-parallel conversion into 64 bit datas, while data after encryption outputted from the logic circuit 8 is parallel-serial converted into datas each of 16 bits and thereafter given to the DRAM 4.

A signal RdL is an signal indicating that the logic circuit 8 has started processing and is in a processing period, wherein in a period when the signal is at H level, it indicates that the logic circuit 8 is in operation.

Referring to FIG. 21, data given externally through the data I/O terminal 14 is required to be written in straight 4 times, which is because encryption is performed with 64 bits as a unit. For example, with a burst length of 4 given, when a write command WT is given to the semiconductor integrated circuit device 1, then data Da0 to Da3 each with 16 bits in continuation are given from the data I/O terminal 14. The datas are given to the internal interface 9 and the register 6 through the internal bus mpus, data of 64 bits in length is stored into the register 6 and thereafter, the data is given to the logic circuit 8 as data DA for encryption.

At the same time as this, the signal RdL goes to H level to start operation of the logic circuit 8.

When data DA' as a result of the encryption in the logic circuit 8 is outputted to the register 6, the signal RdL goes to L level to cease operation of the logic circuit 8.

The data DA' outputted to the register 6 is parallel-serial converted and outputted onto the internal bus mbus from the internal interface 9 as datas Da'0 to Da'3 each of 16 bits to be written into the memory section 4.

A write command WT given thereafter is required to be inputted with an interval of 2tCLK·n+8tCLK or longer after the first write command, wherein n means the number of cycles of the internal clock signal clkL required for encryption of data of 64 bits.

Figure 22:
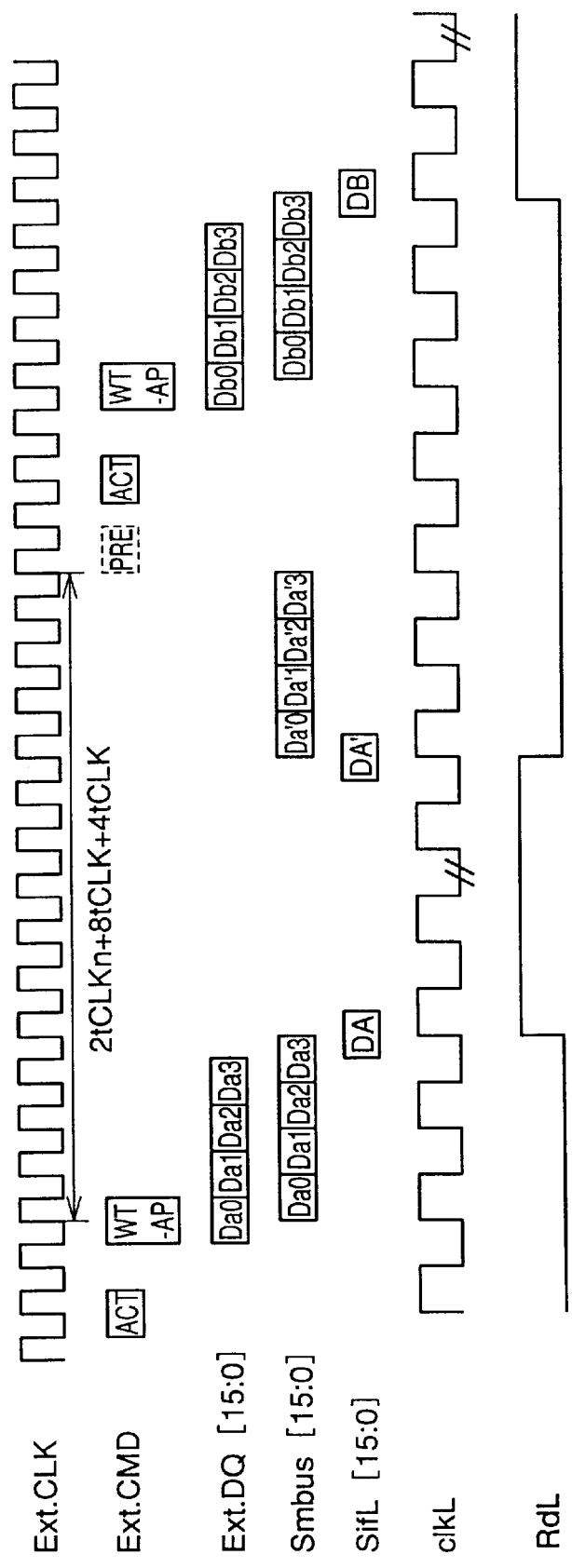
FIG. 22 is a timing chart for describing an operation when 64 bit data is written on a different page in the normal mode.

FIG. 22 is a timing chart for describing operation when 64 bit data is written on a different page in the normal mode.

In this case, a write-with-autoprecharge command is given as a write command, wherein a precharge operation is automatically performed after enciphered data is written to the memory section 4 (DRAM).

After the precharge operation is finished, an act command ACT is again given and thereafter, similar processing is repeated.

Herein, when a simple precharge command is inputted to the semiconductor integrated circuit device 1 instead of the write-with-autoprecharge command, processing as described below is performed.

That is, when a precharge command PRE is inputted before enciphered data is written to the memory section 4, precharge is automatically started after completion of a write operation.

On the other hand, when write has been completed, the precharge operation is to be started anytime soon.

Figure 23:
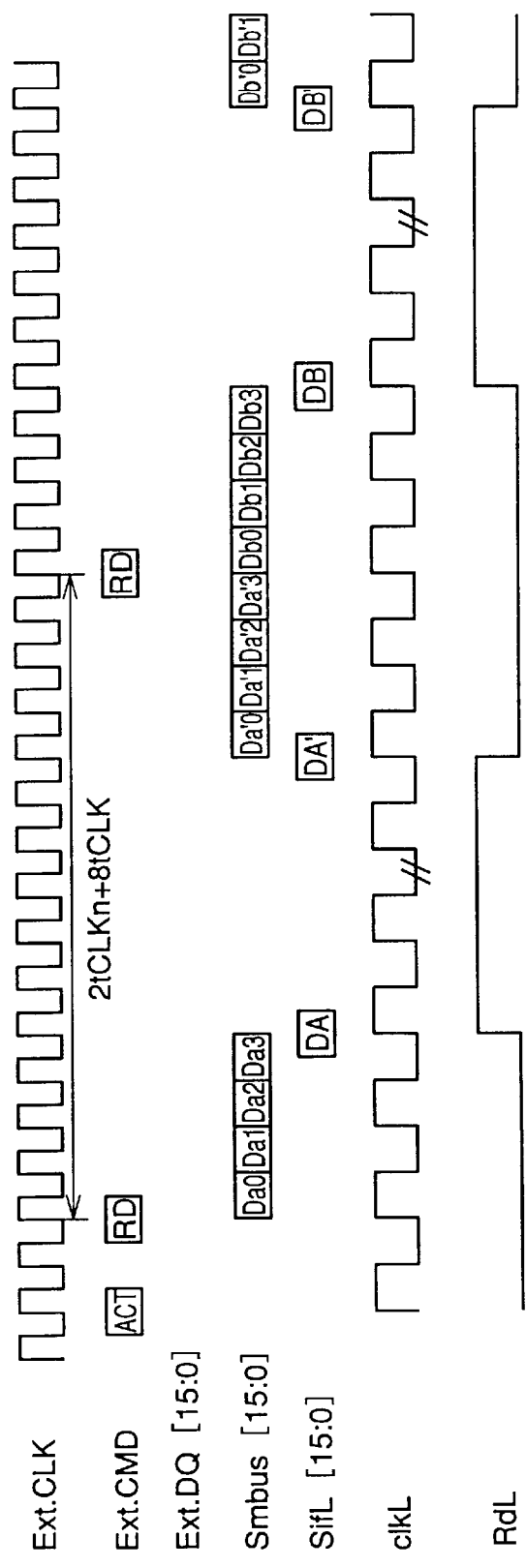
FIG. 23 is a timing chart for describing an operation when read access is performed on the same page in the normal mode.

FIG. 23 is a timing chart for describing an operation when read access is performed on the same page in the normal mode.

In FIG. 23 as well, it is assumed that the external clock signal Ext. CLK is of, for example, 100 MHz.

Hence, it is assumed that the internal clock signal clkM given to the memory section 4 is also of 100 MHz and the clock signal clkL given to the logic circuit 8 is 50 MHz.

Referring to FIG. 23, when a read command RD is given, read data from the memory section 4 is outputted onto the internal data bus mbus as datas Da0 to Da3 each of 16 bits in continuation.

Data DA of 64 bits is serial-parallel converted by the internal interface 9 and the register 6.

The data DA is enciphered in the logic circuit 8. Data DA' after the encryption is outputted onto the internal data bus mbus through the register 6 and the internal interface 9 as datas Da'0 to Da'3 each of 16 bits after parallel-serial conversion. The data Da'0 to Da'3 after the serial-parallel conversion is written to the memory section 4.

A period from the time when a first read command RD is given till the next read command RD is given is equal to 2tCLK·n+8tCLK or longer similar to a write operation; the next read command is required to be inputted at such an interval or longer.

Figure 24:
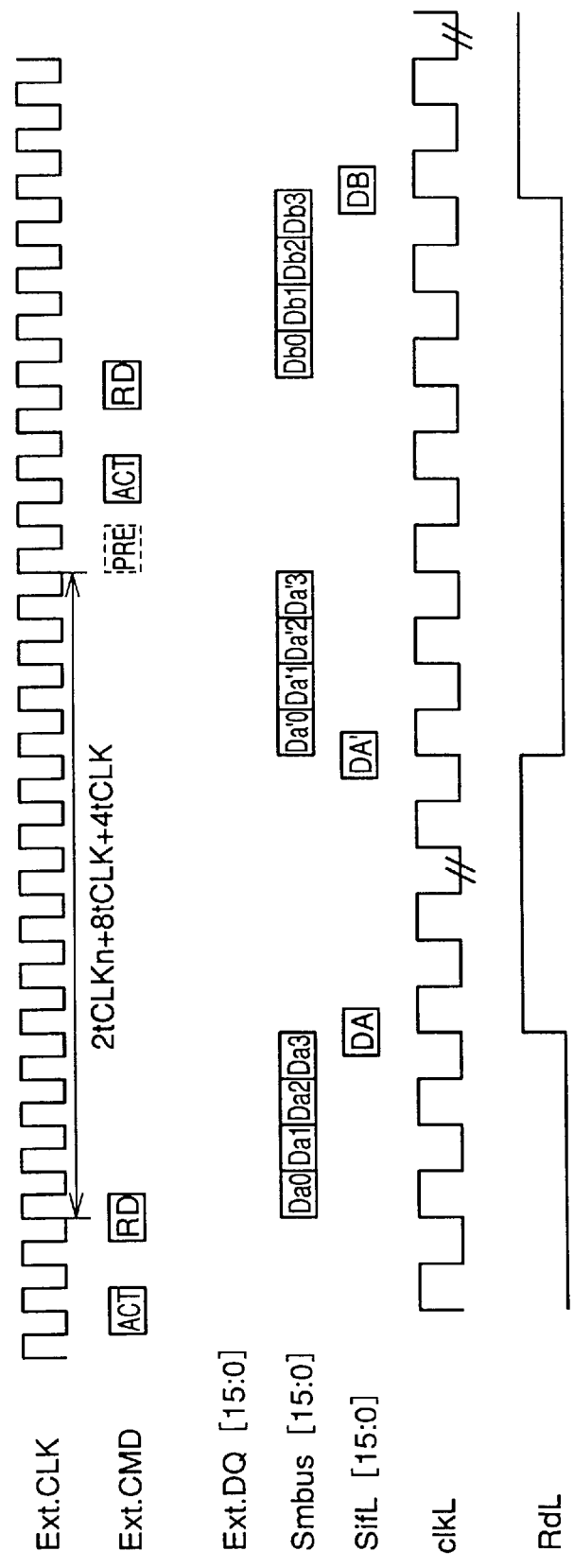
FIG. 24 is a timing chart for describing an operation when read access is performed on a different page.

FIG. 24 is a timing chart for describing an operation when read access is performed on a different page under the same condition as in the FIG. 23.

In this case, processing goes similar to in the case of the write operation shown in FIG. 22 and data having finished with encryption is written to the memory section 4, followed by automatic precharge.

Figure 25:
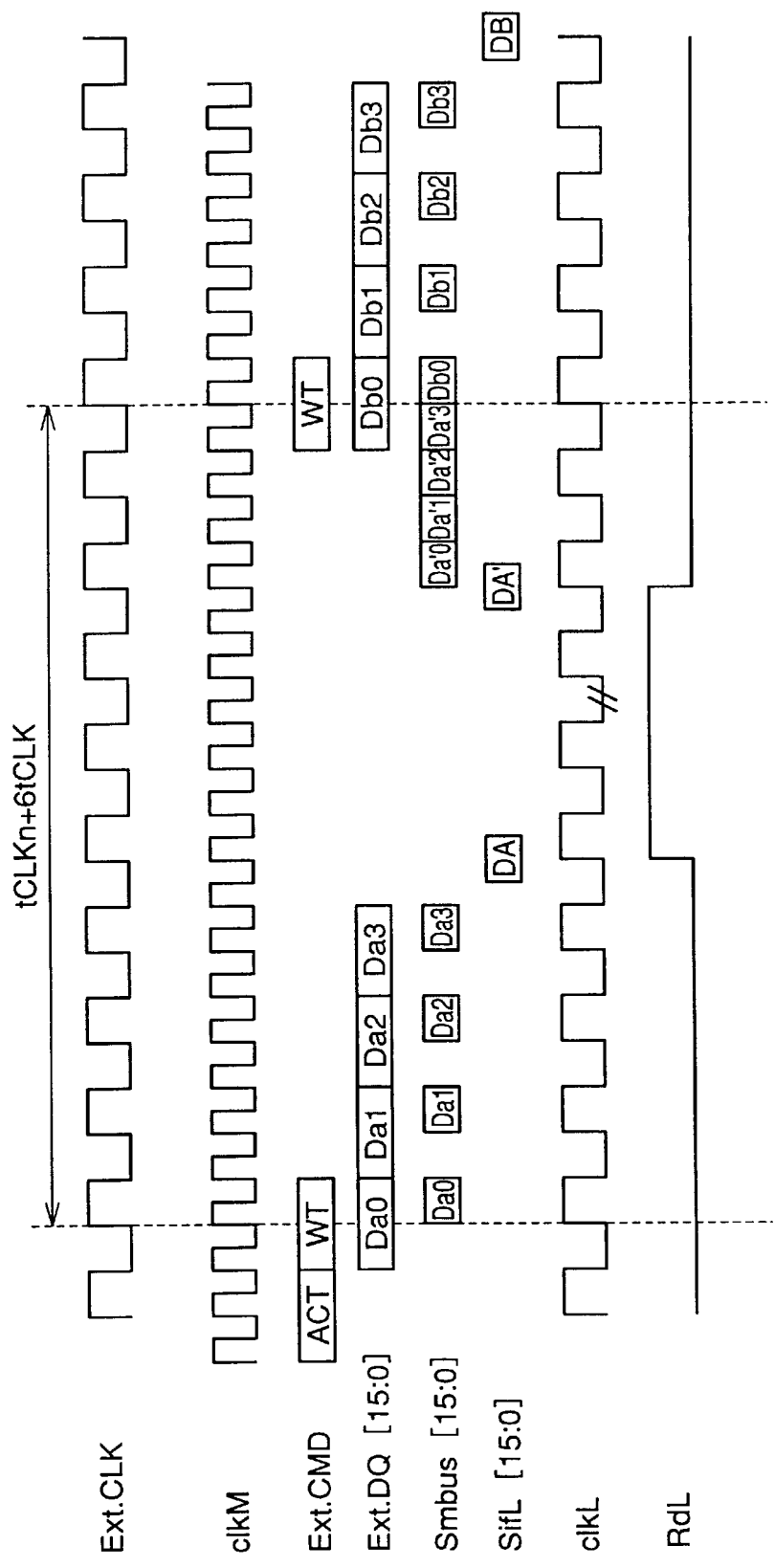
FIG. 25 is a timing chart for describing an operation of the semiconductor integrated circuit device 1 when a external clock signal Ext. CLK is of 50 MHz.

FIG. 25 is a timing chart for describing an operation of the semiconductor integrated circuit device 1 when an external clock signal Ext. CLK is of 50 MHz.

In FIG. 25, shown is a case where write access is performed at addresses on the same page in the normal mode.

In this case, the internal clock signal clkM for use in the memory section 4 generated from the internal clock generating circuit 7 is of a frequency of 100 MHz obtained by multiplying the external clock signal Ext. CLK to convert.

On the other hand, the internal clock signal clkL given to the logic circuit 8 is 50 MHz in synchronism with the external clock signal.

In the operation of FIG. 25, a write command WT and others from the outside are inputted with a frequency of 50 MHz in synchronism with an external clock frequency, while a read operation from the memory section 4 and a write operation to the memory section 4 of an encryption result are processed at 100 MHz in synchronism with the internal clock signal clkM.

In this case, a period of tCLK·n+8tCLK is required to be ensured as a period from issuance of the first write command WT till the time of issuance of the next write command WT.

Figure 26:
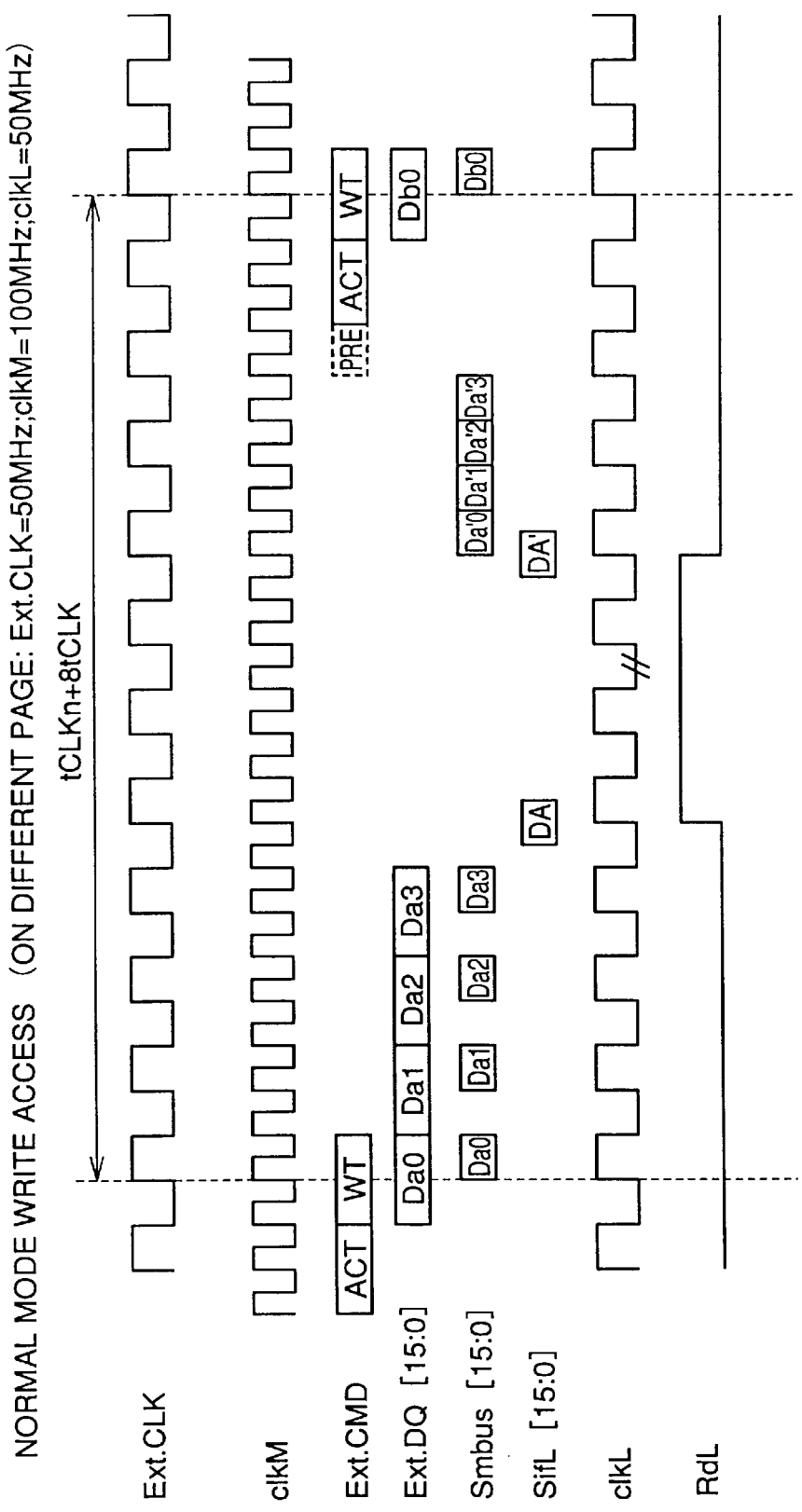
FIG. 26 is a timing chart for describing an operation when write access is performed on a different page in the normal mode.

FIG. 26 is a timing chart for describing an operation when write access is performed on a different page in the normal mode in a case where the external clock signal Ext. CLK is of 50 MHz.

In this case as well, a write-with-autoprecharge command is given as a write command.

Therefore, a precharge operation is performed after data DA' that has been enciphered in the logic circuit 8 is parallel-serial conversion and written into the memory section 4 as datas Da'0 to Da'3 each of 16 bits.

A period from the time when a first time write command WT is given till the next write command WT is given is required to be equal to or longer than a period of tCLK·n+8tCLK.

FIG. 27 is a timing chart for describing an operation when read access is performed on the same page in the normal mode under the same conditions in the external clock signal Ext. CLK, and the internal clock signals clkM and clkL as for FIGS. 25 and 26.

Furthermore, FIG. 28 is a timing chart for describing an operation when read access is performed on a different page in the normal mode under the same conditions as for FIG. 27.

In FIGS. 27 and 28 as well, except that commands and others are given in synchronism with the external clock signal Ext. CLK, operations basically similar to those described in FIGS. 23 and 24 are performed.

However, in FIG. 27, a period from the time when a first time read command RD is given till the next time read command RD is given is required to be equal to or longer than tCLK·n+4tCLK and in FIG. 28, the period is required to be equal to or longer than tCLK·n+6tCLK.

FIG. 29 is a timing chart for describing an operation when the external clock signal Ext. CLK is of 25 MHz and a frequency multiplication operation is performed in the internal clock generating circuit 7 with the result that the internal clock signal clkM given to the memory section 4 is converted to 100 MHz and the internal clock signal clkL given to the logic circuit 8 is converted to 50 MHz.

External commands are issued in synchronism with the external clock signal Ext. CLK and internal operations are also performed in synchronism with the external clock signal Ext. CLK.

In FIG. 29, shown is an operation in a case where write access is performed on the same pages in the normal mode.

In this case, a period from the time when a first time write command WT is given till the next write command is given is required to be equal to or longer than tCLK·n/2+4tCLK.

FIG. 30 is a timing chart for describing an operation when read access is performed on the same page in the normal mode under conditions that the same clock signal as in FIG. 29 is used.

On the other hand, FIG. 31 is a timing chart for describing an operation when read access is performed on a different page in the normal mode under conditions that the same clock signal as in FIG. 30 is used.

While in the case of FIG. 30, a period from issuance of a first time read command RD till issuance of the next read command RD is required to be equal to or longer than tCLK·n/2+2tCLK, in the case of FIG. 31 the period is required to be equal to or longer than tCLK·n/2+3.5tCLK.

In the normal mode operation described above in a case of access to the same page, when encryption is finished (including a write operation of an encryption result to the memory section 4) in both of read and write operations, it is required that a stop command is inputted after inputting a precharge command. When a stop command is inputted after confirmation of encryption having been completed and in addition no interrupt of refresh occurs during encryption, then no confirmation of a flag FL is required in the processing described in FIG. 8.

When a stop command is inputted in a state of page open, precharge is automatically performed after completion of the encryption (including a write operation of an encryption result to the memory section 4), wherein confirmation of a flag is required.

In any of the cases, completion of encryption is notified to the outside by setting "0" to the flag when the encryption is completed.

When an interrupt is instructed and a refresh command is given during encryption or during write of an encryption result to the memory section 4, then commands are accepted and the number of accepted refresh commands is counted. That is, a separate counter is provided. Then, after an operation of encryption are completed, or after a write operation of the encryption result to the memory section 4 is completed, refresh commands are given to the memory section 4 in times equal to the number of counts at intervals of a proper cycle period.

In this case, the refresh operations have only to be performed till a refresh counter in the memory section 4 comes to indicate 0 in count value while decrementing the counter.

In general, refresh of a CBR command is performed when an autorefrsh command is given or the memory section 4 is a DRAM in the EDO mode. Therefore, an address where refresh is performed is an address generated from the separate refresh address counter. After the refresh operations are completed, the flag FL described in FIG. 8 is altered from "1" to "0" considering the completion of refresh operations as completion of the encryption.

Note that not only in the block mode but also in the buffer mode, operations are basically similar to in the case of the normal mode as described above.

What is different is in that continuous data inputs are automatically generated in the semiconductor integrated device 1 with a start address as a reference.

Furthermore, in the buffer mode of a case where the memory section 4 includes a plurality of banks, a buffer ID assigned to a bank different from a bank on which read is performed is selected and an encryption result is written in the ID assigned buffer area.

Input of a start address means, for example, to specify a row address when an ACT command is inputted as in access to an ordinary SDRAM and then specify a column address by inputting it when dummy read or dummy write is performed.

Even if a burst length is 1 or longer, input of a start command is to an address to which input is performed on a first dummy column access.

In the block mode and buffer mode, after an encryption result is completely stored into the memory section 4 and thus the encryption is completed, a bank that has been active is automatically precharged.

In the case, a precharge command and an autoprecharge command that are inputted during the encryption are neglected.

Furthermore, in the block mode and buffer mode, once a start address is given, a column access operation is neglected even if the command is externally given thereafter.

Moreover, in the block mode and buffer mode, encryption is automatically performed over a block length from the start address. At this time, operations of not only increment of a block length but also decrement of a block length can be possible by data setting on the register 6.

Besides, in the block mode and buffer mode, data write such as not only in a sequential mode but also in an interleave mode as in SDRAM can be possible.

[Example 2]

Figure 32:
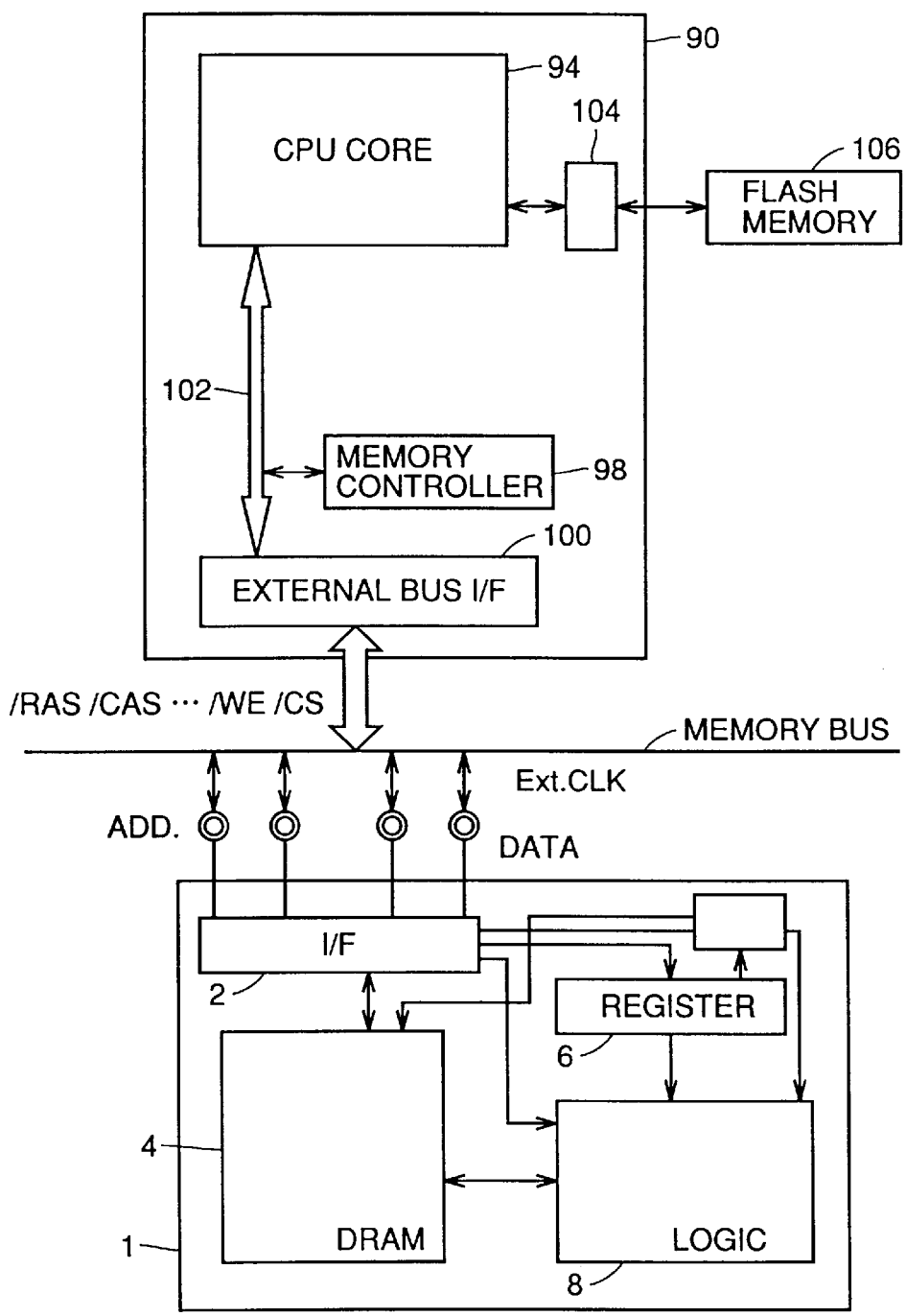
FIG. 32 is a conceptual block diagram representing a way how the semiconductor integrated circuit device 1 of the present invention and a microprocessor 90 are connected.

FIG. 32 is a conceptual block diagram representing a way how the semiconductor integrated circuit device 1 of the present invention and a microprocessor 90 are connected.

The microcomputer 90 includes: a CPU core 94, a memory controller 98; and an external bus interface circuit 100, wherein the constituents are connected to each other by an internal bus 102. The CPU core 94 is connected to a flash memory 106 in which data to be enciphered or deciphered is stored through a serial interface 104.

The external interface circuit 100 outputs a control signal, an address signal and data to the semiconductor integrated circuit device 1 according to instructions from the CPU core 94.

FIG. 32 shows a system suitable for a normal mode operation.

That is, such a configuration is suitable for a system in which in the normal mode, the data to be enciphered or deciphered is given to the microcomputer 90 from an external device other than the memory section 4 of the semiconductor integrated circuit device 1, for example the flash memory 106.

When data is temporarily stored in the memory section 4 transmitted through the microcomputer 90, the data is held in the memory section 4 after being automatically converted to a cryptographic processing result. Hence the number of accesses to the memory section 4 required for cryptographic processing can be reduced.

Figure 33:
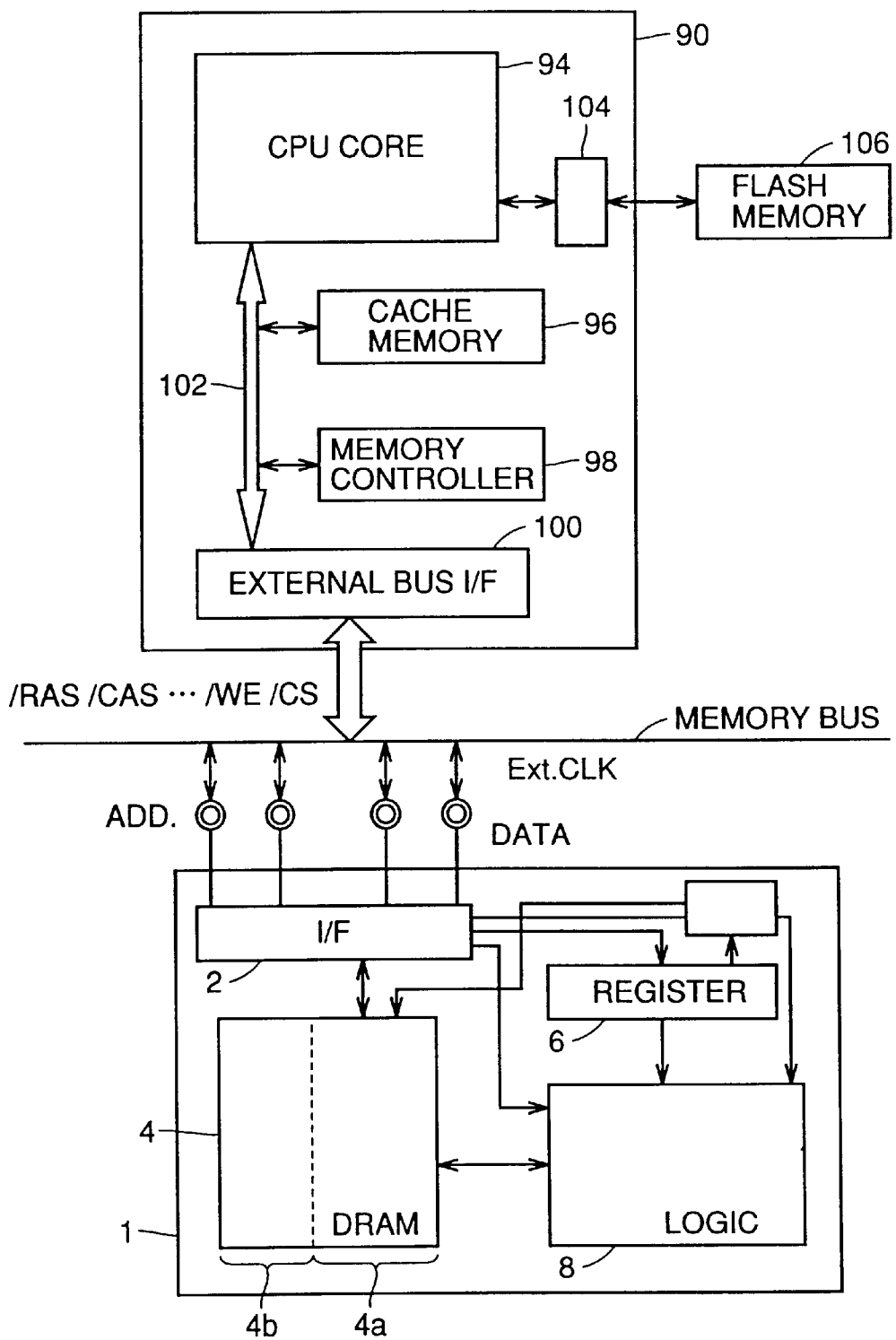
FIG. 33 is a conceptual block diagram representing another way how the semiconductor integrated circuit device 1 of the present invention and a microprocessor 90 are connected.

FIG. 33 is a conceptual block diagram representing another way how the semiconductor integrated circuit device 1 of the present invention and the microprocessor 90 are connected.

The microcomputer 90 includes: a CPU core 94; a cache memory 96; a memory controller 98; and an external bus interface circuit 100, wherein the constituents are connected to each other by an internal bus 102. The external bus interface circuit 100 outputs a control signal, an address signal and data to the semiconductor integrated circuit device 1 according to an instruction from the CPU core 94. Therefore, the external bus interface circuit 100 and a logic integrated DRAM 92 are connected to each other through a control signal bus transmitting control signals such as signals /RAS, /CAS, . . . , /CS, through an address bus transmitting an address ADD and through a data bus transmitting data DATA.

In order to control the semiconductor integrated circuit device 1 in such a system, there is something to be considered about softwear run on the microcomputer 90.

Figure 34:
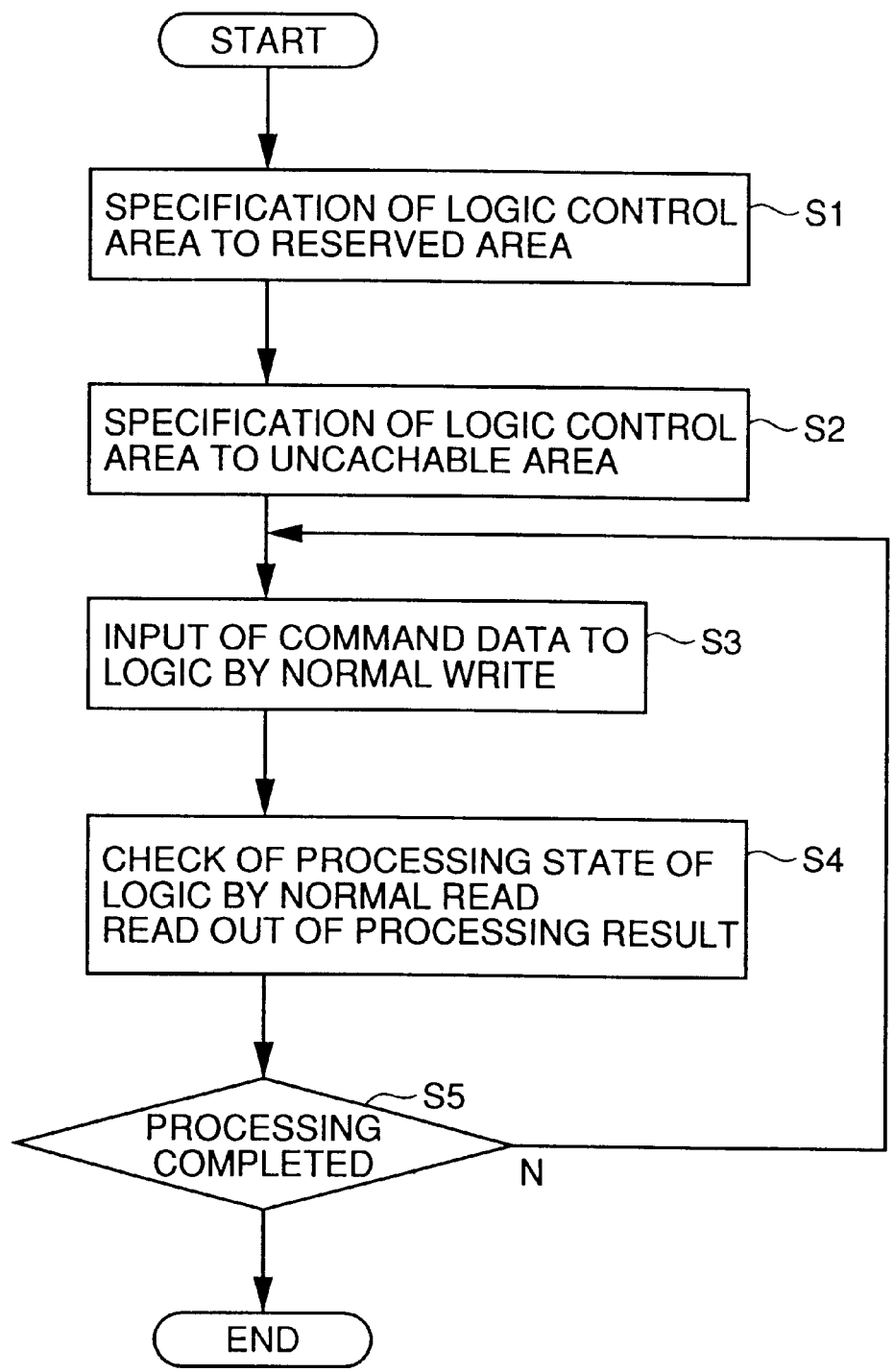
FIG. 34 is a flow chart for describing control of the semiconductor integrated circuit device 1.

FIG. 34 is a flow chart for describing control of the semiconductor integrated circuit device 1.

Deferring to FIG. 34, first of all, in step S1 an address of a logic control area is specified in a reserved area. That is, thereby, a program is not assigned on an address space for command control of a logic circuit. As a method to prohibit the area from the assignment, one is exemplified, where a logic control area is protected as a reserved area using a function of an OS (operation system).

A special attention is required to be paid even to a start-up time point of the OS such that a kernel itself, which is the heart of an OS, performing basic control for the system such as memory management, interrupt management and inter-process communications is not assigned in the logic control area. Accordingly, a reserved area is specified on the OS side with a special attention such that the kernel itself is not assigned on a logic control area.

Then, in step S2, at least a logic control area and an area where data to be enciphered or deciphered is stored are specified as an uncachable area 4a in a system with data cache as shown in FIG. 33.

That is, even in a case where data corresponding to a command is sent from the CPU core 94 in FIG. 33 through the internal bus 102 to the semiconductor integrated circuit device 1 specifying a prescribed address space, the data corresponding to the command is written into a cache memory 96 and not transmitted to the semiconductor integrated circuit device 1 if the cache memory 96 operates. In that case, the logic circuit 8 integrated in the semiconductor integrated circuit device 1 cannot operate according to the command. Accordingly, it is necessary to set such that the logic control area is not cached. This applies to an area where data to be enciphered is stored, in a similar way. In the majority of microcomputers, control is possible that part of an address space is specified to an uncachable area.

Furthermore, in a case where a memory management unit function is available, it is set such that a virtual address space is not used in the logic control region.

In such a fashion, in a system such as in which a cache memory is available, initialization of the system is performed such that at least a logic control area in the semiconductor integrated circuit device 1 is accessed without fail without using the cache memory.

Then, in step S3, a command for logic control is inputted by normal write to an assigned area and in step S4, there can be performed check on processing state in a logic and read of a processing result by normal read. Furthermore, if in step S5, the processing is not completed yet, the processing of steps S3 and S4 is repeated. To be concrete, by checking a flag written in a bit D1 of an address Y=0h, a processing state can be judged. After checking the flag FL to confirm completion of the processing, the microcomputer can start the next operation such as to access an operation result.

Therefore, while completion of a processing is transmitted through a dedicated pin to a receiver side in a prior art practice, it becomes possible according to the present invention that a flag state is checked by performing an ordinary normal read on SDRAM.

Figure 35:
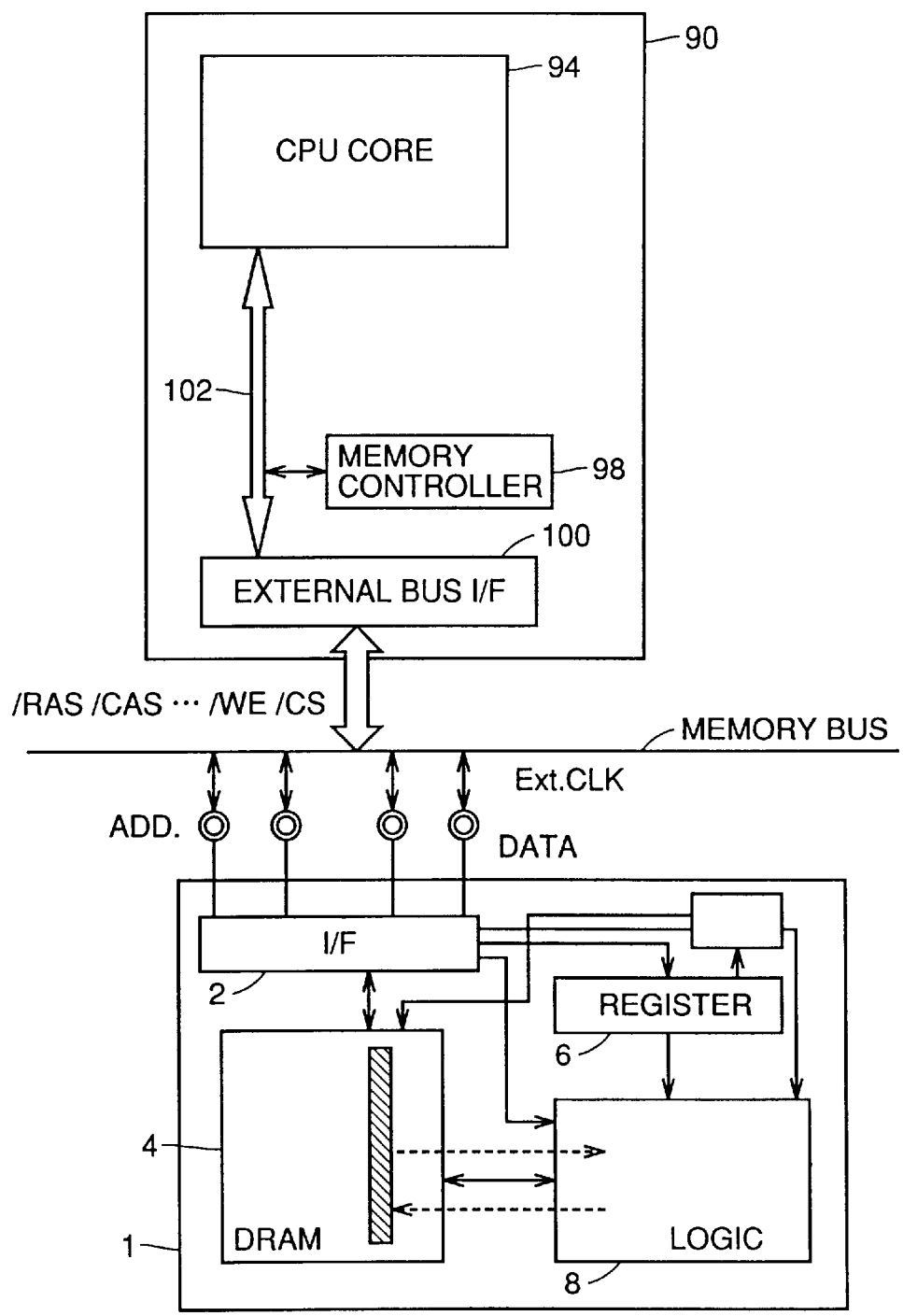
FIG. 35 is a conceptual block diagram representing an example of a system suitable for application of a block mode of the semiconductor integrated circuit device 1.

FIG. 35 is a conceptual block diagram representing an example of a system suitable for application of a block mode of the semiconductor integrated circuit device 1.

That is, the block mode is suitable for a system such as in which data to be enciphered or deciphered is stored in the memory section 4 (main memory) of the semiconductor integrated circuit device in advance. Since cryptographic processing can be performed without outputting data in a main memory onto an external bus, it becomes possible to achieve a high speed operation and low power consumption in a compatible manner.

Figure 36:
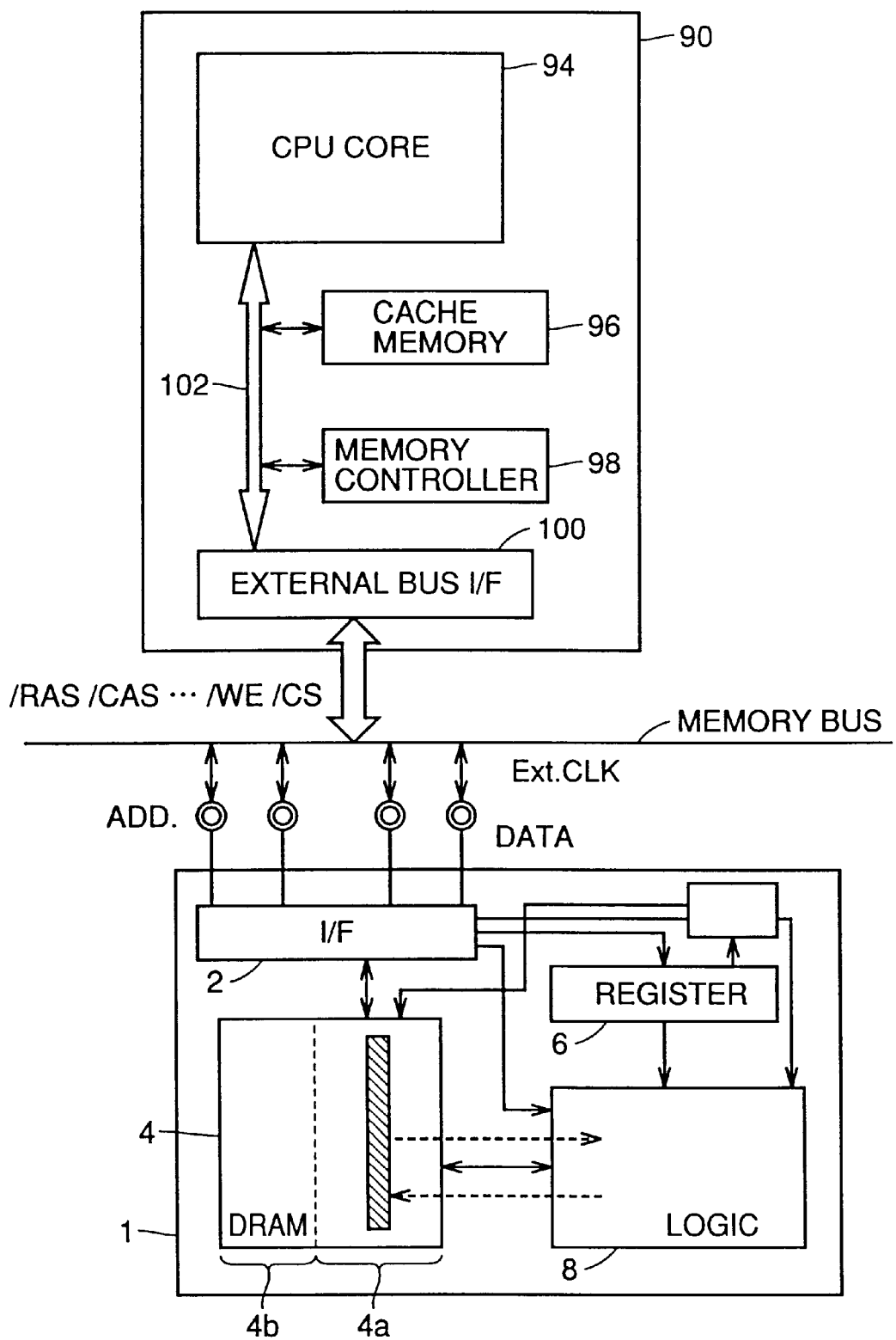
FIG. 36 is a conceptual block diagram representing a configuration when the semiconductor integrated circuit device 1 operating in the block mode is applied to a system in which a cache memory 96 exist.

FIG. 36 is a conceptual block diagram representing a configuration when the semiconductor integrated circuit device 1 operating in the block mode is applied to a system in which a cache memory 96 exist.

In this case, a cryptographic processing area is specified as at least uncachable area 4a.

When a virtual memory address space is used, all of a data block to be enciphered or deciphered is housed within the same page.

However, in a microcomputer having a function of flushing only a line including a specific address, no necessity arises that a specific area is designated as an uncachable area.

Then, description will be given of a system where write back is performed with data cache equipped.

In a case where data desired to be enciphered or deciphered exists in a cache prior to entry to a cryptographic mode, the cache is cleared and flushed. That is, write back is performed to disable a tag. Then, the system enters the cryptographic mode and a start address is inputted. Since a cache line including the start address is allocated in the data cache, immediate flushing is required.

The term "flush" herein means only to invalidate a tag without write back.

Figure 37:
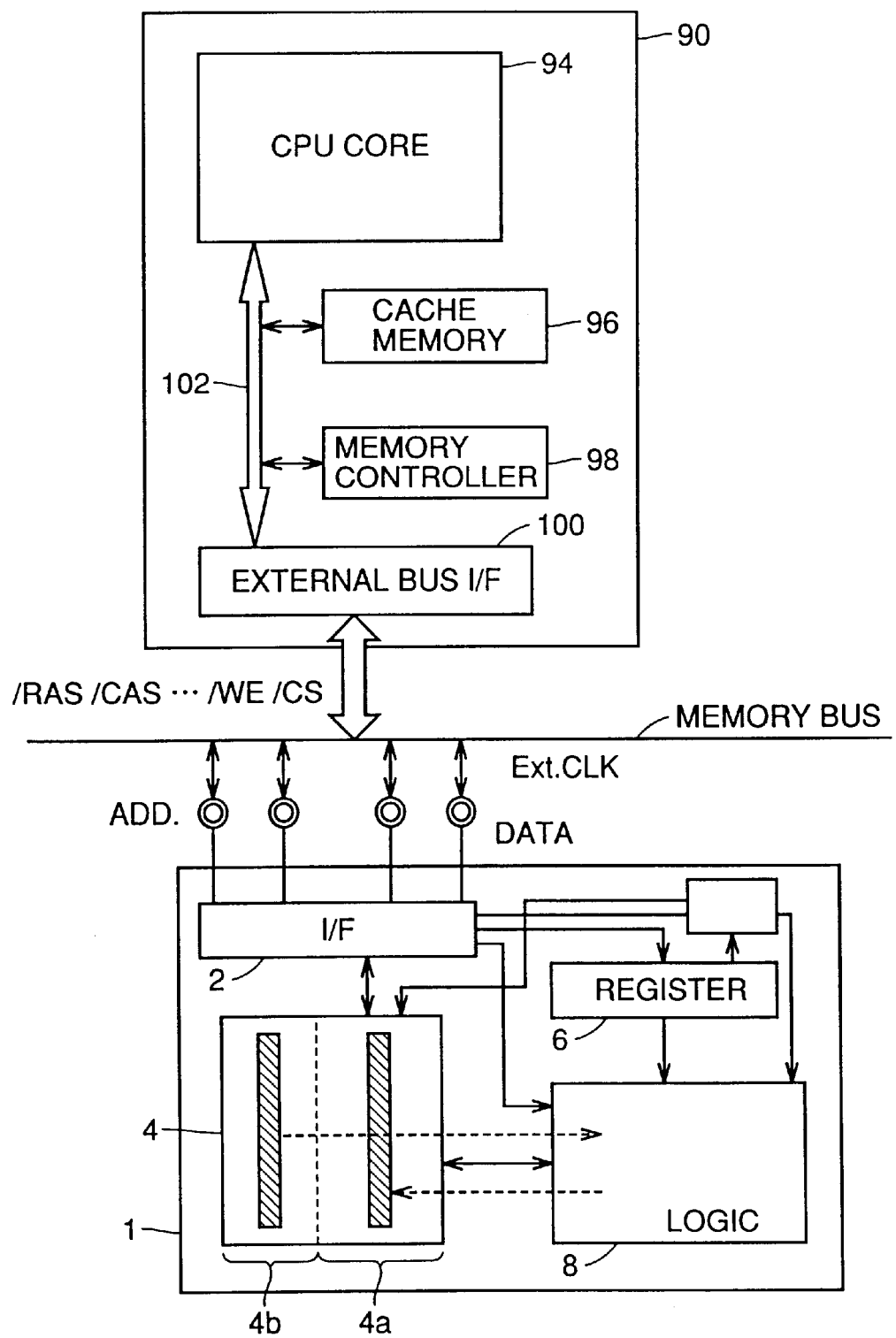
FIG. 37 is a schematic block diagram showing a configuration of a system suitable when a buffer mode of the semiconductor integrated circuit device 1 is adopted.

FIG. 37 is a schematic block diagram showing a configuration of a system suitable when a buffer mode of the semiconductor integrated circuit device 1 is adopted.

In the buffer mode, a buffer area is required to exist in the uncachable area 4a.

On the other hand, data itself prior to cryptographic processing may be stored in the uncachable area 4b.

When a virtual memory address space is used, all of a data block to be enciphered or deciphered is required to be housed within the same page.

When a semiconductor integrated circuit 1 relating to the present invention is used as described above, the semiconductor integrated circuit 1 can be properly applied to various systems to enable high speed cryptographic processing with low power consumption.

Furthermore, description will be given of a case of a write back system with a data cache in the buffer mode.

If data to be enciphered or deciphered exists in a cache prior to the cryptographic mode, the data is cleared and flushed. That is, write back is performed to disable a tag. Then, a cryptographic processing result is stored into a buffer area set in the uncachable area 4a. While in the buffer mode, a storage destination of a processing result is specified by a buffer ID, in this case a method can be adopted in which a storage destination of the uncachable area 4a is specified with an address.

[Third Example]

Figure 38:
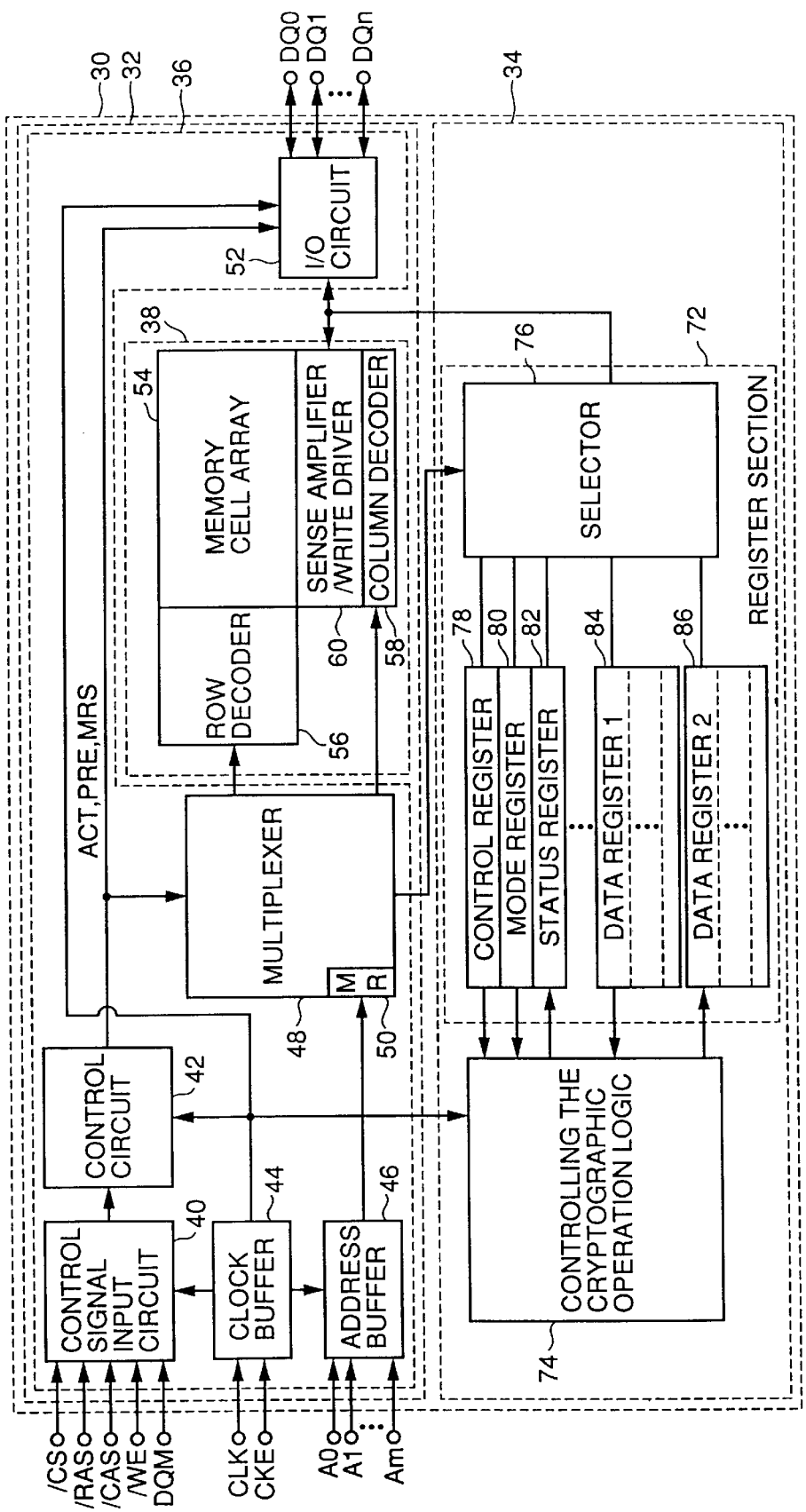
FIG. 38 a block diagram representing a configuration of a logic integrated DRAM 30 of a third example, obtained by modifying the configuration of the semiconductor integrated circuit device 1 of the first example.

FIG. 38 a block diagram representing a configuration of a logic integrated DRAM 30 of a third example, obtained by modifying the configuration of the semiconductor integrated circuit device 1 of the first example.

Referring to FIG. 38, a logic integrated DRAM 30 includes: a SDRAM section 32; and a logic section 34.

The SDRAM section 32 includes: an interface section 36 receiving an external signal to output a control signal according to the external signal; and a DRAM core 38 performing data holding according to an output from the interface section 36. The interface section 36 includes: a control signal input circuit 40 receiving control signals /CS, /RAS, /CAS, /WE and DQM; a clock buffer 44 receiving a clock signal CLK and a clock enable signal CKE to generate an internal clock; an address buffer 46 catching an address signal A0 to An in synchronism with an output of the clock buffer 44; and an I/O circuit 52 performing input/output of data signals DQ0 to DQn in synchronism with the internal clock. Note that the clock buffer 44 may be of a configuration including an internal clock generating circuit 7 similar to the first example.

The interface section 36 further includes: a control circuit 42 outputting command signals ACT and PRE and others in response to outputs of the control signal input circuit 40; and a multiplexer 48 multiplexing an output of the address buffer 46 as an S address and a Y address according to an output of the control circuit 42.

The multiplexer 48 includes: a mode register 50 capable of setting a mode according to a signal bit of the address signal A0 to Am in response to a mode register set MRS command.

The DRAM core 38 includes: a memory cell array 54 with memory cells arranged in a matrix of rows and columns; a row decoder 56 performing row select on the memory cell array 54 according to a row address given from the multiplexer 48; a column decoder 58 performing column select on the memory cell array 54 according to a column address given from the multiplexer 48; and an sense amplifier driver/write driver 60 reading out data from a selected memory cell and writing data to a selected memory cell.

The logic section 34 includes: a cryptographic operation logic 74; and a register section 72 holding mode information for controlling the cryptographic operation logic 74, data inputted to the cryptographic operation logic 74 and an operation result of the cryptographic operation logic 74 in response to an output of the interface section 36.

The resister section 72 includes: a selector 76, being activated when an area specified by an address signal A0 to Am is a prescribed value to catch a data signal inputted externally through an I/O circuit 52; a control register 78 writing data given from the outside through the selector 76; a mode register 80; a data register 84; and a status register 82 and a data register 86 holding data outputted from the cryptographic operation logic to read out the held data to the outside as data signals DQ0 to DQn through the selector 76 and the I/O circuit 52.

Figure 39:
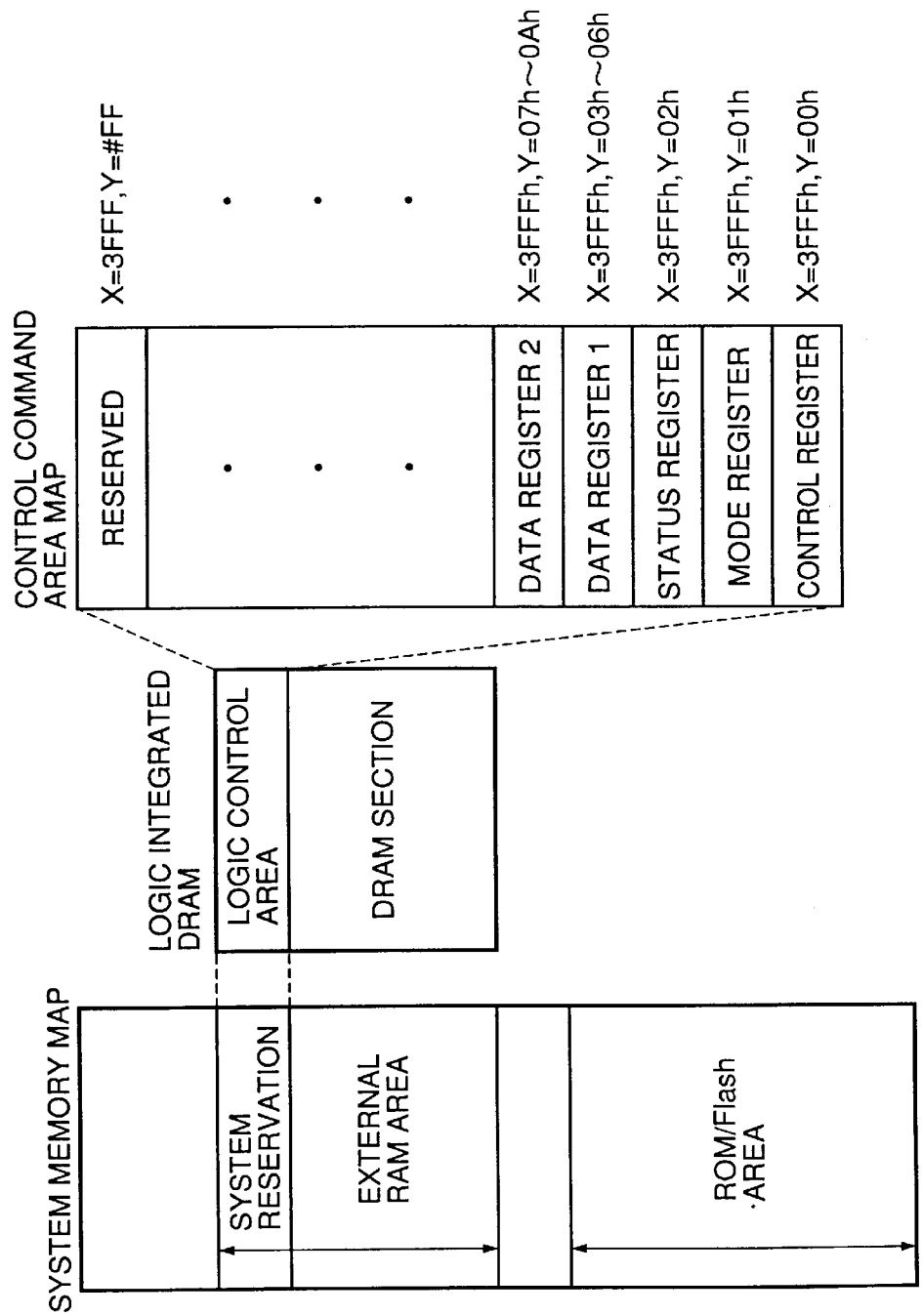
FIG. 39 is a drawing representing a memory map of a system applied to the logic integrated DRAM 30 of the third example.

FIG. 39 is a drawing representing a memory map of a system applied to the logic integrated DRAM 30 of the third example.

Referring to FIG. 39, an external RAM area in a system memory map corresponds to a logic integrated DRAM. The logic integrated DRAM is divided into a logic control area and a DRAM area, and a cryptographic operation logic incorporated is controlled by access to the logic control area. An area on the system memory map corresponding to the logic control area is used as a system reserved area, and when a cache of a CPU and MMU (memory management unit) are used, used as an uncachable area. Furthermore, control in advance is performed by firmwear of the system such that an operating system is not loaded in this area. Moreover, an application program is also prohibited from using this area.

The logic control area is assigned, for example, in an area of an row address, X=3FFFh and a column address Y=0h to FFh.

The control register 78 of FIG. 38 is assigned, for example, at an address of X=3FFFh and Y=00h. The mode register 80 is assigned at an address of X=3FFFh and Y=01h. The status register 82 is assigned at an address of X=3FFFh and Y=02h. The first data register 84 is assigned at an address of X=3FFFh and Y=03h and the second data register 86 is assigned at an address of X=3FFFh and Y=04h.

The cryptographic operation logic 74 of FIG. 38 includes an accelerator of a major cryptosystem used for establishment of security on a net work. The cryptographic operation logic 74 supports functions of a public key cryptosystem used in electronic authentication and a secrete key cryptosystem used in data transmission/reception after the authentication. Since processing is performed in a cryptographic operation dedicated logic circuit, the processing can be performed with lower power consumption and higher speed than by a general purpose CPU, thus being suitable for a battery drive system, for example.

Then, description will be given of what assignments are made to respective registers of the logic control area shown in FIG. 39.

The control register 78 is assigned with 16 bits, D0 to D15 of Y address 0h. By writing in a bit D0 with 1, a cryptographic function is reset. That is, a processing is performed in which a reset pulse of a prescribed time is given to the cryptographic operation logic 74. When a bit D1 is 1, it indicates that the cryptographic operation logic 74 is in process of encryption or decryption. Therefore, when the cryptographic operation logic is externally accessed, access has to be performed after a flag indicated in the bit D1 is confirmed 0.

The control register 78 is used commonly in a public key cryptosystem and a secrete key cryptosystem.

Next, description will be given of some examples of a register used in control of a secrete key cryptosystem.

The mode register 80 is assigned at an address of Y=1h, wherein bits D1 and D0 of 16 bits thereof are used in selection of a cryptosystem. If the two bits are "01," then a cryptosystem is DES and if the two bits are "10," then a cryptosystem is Triple DES. If the two bits are "00," then a cryptosystem is in a hold state.

Bits D5 to D2 are used in selection of the block encryption mode. If the bits are "0001," then ECB is specified as the block encryption mode. If being "0010," then CBC is specified as the block encryption mode. If being "0100," then OFB is specified as the block encryption mode. If being "1000," then CFB64 is specified as the block encryption mode. If being "0000," then the block encryption mode is in a hold state.

Bits D8 to D6 are used in selection of a data processing mode. If the bits are "001," then the normal mode is specified, if the bits are "010," then the block mode is specified and if the bits are "100," then the buffer mode is specified, while If the bits are "000," then the data processing mode is in the hold state.

In such a fashion, since 16 bits of one address two byte data at Y=1h can be assigned to respective plural modes, an operating mode, even when a plurality of modes exist, can be specified with one time access if $2^{16}$ combinations are effectively used.

The status register 82 is assigned at an address of Y=02h. When two bits D1 and D0 of the status register are "01," then it indicates encryption, when being "100," then it indicates decryption, while when being "00," then it indicates processing in the hold state. When bit D5 and D4 are "01," then it indicates an input start of a plain text or a cipher text, when being "10," then it indicates input stop, while when being "00," it indicates processing in the hold state.

Bits D9 to D6 indicate a text length in one block of each of OFB and CFB. An address of Y=3h to 6h is an area where a DES key of 64 bits and others are stored. An area with an address of Y=7h to Ah is an area where a key used in Triple-DES is stored.

The first data register 84 is, as described above, a register for inputting data to be enciphered or deciphered to the logic circuit 74.

The second data register 86 is, as described above, a register for reading out enciphered or deciphered data from the logic circuit 74.

While the first and second data registers 84 and 86 each are seen as one register from the outside, each is actually constructed of a plurality of registers and is a kind of a first-in first-out (FIFO) memory.

Figure 40:
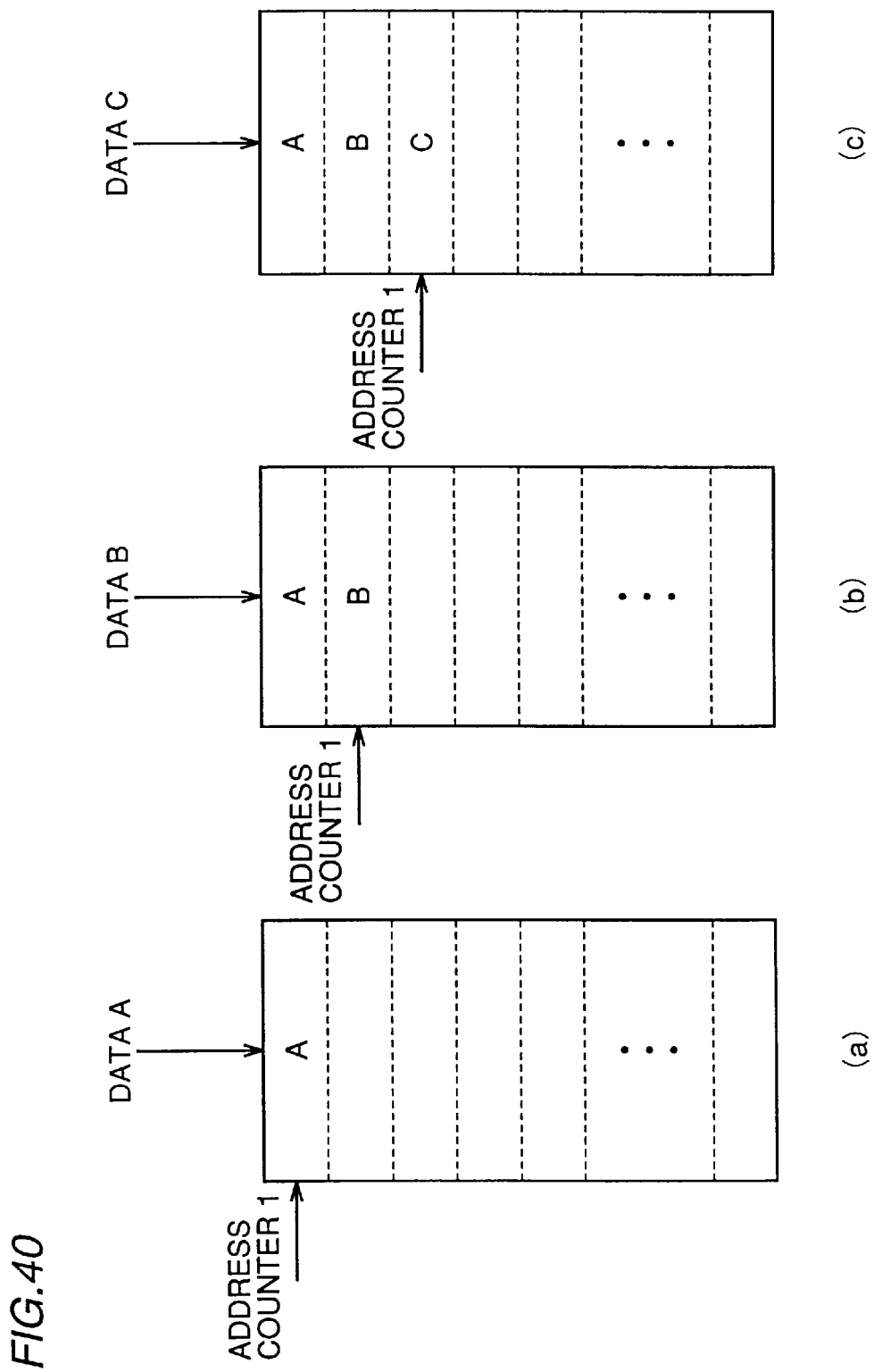
FIG. 40 is drawings representing data write on a first data register 84.

FIG. 40 is drawings representing data write on the first data register 84. Datas are sequentially written to parts (a) to (c) of FIG. 40 in the order. Though not shown in FIG. 38, a counter for operating the data register 84 as FIFO is provided and the counter counts an address of the resister.

Figure 41:
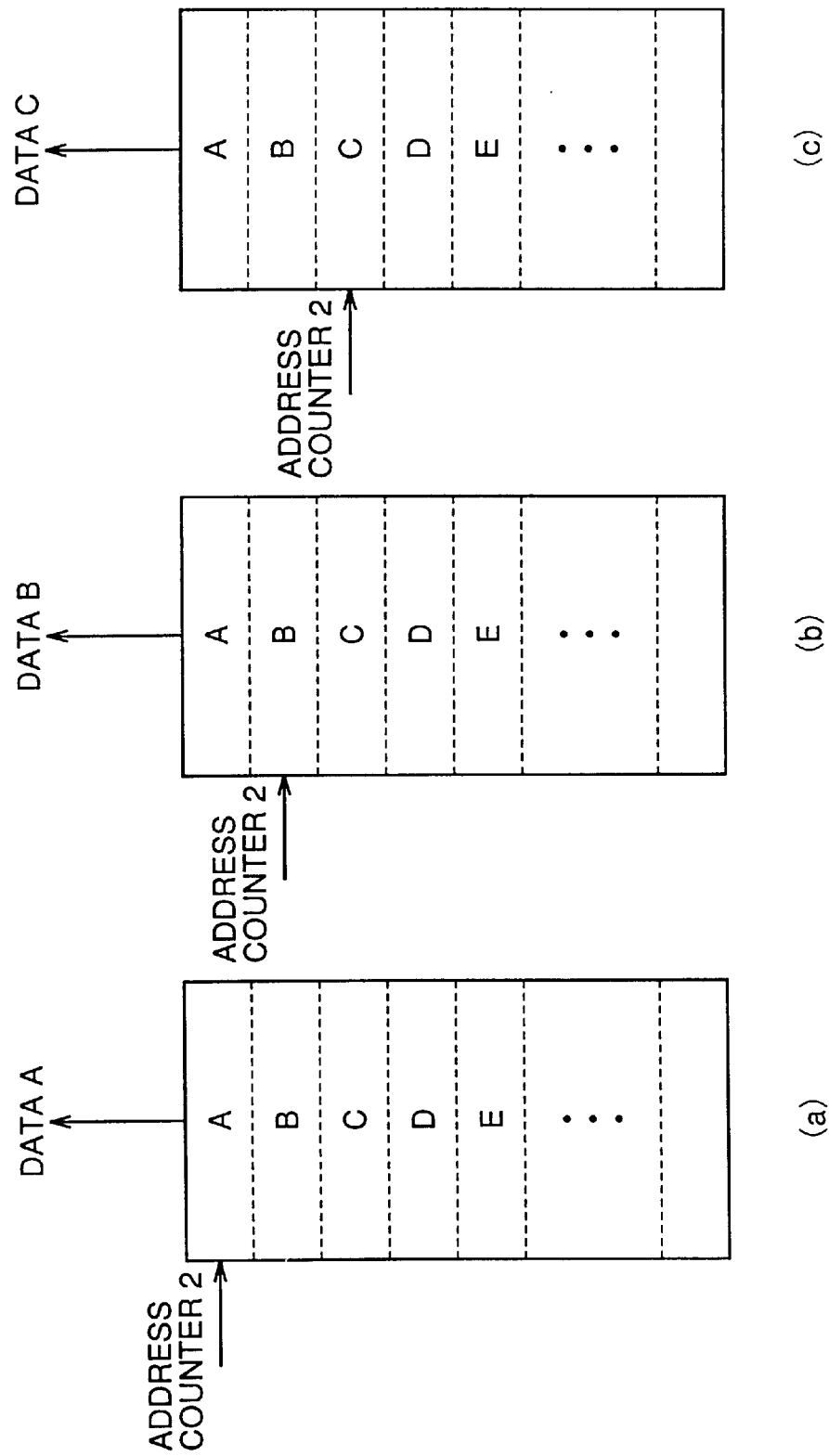
FIG. 41 is drawings representing data read from the first data register 84.

FIG. 41 is drawings representing data read from the first data register 84. Datas are sequentially read out from parts (a) to (c) of FIG. 41 in the order.

The second data register 86 also performs a FIFO operation similar to that of the first data register 84.

In addition, there exist some other registers though not shown in FIG. 38: a register setting an initial vector for encryption, a register specifying a block length, a register specifying the number of buffers and a register such as indicating a buffer ID.

Note that in order to perform a public key cryptosystem, for example a RSA cryptographic processing, an area at an address of Y=12h to 1Fh is used as a reserved area. As will be described later, in a case where a public key cryptosystem is applied, a cryptographic processing result is stored in a register included; therefore, access to the DRAM area can be performed even during cryptographic processing.

In case where a row address X at which read is performed by an ACT command for SDRAM is 3FFFh, the multiplexer 48 detects it to activate the selector 76. Then, a column address Y is inputted by a read command or a write command and thereby, selection is performed on which of the registers is accessed. Thereafter, data inputted externally through the I/O circuit 52 is written to a register.

While in the case of the third example, an address area secured as the logic control area is from 3FFF00h to 3FFFFFh, it is also possible that an assigned address is altered in a multiplexer according to storage contents of the register 50 that can be set by a mode register set instruction and thereby, a logic integrated DRAM of the present invention is incorporated in various kinds of microcomputers.

In a case where an address is not assigned by a mode register set instruction, a logic integrated DRAM of the present invention can be used as an ordinary 64 Mbit SDRAM. A bit may be provided to specify whether or not an internally incorporated logic is used as a mode register for application as an ordinary SDRAM.

Figure 42:
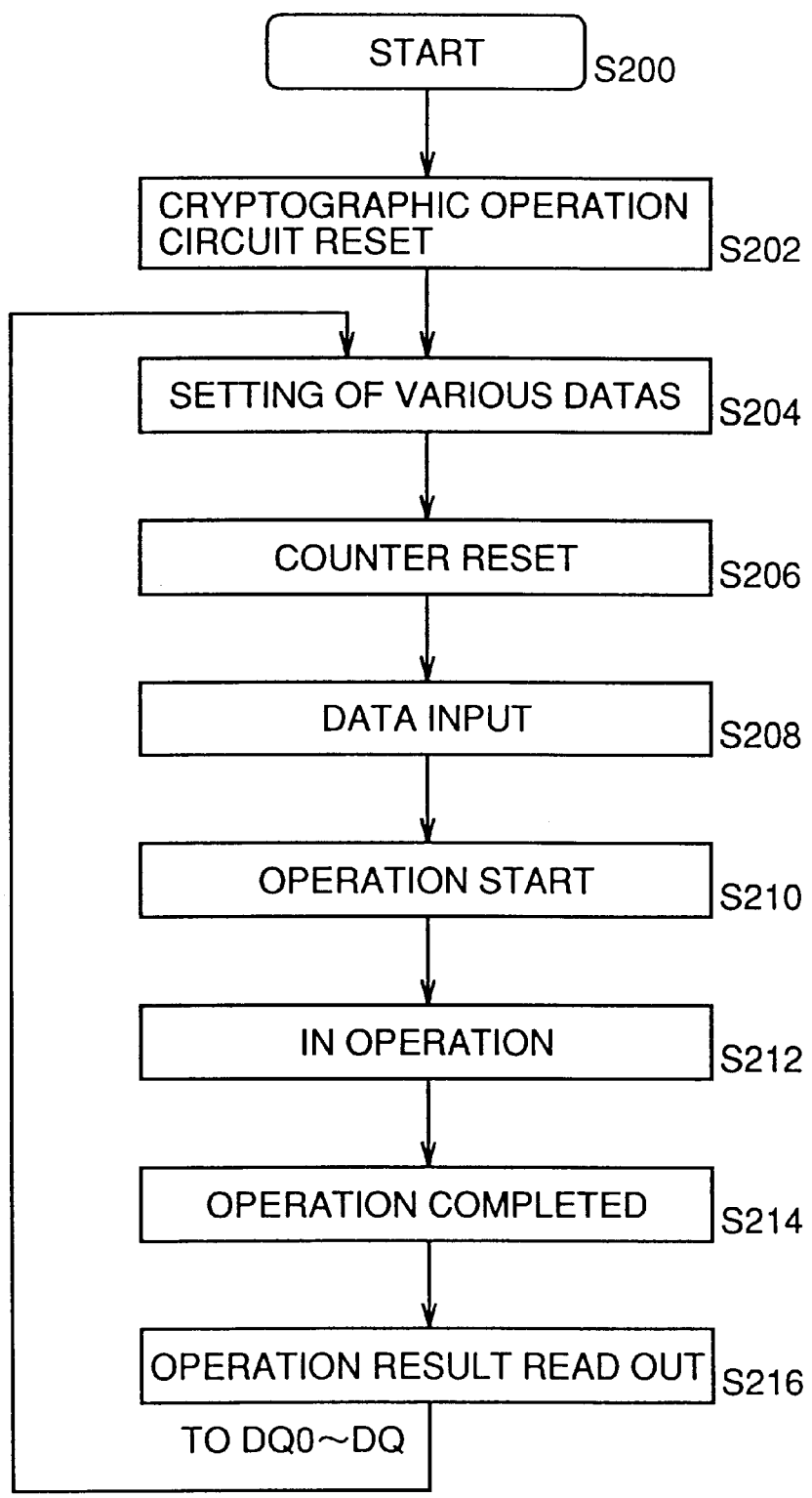
FIG. 42 is a first flow chart for describing an operation of the logic integrated DRAM 30 shown in FIG. 38.

FIG. 42 is a first flow chart for describing an operation of the logic integrated DRAM 30 shown in FIG. 38.

Referring to FIG. 42, at first, when the processing gets started (step S200), a cryptographic operation circuit is reset (step S202). That is, the cryptographic operation circuit is reset by first writing a logical "1" in a reset bit of a control register, in advance of the use of the cryptographic operation circuit.

Subsequently, setting of various datas are performed (step S204). For example, performed are selection of encryption or decryption, selection of a cryptographic mode, input of a secrete key and input of an initial vector. When the setting has been made in advance, the above described processing may be skipped.

Next, a counter in a register is reset (step S206). That is, address counters of the respective data registers 84 and 86 are reset by writing a logical "1" in reset bits of the first and second registers in the control register.

Next, input is performed of data desired to be enciphered or deciphered (step S208). That is, a data input start bit is set and the datas desired to be enciphered or deciphered are continuously written to the first data register 84. The written datas are sequentially stored into the data register 84 in the FIFO mode. On each write, the address counter of the data register 84 is incremented. When data input is completed, a data input start bit is cleared (or a termination bit is set). Thereby, serially written data is converted parallel data for preparation of cryptographic processing.

Following this, an operation gets started in the logic circuit 84 (step S210). The operation gets started by writing a logical "1" in a operation start bit of the control register 78.

Subsequent to this, the operation is performed (step S212). During the operation, a busy bit of the status register 82 indicates a logical "1." It is confirmed by checking the busy bit whether or not the operation is going. The logical value can be read out, for example, as a signal RdL. Data processed in the cryptographic operation logic 74 is stored into the second data register 86 in a FIFO mode whenever the data is processed. Each time data is stored, an address counter for the second register 86 is incremented.

Thereby, data of the cryptographic processing outputted in parallel can be outputted as serial data.

When the operation is completed (step S214), the busy bit of the status register goes to a logical "0." In succession, read-out of the operation result is performed (step S216). When the operation result is read out, an address counter for the second data register 86 is reset. Datas are continuously read out from the data register 86. Each time when data is read out, the address counter for the second data register 86 is incremented.

Figure 43:
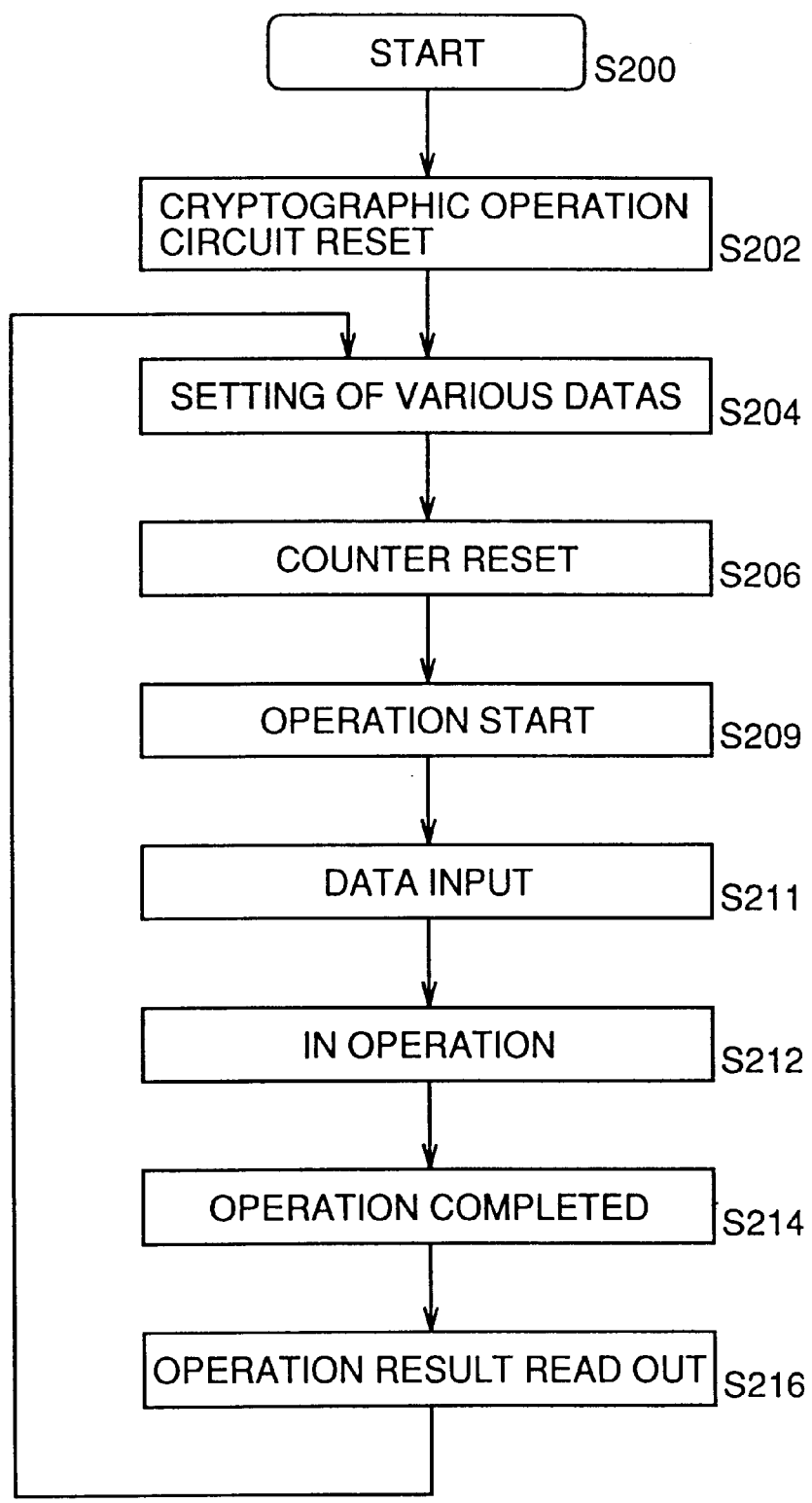
FIG. 43 is a flow chart for describing another operation of the logic integrated DRAM 30 shown in FIG. 38.

FIG. 43 is a flow chart for describing another operation of the logic integrated DRAM 30 shown in FIG. 38.

Referring to FIG. 43, processing up to step S206 is similar to that of FIG. 42.

In FIG. 43, following step S206, an operation in the cryptographic operation logic 74 gets started (step S209). The operation gets started by writing a logical "1" in an operation start bit of the control register. However, the cryptographic operation logic 74 is in a standby state when the first data register 84 is empty.

Next, data input is performed (step S211). A data input start bit is set and datas desired to be enciphered or deciphered are continuously written to the data register 84. Written datas are sequentially stored into the first data register 84 in a FIFO mode. Each time when data is written, the address counter for the first data register 84 is incremented. When data of 8 bytes is accumulated in the data register 84, the operation gets started. When data input is completed, a data input start bit is cleared or a data termination bit is set.

Next, the operation continues to be performed in the cryptographic operation logic 74 (step S212). During the operation, a busy bit of the status register 82 indicates a logical "1." It can be confirmed by checking the busy bit whether or not the operation is going. Data processed in the cryptographic operation logic 74 is stored into the second data register 86 in a FIFO mode whenever the data is processed. Each time when data is stored, the address counter for the second data register 86 is incremented.

Processing subsequent to the above described processing is similar to that of FIG. 42; so description thereof is omitted.

Note that in the above presented description, the first and second data registers 84 and 86 each are simply constituted of a register circuit.

However, such a register can be constituted of a static random access memory as well.

Figure 44:
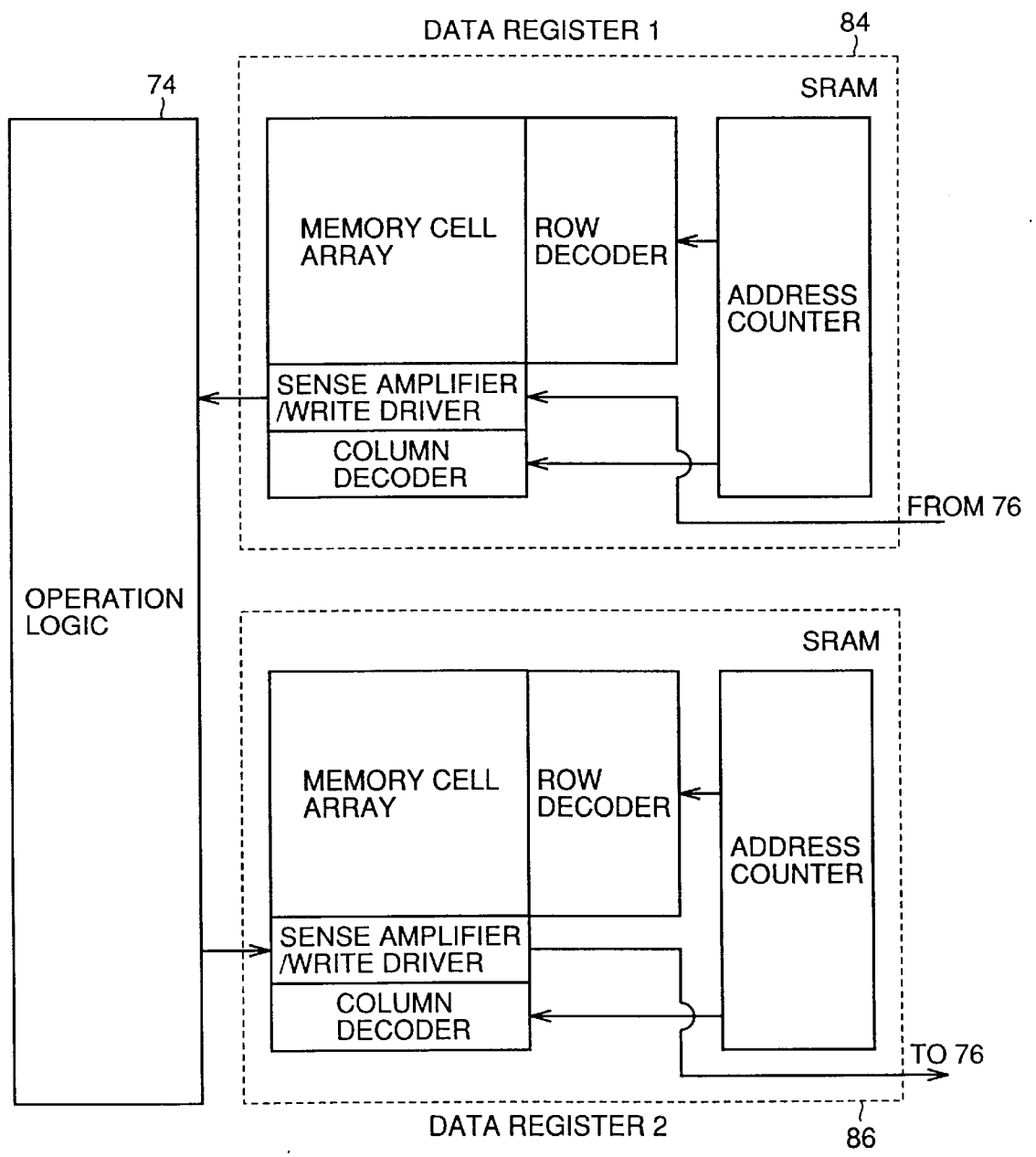
FIG. 44 is a block diagram representing a configuration when the first and second registers are constituted of SRAMs.

FIG. 44 is a block diagram representing a configuration when the first and second data registers for use in performing input/output of data on the cryptographic operation logic 74 are constituted of SRAMs.

With a configuration described above as well, a logical operation such as encryption can be performed at high speed according to a request of a system.

Fourth Embodiment

Figure 45:
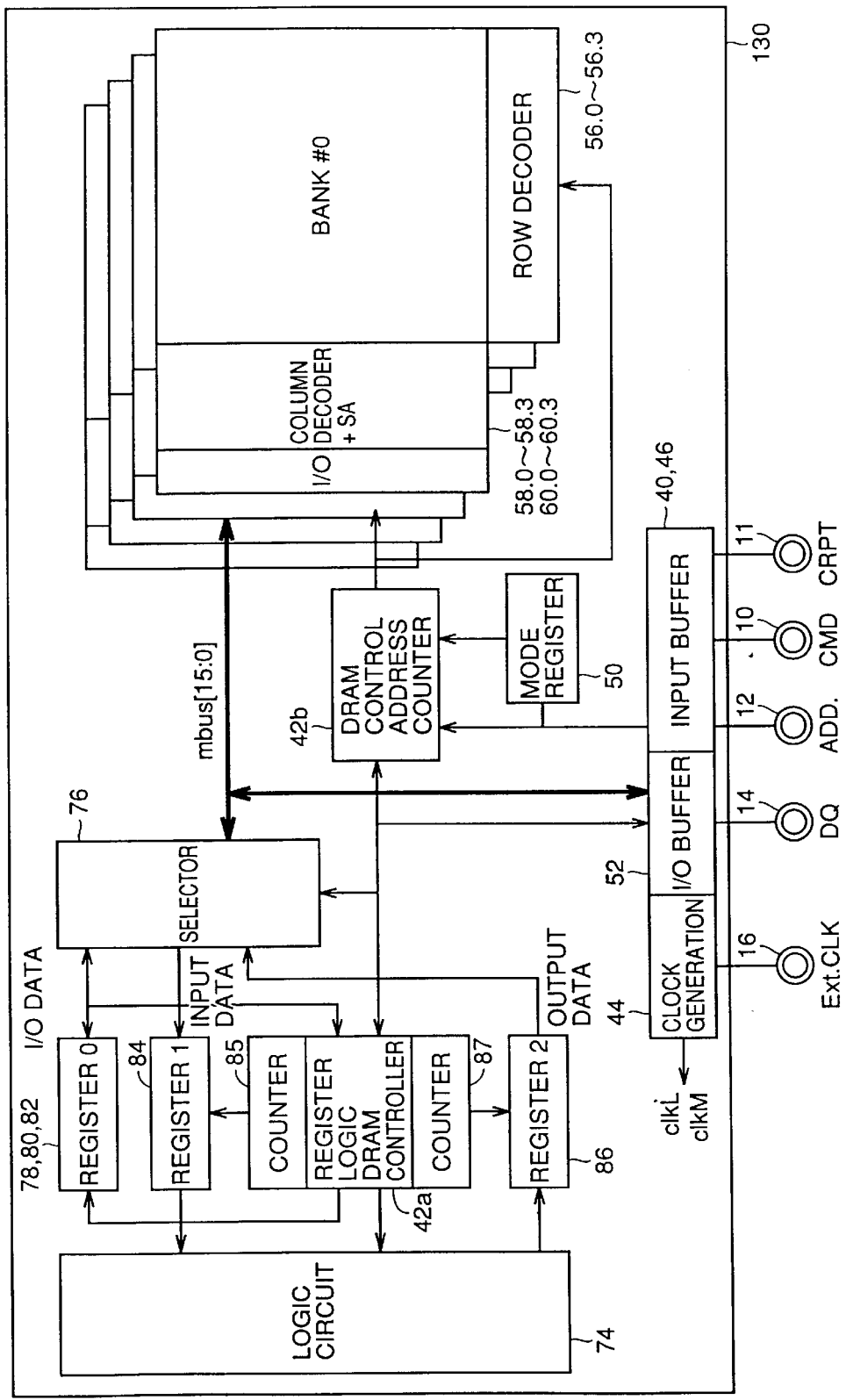
FIG. 45 is a schematic diagram for describing a configuration of a logic integrated DRAM 130 of a fourth example of the present invention.

FIG. 45 is a schematic diagram for describing a configuration of a logic integrated DRAM 130 of a fourth example of the present invention.

A configuration of the logic integrated DRAM 130 of a fourth embodiment of the present invention shown in FIG. 45 is basically almost similar to that of the logic integrated DRAM 30 of the third example shown in FIG. 38.

However, first of all, in the logic integrated DRAM 130, 4 banks #0 to #3 are provided in a memory cell array 38 and the banks are so configured to be read out from or written to independently of each other.

Corresponding to such a configuration, row decoders 56.0 to 56.3, column decoders 58.0 to 58.3 and sense amplifiers 60.0 to 60.3 are provided to the respective banks.

Furthermore, in FIG. 45, a control signal input terminal 11 is newly provided to which terminal a control signal CRYPT for externally instructing a cryptographic operation is given.

Furthermore, in the logic integrated DRAM 130, a control circuit 42 is explicitly shown being divided into a address counter for automatically generating an internal address in a refresh operation, a block operation, a buffer mode operation and others; a DRAM control section 42b for controlling operation of the DRAM according to a control signal and an address signal; and a resister logic DRAM control section 42a for controlling a register, a logic circuit, supply/reception of data between a logic circuit and the DRAM, and others.

Note that in FIG. 45, a register 0 (hereinafter referred to as Reg0 for short as well) are shown collectively for the control register 78, the mode register 80 and the status register 82 shown in FIG. 38; a counter 85 is explicitly shown for a first data register 84 hereinafter referred to as Reg1 for short as well) and a second address counter 87 is explicitly shown for a second data register 86 (hereinafter Reg2 for short as well).

In the logic integrated DRAM 130 of a fourth example shown in FIG. 45 as well, a mode register 50 is to hold a parameter of mode register set which is a control command for the DRAM. The mode register 50 can perform not only mode setting for the DRAM, but also setting of access enable or disable to the register Reg0, the first data register 84 and the second data register 86. When a mode register set is inputted, the control register and the cryptographic operation circuit 74 are reset.

Furthermore, in the logic integrated DRAM 130 shown in FIG. 45 as well, the register Reg0 is a register for controlling a command to control the cryptographic operation circuit 74 and for controlling a mode, the first data register Reg1 is a register for holding input data to the cryptographic operation logic and the second data register Reg2 is a register for holding an output result of the cryptographic operation logic.

Since the other points in construction are similar to corresponding points in construction of the logic integrated DRAM 30 of the third example shown in FIG. 38; so the same symbols are attached to the same constituents and description thereof is omitted.

[Register-Register Operation]

Next, description will be given of an operation of the logic integrated DRAM 130 of the fourth example shown in FIG. 45.

In the first example and others, a configuration and operations are such that data to be cryptographically processed is given to the logic circuit 74 from the outside or the memory cell array and data after cryptographic processing is again written to the memory cell array.

However, as shown in FIG. 45, if a configuration is adopted in which the two registers 85 and 86 are provided for data inputting/outputting on the logic 74, the following operation (a register-register operation) can be performed.

Figure 46:
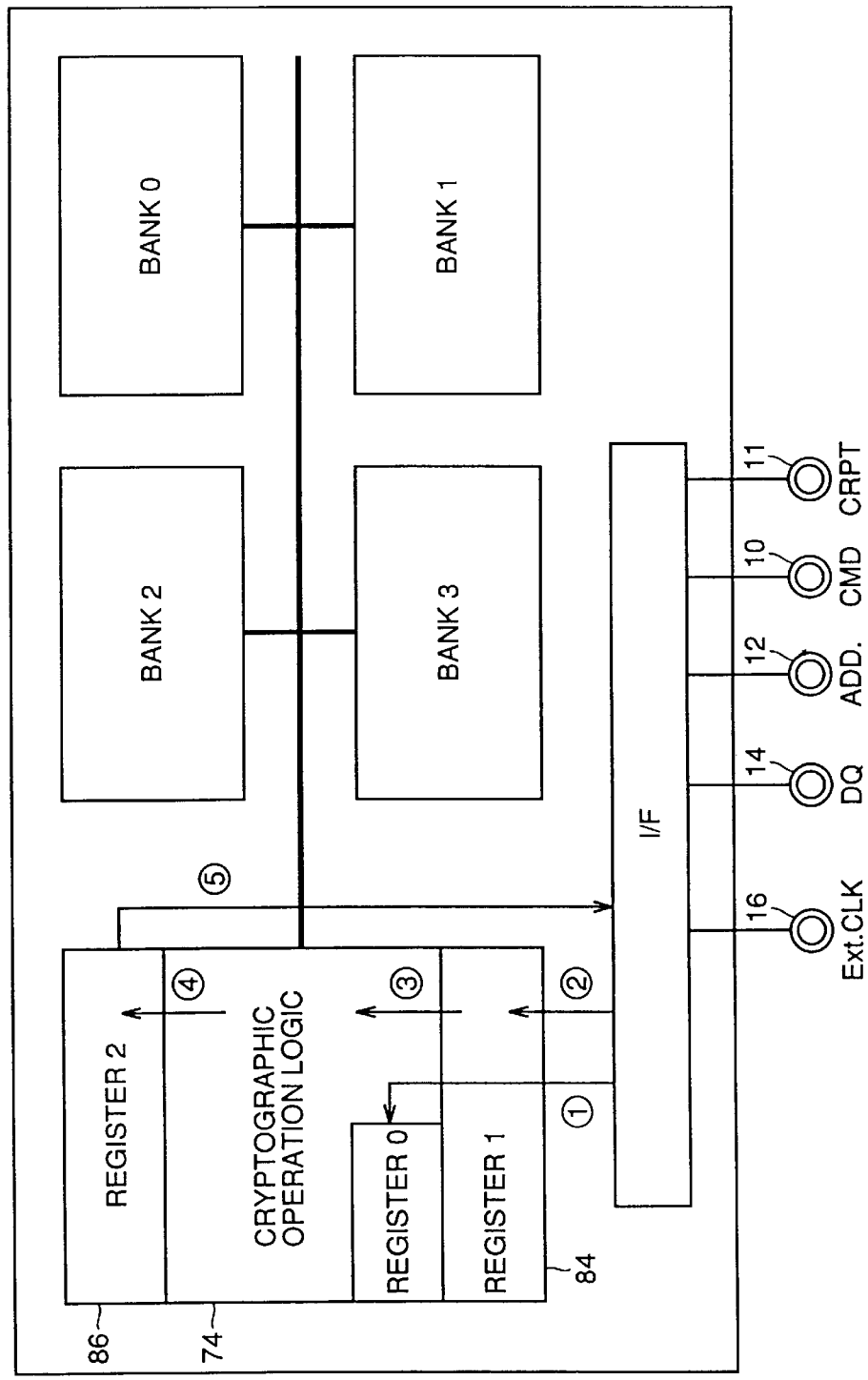
FIG. 46 is a conceptual block diagram for describing a register-register operation.

FIG. 46 is a conceptual block diagram for describing such a register-register operation.

First, by inputting a control signal, data is written on the register 0 to perform setting of the write mode ([1]).

In succession, data to be enciphered or deciphered is written to the first register 84 through the data I/O terminal 14 from the outside ([2]).

When data of a data block length, that is data of 8 bytes, for cryptographic processing is inputted, processing of the cryptographic operation logic 74 gets started ([3]). Subsequent to this, each time when processing for data of 8 bytes is completed, a processing result is written to the second register 86 ([4]).

Access from the outside can be performed to the banks 0 to 3 while such a processing of the cryptographic operation logic circuit 74 is performed.

Successively, after it is confirmed that the flag FL in the register 0 is 0, data is outputted to the outside from the second register 86 through data I/O terminal 14 ([5]).

Figure 47:
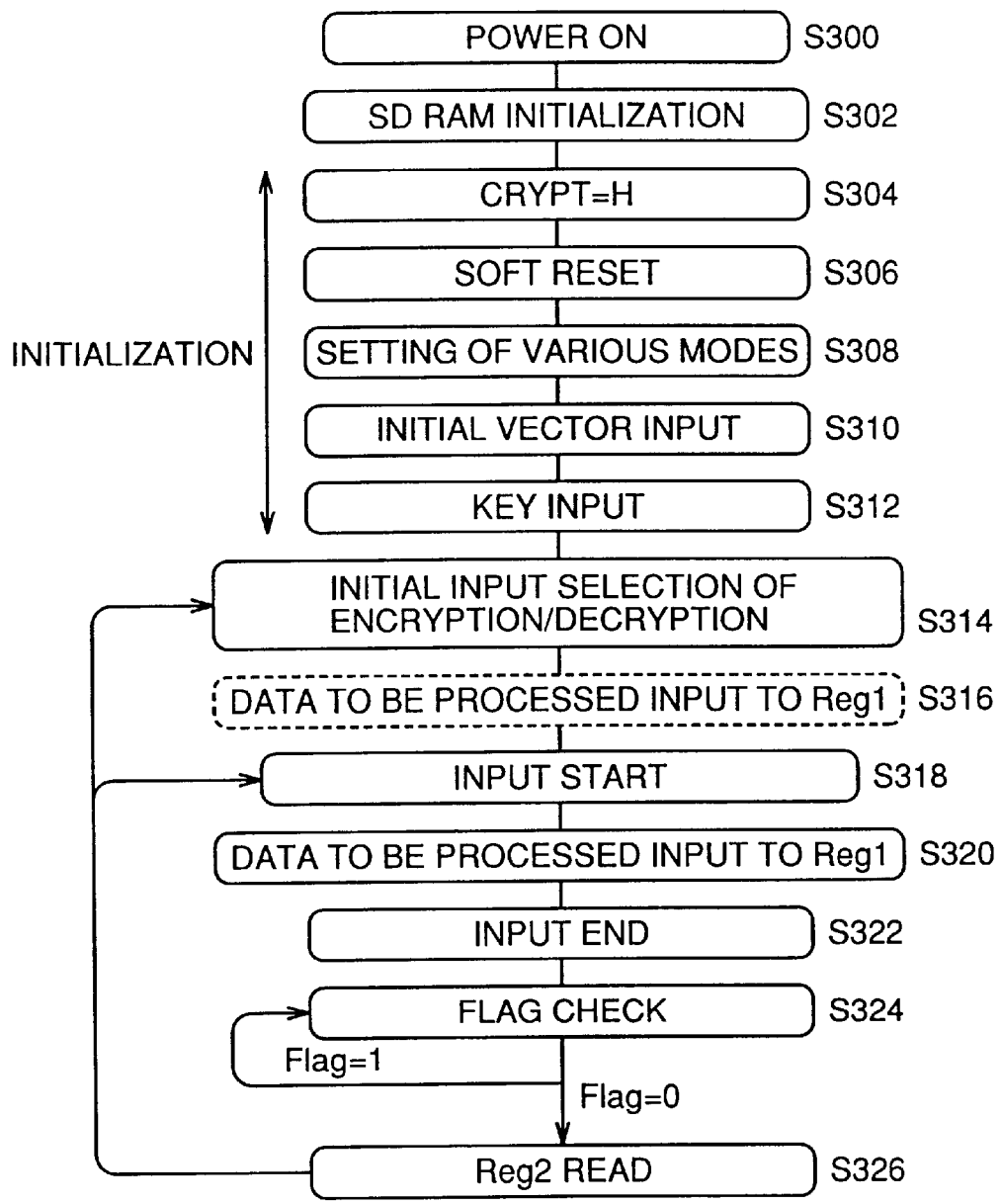
FIG. 47 is a flow chart for describing an operation of the logic integrated DRAM 130 in a more detailed manner.

FIG. 47 is a flow chart for describing an operation of such a logic integrated DRAM 130 in a more detailed manner.

First of all, power is turned on (step S300) and initialization of DRAM is performed (step S302).

Following this, a signal CRYPT given to the control signal input terminal 11 is raised to "H" level and thereby, data write to the register 0 becomes possible.

Then, when a cryptographic function is used for the first time after the power-on, soft reset is performed (step S306).

Furthermore setting of various modes is performed (step S308). For example, performed are selection of a secrete key cryptosystem, selection on whether or not a key input is performed, selection on a cryptographic processing mode and others.

Still furthermore, an initial vector IV is inputted by necessity (step S310).

Then, a secrete key is inputted (step S312).

Moreover, the processing moves to selection on whether or not an initial input is performed and selection on which of encryption and decryption is performed (step S314) and following this, if the initial input is to be performed, then data to be processed is inputted to the first register Reg1 (step S316).

When the above described initialization is completed, usually an input start command is first given (step S318). At this time, the flag FL in the register 0 is set to "1."

Subsequently, data to be processed is inputted to the first register 84 (step S320). When input of data of 8 bytes in length is completed, an encryption/decryption gets started. A processing result is written to the second register 86 whenever the processing result is obtained. When the first register becomes empty, the processing enter a standby state.

Next, when an input stop command is inputted (step S322), then flag check is performed (step S324). When the processing is perfectly completed, the flag Fl becomes "0"; therefore, after it is confirmed, data is read out to the outside from the second register 86 through the data I/O terminal 14 (step S326).

Subsequent processing is a repetition of the processing described above.

Note that the operations in steps S314 and S318 can also be simultaneously performed resetting a value of the counter 85 properly.

Figure 48:
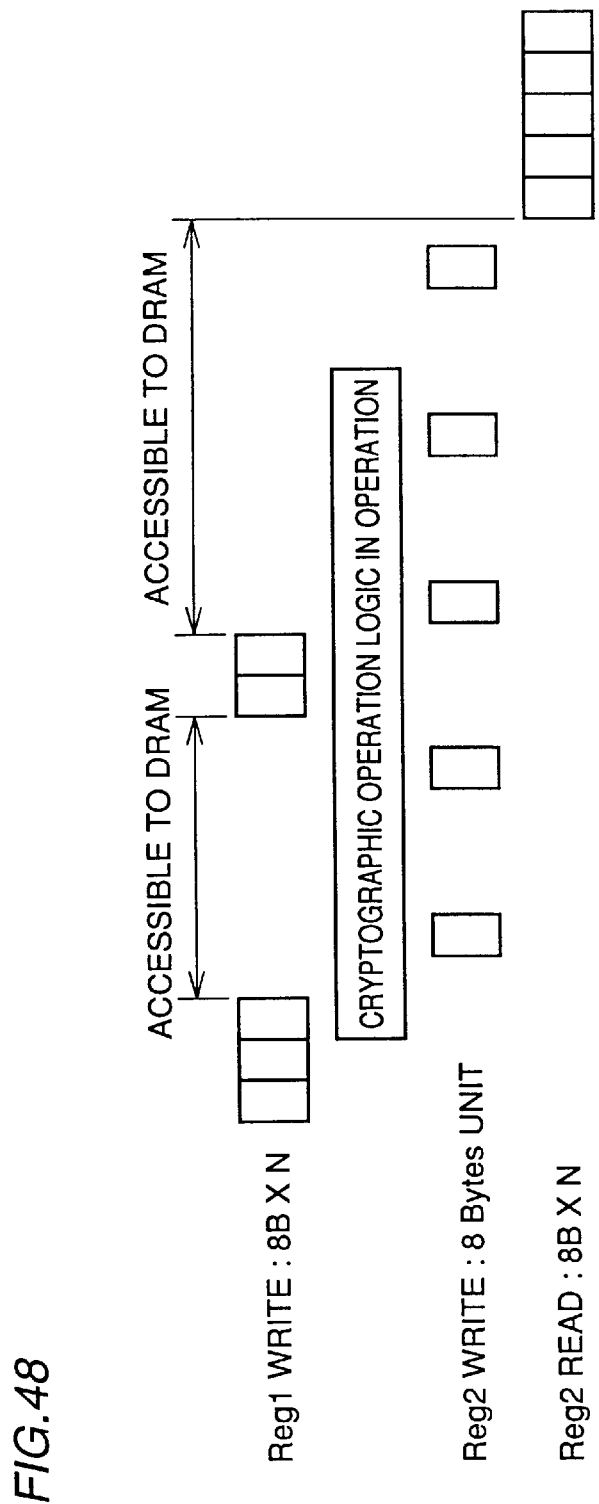
FIG. 48 is a timing chart for describing an operation of the logic integrated DRAM 130 in the processing flow as shown in FIG. 47.

FIG. 48 is a timing chart for describing an operation of the logic integrated DRAM 130 in the processing flow as shown in FIG. 47.

Except a period in which data write to the first register 84 is performed, access to DRAM is possible even when the cryptographic operation logic circuit 74 is in operation.

Each time the processing is completed in the cryptographic operation, datas are sequentially written into the second register 86.

During a period in which data is read out from the second register to outside, access to DRAM is impossible.

By performing the processing as described above, access to DRAM is possible anytime even when the cryptographic operation logic circuit 74 is in operation as long as no external access to the register is performed.

Therefore, no problem arises even if interrupt occurs during cryptographic processing and data write or read can be performed on DRAM during cryptographic processing.

In this case, the first and second registers 84 and 86 each function as a FIFO of a 8 bit width (512 stages). When data write reaches the last stage, then the operation returns to the first stage and overwrite is performed there; therefore, a processing result is required to be read out from a register prior to the overwrite.

[Register-DRAM Operation Mode]

Figure 49:
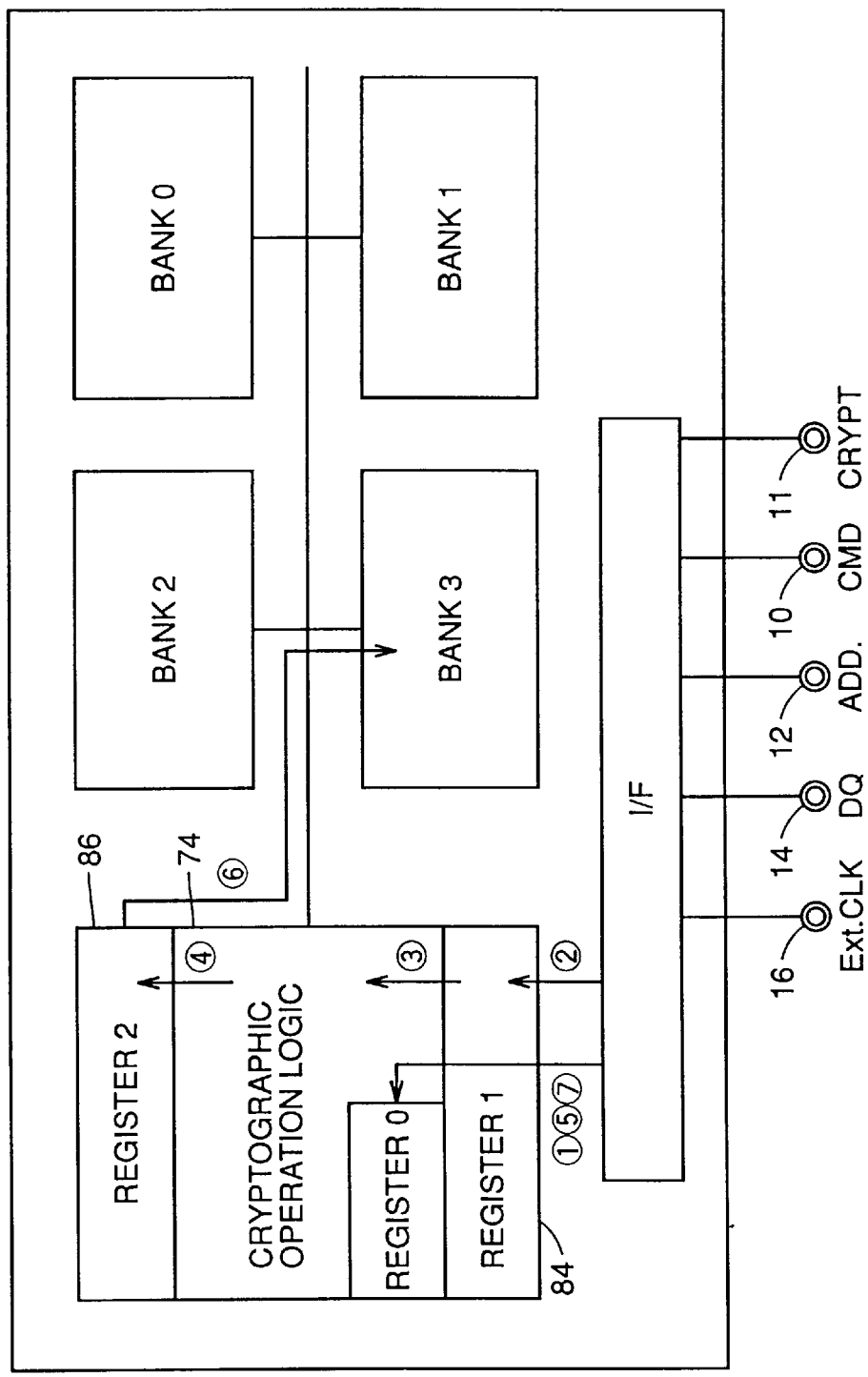
FIG. 49 is a conceptual block diagram for describing another operation of the logic integrated DRAM 130 shown in FIG. 45.

FIG. 49 is a conceptual block diagram for describing another operation [Register-DRAM Operation Mode] of the logic integrated DRAM 130 shown in FIG. 45.

In FIG. 46, the configuration is such that data processed in the cryptographic operation logic circuit 74 is read out to the outside through the data I/O terminal 14.

However, a configuration is possible in which data processed in cryptographic operation is not read out to the outside but written into a memory cell array of the DRAM section.

In this configuration, a specific bank, for example the bank 3, is selected as a bank for such data write in advance.

With such a specific bank selected, the DRAM section can be adapted for interrupt from a memory controller or the like to another bank.

Referring to FIG. 49, at first, a mode setting is performed by writing data into the register 0 ([1]). Successively, data to be enciphered or deciphered is written into the first register 84 ([2]).

When data inputted into the first register 84 amounts to 8 bytes, a cryptographic processing gets started in the cryptographic operation logic circuit 74 ([3]).

After the processing is completed, data write of 8 bytes as a unit is performed into the second data register 86 ([4]).

In a period from data input to the register 1 to data input to the register 2, the banks 0 to 3 of the DRAM section can be accessed.

Subsequent to this, it is confirmed that the flag FL is "0" and thereafter, entry to the register-DRAM transfer mode is performed ([5]).

When such an entry is performed, data write to a register transfer-destination bank (for example the bank 3) is performed ([6]).

When the counter for the second data register 86 is reset, write is performed starting at the first stage and when not being reset, write gets again started at a stage somewhere between the first and last stages.

In this case, data transfer is performed by write accessing to an address to which data is desired to be transferred.

When the data transfer described above is completed, exit from the register-DRAM transfer mode is performed ([7]).

During the processing described above, a bank not specified as a register transfer-destination can be accessed similar to the case described with reference to FIG. 46.

Figure 50:
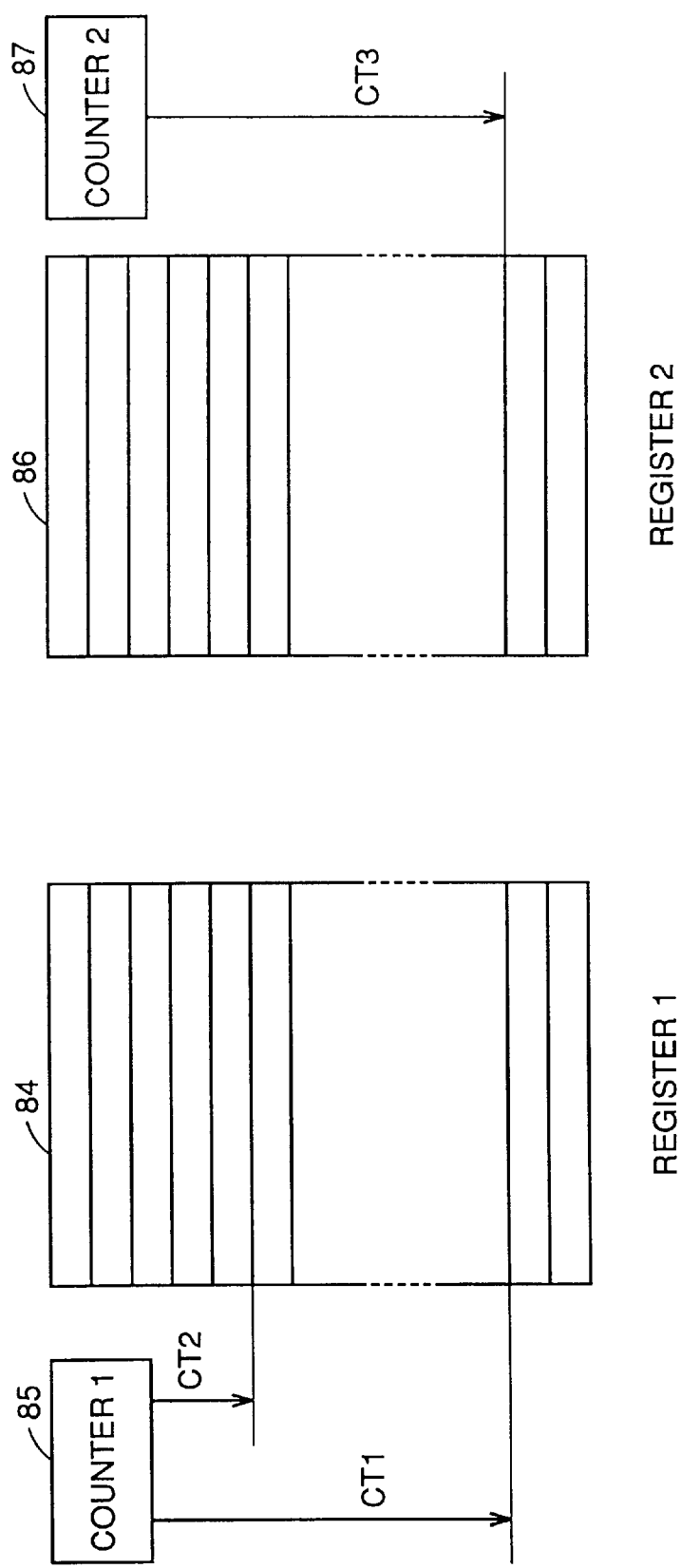
FIG. 50 is a conceptual drawing for describing a concept of operations of the first and second registers 84 and 86, and counters 85 and 87.

FIG. 50 is a conceptual drawing for describing a concept of operations of the first and second registers 84 and 86, and counters 85 and 87 in order to enable the configuration described above.

The first counter 85 counts a position where data write is completed as a count CT1, while counting a position to which input to the logic circuit 74 has progressed as a count CT2.

On the other hand, the second counter counts a position to which write of a processing result has progressed as a count CT3.

In the first register 84, the processing is permitted to continues till CT2<CT1 and a write operation on the first register 84 is higher in priority than a read operation thereon.

Figure 51:
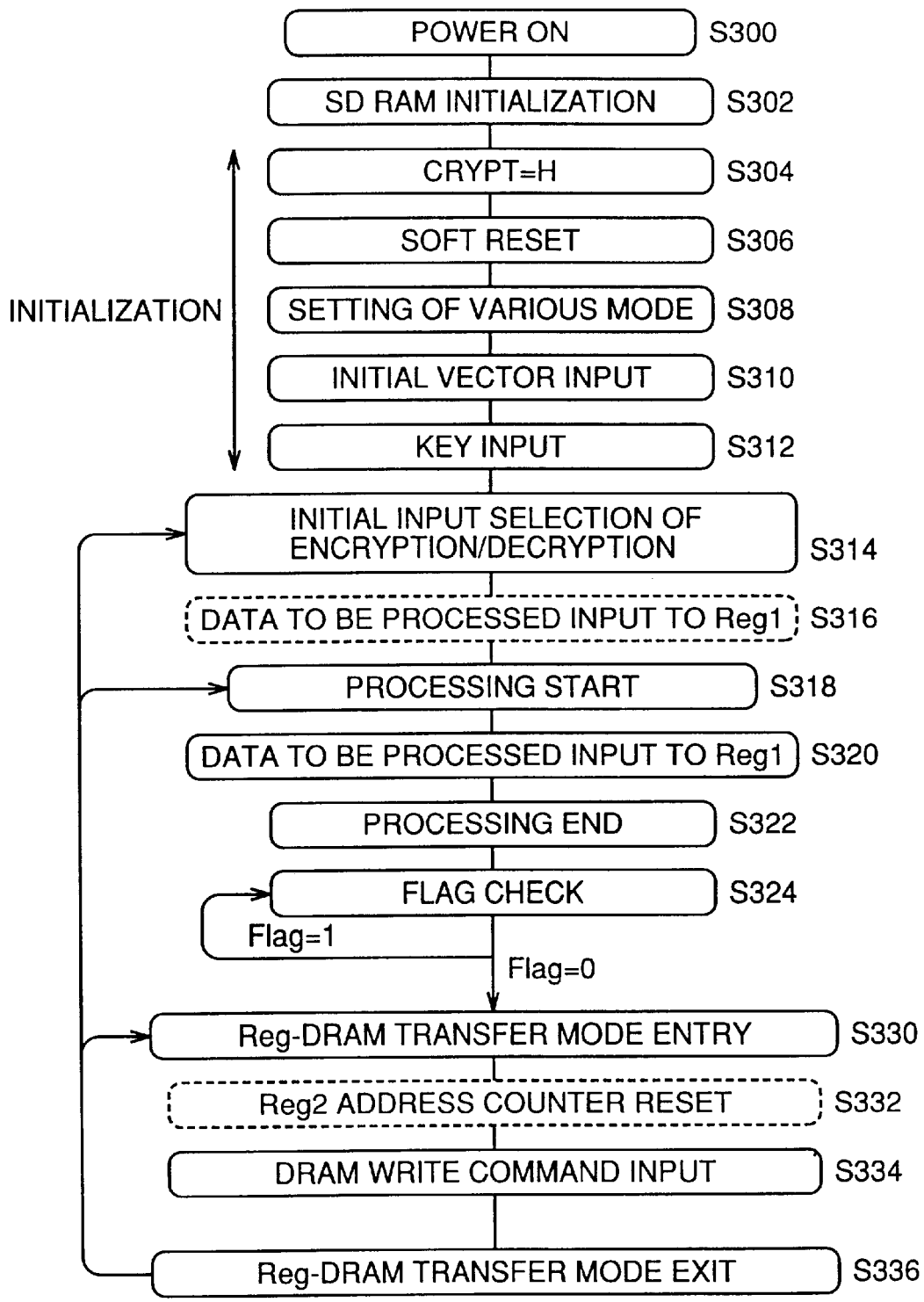
FIG. 51 is a flow chart for describing more of details of the operation described referring to FIG. 49.

FIG. 51 is a flow chart for describing more of details of the operation described referring to FIG. 49.

Referring to FIG. 51, the processing up to step S324 is similar to that shown in FIG. 47 basically.

Thereafter, when it is confirmed that the flag is "0," entry to the register-DRAM transfer mode is performed (step S330).

Following this, the address counter 87 of the second register 86 is reset (step S332) and a write command to DRAM is inputted (step S334).

In response to this, data transfer from the second register 86 to the bank 3 is performed.

Then, given is a command to exit from the register-DRAM transfer mode (step S336).

Thereafter, the processing returns to any of steps S314, S318 and S330 according to designation by a control signal.

By performing the processing as described above, a processing result can be transferred from the second register 86 to the DRAM after completion of the operation between the registers.

At this time, by giving a write command to the DRAM, data of the register 2 is transferred to an accessed address in the DRAM.

In this situation, disabled is data given to the external data I/O terminal 14 in parallel to the data transfer.

Furthermore, when read data from an accessed address is desired to be transferred to the second register 86 and read out to the outside by read access to the DRAM, a configuration can also be adopted in which data is read out from the second register 86 through the data I/O terminal 14.

(External Bus during Period of Register-DRAM Transfer Mode).

During a period of the register-DRAM transfer mode in the register-DRAM operating mode as described above or a DRAM-register operating mode which will be described later, data transfer between the registers 84, 86 and DRAM section is performed through the internal data bus mbus within the logic integrated DRAM 130 chip by access to the logic integrated DRAM 130.

Figure 52:
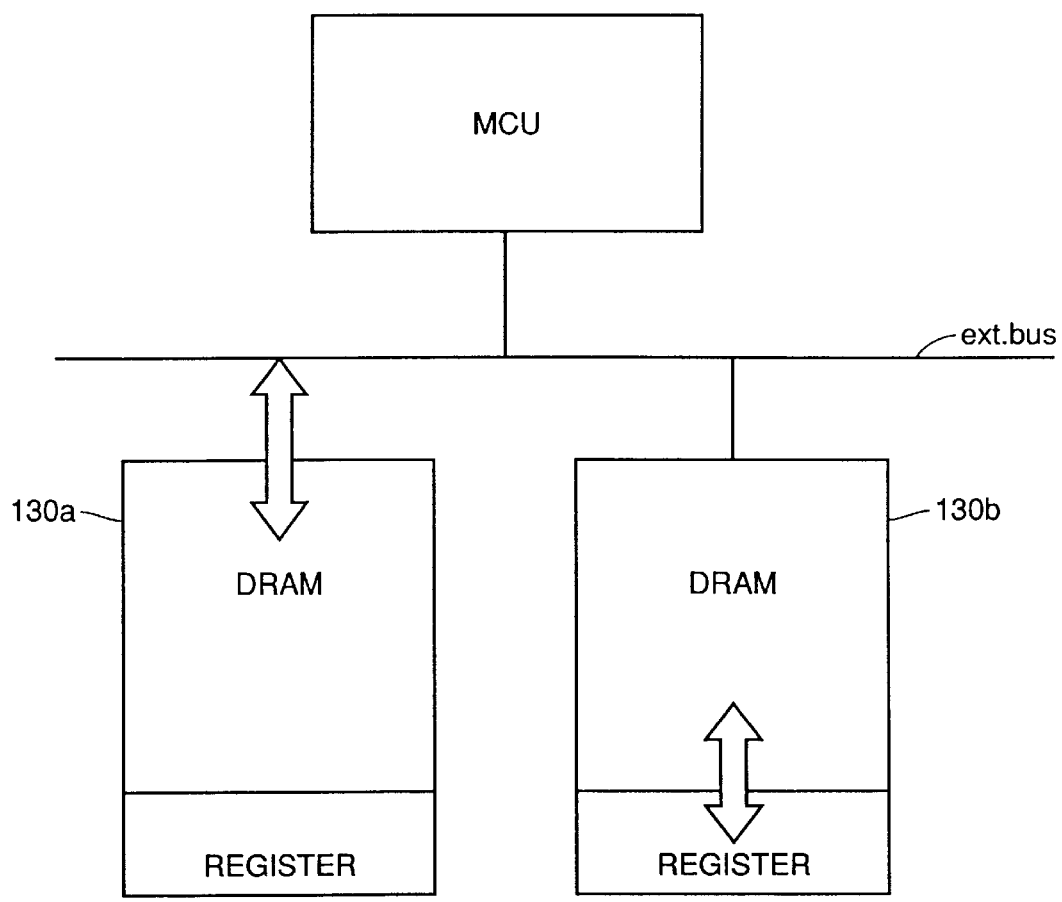
FIG. 52 is a block diagram representing a state of an external bus.

FIG. 52 is a block diagram representing a state of an external data bus when such logic integrated DRAMs 130*a* and 130*b* are connected to a micro-control unit MCU through the external bus ext. bus.

As shown in FIG. 52, in the register-DRAM transfer mode, there is no chance that data is inputted to a data I/O terminal of the logic integrated DRAM 130*b* or contrary to this, data is outputted from the data I/O terminal thereof. Therefore, a bus to which the data I/O terminal is connected of the external bus ext. bus is open to the other chips. Accordingly, for example, the logic integrated DRAM 130*a* can perform supply/reception of data with the external bus ext. bus.

FIG. 53 is a timing chart representing a state where the logic integrated DRAM 130*b* operates in a full page mode of the register-DRAM transfer mode.

That is, an ACT command and a row address Xa are inputted at a time point t1 of FIG. 53, a read command RD (or a write command WT) and a column address Ya are inputted at a time point t2 and thereafter, the logic integrated DRAM 130*b* starts an operation of the full page mode. During a period TP1 till a precharge command or the like is given, a row address is fixed at Xa and datas in the DRAM section at column addresses Y=Ya, Ya+1, Ya+2 . . . are transferred between the DRAM section and the register while generating the column addresses internally.

Therefore, during a period TP2, open are not only a bus to which the data I/O terminal is connected, but also an address bus and a command bus are open to the other chips.

That is, such a period TP2 can be effectively utilized for access to the other devices.

[Address Assignment on Register]

FIG. 54 is a drawing representing assignment of addresses on the register 0, the first data register 84 and the second data register 86. FIG. 55 is a drawing representing an example of data held in the registers.

Note that it is assumed that all of row addresses X are #3FFF.

Referring to FIGS. 54 and 55, soft reset is performed or a flag is set at a column address Y=#00.

Herein, if data D0 is 1, then it indicates that a cryptographic function is reset and data D1 is a flag indicating that a cryptographic processing is going.

A Y address #01 is an area for setting of a mode or a cryptographic area.

In this area, performed are selection of a cryptosystem, selection of a length of a key and a block encryption mode, and in addition designation of a bank, between an internal register and which direct data transfer can be performed during the period of the register transfer mode.

A Y address #02 is an area for holding: data indicating whether encryption or decryption, or entry into a hold state is performed; data indicating whether input start, stop or entry into a hold state of a plain text or a cipher text is specified; a signal for resetting the counter 85 of the first register 84 and a signal for resetting the address counter 87 of the second register 86.

In addition to the above described operations, in a case of a block cipher in chain, also stored is data indicating whether an initial vector is inputted or all datas in processing are selected as an initial data.

A Y address #03 is accessed when data write is performed to the first register 84.

A Y address #04 is an address indicating an access to the second register 86.

At a Y address #05, stored is data for control of the register DR transfer mode.

At a Y address #06, store is data for control of partial refresh, wherein the term "partial refresh" means a function to refresh only a specified address space in self-refresh.

At Y addresses #10 to #13, stored is a first key of 64 bits in length, and at Y address #14 to #17, stored is a second key of 64 bits in length.

At Y addresses #18 to 1*b*, stored is a third key of 64 bits in length.

At Y addresses "1*c* to 1F, stored is an initial value of an initial vector.

Y addresses #20 to #5F are an area reserved for a public key.

[DRAM-Register Operating Mode]

Next, further description will be given of other operations between the DRAM and each of the register 0, the first and second registers 84 and 76.

Figure 56:
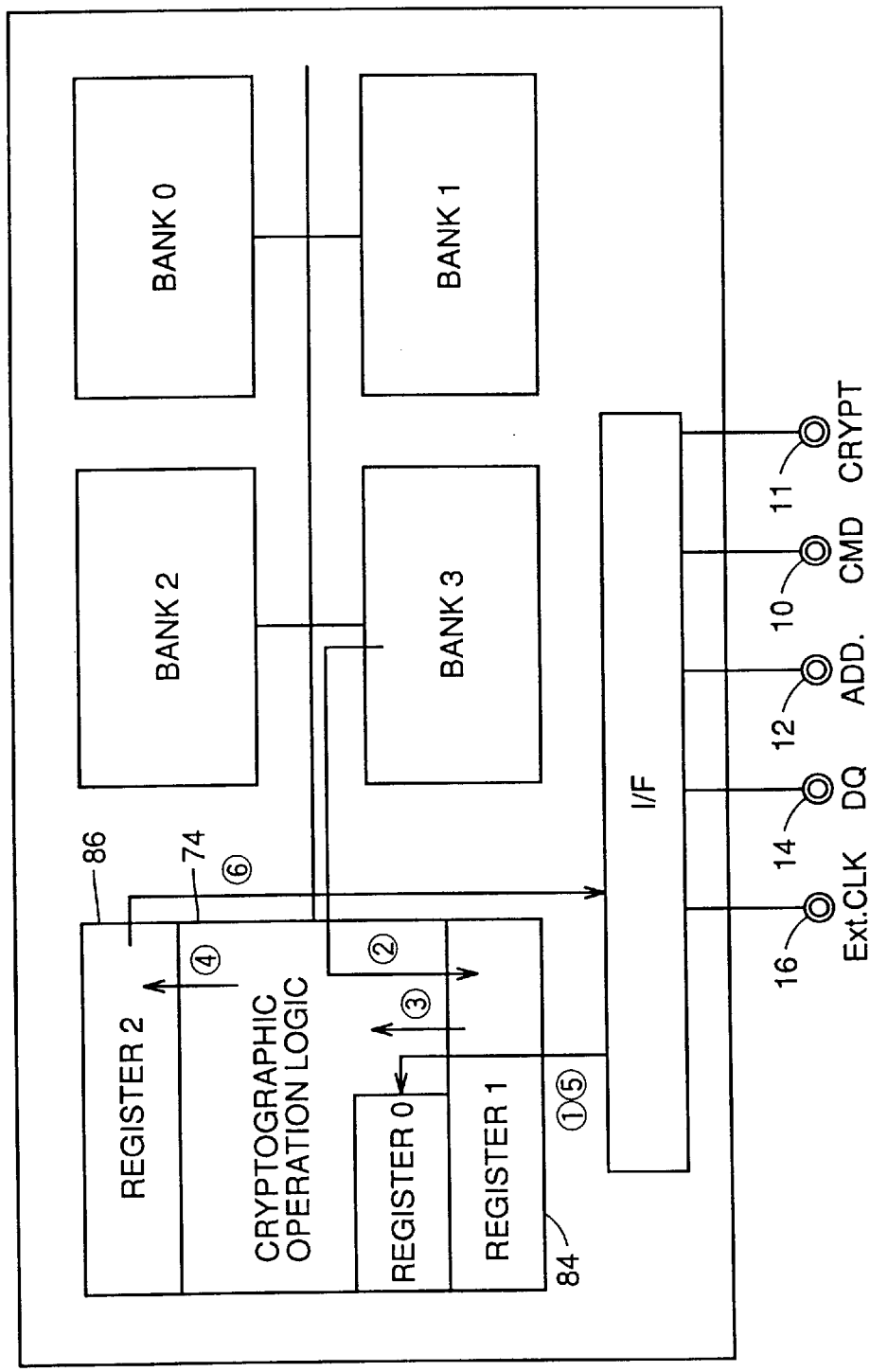
FIG. 56 is a schematic block diagram for describing a DRAM-register operating mode.

FIG. 56 is a schematic block diagram for describing an operating mode in which data stored in advance in such a DRAM is enciphered in the logic circuit 74 to output a result to the outside (the operating mode is hereinafter referred to as DRAM-register operating mode).

Referring to FIG. 56 at first, a prescribed signal is inputted from control signal input terminals 10 and 11 to write data into the register 0 and enter the register-DRAM transfer mode ([1]).

Then, data desired to be enciphered or deciphered is transferred to the first register 86 from the DRAM section ([2]). When the counter of the first register 84 is reset, data is transferred starting at a leading place of the first register 84, while when being not reset, data transfer is restarted at a place somewhere between the leading place and the last place. In this case, data to be transferred is specified by performing read access to an address in the DRAM section from which transfer is desired ([3]).

When data of 8 bytes in length is inputted to the first register 84, a processing gets started in the cryptographic operation logic circuit 74 ([3]). Data whose processing has been completed is written into the second register 86 with each data of 8 bytes as a unit ([4]).

Herein, by inputting a prescribed control signal, exit from the register-DRAM transfer mode is performed ([5]). In this case, in the register-DRAM transfer mode including the processing from [1] to [5], access to a bank which is not specified as a transfer source to the register is enabled without regard to whether or not the above described processing from [1] to [5] is performed.

After it is confirmed with the logic integrated DRAM 130 that the flag FL="0," read-out of data is performed from the second register 86 through the data I/O terminal 14 ([6]).

Figure 57:
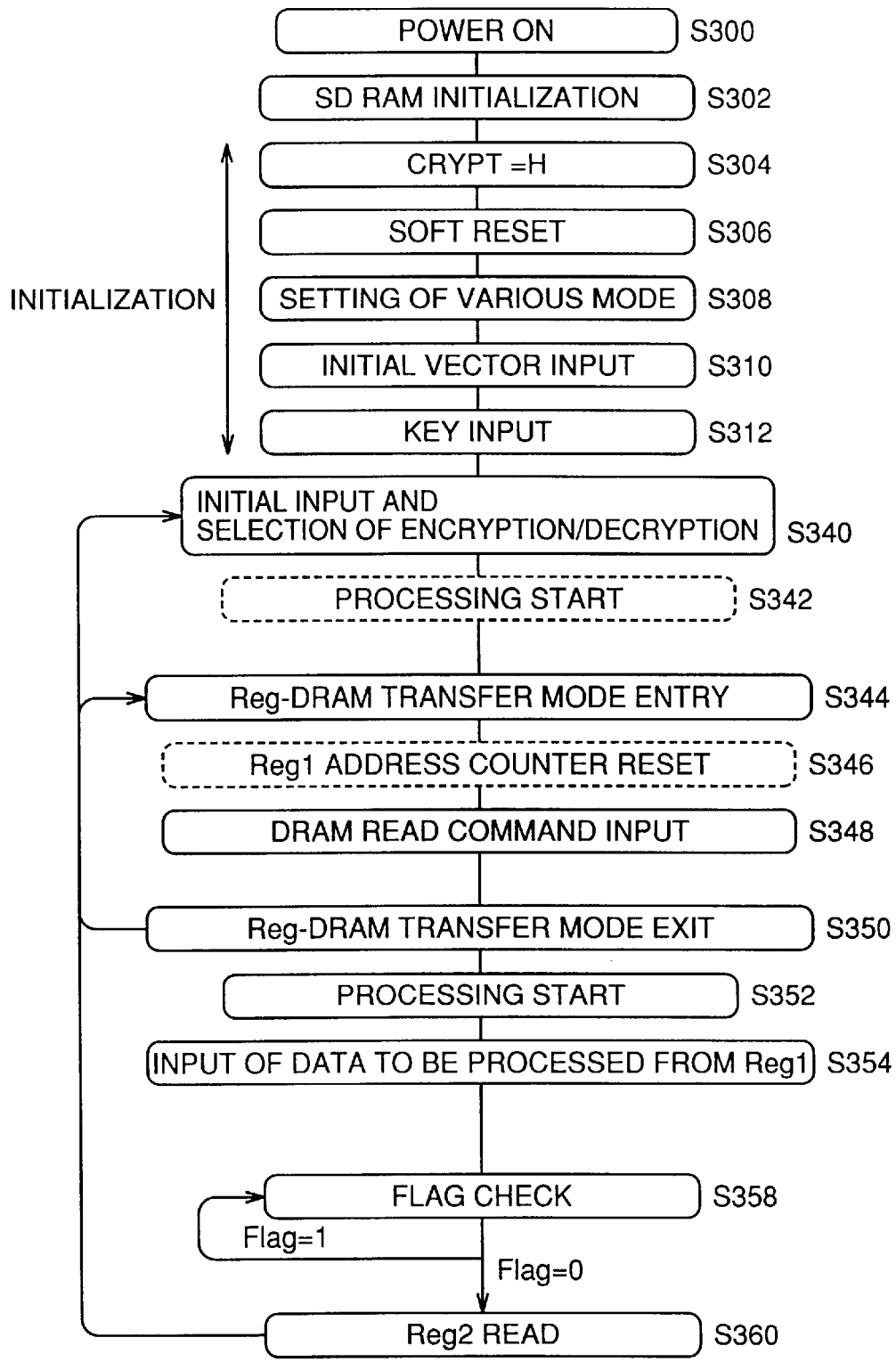
FIG. 57 is a flow chart for describing more of details of the operation described in FIG. 56.

FIG. 57 is a flow chart for describing more of details of the operation described in FIG. 56.

Referring to FIG. 57, processing up to step S312 is similar to the processing shown in FIG. 51 basically.

In succession thereto, after an initial input and selection of encryption/decryption are performed (step S340), processing gets started (step S342), and then entry to the register-DRAM transfer mode is performed (step S344).

Subsequently, the address counter 85 of the first register 84 is reset (step S346) and a read command to the DRAM is inputted (step S348).

In response to this, for example, data is transferred to the first register, for example to the bank 3.

When data input to the first register is completed, then a command to exit from the register-DRAM transfer mode is given (step S350).

Thereafter, a start command for processing is inputted (step S352) and thereby, data in the first register is enciphered/deciphered, wherein the processing continues up to the last data bits in the first register to automatic termination.

Thereafter, when it is confirmed that the flag FL is "0," contents of the second register are read out from the data I/O terminal 14 (step S360).

Following this, one of the processings of steps S340 and S344 is restored according to designation of a control signal.

By performing the processing as described, after an inter-register operation is completed, a processing result can be transferred to the outside from the second register 86.

In a case where in step S342, a processing start command is inputted, a processing is started when data of the minimum operation unit is stored into the first register.

(Reduction in Standby Current Utilizing Register-DRAM Transfer Mode)

Furthermore, by the use of the register-DRAM transfer mode, a standby current of the logic integrated DRAM 130a can also be reduced by a great margin as described below.

That is, it is assumed that the first register 84 is constituted of, for example, a circuit not requiring refresh such as SRAM.

In this case, when a size of data to be held is equal to or less than a size of the first register 84, data of the size is transferred to the first register 84 and thereafter, no refresh operation is required in the DRAM section. As a result, a standby current can be suppressed.

In order to perform such an operation, the following procedure is adopted, for example.

i) Data required in the register-DRAM transfer mode is transferred directly to the first register 84 from the DRAM section;
ii) all banks are made to be in a non-selected state in setting a bank for partial self-refresh.
iii) entry to the self-refresh mode is performed; and
iv) the system enters a standby state.

In an ordinary self-refresh, input buffers for a command, an address, a data I/O terminal and others are forced to enter an inactive state and in this state, the DRAM section is subjected to automatic refresh. In this situation, for example, a standby current is consumed at a level of the order of 300 µA. Contrast to this, when the operations as described above is performed, a standby current can be reduced to, for example, a value equal to or less than 20 µA since no current to be required for a refresh operation is consumed.

First Modification of Fourth Example

Figure 58:
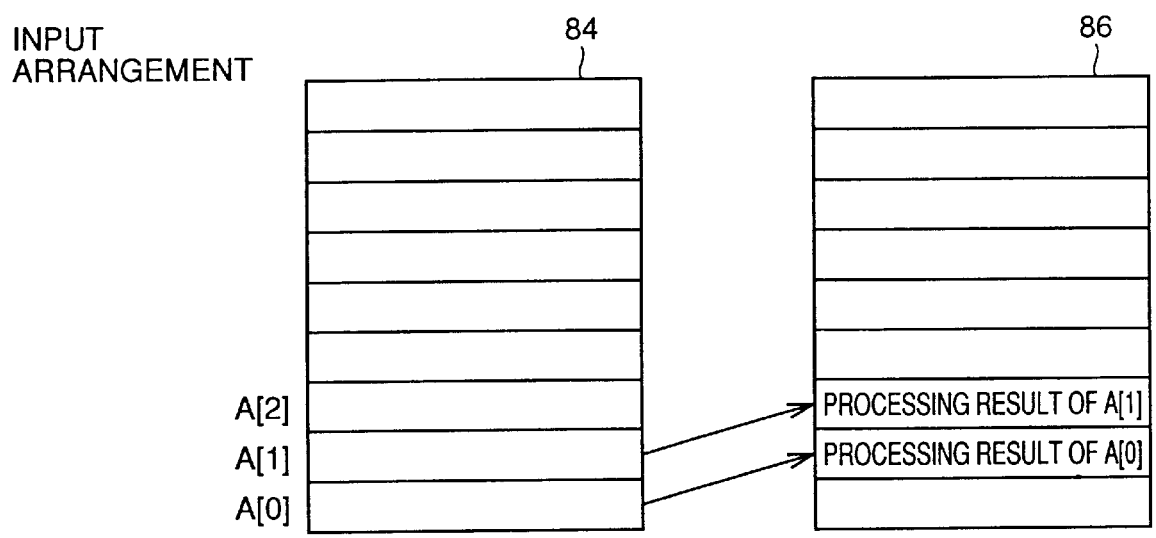
FIG. 58 is a drawing representing a concept of a data transfer timing for improving on a transfer efficiency when an operation is performed in the register-DRAM transfer mode.

FIG. 58 is a drawing representing a concept of a data transfer timing for improving a transfer efficiency when an operation is performed in the register-DRAM transfer mode.

Referring to FIG. 58, in a case where data is written to the DRAM section from the second register 86, a subsequent text data desired to be inputted is given to the data I/O terminal 14 when a DRAM area address is given to the logic integrated DRAM 130 in the register-DRAM transfer mode.

In this case, not only is data transferred to the DRAM section from the second register 86, but data that has been given to the data I/O terminal 14 is also inputted to the first register 84. By doing so, a data transfer efficiency can be improved.

On the other hand, when a DRAM address is given to the logic integrated DRAM 130 in order to transfer data to the first register 84 from the DRAM section, not only is data of a prescribed DRAM address transferred to the first register 84, but data of the second register 86 is outputted to the outside from the data I/O terminal 14. By doing so as well, an efficiency of data transfer can be improved.

Second Modification of Fourth Example

Figure 59:
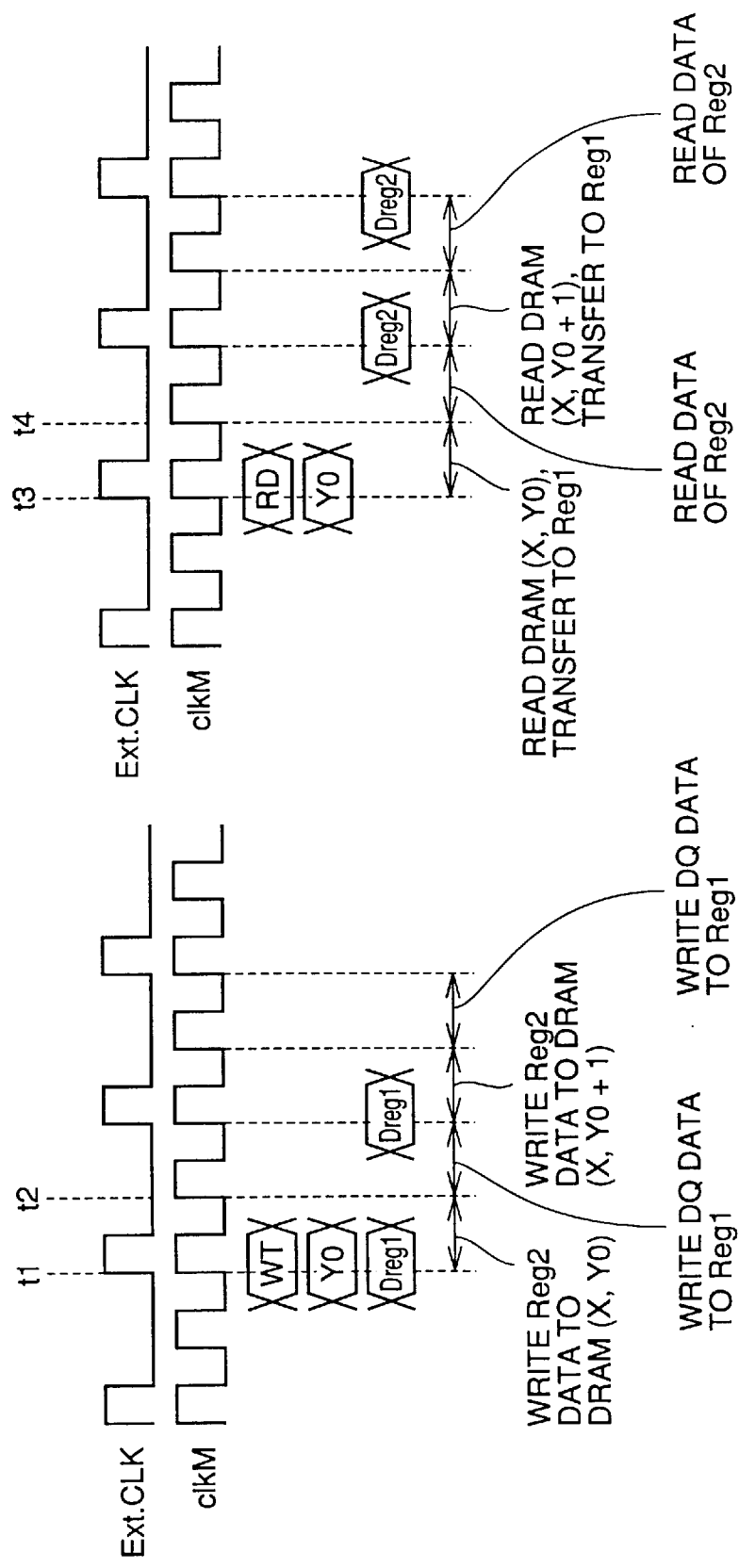
FIG. 59 is a timing chart describing an operation for improving a efficiency of data transfer.

FIG. 59 is a timing chart describing an operation for improving a efficiency of data transfer when a frequency of the external clock signal Ext. CLK is low.

When the frequency of the external clock signal Ext. CLK is low, the internal clock signal clkM supplied to the DRAM section is of a frequency having a value obtained by multiplying the frequency of the external clock signal Ext. CLK. In this case, the register and the DRAM section are alternately accessed in the first and second half cycles of the clock.

That is, at a time point t1 when data transfer (write) from the second register 86 to the DRAM section is instructed, the data of the second register 86 is first transferred to the DRAM section. Subsequent to this, at a time point t2 of the next activation timing of the internal clock signal clkM, data that has been given to the data I/O terminal 14 is inputted to the first register 84. Thereafter, data transfer from the register to the DRAM section is likewise performed.

On the other hand, at a time point t3 when data transfer (read out) to the first register 84 from the DRAM section is instructed, data of the DRAM section is first transferred to the first register 84. Then, at a time point t4 of the still next activation timing of the internal clock signal clkM, data of the second register 86 is transferred to the DRAM section. Thereafter, data transfer from the DRAM section to the outside is performed in a similar way.

With the above described operations adopted, an efficiency of data transfer can be improved.

Note that while in the above presented description, a width of the internal bus mbus is, for example, 16 bits, access from the register and access from the DRAM section can also be simultaneously performed by adopting data transfer with a bus width of 32 bits thereof.

Figure 60:
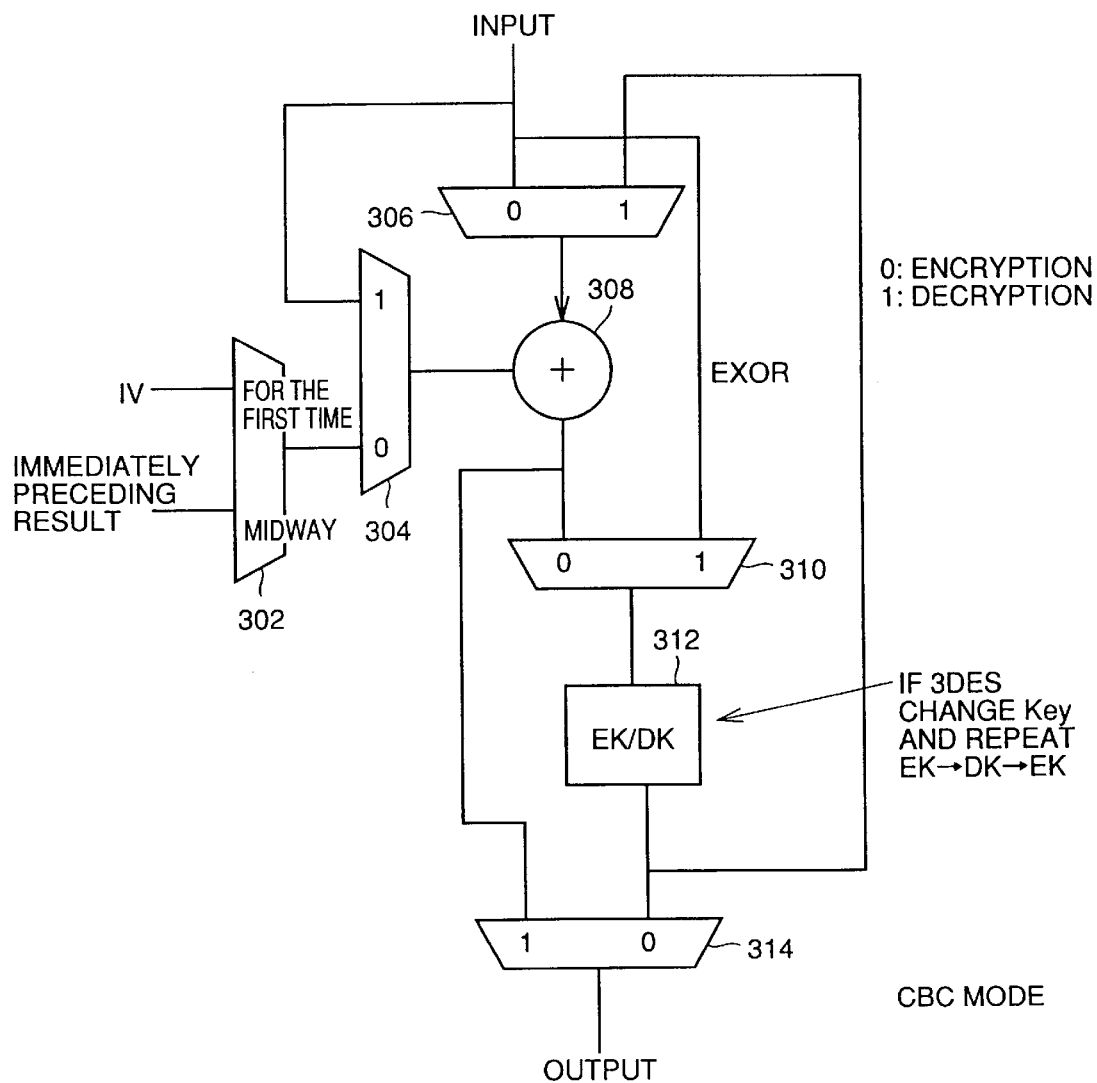
FIG. 60 is a block diagram representing an example of a circuit configuration for performing encryption or decryption in the CBC mode.

FIG. 60 is a block diagram representing an example of a circuit configuration for performing encryption or decryption processing in the CBC mode.

At the first part in the start of encryption, an initial vector IV is selected by the multiplexer 302 and given to the multiplexer 304. On the other hand, when processing of the next data block is performed during the encryption, an immediately preceding processing result in the multiplexer 302 is given to the multiplexer 304 therefrom.

The multiplexer 304 gives data from the multiplexer 302 to one input of an exclusive logical sum operation circuit 308 in encryption, while giving input data to the one input of the exclusive logical sum operation circuit 308 in decryption.

The multiplexer 306 gives input data to the other input of the exclusive logical sum operation circuit 308 in encryption, while giving an output of an encryption/decryption circuit 312 to the other input of the exclusive logical sum operation circuit 308 in decryption.

An output of the exclusive logical operation circuit 308 is given to the encryption/decryption circuit 312 through the multiplexer 310 in encryption, while on the other hand, being outputted through the multiplexer 314.

In decryption, input data is given to the encryption/decryption circuit 312 and an output of the encryption/decryption circuit 312 is given to the other input of the exclusive logical sum operation circuit 308 through the multiplexer 306.

In encryption, on the other hand, an output of the encryption/decryption circuit 312 is outputted through the multiplexer 314.

In the CBC mode, such configurations are cascade connected to enable the encryption and decryption as described in FIGS. 18 and 19.

Fifth Example

Figure 61:
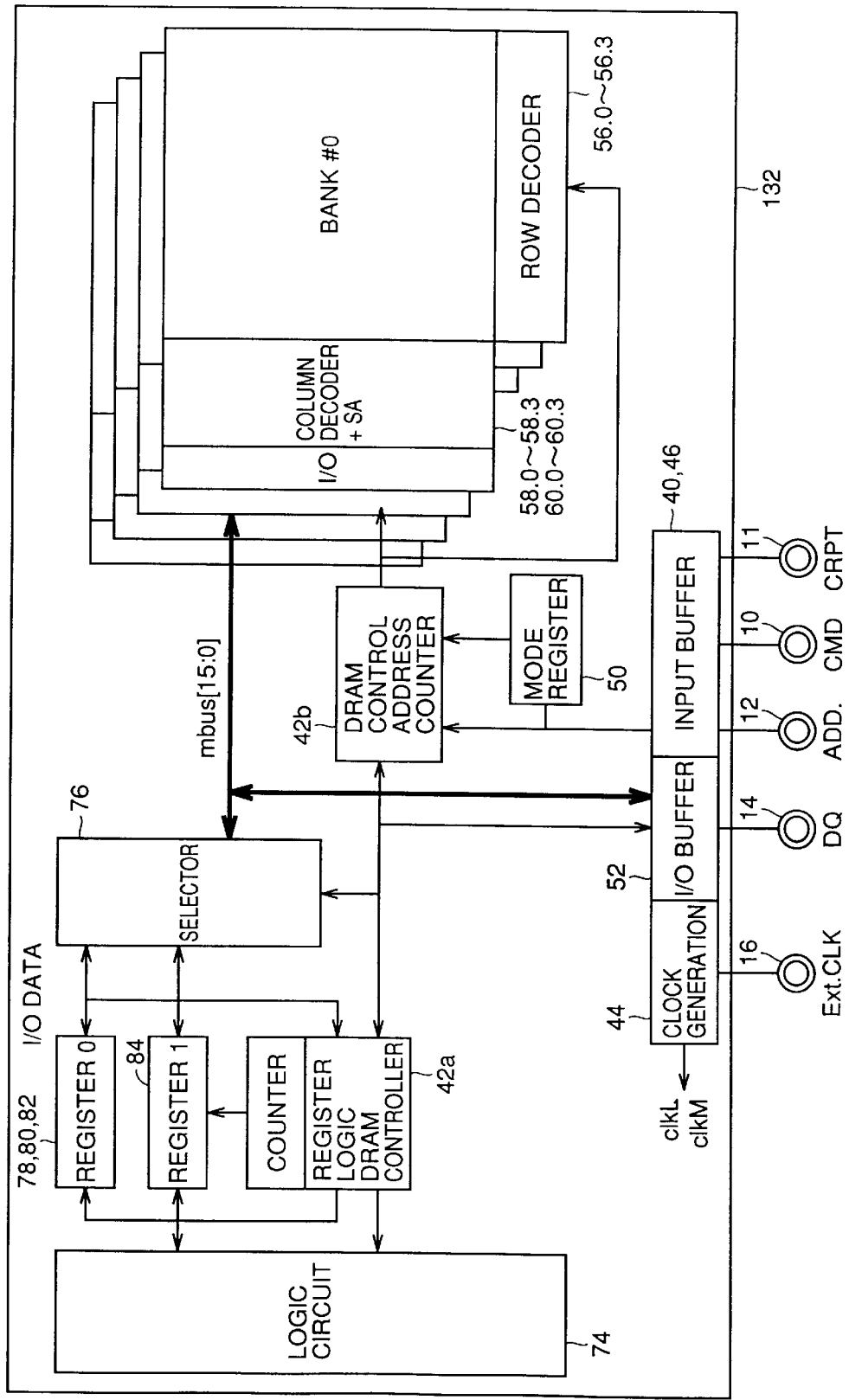
FIG. 61 is a schematic block diagram for describing a configuration of a logic integrated DRAM 132 of a fifth example of the present invention.

FIG. 61 is a schematic block diagram for describing a configuration of a logic integrated DRAM 132 of a fifth example of the present invention.

A configuration of the logic integrated DRAM 132 of the fifth example shown in FIG. 61 is almost the same as of the logic integrated DRAM 130 of the fourth example shown in FIG. 45.

The logic integrated DRAM 132, however, is different from the logic integrated DRAM 130 of the fourth example in that the second register 86 is deleted and input/output of data on the logic circuit 74 is performed through the first register 84.

The other points are basically similar to corresponding points in configuration of the logic integrate DRAM 130 of the fourth example shown in FIG. 45; therefore the same symbols are attached to the same constituents and no description thereof is repeated.

[Register-Register Operation]

Next, description will be given of a register-register operation of the logic integrated DRAM 132 of the fifth example shown in FIG. 61.

Figure 62:
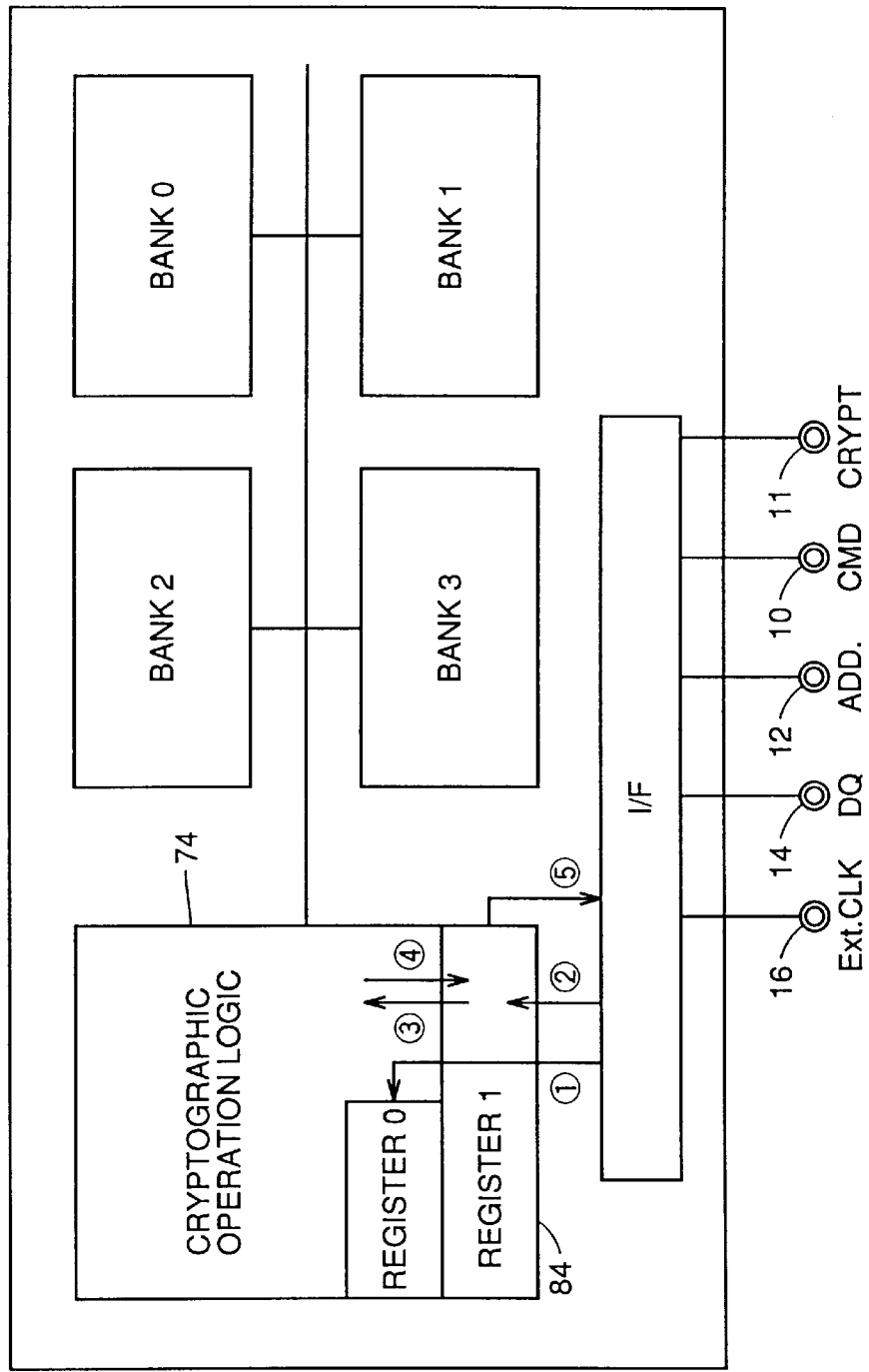
FIG. 62 is a conceptual block diagram for describing a register-register operation of the logic integrated DRAM 132 of the fourth example.

FIG. 62 is a conceptual block diagram for describing the register-register operation of the logic integrated DRAM 132 of the fourth example.

The operation is similar to the operation of FIG. 46 except that the logic circuit 74 performs supply/reception of data through the register 84.

Figure 63:
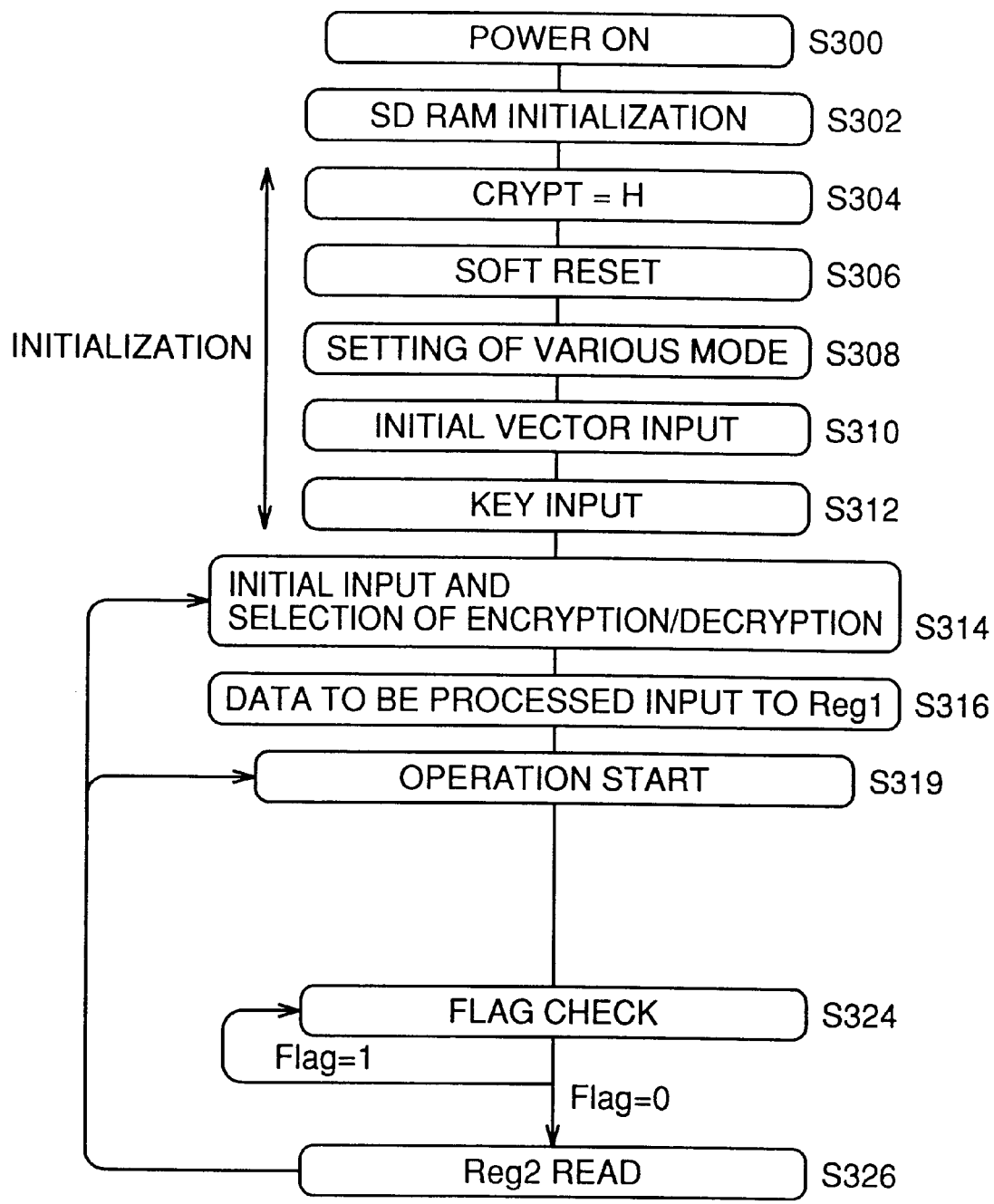
FIG. 63 is a flow chart for describing an operation of the logic integrated DRAM 132 in a more detailed manner.

FIG. 63 is a flow chart for describing such an operation of the logic integrated DRAM 132 in a more detailed manner, which is comparable to FIG. 47.

In comparison with FIG. 47, the processing operation gets started in step S319 instead of in steps S318, S320 and S322.

Figure 64:
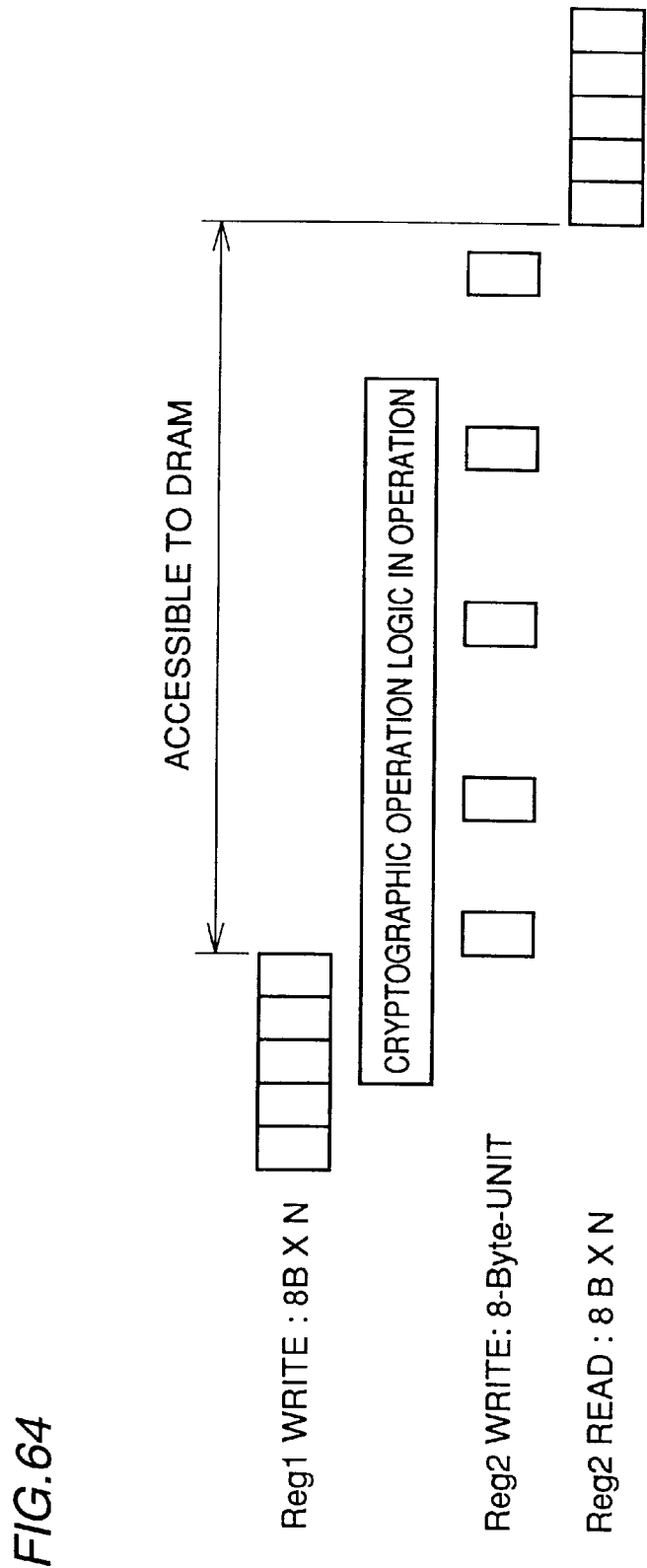
FIG. 64 is a timing chart for describing an operation of the logic integrated DRAM 132 in the processing flow as shown in FIG. 61.

FIG. 64 is a timing chart for describing an operation of the logic integrated DRAM 132 in the processing flow as shown in FIG. 61.

The DRAM section can be accessed except a period in which write and read on the first register 84 are performed even during operation of the cryptographic operation logic circuit 74.

Figure 65:
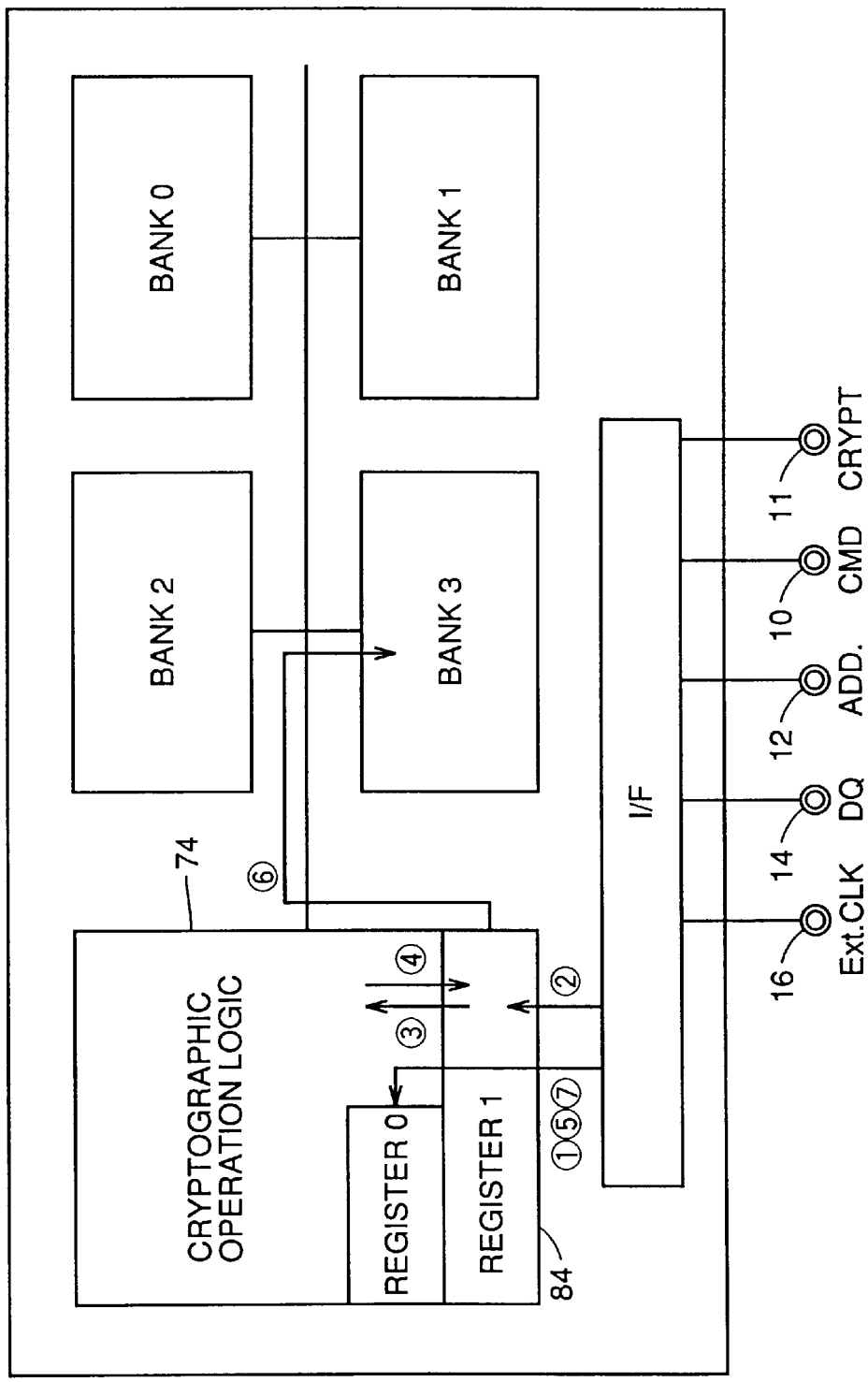
FIG. 65 is a conceptual block diagram for describing the register-DRAM operation of the logic integrated DRAM 132 shown in FIG. 61.

FIG. 65 is a conceptual block diagram for describing the register-DRAM operation of the logic integrated DRAM 132 shown in FIG. 61.

The operation is similar to that of FIG. 49 except that the logic circuit 74 performs supply/reception of data through the register 84.

Figure 66:
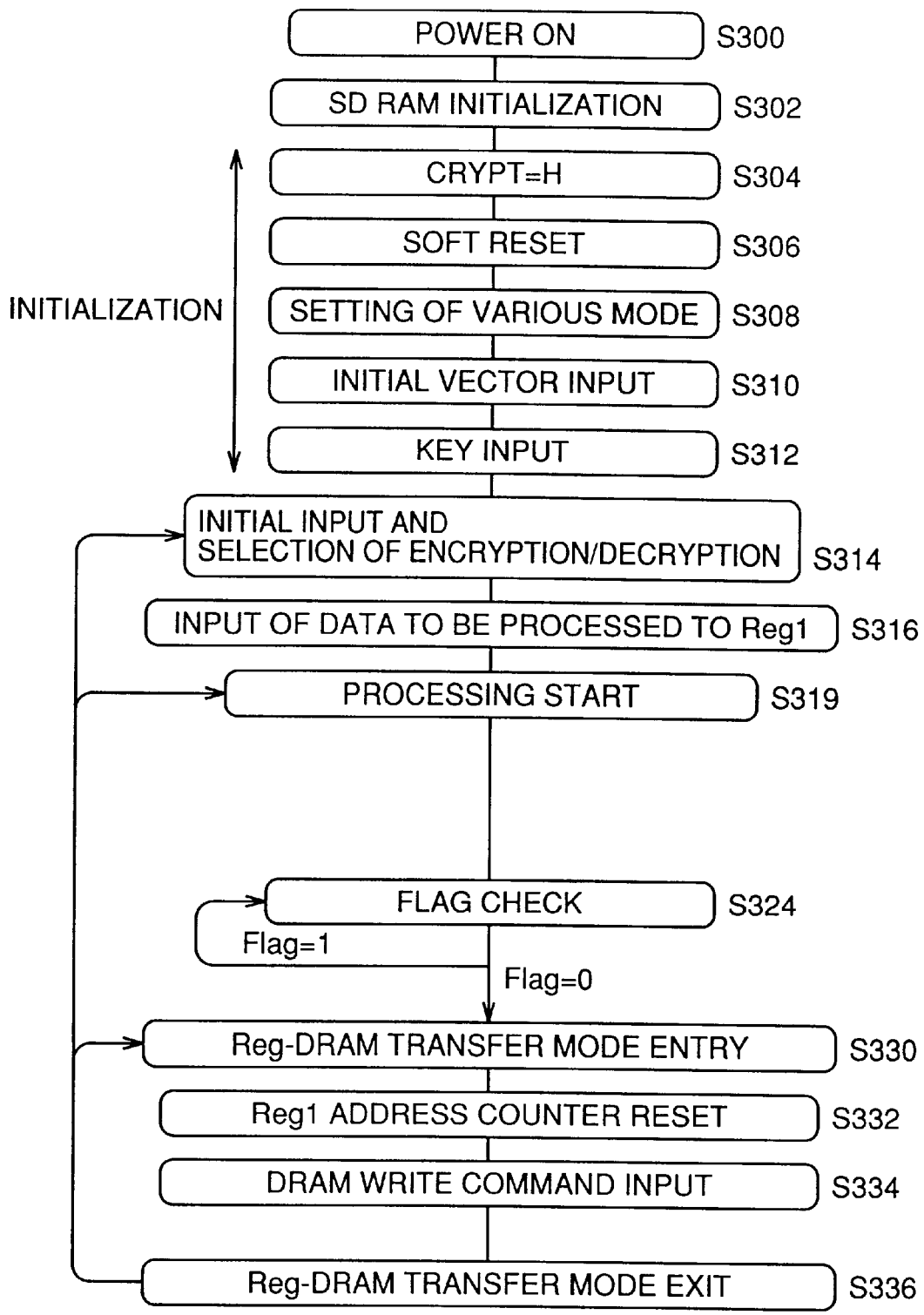
FIG. 66 is a flow chart for describing more of details of the operation described in FIG. 65.

FIG. 66 is a flow chart for describing the operation described in FIG. 65 in a more detailed manner.

In comparison with FIG. 51, the processing operation gets started in step S319 instead of in steps S318, S320 and S322.

Note that an operation similar to all the operation described in the fourth example can also be realized if read and write can be simultaneously performed and a band width is doubled by adopting a configuration of the first register 84 with dual ports.

Furthermore, data D stored in the register 84 is processed in the logic circuit 74 and a processing result thereof is written into the register 84 in its originally stored place. By doing so, in the fifth example, one address counter can be sufficient while in the fourth example, the configuration is adopted in which separate address counters are provided to the first and second registers, respectively.

Still furthermore, when data of the minimum operation unit is stored into the register 84 and processing gets started at that time, a configuration can be adopted in which the data corresponding to the count CT2 shown in FIG. 50 is processed and a processing result thereof is written into an original place with the count CT2 as a reference.

Note that by utilizing the register-DRAM transfer mode, similar to the configuration of the fourth example even in the configuration of the fifth example, an effective utilization of the bus can be realized if the bus is open to other chips.

First Modification of Fifth Example

Figure 67:
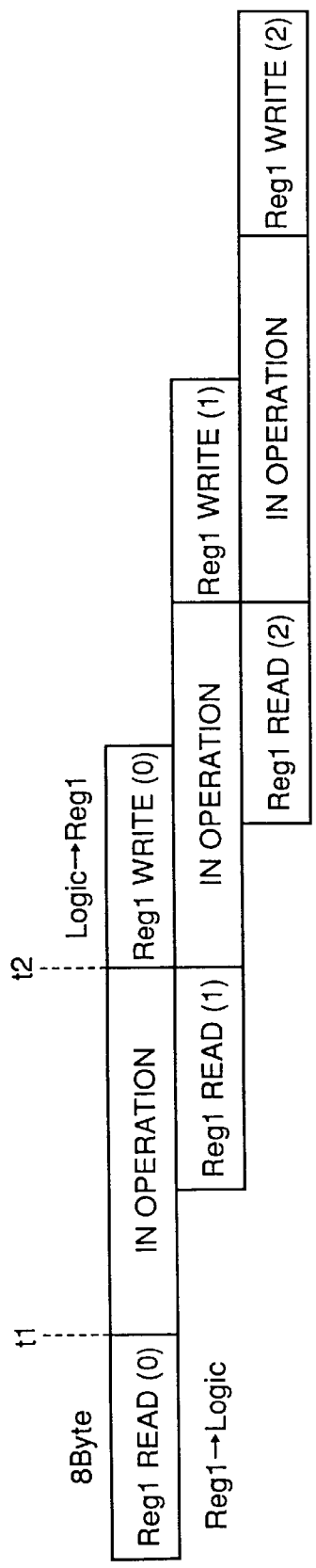
FIG. 67 is a conceptual drawing for describing data transfer processing between the register 84 and a logic circuit 74 in a first modification of the fifth example.

FIG. 67 is a conceptual drawing for describing data transfer processing between the register 84 and a logic circuit 74 in a first modification of the fifth example.

Referring to FIG. 67, the logic circuit 74 read ahead next data in advance during a current operation. By performing such processing, since contents of the register 84 are read during the operation between time points t1 to t2, therefore data of a processing result can be immediately written to the register 84 and outputted at a time point t3 when the operation is completed.

Second Modification of Fifth Example

Figure 68:
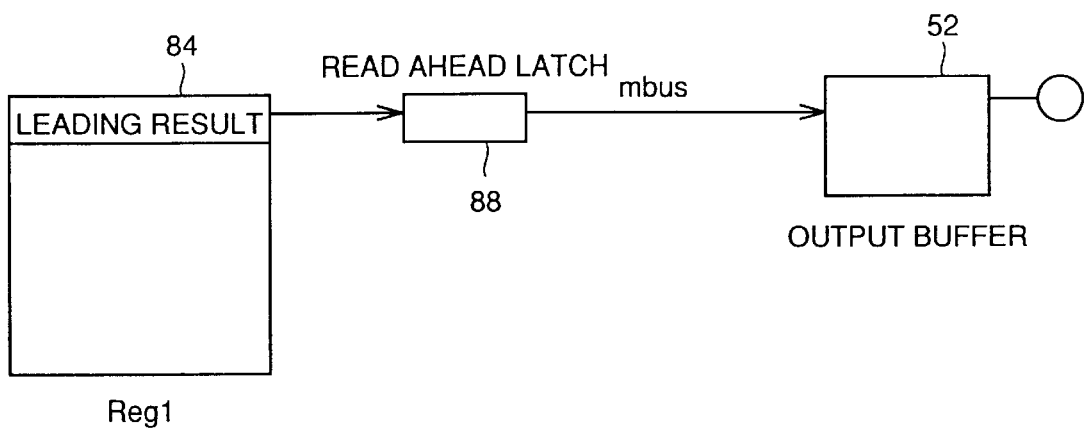
FIG. 68 is a conceptual block diagram for describing a route from the register 84 to a data output in a second modification of the fifth example.

FIG. 68 is a conceptual block diagram for describing a route from the register 84 to a data output in a second modification of the fifth example.

A configuration is adopted in which a read ahead latch circuit 88 is provided between the register 84 and the I/O buffer 52. That is, when processing is completed in the logic circuit 74, the leading operation result is read in advance into the read ahead latch circuit 88 from the register 84 and held in the read ahead latch circuit 88.

Timing of data output from the register 84 to the data I/O terminal 14 is required to be the same as, for example, that in a general purpose SDRAM. With such a configuration, no chance arises that timing of data output is delayed even if data is outputted to the data I/O terminal 14 after an external command is accepted.

[DRAM-Register Operation Mode of Fifth Example]

Figure 69:
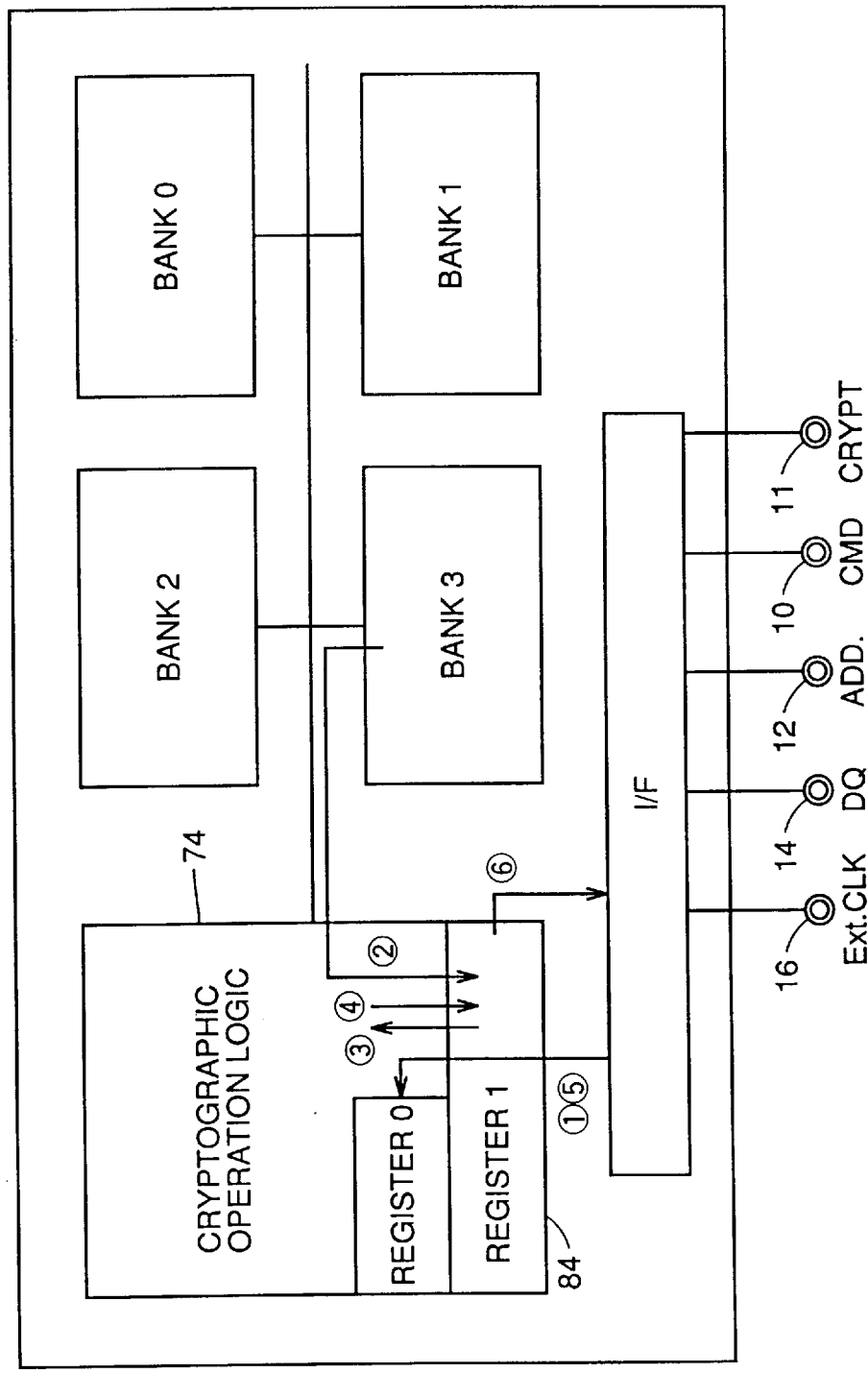
FIG. 69 is a conceptual block diagram for describing the DRAM-register operation mode.

FIG. 69 is a conceptual block diagram for describing an operation mode in which data stored in advance in the DRAM section is enciphered in the logic circuit 74 and thereafter outputted to the outside, that is the DRAM-register operation mode, in the fifth example.

The operation is similar to the operation of FIG. 56 except that the logic circuit 74 performs supply/reception of data through the register 84.

Figure 70:
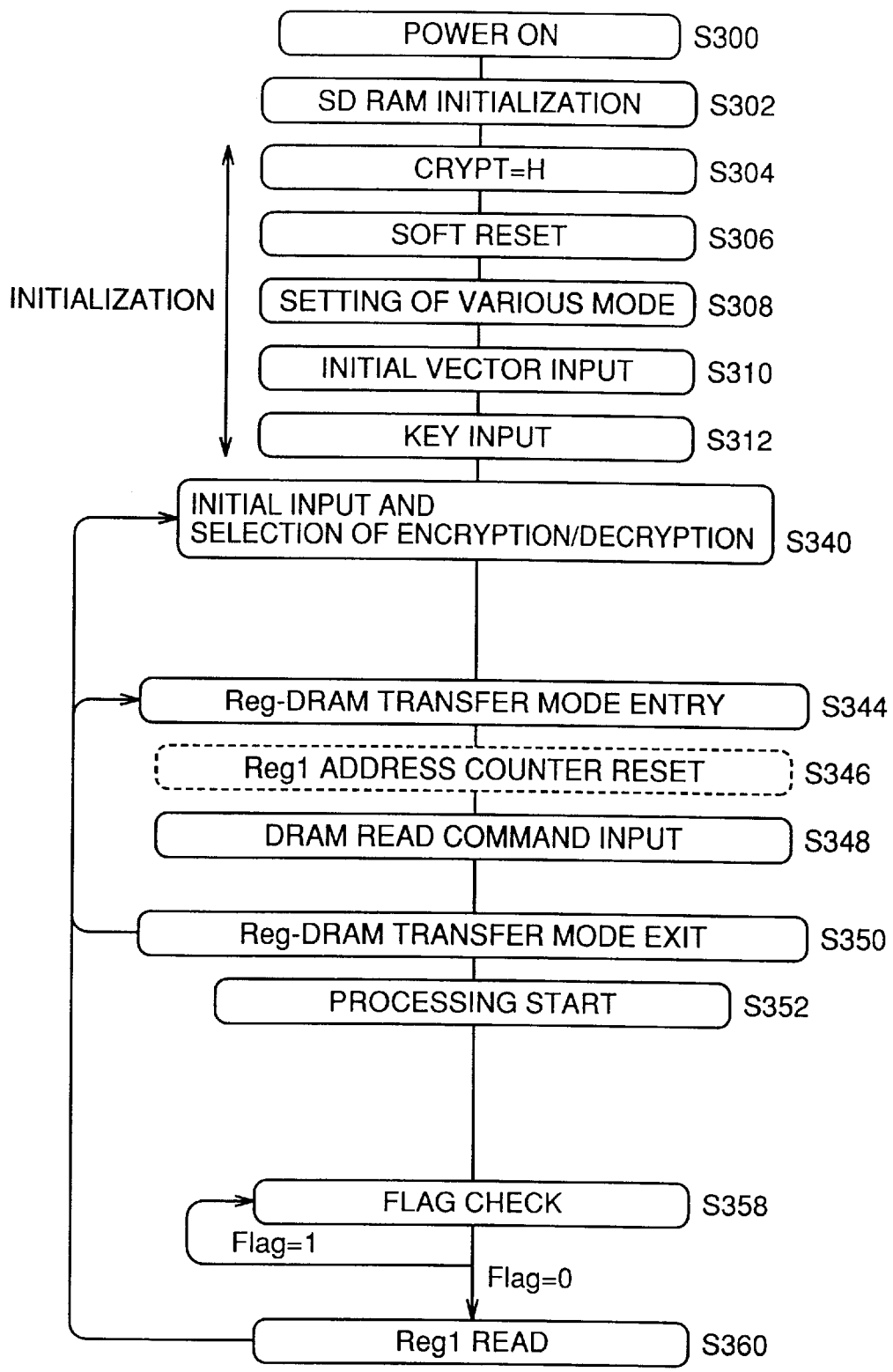
FIG. 70 is a flow chart for describing more of details of the operation described in FIG. 69.

FIG. 70 is a flow chart for describing more of details of the operation described in FIG. 69.

In comparison with FIG. 57, steps S342 and S356 are deleted and data read is performed in step S360' instead of in S360.

By performing processing as described above, a processing result can be transferred to the outside from the first register 84.

Note that in this case as well, an operation similar to that in the fourth example can also be realized if write and read can be simultaneously performed and a band width is doubled by adopting a configuration of the first register 84 with dual ports.

Furthermore by using the register-DRAM transfer mode similar to the fourth example, a standby current can be reduced by a great margin.

Sixth Example

A configuration will be described in which no obstacle is given to encryption even when an autorefresh command is given externally to the logic integrated DRAM 130 shown in FIG. 45 or the logic integrated DRAM 132 shown in FIG. 61.

First, the address counter 42b includes row address counters provided to the respective banks in the configuration shown in FIG. 45.

Figure 71:
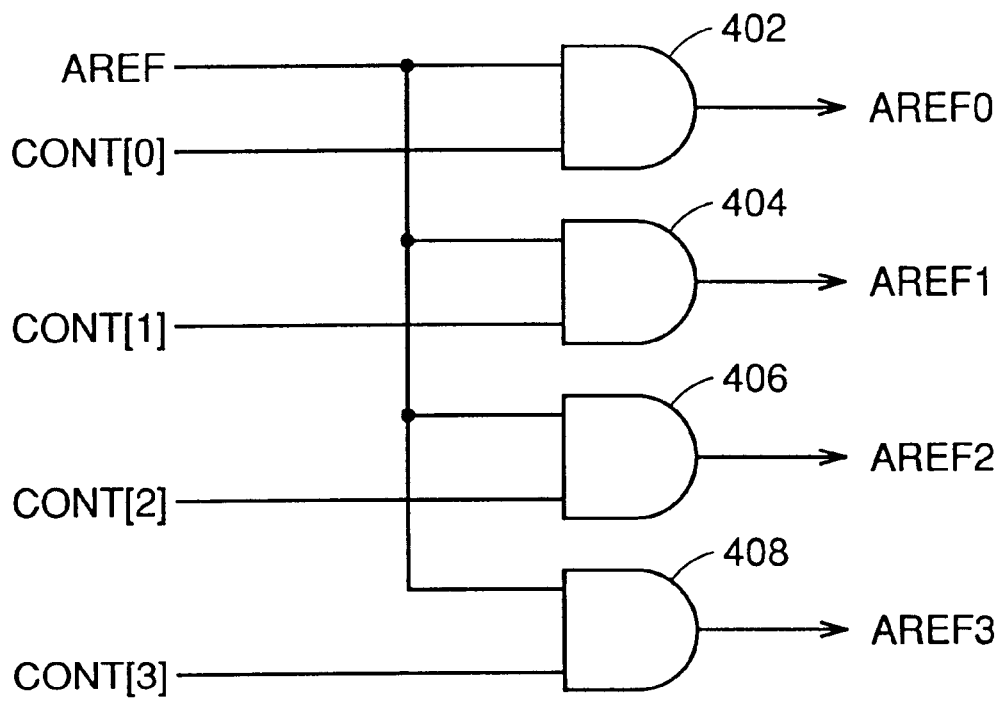
FIG. 71 is a block diagram representing a circuit configuration generating an internal command for autorefresh.

FIG. 71 is, in such a configuration, a block diagram representing a circuit configuration generating an internal command for autorefresh.

An autorefresh command given externally is given to one input ends of AND circuits 402, 404, 406 and 408.

On the other hand, to the other input ends of the AND circuits 402 to 408, given are respective signals CONT [0] to CONT[3] indicating which of banks is specified to a bank for use in encryption and performs supply/reception with a register. For example, when the DRAM section is not specified for use in encryption, [CONT[0] to CONT[3]]=[1, 1, 1, 1].

On the other hand, when a bank for use in encryption is a bank #0, [CONT[0] to CONT[3]]=[0, 1, 1, 1]. In this case, autorefesh internal commands AFREF1 to AREF3 for the banks #1 to #3 are activated, while a signal AREF0 for the bank #0 is not activated. Therefore, a bank specified for use in encryption receives no influence of an external autorefesh command.

When it is stored in any of the registers that an autorefresh command has been given, the bank#0 has only to receive autorefresh after the encryption is completed.

Seventh Example

The logic integrated DRAMs 130, 132 and so on can be further added with a function as will be described below in order to achieve further decrease in power consumption.

That is, first, a function can be added such that designation of a partial refresh mode can be possible.

That is, a memory space to be refreshed in a self-refresh mode can be designated with one bank as a unite. In this case, a configuration basically similar to the sixth example is provided and it is only required that an internal command for autorefresh is also generated for each bank.

Furthermore, in order to reduce a standby current in a non-power down mode, a low power mode as described below can be set.

Figure 72:
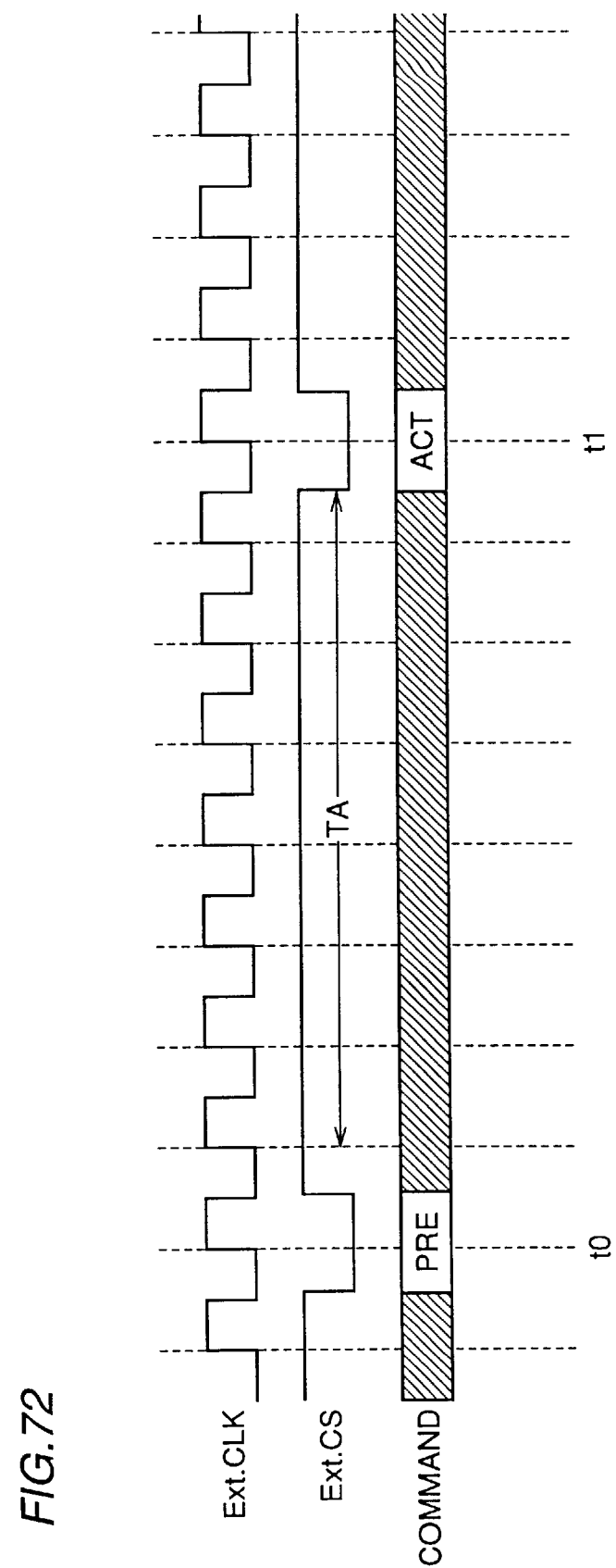
FIG. 72 is a timing chart representing a method for entry to a low power mode.

FIG. 72 is a timing chart for describing such a low power mode.

Note that entry to the low power mode is controlled by whether a specific address assigned when inputting a mode register set command (MRS command) is inputted or a logic control space as described in FIG. 2 is assigned.

Referring to FIG. 72, at a time point t0, not only a chip select signal Ext. CS is activated (at "L" level), but the precharge command PRE is also given at an activation edge of the external clock signal Ext. CLK.

In the low power mode, during a period when as in a period TA of FIG. 72, the chip select signal is at "H" level, a bank is inactive and in addition during a period when no data is outputted, power consumption is cut as will be described below. That is, in such a period TA, the signals clkM and clkL are both inactive and first stage input buffers for the respective signals /RAS, /CAS, /WE and ADD are also inactive.

Figure 73:
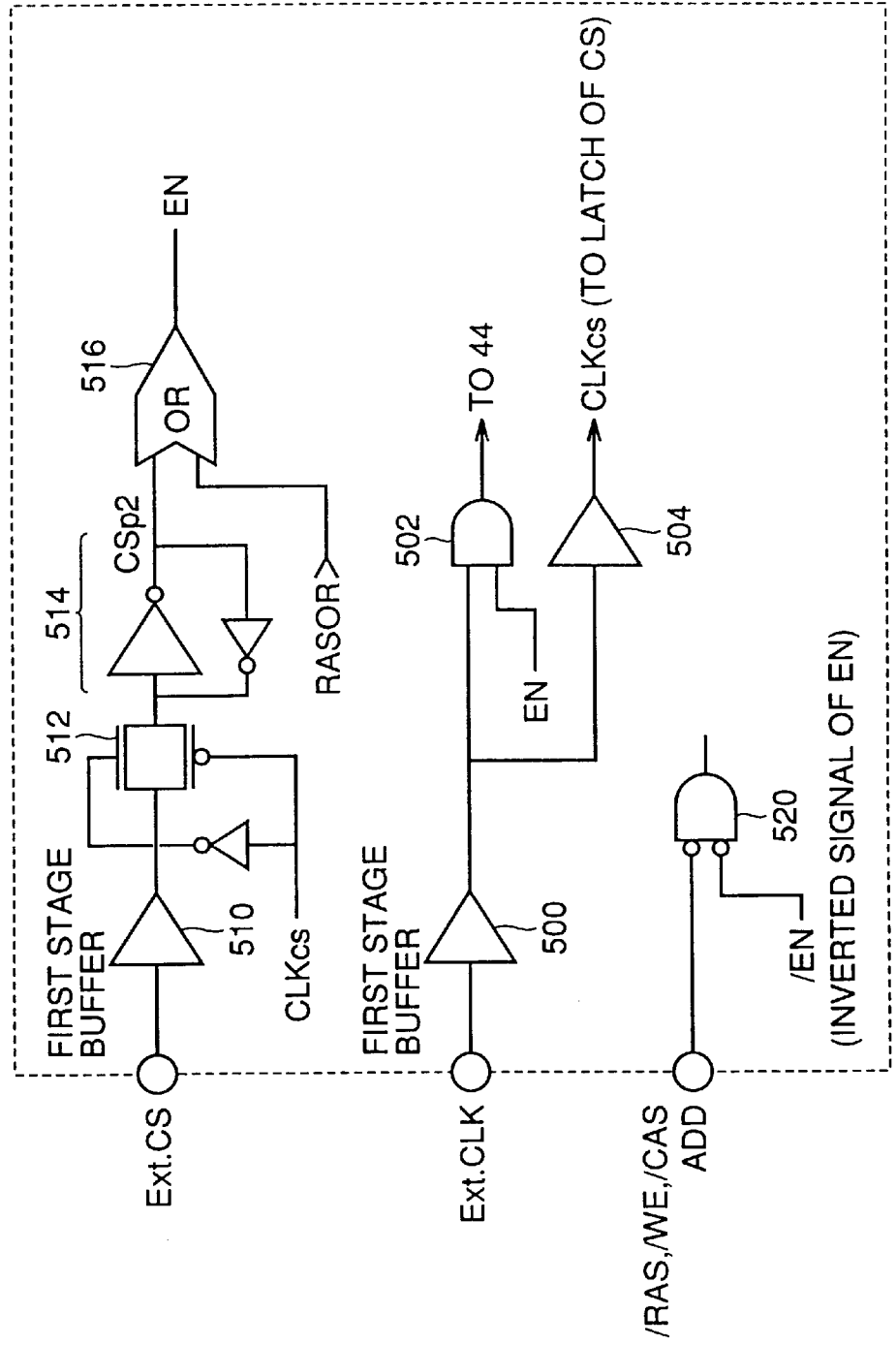
FIG. 73 is a diagram representing a circuit configuration performing control of input buffers 40 or 46 in the low power mode.

FIG. 73 is a diagram representing a circuit configuration performing control of an input buffer 40 or 46 in such a low power mode.

That is, after the external clock signal Ext. CLK is given to a first stage input buffer 500, the signal is further given to an internal clock generating circuit 44 through an AND circuit 502 activated by the signal EN. On the other hand, an output of the first stage input buffer 500 is given to a chip select signal input buffer as a signal CLKcs through an immediately subsequent stage buffer 504.

The chip select signal input buffer includes: a first stage buffer 510 receiving a signal Ext. CS; a transfer gate 512 controlled by a signal CLKcs; a latch circuit 514 for holding an output of the transfer gate 512 to output a signal CSp2; and an OR circuit 516 receiving a signal RASOR, a result of a logical sum operation between the signal CSp2 and the internal RAS signal for each bank to output the signal EN.

In the buffer circuits 40 and 46, a logic gate 520 receiving the command signals /RAS, /WE or /CAS, or the address signal ADD other than the chip select signal and the signal CKE is a NOR circuit receiving a corresponding one among the signals at one input thereof and further receiving an inverted signal /EN of the signal EN at the other input end thereof.

Figure 74:
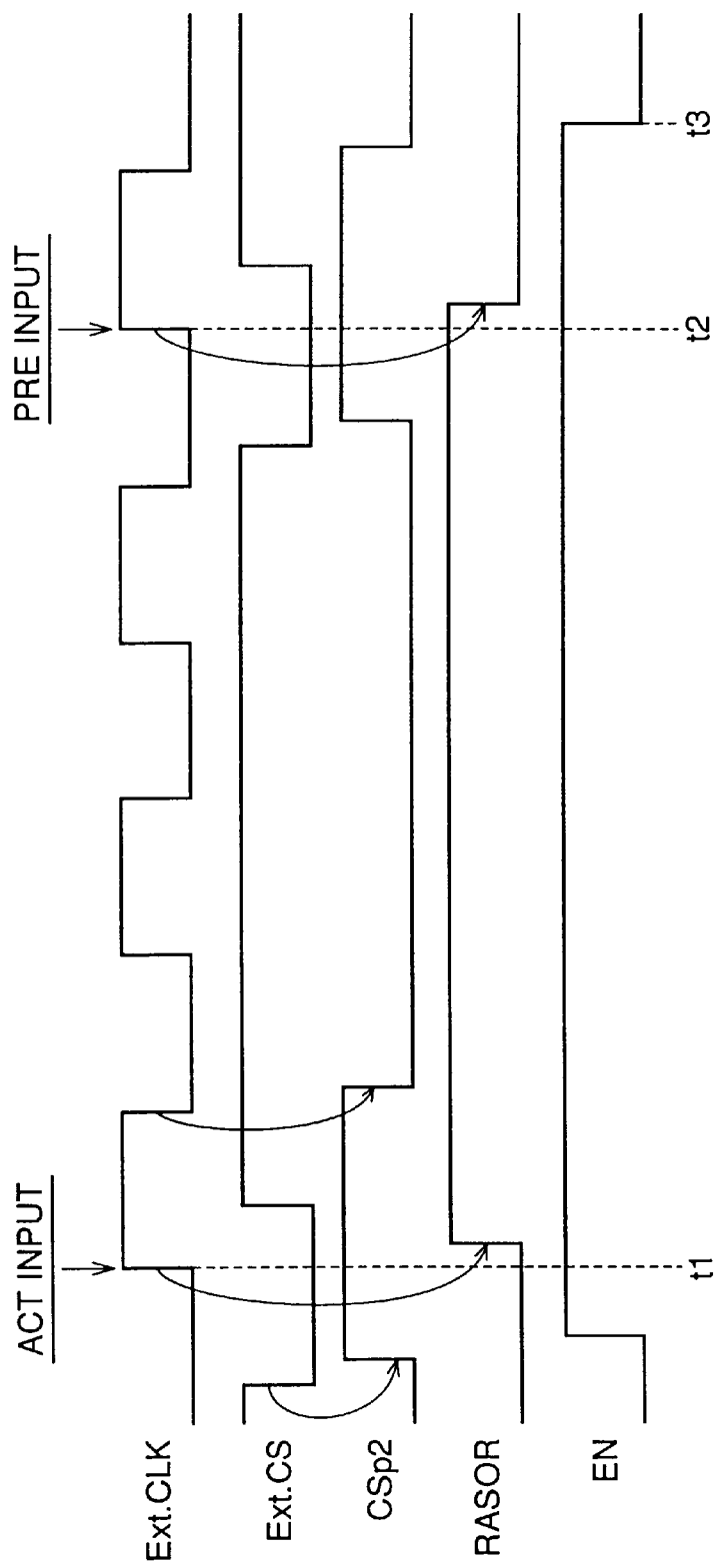
FIG. 74 is a timing chart for describing an operation of the circuit shown in FIG. 73.

FIG. 74 is a timing chart for describing an operation of the circuit shown in FIG. 73.

When an ACT command is given at a time point t0, the signal EN is activated to activate the logic gate 520.

On the other hand, when the chip select signal Ext. CS is activated and the precharge command PRE is given at a time point t2, the signal EN is deactivated at a time point t3 to deactivate the logic gate 520 as well. Furthermore, the external clock signal Ext. CLK is not given to the internal clock generating circuit 44 and none of the internal clock signals clkM and clkL are generated. However, when output of data still continues even after a precharge command is inputted, the signal clkM is active during the data output.

Therefore, power consumption in the low power mode can be reduced.

Eighth Example

Figure 75:
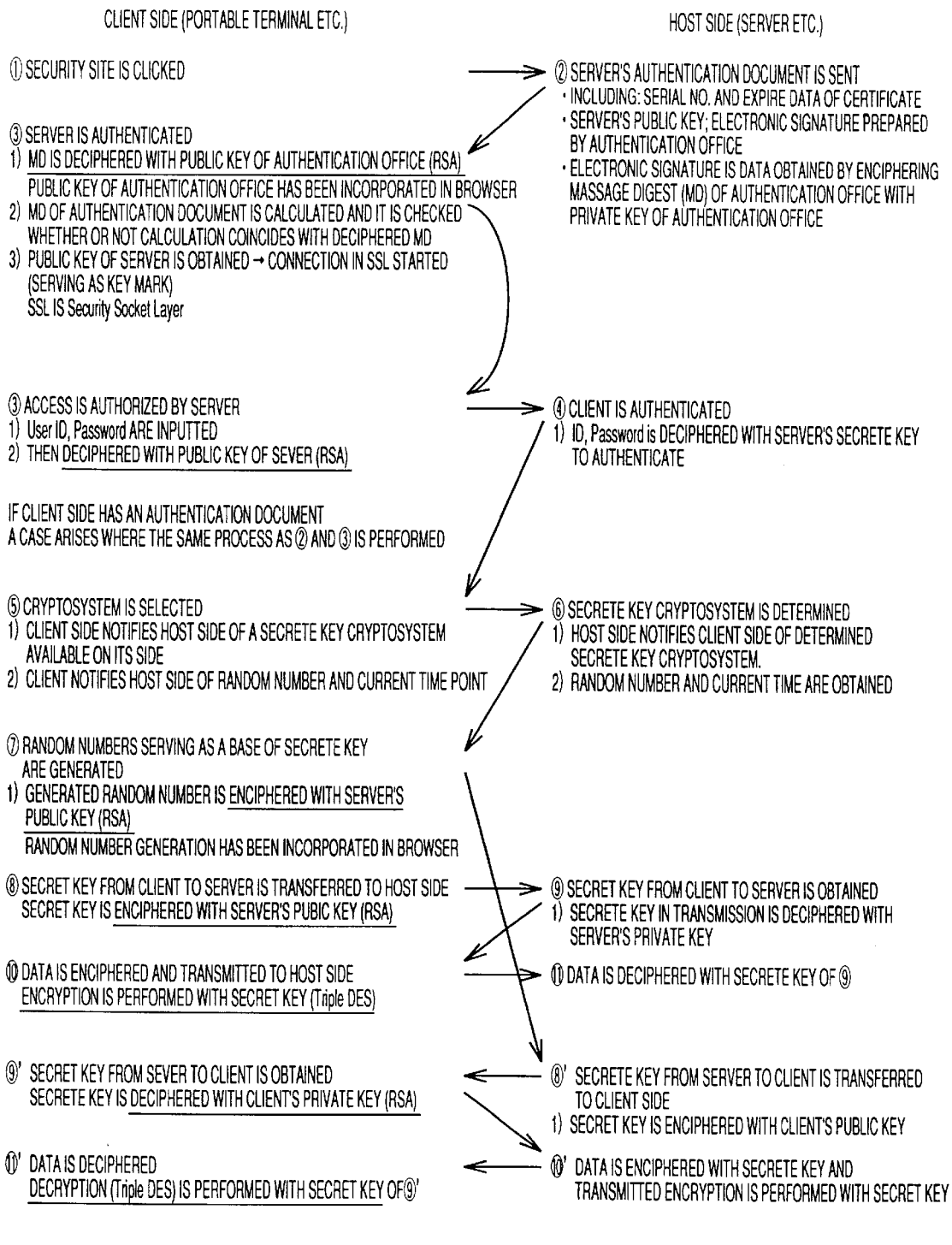
FIG. 75 is an illustration for simply describing processing of security data communication on the internet.

FIG. 75 is an illustration for simply describing processing of security data communication on the internet.

[1] A security site is clicked on a client side.

[2] In response to this, a host side (a server etc.) sends a server's authentication document. The server's authentication document includes: a serial number of a certificate and an expire data thereof, a public key of a sever, an electronic signature prepared by an authentication office, wherein the term "electronic signature" means data obtained by enciphering a massage digest (MD) of the authentication office with a private key (or secrete key) of the authentication office.

[3] Subsequent to this, authentication of the sever is performed on the client side.

Details of the above described procedure are as follows:

First, 1) A message digest is deciphered with the public key of the authentication office (*). The public key of the authentication office has been generally incorporated in a browser.

2) A message digest of the authentication document is calculated and it is checked whether or not the calculation coincides with a deciphered message digest.

3) A public key of the server is obtained.

By following the above described procedure, for example, connection in SSL (Security Socket Layer) gets started. Then, processing from the client side to the server is performed in order to receive its authorization to access to the server.

For example, a user ID, a password and others are sent to the host (server) after encryption with the public key of the server (*).

In the processing, if the client side has an authentication document, a case arises where the client side performs the same operations as the above described ones performed by the server.

4) Subsequently, the host side performs authentication of the client using a user ID and password of the user which has been sent to the host side.

That is, authentication processing is performed by deciphering the ID and password of the user using a secrete key of the server.

5) The client side performs selection of a secret key cryptosystem.

A secrete key cryptosystem which can be used is notified and a random number and a current time point is sent to the host side [1].

6) The host side determines a secret key cryptosystem and notifies the client side of which secrete key cryptosystem is adopted and obtains the random number and the current time point [2].

7) The client generates random numbers serving as a base of a secret key.

The random numbers generated are enciphered with the public key of the server and thereafter sent to the server (*).

8) Furthermore, the client side enciphers a secrete key in transmission from the client to the server with the public key of the server in order to transfer the secret key used in the transmission (*).

9) The host side deciphers the secrete key in the transmission from the client to the server with the private key (secrete key) to obtain the secrete key in the transmission.

10) The client side transmits necessary data after encryption on its side. At this time, encryption with the secrete key is performed. (*). For example, the Triple DES system is adopted.

11) The host side performs decryption of data with the secrete key obtained in 9).

On the other hand, the server side as well enciphers a secret key (session key) in transmission from the server to the client with the public key of the client in order to transfer the secret key in the transmission.

The client deciphers the secret key in the transmission from the server to the client with the private key (secrete key) of the client side to obtain the secret key in the transmission (*).

The host side transmits data to the client side after enciphering the data with the session key in transmission from the server to the client thus obtained.

The client side deciphers the data with the session key obtained in [9'].

In data communication as described above, the processing indicated by the symbol (*) can be performed with a semiconductor integrated circuit device 1 or a logic integrated DRAM relating to the present invention.

Note that if data that has been processed by encryption or the like is stored in the second register 86 and then read out from the second register, that is if the data is placed in the register-register operating mode, no control of the DRAM section from the microcomputer 90 is required since absolutely no access to the DRAM section arises. Furthermore, even if access to the DRAM section or a refresh request occurs during processing, the processing can be performed as was going prior to the access or the like.

While, in a secrete cryptosystem, encryption is performed with 64 bits as a unit, a necessity arises to perform padding according a rule when input data is less than 64 bits in length. In this case, the processing is performed by a semiconductor integrated circuit 1 or the logic integrated DRAM 30, and 130 up to immediately prior to the last data bits and the microcomputer 90 follows the processing to encipher the last data.

This is because since how much of padding is performed is properly changed according to data, this part can be better processed by the microcomputer 90 side to obtain a simpler and easier configuration as a system.

Furthermore, in the semiconductor integrated circuit device 1 or the logic integrated circuit, a configuration can be adopted in which two or more kinds of keys are retained on hand. The reason why is that since two kinds keys are used with an authentication office and a server, respectively, if the two kinds of keys are simultaneously retained on hand, no necessity arises that a key is newly loaded each time encryption is alternately performed with the authentication office or the server since keys are steadily used for the respective two uses.

Note that while in the above presented description, encryption is mainly focused on examples taken up as processing in a logic circuit incorporated on a semiconductor circuit device together with a memory section, it is specifically confirmed here that the present invention is not limited to the cases described in the examples. Processing performed by a logic circuit may be, for example, decryption or furthermore, image processing or the like.

Ninth Example

As described in FIGS. 21 to 31 of the first example, in a logic integrated DRAM relating to the present invention, cases arise in which a clock signal clkM for use in controlling operation of the DRAM section has an operating frequency ranging from a comparatively low value to a comparatively high value.

In the cases, if although the clock signal clkM operates at low speed, the DRAM section is controlled at timings according to the number of clocks similar to a case at high speed, a performance of the DRAM section has a chance to be degraded down to an unnecessary low level compared with expectation for the clock signal at the low speed due to the presence of an unnecessary operating margin.

In the following description, a configuration and operation of a logic integrated DRAM will be presented in which even when the clock signal clkM operates at a comparatively low frequency, an operation of the DRAM section is performed with high performance maintained.

[Interlock of Column Operation]

Figure 76:
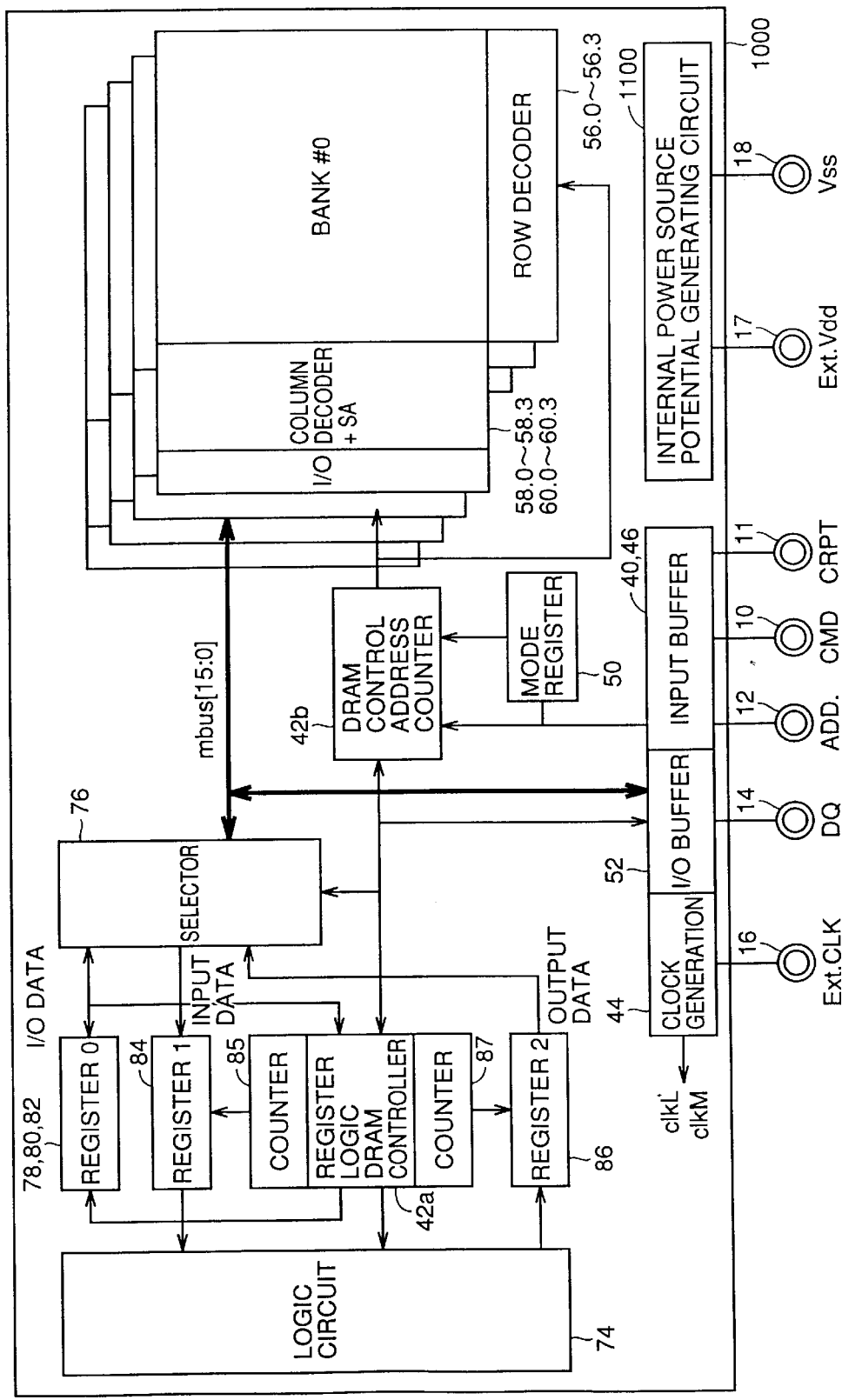
FIG. 76 is a schematic block diagram for describing a logic integrated DRAM relating to a ninth example of the present invention.

FIG. 76 is a schematic block diagram for describing a logic integrated DRAM relating to a ninth example of the present invention, which is the diagram comparable to that of FIG. 45 of the fourth example.

Since a configuration of a logic integrated DRAM 1000 relating to the ninth example has control of the DRAM section as a feature, a configuration associated with control of the DRAM section can also be applied to the logic integrated DRAM 132 shown in FIG. 61 of the fifth example.

Furthermore, since the configuration is to be associated with high performance in a low speed operation of the DRAM section, a configuration described below can also be applied to a configuration in which only DRAM is integrated on one chip.

At first, referring to FIG. 76, a configuration of a logic integrated DRAM 1000 is basically similar to the configuration of the logic integrated DRAM 130 shown in FIG. 45.

However, in FIG. 76, the configuration explicitly includes: an internal power source potential generating circuit 1100 for supplying an internal power source potential; a power source terminal 17 for supplying an external power source potential Ext. Vdd to the internal power source potential generating circuit 1100; and a power source terminal 18 for supplying a ground potential Vss to the internal power source potential generating circuit 1100.

As will be clear from the following description, since the configuration of the logic integrated DRAM 1000 of the ninth example is different from the configuration of the logic integrated DRAM 130 only in configurations of a DRAM control section and an address counter section 42b and a configuration of the internal power source potential generating circuit 1100; therefore, the same symbols are attached to the same constituents in configuration of FIG. 76 and no description thereof is repeated.

Figure 77:
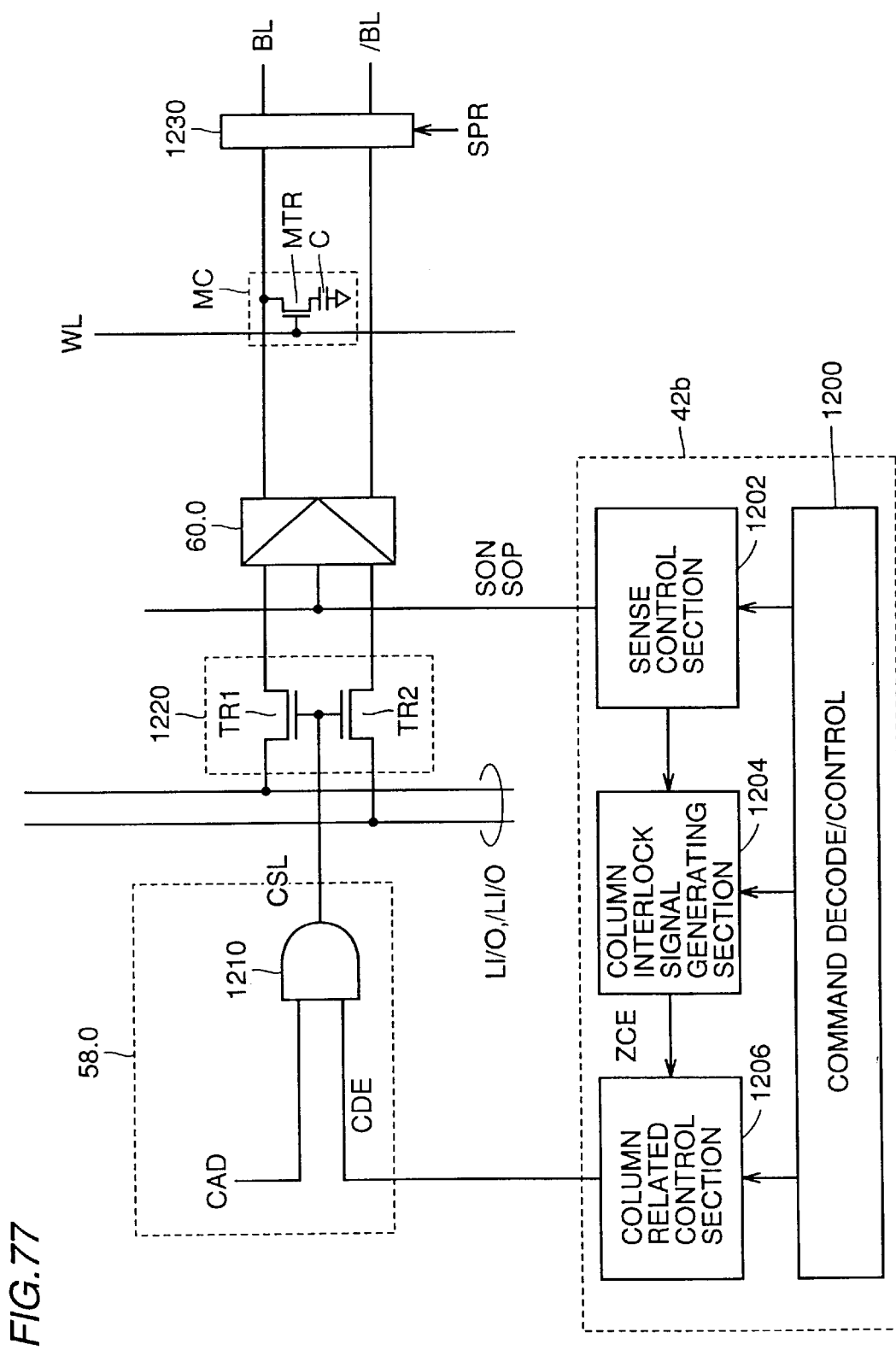
FIG. 77 is a schematic block diagram representing a configuration of a DRAM control section 42b, and a column decoder 58.0, a sense amplifier 60.0 and an I/O section provided to a bank #0, which are extracted.

FIG. 77 is a schematic block diagram representing a configuration of a DRAM control section 42b, and a column decoder 58.0, a sense amplifier 60.0 and an I/O section provided to a bank #0, which are extracted.

Referring to FIG. 77, the DRAM control section 42b includes: a command decode/control section 1200 receiving an input from the input buffer 40 to generate a command signal; a sense control section 1202 receiving an output from the command decode/control section to output signals SON and SOP for controlling an operation of the sense amplifier 60.0; a column interlock signal generating section 1204 for outputting a column interlock signal ZCE as will be described, according to an output from the sense control section 1202; and a column related control section 1206 for outputting a column decoder activation signal CDE according to control from the command decode/control section 1200 and the signal ZCE.

The column decoder 58.0 includes: a decoder 1210 receiving a column address decode signal CAD generated according to an address signal and a signal CDE from the DRAM control section 42b to output a signal CSL for selecting a memory cell column selected in the bank #0.

In the bank #0, provided is a bit line pair BL and /BL and at an intersection of a word line WL selected by a row decoder 56.0 and a bit line BL, provided is a memory cell MC including a memory cell transistor MTR and a memory cell capacitor C.

Data stored in a memory cell MC is read out onto a bit line BL in response to activation of a word line WL and amplified by the sense amplifier 60.0 when it is activated by the activation signals SON and SOP. The data amplified by the sense amplifier 60.0 is read out onto an I/O line pair LI/O ad /LI/O from the bit line pair BL and /BL by that transistors TR1 and TR2 included in an I/O gate 1220 selected by the signal CSL are made conductive by the signal SCL.

Furthermore, a precharge circuit 1230 is provided correspondingly to the bit lines BL and /BL for equalizing and precharging the bit lines BL and /BL of the bit line pair to a prescribed potential in response to the signal SPR from the DRAM control section 42b.

Figure 78:
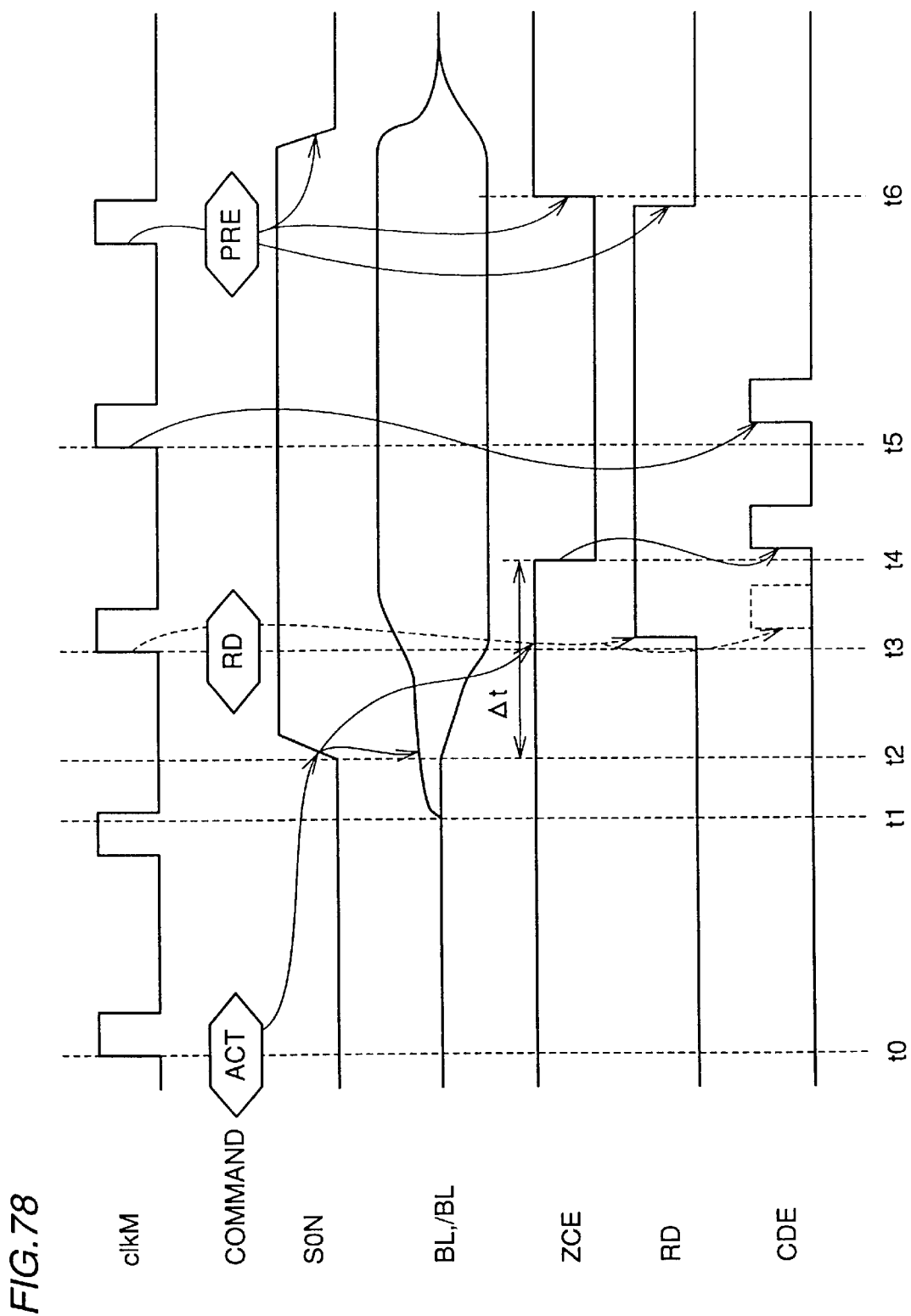
FIG. 78 is a timing chart for describing operations in which data is read out onto a bit line pair and further onto an I/O line pair LI/O and /LI/O.

FIG. 78 is a timing chart for describing an operation in which data from a memory cell MC is read out onto a bit line pair and further onto an I/O line pair LI/O and /LI/O in the configurations shown in FIG. 77.

Major commands are an ACT command and a read or write command in a synchronous DRAM (hereinafter referred to as SDRAM). The read and write commands are required to be time-separated from each other by a value defined with a time tRCD.

For example, in a case where a specification value of the time tRCD is 20 ns with a clock signal clkM of 100 MHz in operating frequency, the time tRCD is defined so as take a value tRCD=2×clkM as a function of a frequency of the clock signal clkM.

In a case where tRCD is defined in such a way, however, if a clock cycle is any less that 10 ns, for example if tRCD is 9.5 ns, the time tRCD is required to be set tRCD=3clkM instead of the rule in order to satisfy the specification value 20 ns.

However, after a READ/WRITE command is inputted, if a spare is available in a timing margin for read or write operation on the DRAM section, a timing of an operation associated with the time tRCD, that is timing of an operation of the sense amplifier and a time required between when the data is read out by the sense amplifier 60.0 and when the data is further read out onto the I/O line pair LI/O and /LI/O, is properly adjusted and thereby, the time tRCD can be maintained 2 clocks unchanged even when a cycle of the clock signal clkM becomes 9.5 ns as exemplified above.

That is, if a timing of the signal ZCE described in FIG. 77 is adjusted, an operation of the DRAM section can be of high performance as will be described below.

Referring to FIG. 78, the ACT command is inputted at an timing of activation of the clock signal clkM at a time point t0.

In response, at a time point t1, a level of a word line WL enters an active state to read out data from the memory cell MC onto the bit line BL. Successively, in response to activation of the ACT command at the time point to, the sense amplifier activation signal SON outputted from the sense control section 1202 goes to "H" level at a time point t2 and thereby, amplification of voltages read out onto the bit line pair BL and /BL are performed.

Then, at a time point t3, when a time of 2 clocks elapses after the clock signal clkM enters an active state at the time point t0, a read command (hereinafter referred to as RD for short as well) is given in response to activation of the clock signal clkM. In response, a signal RD which is at "H" level during the burst read is outputted from the command decode/control section 1200 to the column related control section 1206. At this time point, however, the column interlock signal ZCE becomes "H" level to suppress activation of the signal CDE outputted from the column related control section 1206.

That is, while the signal RD for activating the signal CDE is given to the column related control section 1206 from the command decode/control section 1200 at the time point t3 according to issuance of a command RD, the column related control section 1206 does not start an activation operation of the signal CDE during a period when the signal ZCE is in an active state.

The signal ZCE outputted from the column interlock signal generating circuit 1204 goes to "L" level at a time point t4 when a time length Δt elapses after the signal SON outputted from the sense control section 1202 is activated at a time point t2. In response, the signal CDE at an active level is outputted from the column related control section 1206.

In other words, when the column interlock signal ZCE is at "H" level, no column related operation gets started even if a READ command (or a WRITE command) is inputted.

FIG. 78 shows here, with a dotted line, a timing at which the column enable signal CDE is activated when the column interlock signal generating section 1204 does not exist, in other words when no control by the column interlock signal ZCE exists.

When the column interlock signal ZCE does not exist, there is a risk that the select signal CSL enters an active state before amplification by the sense amplifier 60.0 is completed and the bit line pair BL and /BL and the I/O line pair LI/O and /LI/O are connected to each other before a potential difference between the bit line pair BL and /BL is sufficiently amplified, with the result that data is destroyed.

As contrasted with this, when the column interlock signal ZCE exists as shown with a solid line of FIG. 78, the column decode enable signal CDE goes to "H" level at a timing at which the signal ZCE goes to "L" level after amplification of the potential difference level on the bit line pair BL and /BL is completed.

Therefore, by providing the interlock signal generating section 1204, the time tRCD can be maintained to be tRCD=2×clkM even when a clock cycle of the clock signal clkM becomes a little shorter than 10 ns.

In a case where a read operation or a write operation is performed in a burst mode, it is only required that the column decode enable signal CDE is activated with an activation edge of the clock signal clkM as a reference for datas subsequent to a first data on which a burst read operation or burst write operation is performed.

In FIG. 78, shown is that activation of the signal CDE for a second data is performed in response to activation of the clock signal clkM at the time point t5.

In an operation of a burst mode, this also applies to more of datas following first data in a similar way when the more of datas are read or written.

Moreover, at a time point t6, when the precharge command PRE is given in response to activation of the clock signal clkM, a precharge operation gets started and in response, the signal RD goes to "L" and in addition the column interlock signal ZCE is reset to "H" level.

Note that while in the above presented description, a case is taken up where a specification value of the time tRCD is 20 ns, the present invention is not limited to such a case. Accordingly, in a case where the specification value of the time tRCD is set at a prescribed value, the present invention can be applied in a similar way when the clock signal clkM is any less than one divided by an integer times the specification value.

Figure 79:
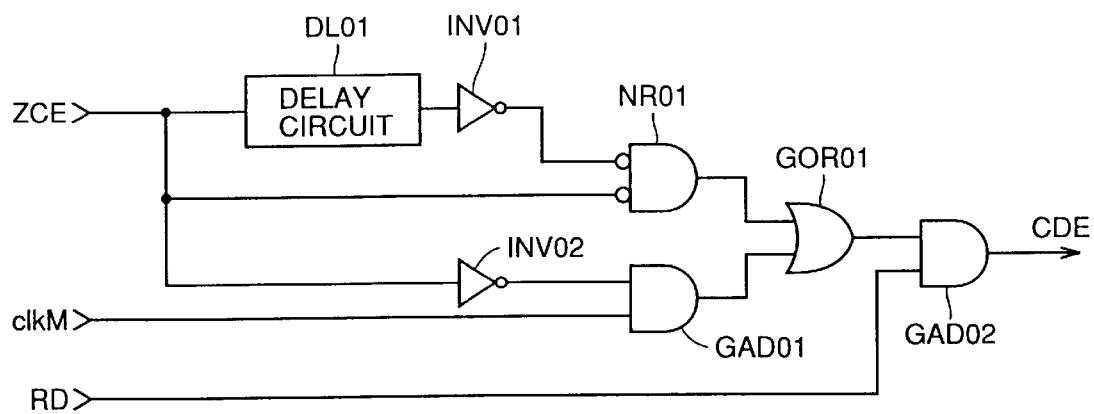
FIG. 79 is a diagram representing a configuration of a column related control section 1206.

FIG. 79 is a diagram representing a configuration of a column related control section 1206.

Referring to FIG. 79, the column related control section 1206 includes: a delay circuit DL0 receiving the signal ZCE; an inverter INV01 receiving and inverting an output of the delay circuit DL0; a NOR circuit receiving an output of the inverter INV01 and the signal ZCE; an inverter INV02 inverting the signal ZCE; an AND circuit GAD01 receiving an output of the inverter INV02 and the clock signal clkM; an OR circuit GOR01 receiving an output of the NOR circuit NR01 and an output of the AND circuit GAD01; and an AND circuit GAD02 receiving an output of the OR circuit GOR01 and the signal RD to output the signal CDE.

When the signal ZCE="H" level, the signal CDE is inactive (at "L" level) regardless of a level of the signal clkM. A one shot pulse with a pulse width corresponding to a delay time of the delay circuit DL0 is outputted as the signal CDE in response to a fall of the signal ZCE. Since the signal RD is at "H" level during a period of burst read as described above, the clock signal clkM is outputted as the signal CDE while the signal ZCE is at "L" level.

[Increase in Performance in Write-with-Autoprecharge Operation]

Figure 80:
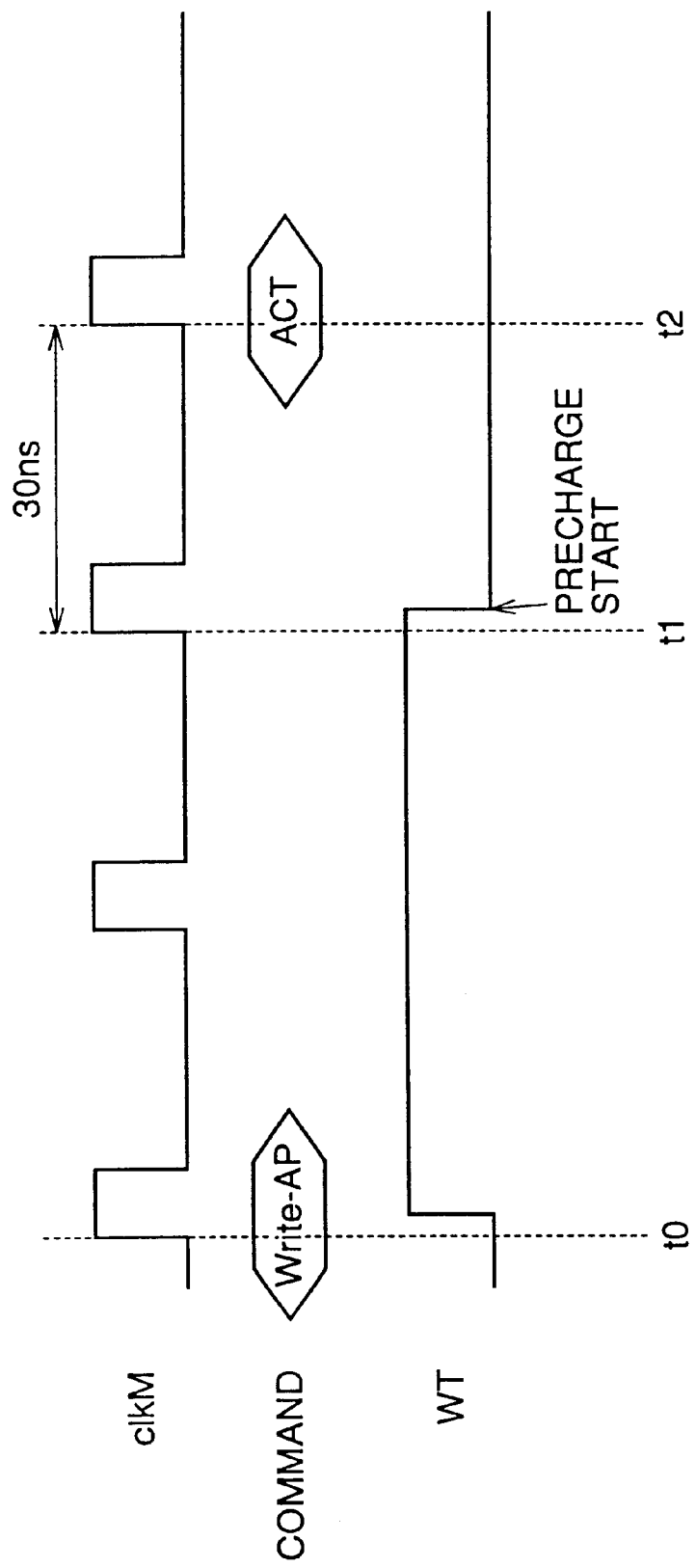
FIG. 80 is a timing chart representing timings when a prior art write-with-autoprecharge operation is performed.

FIG. 80 is a timing chart representing timings when a prior art write-with autoprecharge operation is performed. In FIG. 80, a case is shown where a burst length is 2 as an example.

In FIG. 80, shown is a write-with-autoprecharge operation with a burst length of 2 in system having such a comparatively low speed as a cycle tCLK=30 ns of the clock signal clkM.

At a time point t0, when the write-with-autoprecharge command Write-AP is inputted, a reference signal (a flag signal) WT indicating "in write operation" enters an active state to stay there for a period of 2 clocks.

Then, a precharge operation gets automatically started with an activation edge (a pulse edge in transition to "H" level) of the clock signal clkM at a time point t1 when a time of 2 clocks elapses as a reference.

As a result, it is required that a timing at which the ACT command is given at the next time is a timing at a time point t2 when one clock elapses after an activation timing of the clock signal clkM at the time point t1.

However, when a clock cycle of the clock signal clkM is sufficiently large, a case arises where a time margin till the next ACT command is given after the start of a precharge operation increases to an extent larger than necessary.

Figure 81:
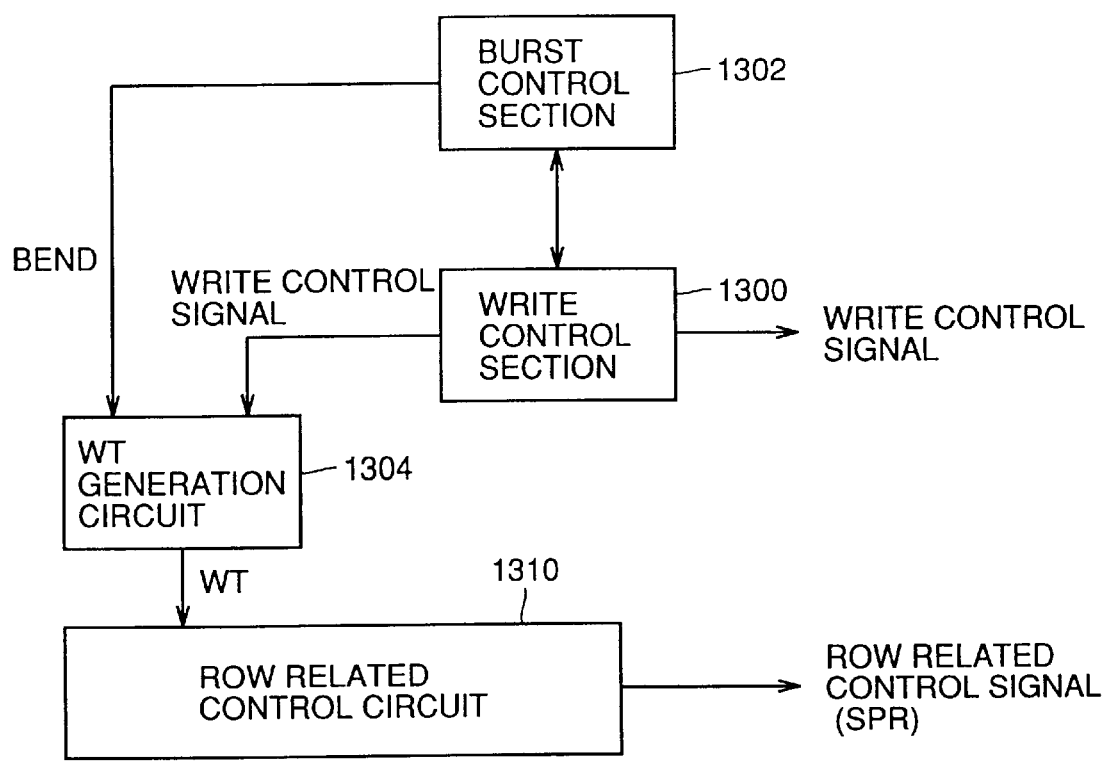
FIG. 81 is a schematic block diagram representing a configuration for control of a write operation, which is extracted.

FIG. 81 is a schematic block diagram representing a configuration for control of a write operation, which is provided in the DRAM control section 42b in the configuration of the logic integrated DRAM 1000 shown in FIG. 76 and which is extracted.

Referring to FIG. 81, a write control section 1300 generates a signal for controlling a write operation, for example a signal for determining an activation timing of a write driver.

A burst control section 1302 generates a signal for controlling a burst write operation in a write operation and a write control section 1300 generates a write control signal according to control of the burst control section 1302.

A WT generating circuit 1304 forces the flag signal WT for indicating "being in a state of write operation" into an active state in response to activation of a write control signal performed by the write control section 1300. The WT generating circuit 1304 further forces the signal WT into an inactive state ("L" level) in response to a burst end signal BEND indicating completion of the burst write operation outputted from the burst control section 1302.

The row related control circuit 1310 outputs a row related control signal, for example the signal SPR for activating a precharge operation, in response to deactivation of the signal WT.

Figure 82:
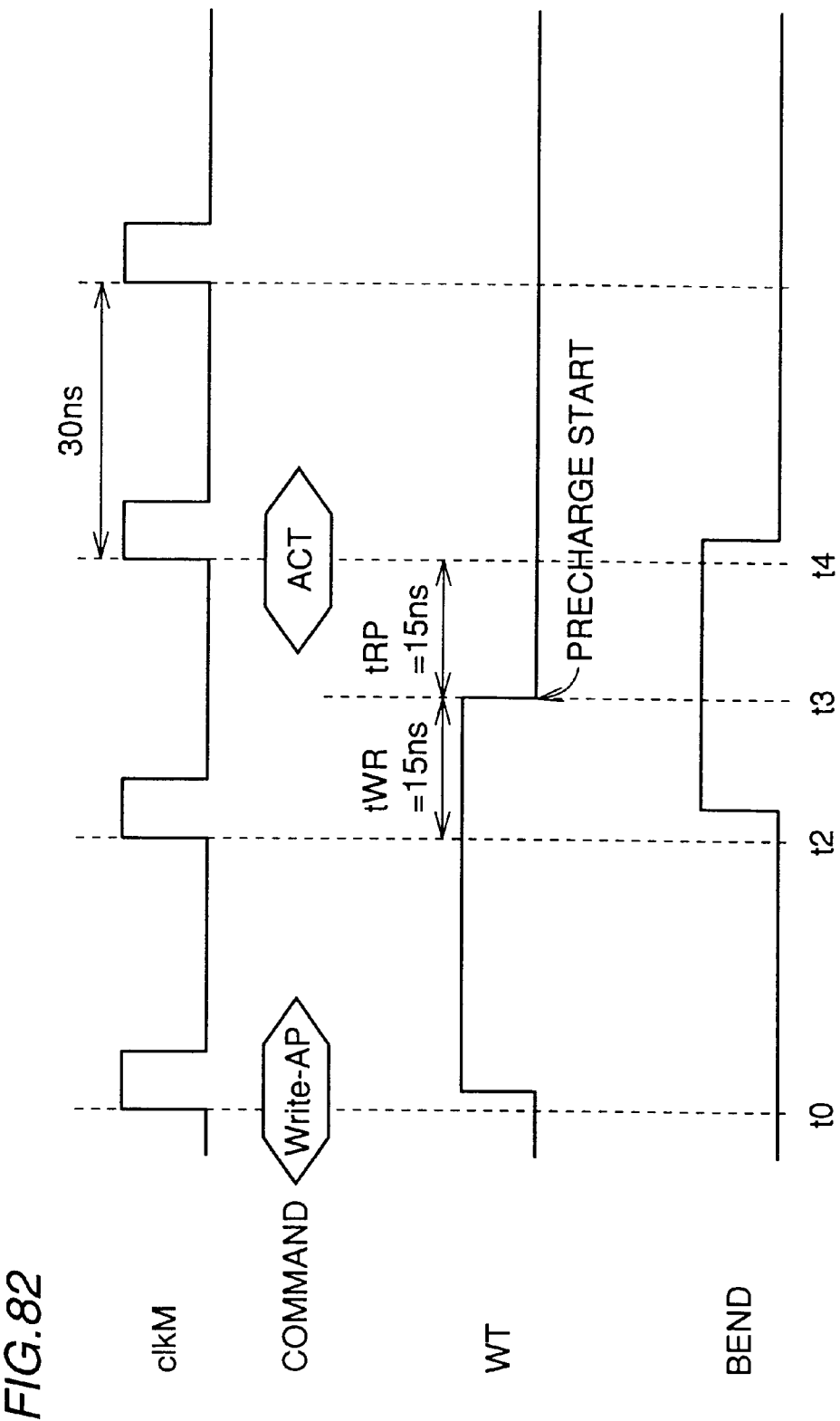
FIG. 82 is a timing chart for describing an operation of a write related control circuit shown in FIG. 81.

FIG. 82 is a timing chart for describing an operation of a write related control circuit shown in FIG. 81.

In operations shown in FIG. 82, description is given of a case where a cycle tCLK of the clock signal clkM is longer than a time (tWR+tRP) which is the sum of a margin time tWR for a write operation and a margin time tPR for performing a precharge operation.

At a time point t0, a WRITE-AP command for instructing a write-with-autoprecharge operation is given in response to an activation edge of the clock signal clkM.

In response to this, a write control signal is outputted from the write control circuit 1300 and the signal WT outputted from the WT generating circuit 1304 transitions to "H" level. The burst end signal BEND at an active level indicating completion of a burst operation in a case of a burst length of 2 is outputted from the burst control circuit 1302 in response to an activation edge of the clock signal clkM at a time point t2.

In the WT generating circuit 1304, the signal WT is forced into an inactive state (at "L" level) at a time point t3 when a time length tWR elapses after activation of the signal BEND.

In response to this, the row related control circuit 1310 outputs a control signal SPR for starting a precharge operation.

Since the precharge operation is completed when a time length tRP elapses after a time point t3, it becomes possible to give the ACT command at a time point t4 of the next clock activation edge subsequent to an activation edge of the clock signal clkM at a time point t2.

Accordingly, in a case where the clock signal clkM is at a comparatively low speed, it is possible to decrease the number of clocks in a period from when the write-with-autoprecharge command Write-AP is given till the next ACT command is given.

Note that in the above presented description, a case is taken up of the write-with-autoprecharge operation, it is also possible to decrease the number of clocks in a period from when a read-with-autoprecharge command Read-AP is given till the ACT command can be given, by providing a similar configuration in a read-with-autoprecharge operation.

[Configuration Associated with Autorefresh Operation]

For example, in a configuration of a prior art 64 Mbit SDRAM, an autorefresh operation is performed activating 4 banks simultaneously. In this case, the refresh operation is performed for each 4096 bits at a time in one bank.

When the number of memory cells to be simultaneously refreshed increases, however, a peak current value consumed in autorefresh increases. Therefore, in system which is hard to secure a large capacity decoupling capacitor, a power source level greatly falls at the current peak and thereby, a high possibility arises of a malfunction in DRAM.

Figure 83:
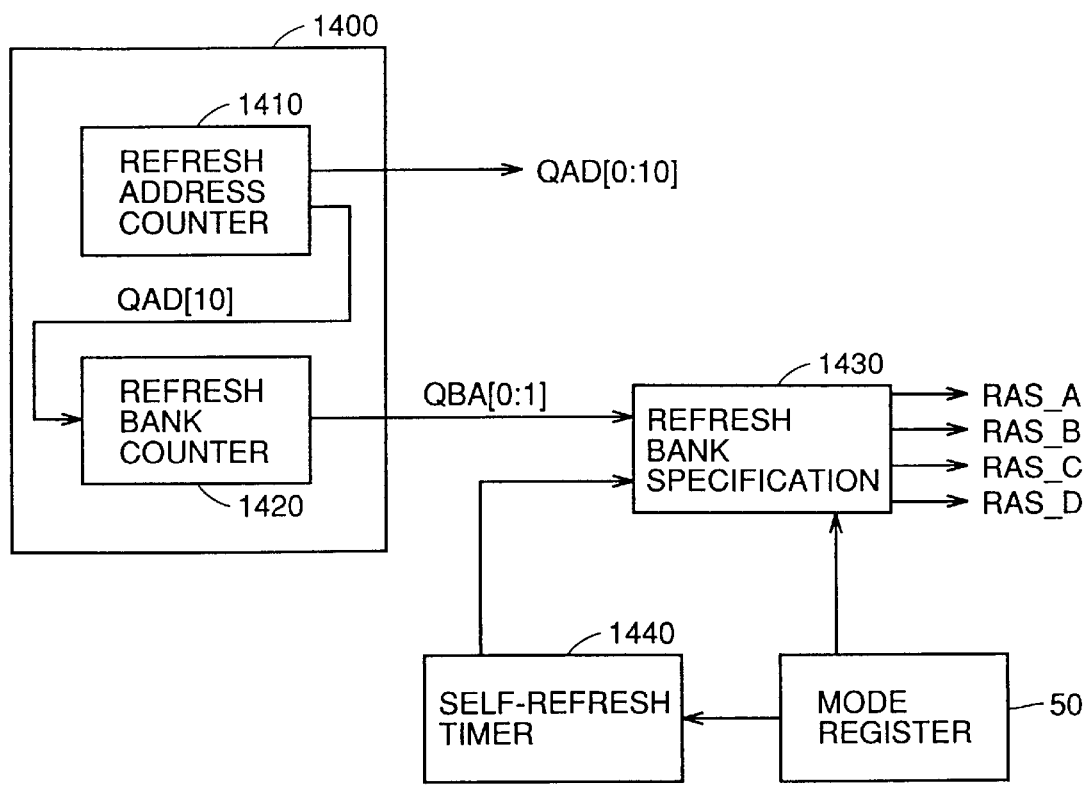
FIG. 83 is a schematic block diagram for describing a configuration controlling an autorefresh operation for preventing a malfunction in a refresh operation.

FIG. 83 is a schematic block diagram for describing a configuration controlling an autorefresh operation for preventing a malfunction in such a refresh operation.

A configuration shown in FIG. 83 is included in the DRAM control section 42b of FIG. 76. Referring to FIG. 83, an autorefresh counter 1400 outputs an internal address signal QAD [0:10] for specifying a memory cell row on which a refresh operation is performed, and a signal QBA [0:1] for specifying a bank in which autorefresh is performed in the auotrefresh operation mode.

The autorefresh counter 1400 includes: a refresh address counter 1410 for generating the address signal QAD [0:10]; and a refresh bank counter 1420 for receiving the highest address QAD [10] outputted from a refresh address counter to output a bank address QBA [0:1] for specifying a bank which is refreshed.

A refresh bank specifying circuit 1430 receives the signal QBA [0:1] from the refresh bank counter 1420 to activate an internal RAS signal corresponding to a bank on which an autorefresh operation is performed among internal RAS signals RAS_A, RAS_B, RAS_C and RAS_D corresponding to the respective 4 banks according to control of the mode register 50.

For example, according to specification to the mode register 50, cases of operation are specified: a case where all of the internal RAS signals corresponding to the 4 banks are simultaneously activated; a case where two banks are activated at a time; and a case where each bank as a unit is activated.

The self-refresh timer 1440 gives a trigger signal for an internal RAS signal outputted by the refresh bank specifying circuit 1430.

Therefore, by providing the refresh bank counter 1420 and the refresh bank specifying circuit 1430, it becomes possible not only to specify a mode in which autorefresh is simultaneously performed on the 4 banks, but also to perform autorefresh on two banks at a time or on each bank.

Note that while it is possible to control what number of banks is adopted as a unit in performing autorefresh by inputting a command of mode register set of combination of address signals as described above, it is also possible to specify banks on which a refresh operation is simultaneously performed by accessing to an address space specially assigned in the logic integrated DRAM shown in FIG. 76.

Note that while in the above presented description, the configuration is taken up where areas that are simultaneously refreshed are specified all of one bank as a unit, a current peak can also be suppressed in a similar manner, for example, in a case where 4 banks are simultaneously refreshed by reducing the number of memory cells to be simultaneously refreshed per bank to half or quarter.

Figure 84:
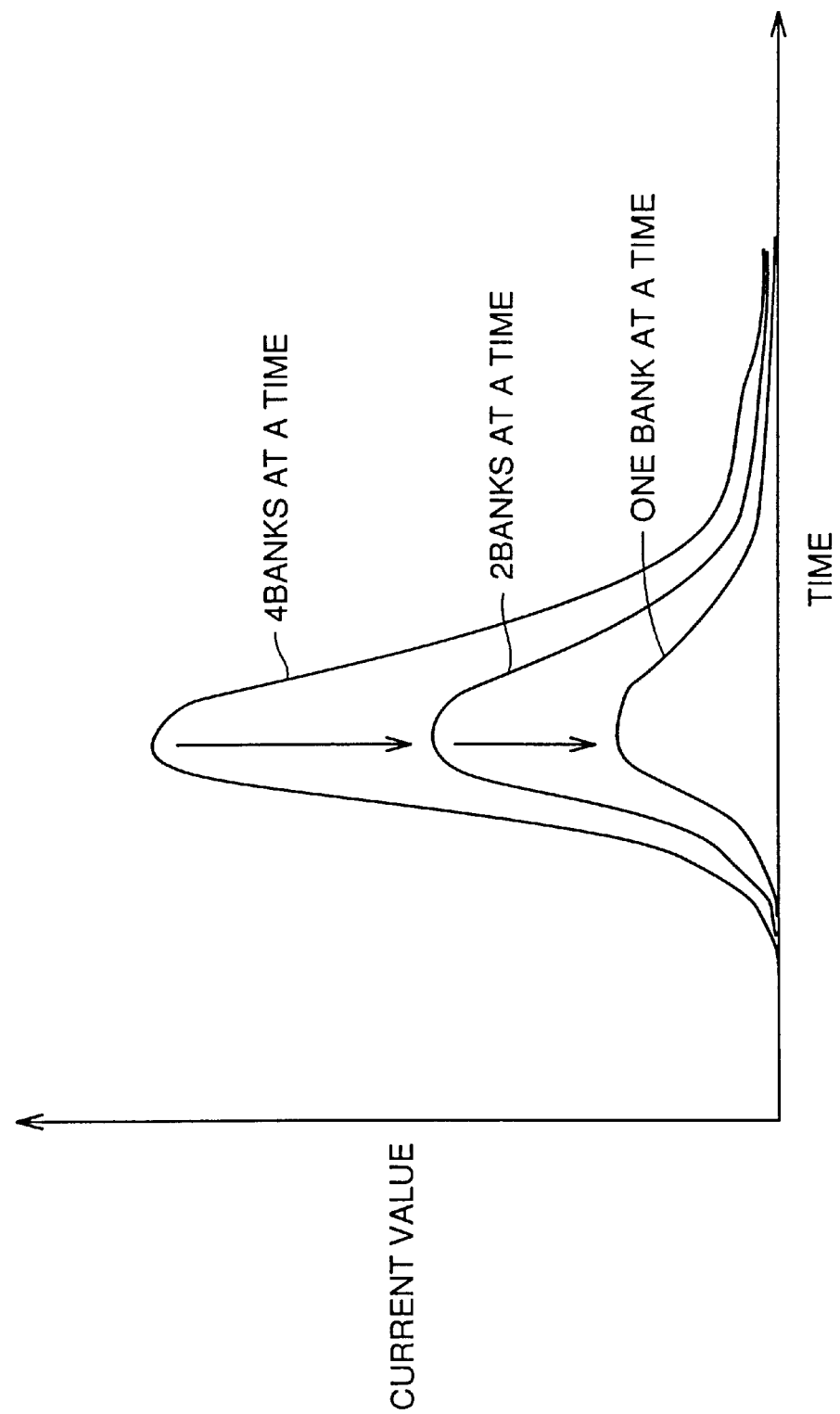
FIG. 84 is a graph for describing an effect of reducing a current peak in the autorefreah operation described in FIG. 83.

FIG. 84 is a graph for describing an effect of reducing a current peak in the autorefreah operation described in FIG. 83.

That is, if autorefresh is performed on two banks at a time or on each bank instead of an autorefresh operation on 4 banks at a time, a peak value of an operating current in the DRAM section can be decreased according to this order.

Note that in the above presented description, a cycle T0 of the selfrefresh timer 1440 is altered according to the number of memory cells refreshed simultaneously.

For example, if a cycle when the 4 banks are refreshed at a time is T0, the cycle is adopted as T0/2 in a case where 2 banks are autorefreshed at a time. Furthermore, the cycle is adopted as T0/4 in a case where each bank is separately autorefreshed.

By doing so, even when the number of banks to be simultaneously autorefreshed is reduced, a cycle at which a refresh operation is performed on an individual memory cell can be substantially the same interval.

[Configuration of Power Source Cut Mode]

Figure 85:
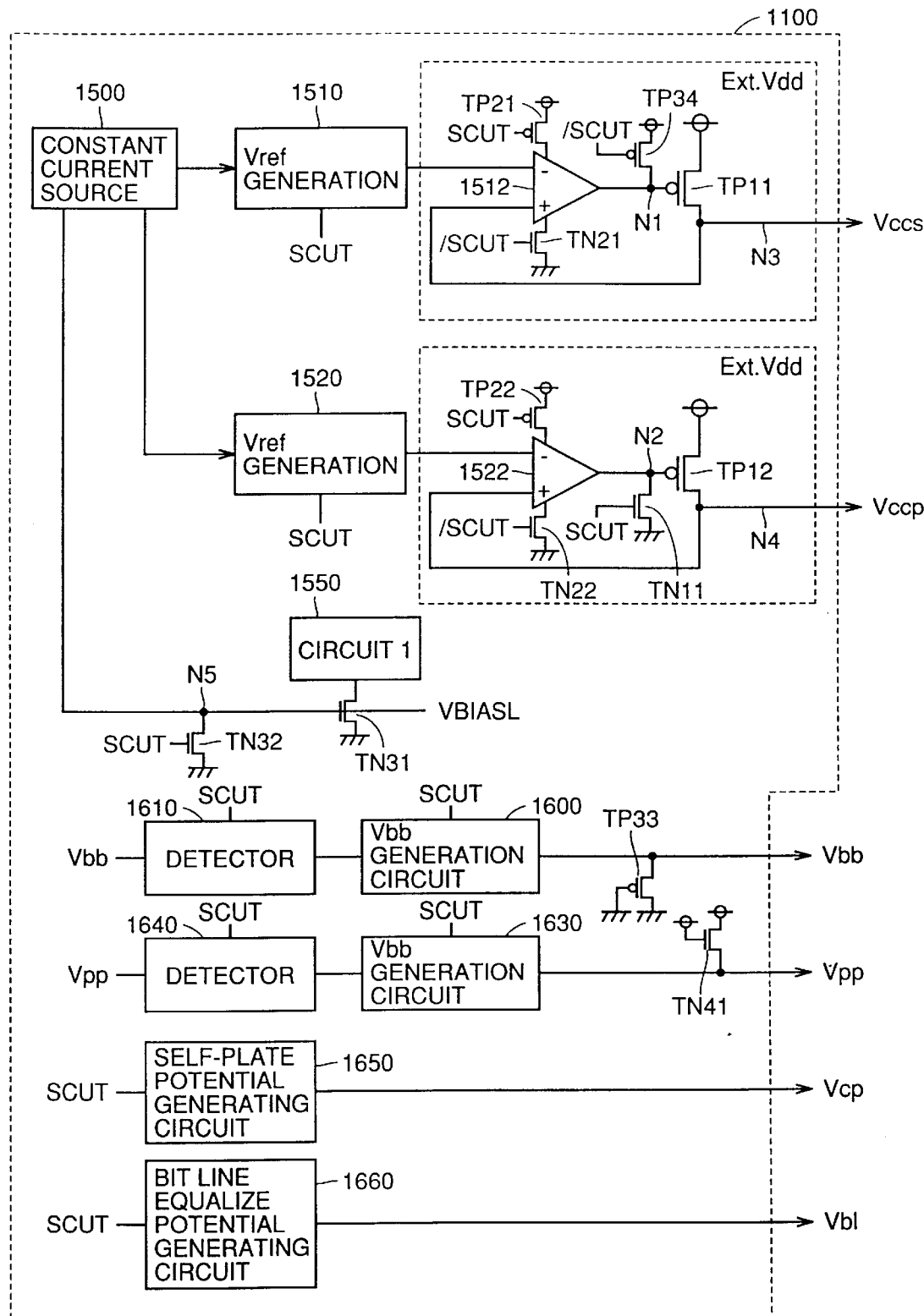
FIG. 85 is a schematic block diagram representing a configuration associated with an internal power source potential generating circuit 1100.

FIG. 85 is a schematic block diagram representing a configuration associated with an internal power source potential generating circuit 1100 in the configuration shown in FIG. 76.

The configuration of the internal power source potential generating circuit 1100 shown in FIG. 85 can decrease a current consumed in a standby operation as described below.

When the system enters a power source cut mode according to a combination of external control signals as will be described later, a signal SCUT outputted from the DRAM control section 42b is set to "H" level.

Referring to FIG. 85, the internal power source potential generating circuit 1100 includes: a constant current source 1500 for generating a reference potential VBIASL; a reference potential generating circuit 1510 for receiving the output VBIASL from the constant current source 1500 to generate a first reference potential; a comparator circuit 1512 receiving an output of the reference potential generating circuit 1510 at a minus input node thereof; and a P channel MOS transistor TP11 provided between an external power source potential Ext. Vdd and a node N3 for supplying a memory cell array power source potential Vccs, and whose gate is coupled with an output node N1 of the comparator circuit 1412. The node N3 is coupled with a plus input node of the comparator circuit 1512.

The internal reference potential generating circuit 1100 further includes: a reference potential generating circuit 1520 for receiving an output of the constant current source 1500 to generate a second reference potential; a comparator circuit 1522 receiving the second reference potential outputted from the reference potential generating circuit 1520 at a minus input node thereof; a P channel MOS transistor TP12 provided between the external power source potential Ext. Vdd and a node N4 for outputting a potential Vcc supplied to a peripheral circuit of the DRAM section, and whose gate is coupled with an output node N2 of the comparator circuit 1422; and an N channel MOS transistor TN11 provided between the node N2 and a ground potential, and receiving the signal SCUT at its gate. A peripheral circuit of the DRAM section controls a select operation of a memory cell array and the above described select operations.

Note that the comparator circuit 1512 is supplied with the power source Ext. Vdd through a transistor TP21 receiving the signal SCUT at its gate and further supplied with the ground potential through an N channel MOS transistor TN21 receiving a signal /SCUT which is an inverted signal of the signal SCUT at its gate.

Furthermore, a P channel MOS transistor TP34 receiving the signal /SCUT at its gate is provided between the node N1 and the power source potential Ext. Vdd. When the signal /SCUT goes to "L" level, the transistor TP34 enters a conductive state to raise a gate potential of the transistor TP11 to "H" and force the transistor TP11 into a cut-off state.

In a similar way, the comparator circuit 1522 is supplied with the power source potential Ext. Vdd through a transistor TP21 receiving the signal /SCUT at its gate and further supplied with the ground potential through a transistor TN22 receiving a signal /SCUT at its gate.

Moreover, a transistor TN31 receiving the signal VBIASL outputted from the constant current source 1500 operates as a constant current source to supply a constant current to a circuit 1550.

Note that the circuit 1550 is any of circuits as far as the circuits are ones to which a constant current is supplied based on the constant potential VBIASL outputted from the constant current source 1500 and besides, not limited to one in the internal power source potential generating circuit 110 and may also be one operating in the peripheral circuitry of the DRAM section.

An N channel MOS transistor TN32 receiving the signal SCUT at its gate is provided between a node N5 supplied with the reference potential VBIASL supplied from such a constant current source 1500 and the ground potential.

The internal power source potential generating circuit 1100 further includes: a Vbb generating circuit 1600 for generating a reference potential Vbb; a detector 1610 for monitoring a substrate potential to control the Vbb generating circuit 1600; a P channel MOS transistor TP33 provided between the ground potential and an output node of the Vbb generating circuit and receiving the ground potential at its gate; a Vpp generating circuit 1630 for generating a boosted potential higher than the external power source potential Ext. Vdd, for example a boosted potential Vpp used as an activation potential of a word line or the like; a detector 1640 for monitoring a level of the boosted potential Vpp to control the Vpp generating circuit 1630; and an N channel MOS transistor TN41 provided between an output node of the Vpp generating circuit and the power source Ext. Vdd, and receiving the potential Ext. Vdd at its gate.

Besides, the internal power source potential generating circuit 1100 includes: a self-plate potential generating circuit 1650 receiving the external power source potential Ext. Vdd and the ground potential to operate and supply a self-plate of a memory cell MC with a self-plate potential (an opposite electrode potential of a memory cell capacitor); and a bit line equalize potential generating circuit 1660 for generating an equalize potential Vb1 on the bit line pair.

Next, description will be given of an operation in a power source cut mode.

Among the above described circuits including not only the comparator circuits 1512 and 1522, but also the first and second reference potential generating circuits 1510 and 1520, the detectors 1610 and 1540 and the circuit 1550 are caused to enter an inactive state in company with activation of the signal SCUT. The node N1 is deactivated since the transistor TP34 enters a conductive state and thereby, the transistor TP11 enters a cut-off state.

At this time, the transistor TN32 also enters a conductive state to let the node N5 into the ground potential.

Then, the Vbb generating circuit 1600, the Vpp generating circuit 1630, the self-plate potential generating circuit 1650 and the bit line equalize potential generating circuit 1660 are caused to enter an inactive state in company with activation of the signal SCUT.

When the system enters the power source cut mode and circuits in the internal power source potential generating circuit 1100 are caused to enter an inactive state as described above, potential levels of the circuits gradually decreases due to the presence of a junction leakage and other causes that exist in the substrate.

However, a potential level of an output node of the Vbb generating circuit 1600 is converged to a level defined by a threshold value Vth1, wherein the threshold value Vth1 is that of the transistor TP33. A potential level of an output node of the Vpp generating circuit 1530 is converged to a level of (Ext. Vdd−Vth2), wherein Vth2 is a threshold value of the transistor TN 41, since the transistor TN 41 exists.

Furthermore, regarding a power source for the peripheral circuitry, the comparator circuit 1522 enters an inactive state. However, since the transistor TN11 becomes conductive and thereby, a gate potential of the P channel MOS transistor TP12 assumes the ground potential, therefore the potential Vccp becomes the power source potential Ext. Vdd.

When the configuration as described above is adopted, a path for a through current is cut off and thereby consumed current is reduced, and on the other hand, the potentials Vpp and Vccp stay at an active level; therefore, it is possible to exit out of the power source cut mode by inputting a specific command even after entering the power source cut mode.

Figure 86:
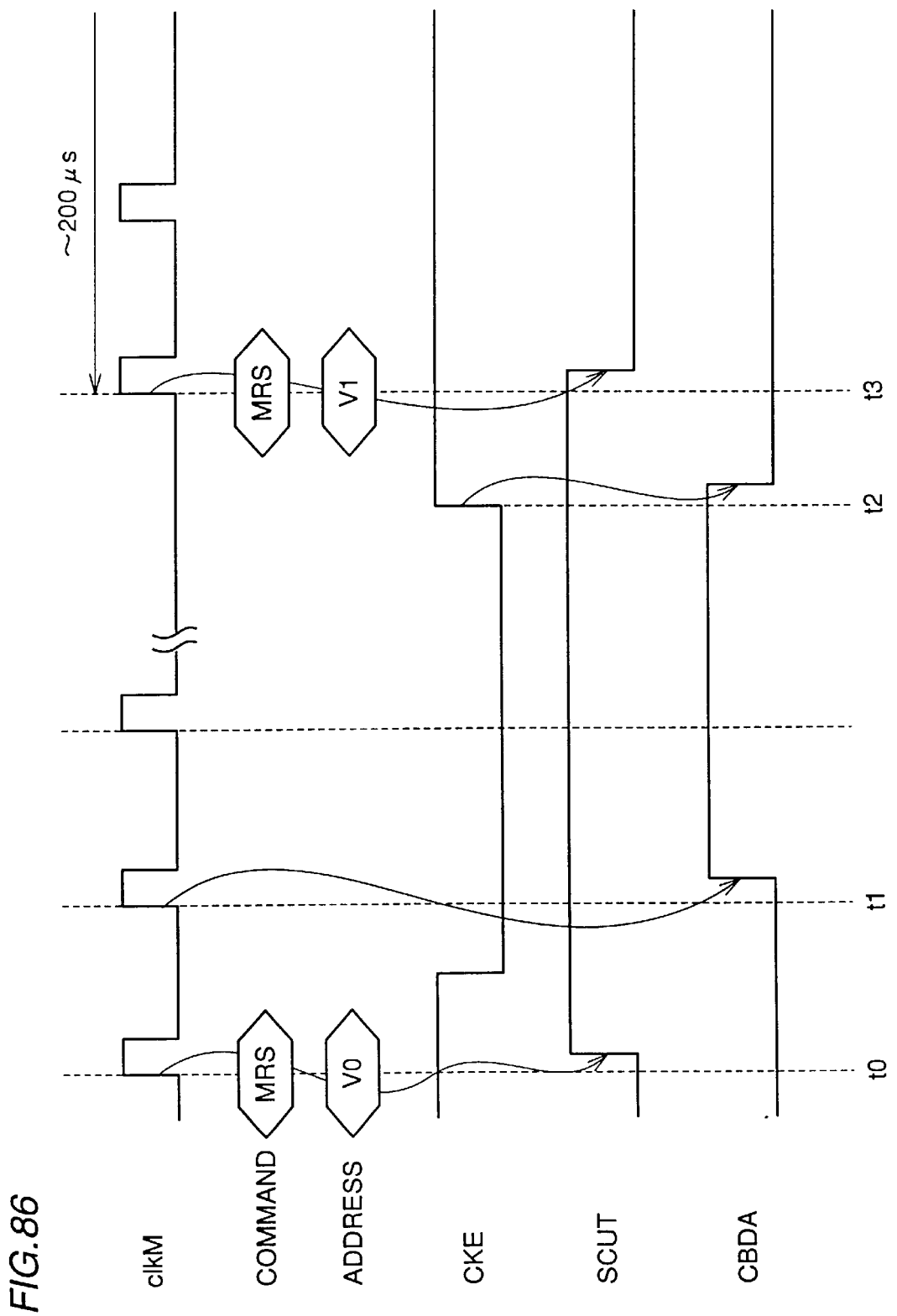
FIG. 86 is a timing chart for describing an operation (entry) entering a power source cut mode and an operation (exit) exiting out of the power source cut mode.

FIG. 86 is a timing chart for describing an operation (entry) entering a power source cut mode and an operation (exit) coming out of the power source cut mode as described above.

At a time point t0, inputted is a combination of the mode register set command MRS and an address V0 for entry into the power source cut mode.

In response to this, the signal SCUT for controlling the power source cut goes to an active level ("H" level).

In response to activation of the signal SCUT, the circuits in the internal power source potential generating circuit 1100 enter an inactive state.

Then, it is caught into the DRAM control section 42b that the signal CKE is in an inactive state ("L" level) in response to a rise of the clock signal clkM at a time point t1. At this time, the DRAM control section 42b forces a clock buffer disable signal CBDA for use in deactivation of a clock buffer 44 to enter an active state ("H" level) when the signal SCUT is already at "H" level.

By doing so, the clock buffer itself becomes inactive to further reduce a consumed current.

Furthermore, buffers for other input signals are forced into an inactive state: which are the I/O buffer 52, the input buffers 40 and 46 and other buffers.

Next, description will be given of an exit operation out of the power source cut mode.

In response to that the signal CKE is at "H" level at a time point t2, the clock disable signal CBDA becomes "L" level in asynchronism.

The clock buffer is activated in response to that the clock disable signal CBDA becomes "L" level.

Subsequent to this, the mode register set command and an address signal assigned for exist out of the mode are inputted at an activation edge of the clock signal clkM at a time point t3 and in response to the input, the signal SCUT is reset to "L" level.

After exit is effected out of the power source cut mode and the internal power source is stabilized, input of commands other than the mode register set command becomes possible.

For example, in a prior art SDRAM, even when the signal goes to "L" level, no chance arises that the clock buffer 44 is deactivated unless being in a self-refresh operation mode.

In comparison with this, in a logic integrated DRAM relating to the present invention, when the signal CKE goes to "L" level, the clock buffer is also deactivated if being in the power source cut mode, thereby enabling a consumed current to further decrease.

Note that addresses assigned for entry into and exit out of the power cut mode can also be the same as each other.

Note that in the above presented description, a case is taken up where the potential Vccp is the potential Ext. Vdd during a period when the signal SCUT is at "H" level. However, a configuration may be adopted in which the constant current source 1500, the reference potential generating circuit 1520 and the comparator circuit 1522 are operated during a period when the signal SCUT is at "H" level to control the potential Vccp to a desired level.

Figure 87:
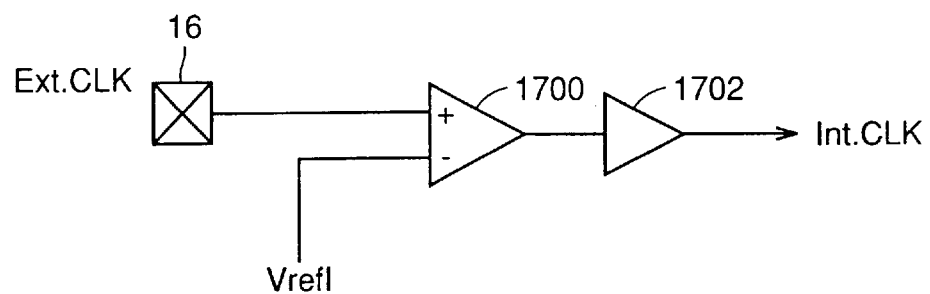
FIG. 87 is a circuit diagram representing an example configuration of a clock buffer 44.

FIG. 87 is a circuit diagram representing an example configuration of the clock buffer 44.

In a case where as shown in FIG. 87, the clock buffer 44 includes a comparator circuit 1700 connected with a terminal 16 at its plus input node and receiving a reference potential VrefI at its minus input node, the clock buffer can be caused to be in an inactive or active state if a level of the reference potential VrefI is controlled according to a level of the signal CBDA when the clock buffer disable signal CBDA enters an active state. An output of the comparator circuit 1700 is outputted from the buffer circuit 1702 as the internal clock signal int. CLK.

Figure 88:
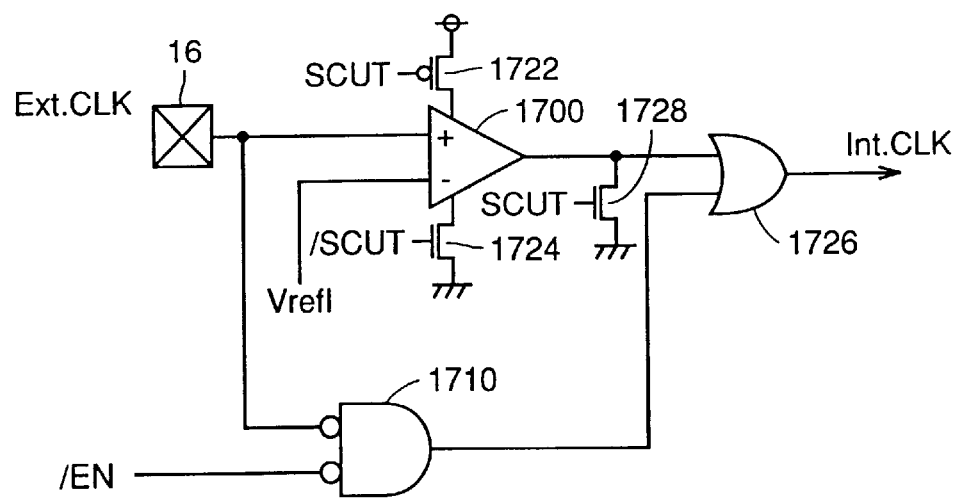
FIG. 88 is a circuit diagram representing another circuit configuration of the clock buffer 44.

FIG. 88 is a circuit diagram representing another circuit configuration of the clock buffer 44.

In a configuration shown in FIG. 88, the clock buffer 44 includes: a comparator circuit 1700 receiving a signal from the terminal 16 at a plus input node thereof and the reference potential VrefI at a minus input node thereof; a NOR circuit 1710 coupled with the terminal 16 at one input node thereof and receiving the signal /EN at the other input node thereof; and an OR circuit 1726 receiving outputs of the comparator circuit 1700 and the NOR circuit 1710 to output the internal clock signal int. CLK. In the clock buffer 44, the comparator 1700 receives the power source potential through a P channel MOS transistor 1722 receiving the signal SCUT at its gate and the ground potential through an N channel MOS transistor 1724 receiving the signal /SCUT at its gate. The clock buffer 44 further includes an N channel MOS transistor 1728 provided between an output node of the comparator circuit 1700 and the ground potential, and receiving the signal SCUT at its gate.

Therefore, it is only required that during a period when the signal SCUT is at "L" level, the external clock signal Ext. CLK is inputted through the comparator circuit 1700, while during a period when the signal is at "H" level in the power cut mode, the reference potential VrefI is controlled to force the comparator circuit 1710 into an inactive state and the clock signal is inputted through the NOR circuit 1710.

As long as the signal /EN is at "H" level, the external clock signal Ext. CLK has a no chance to be caught into the interior through the NOR circuit 1710.

By adopting a configuration as described above, the logic integrated DRAM 1000 can maintain its performance and reduce power consumption even when the clock signal performs comparatively slow.

Tenth Example

A configuration of a logic integrated DRAM of the tenth example is fundamentally the same as that of the logic integrated DRAM 1000 shown in FIG. 76.

However, in the logic integrated DRAM 1000 of the tenth example, as will be described below, a configuration is adopted in which a level of the internal power source voltage is variable according to a cycle of an input clock.

By adopting such a configuration, in a system that is allowed to be operated at a low speed, an internal voltage level is altered such that a speed of an internal operation of the DRAM section is reduced in conformity with a system speed, whereby reduction in power consumption can be achieved at a given clock frequency.

Note that the following description can be applied not limitedly to a case where logic circuitry and a DRAM are mixedly fabricated on one chip but also to a case where only the DRAM is integrated on one chip.

Figure 89:
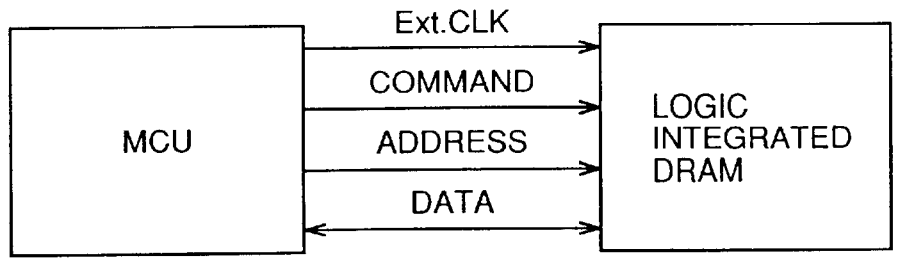
FIG. 89 is a conceptual block diagram representing a configuration of a system in which a logic integrated DRAM 1000 is employed.

FIG. 89 is a conceptual block diagram representing a configuration of a system in which a logic integrated DRAM 1000 is employed.

In the system, connected are a micro-controller unit MCU and a clock synchronous type logic integrated DRAM 1000.

A clock signal CLK, a command signal and an address signal are supplied from the micro-controller unit MCU and supply/reception of data are performed between the micro-controller unit MCU and the logic integrated DRAM 1000.

Figure 90:
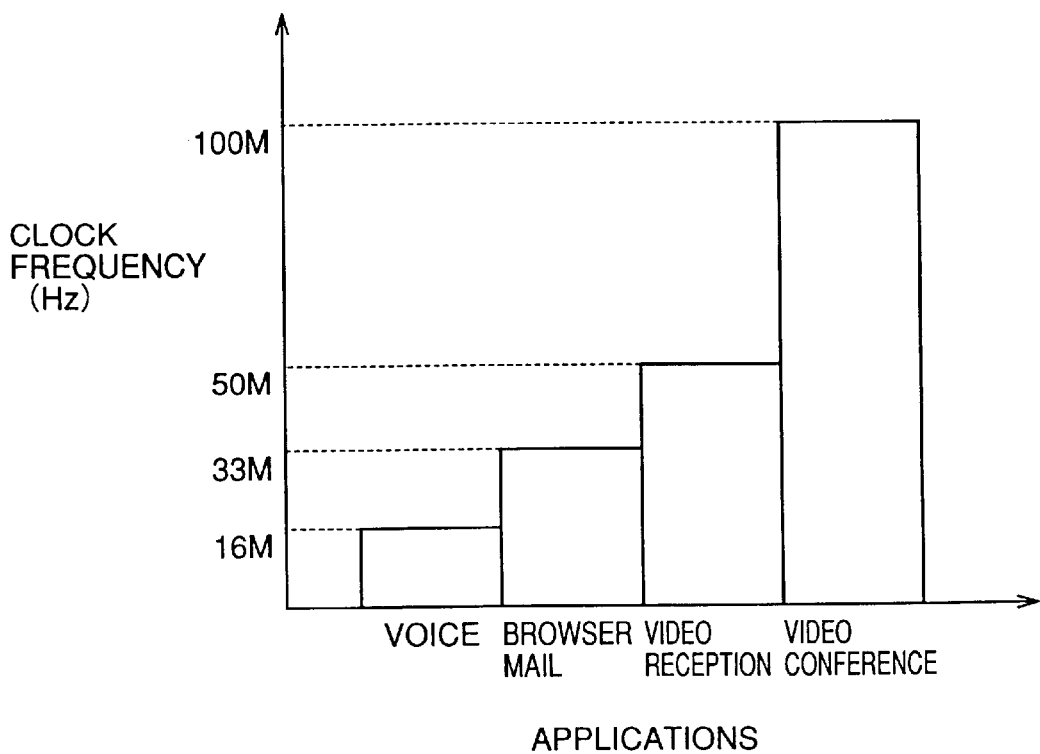
FIG. 90 is a graph representing operating frequencies of a memory required according applications.

FIG. 90 is a graph representing operating frequencies of a memory required according applications in the system as shown in FIG. 89. A band width of data transmission requested for a memory is different according to an application. In FIG. 90, a case of a portable telephone is conceived.

For example, in a case where only voice data is processed, a CLK frequency of the DRAM section is set low, while in a case where a video signal (mainly decoding of video data) or a video conference (mainly encoding of a moving image) is processed, a clock frequency of the DRAM section is set high, thus increasing a processing capability.

In such a way, by changing an operating clock frequency of the DRAM section according to an application, power consumption of the DRAM section can be suppressed.

Figure 91:
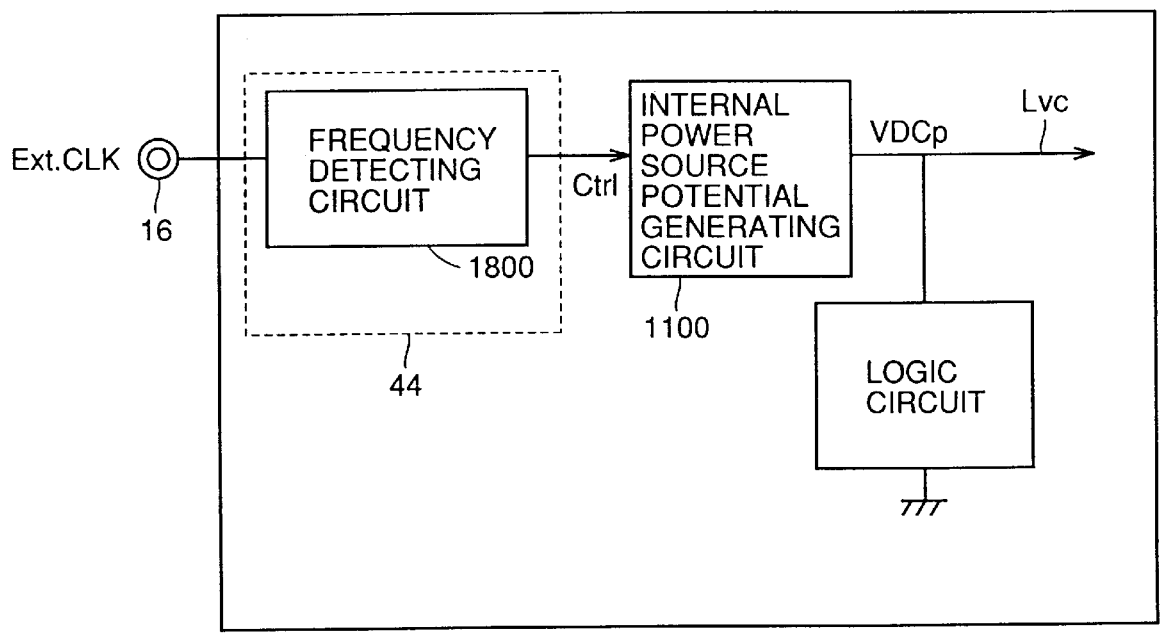
FIG. 91 is a conceptual block diagram for describing a configuration capable of changing an operating speed of a DRAM section according to a clock frequency.

FIG. 91 is a conceptual block diagram for describing a configuration capable of changing an operating speed of a DRAM section according to a clock frequency as shown in FIG. 90.

Referring to FIG. 91, the clock generating circuit 44 includes: a frequency detecting circuit 1800 detecting a frequency of the external clock signal Ext. CLK given to the terminal 16 to output the control signal Ctrl.

The internal power source potential generating circuit 1100 changes a level of the power source potential outputted therefrom according to the control signal Ctrl.

In FIG. 91, a configuration is shown in which the power source VDCp supplied to the logic section from the power source circuit 1100 through a power source line Lvc is controlled. For example, as a frequency of the external clock signal Ext. CLK decreases, a level of the internal power source decreases, while as the frequency increases, the internal power source level increases.

Figure 92:
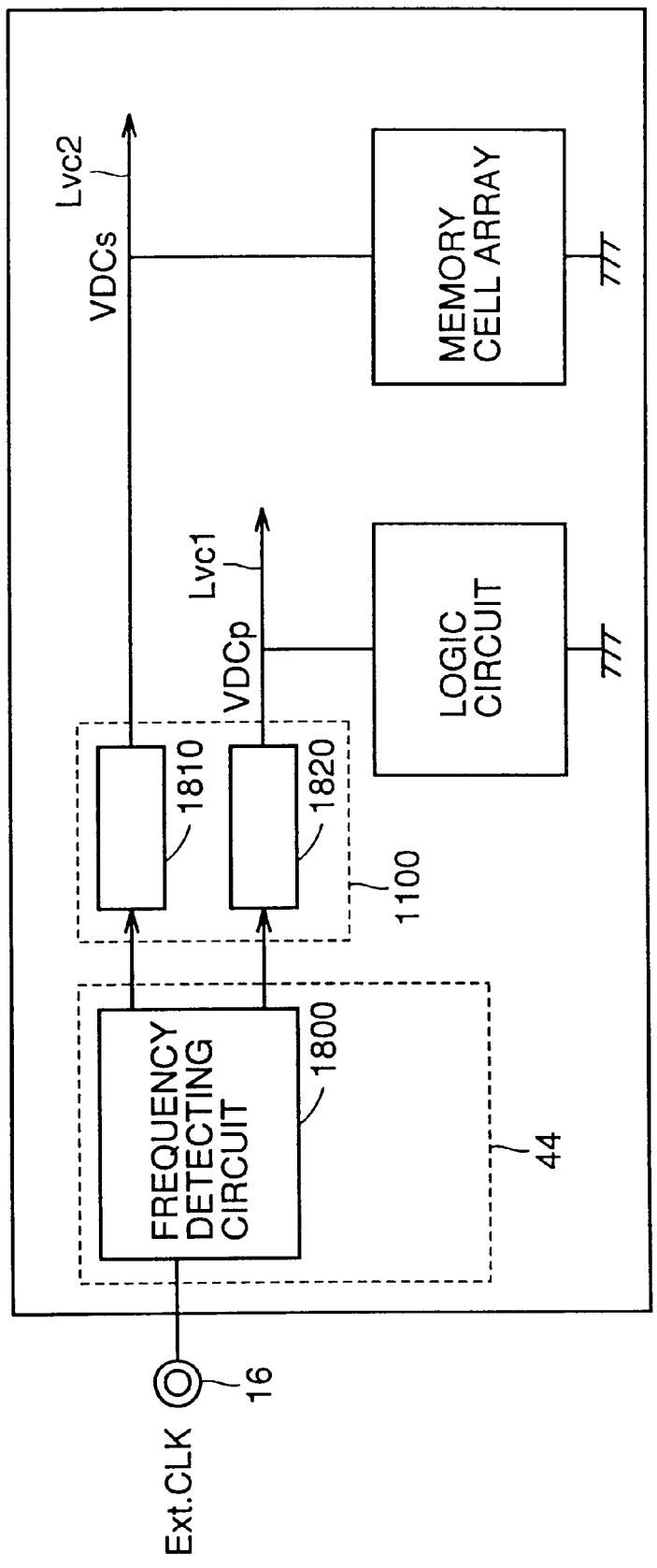
FIG. 92 is a schematic block diagram representing another configuration controlling an internal power source potential according to an external clock signal Ext. CLK.

FIG. 92 is a schematic block diagram representing another configuration controlling an internal power source potential according to the external clock signal Ext. CLK.

A clock generating circuit 44, similar to the case of FIG. 91, includes a frequency detecting circuit 1800 for detecting a frequency of the external clock signal Ext. CLK.

An internal power source potential generating circuit 1100 includes: an internal power source circuit 1810 for generating a power source potential VDCs for a memory cell array section; a power source line Lvc2 for transmitting the potential VDCs to the memory cell array section; an internal power source circuit 1820 for generating an internal power source potential VDCp supplied to the logic circuitry; and a power source line Lvc1 for transmitting the potential VDCp to the logic circuitry section.

Note that it is also possible to control a level of the internal power source potential according to a frequency of the external clock signal Ext. CLK only by the power source potential VDCs for the memory cell array.

In a configuration shown in FIG. 92 as well, the levels VDCs and VDCp of the internal power source are set according to a frequency of the external clock signal Ext. CLK.

Figure 93:
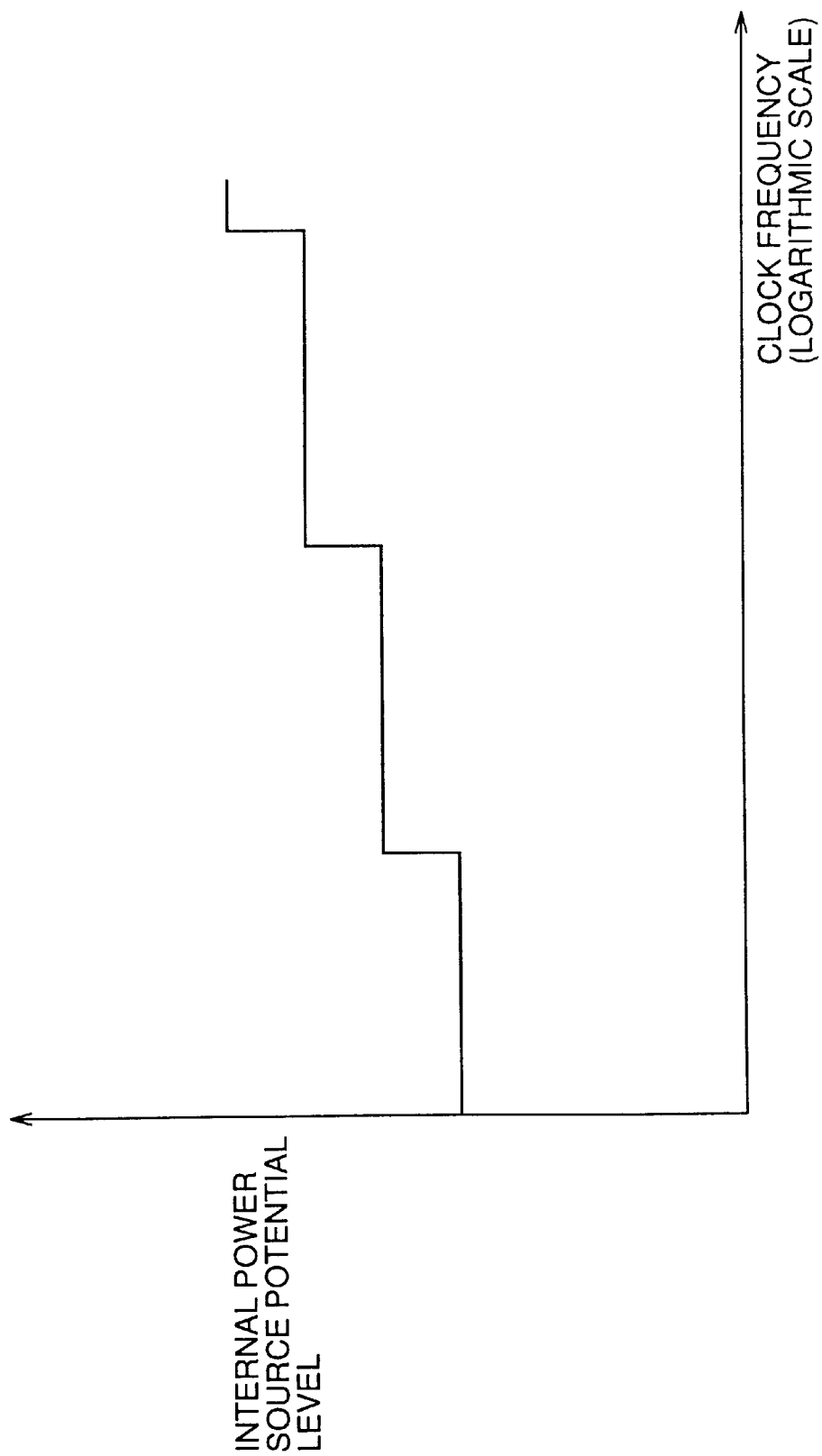
FIG. 93 is a graph for describing a control operation on an internal power source potential.

FIG. 93 is a graph for describing a control operation of an internal power source potential shown in FIG. 91 or 92, wherein the abscissa represents a clock frequency on a logarithmic scale provided thereon and the ordinate represents an internal power source potential level on a linear scale provided thereon.

An internal power source potential level is set according to increase in clock frequency. An internal power source potential level increases with increase in clock frequency, while contrary to this, an internal power source potential decreases with decrease in clock frequency.

By adopting a configuration as described above, an internal power source potential level changes according to a clock frequency and thereby, the DRAM section and the logic section can operate at a speed corresponding to a clock frequency, which enables realization of low power consumption.

Figure 94:
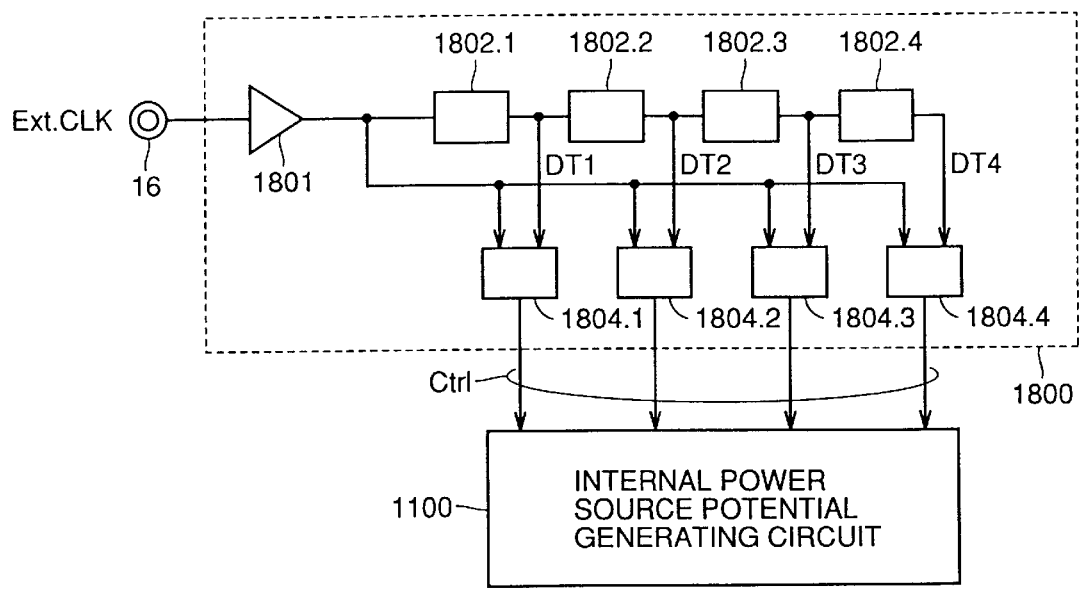
FIG. 94 is a schematic block diagram for describing a configuration of a frequency detecting circuit 1800.

FIG. 94 is a schematic block diagram for describing of a configuration of a frequency detecting circuit 1800 shown in FIG. 91 or 92.

Referring to FIG. 94, the frequency detecting circuit 1800 includes: a clock buffer 1801 receiving the external clock signal Ext. CLK from the terminal 16; delay circuits 1802.1 to 1802.4 receiving an output of the clock buffer and connected in series in chain; a phase comparator 1804.1 receiving outputs of the clock buffer 1801 and the delay circuit 1802.1; a phase comparator 1804.2 receiving outputs of the clock buffer 1801 and the delay circuit 1802.2; a phase comparator 1804.3 receiving outputs of the clock buffer 1801 and the delay circuit 1802.3; and a phase comparator 1804.4 receiving outputs of the clock buffer 1801 and the delay circuit 1802.4.

The internal power source potential generating circuit 1100 changes a power source potential generated by itself according to the signal Ctrl outputted from the phase comparators 1804.1 to 1804.4

Figure 95:
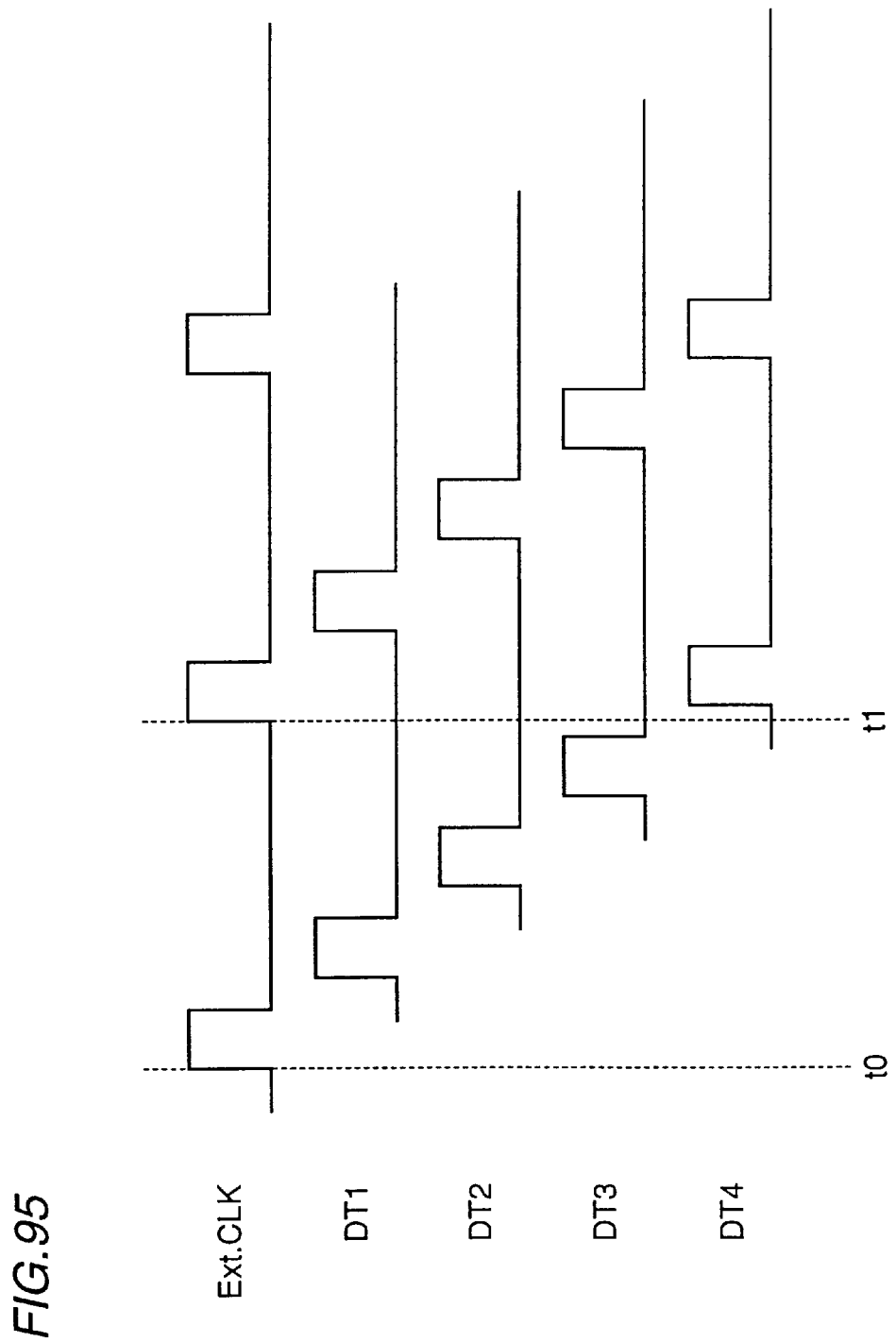
FIG. 95 is a timing chart for describing an operation of the frequency detecting circuit shown in FIG. 94.

FIG. 95 is a timing chart for describing an operation of the frequency detecting circuit shown in FIG. 94.

Referring to FIG. 95, signals DT1 to DR4 at an active level from the delay circuits 1802.1 to 1802.4 each signal being delayed by a prescribed time between one and the next are sequentially outputted in response to an activation edge of the external clock signal Ext. CLK at a time point t0.

Considering operations of the phase comparators 1804.1 to 1804.4 here, the operations go this way: phase differences of the external clock signal Ext. CLK and outputs of the delay circuits 1802.1 to 1802.4 are compared by the phase comparators 1804.1 to 1804.4.

In a state shown in FIG. 95, a phase of the external clock signal Ext. CLK lags an output DT3 of the delay circuit 1802.3 and the phase of the external clock signal Ext. CLK lags an output DT4 of the delay circuit 1802.4

It is only required that an output level of the internal power source potential generating circuit 1100 is adjusted according to a phase difference detected in such a way.

If the external clock signal Ext. CLK lags activation of the delay circuit 1802.1 in phase and activation of the external clock signal Ext. CLK lags activation of an output signal DT2 of the delay circuit 1802.2, a frequency is higher than in the case shown in FIG. 95.

Figure 96:
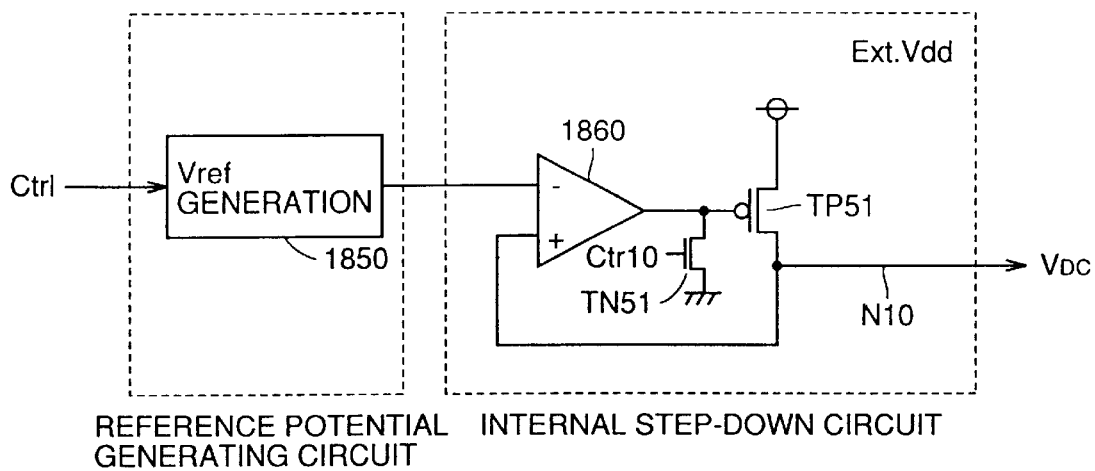
FIG. 96 is a schematic block circuit for describing a configuration of an internal power source circuit in the internal power source potential generating circuit 1100.

FIG. 96 is a schematic block circuit for describing a configuration of an internal power source circuit in the internal power source potential generating circuit 1100 controlled by the frequency detecting circuit 1800. In FIG. 96, the potentials VDCs and VDCp are collectively referred to as potential VDC.

The internal power source circuit shown in FIG. 96 includes: a reference potential generating circuit 1850 altering a reference potential generated by itself according to the control signal Ctrl from the frequency detecting circuit 1800; a comparator circuit 1860 receiving an output of the reference potential generating circuit 1850 at its minus input node; a P channel MOS transistor TP51 provided between a power source output node N10 and the external power source potential Ext. Vdd and receiving an output of the comparator circuit 1860 at its gate; and an N channel MOS transistor TN51 provided between an output node of the comparator circuit 1860 and the ground potential and receiving, for example, a control signal Ctrl0 outputted by the DRAM control section 42b at its gate, wherein the node N10 and a plus input node of the comparator circuit 1860 are coupled with each other.

In an operation of the internal power source circuit shown in FIG. 96, a level of the node N10 outputting the internal power source potential is controlled according to a level of the reference potential generating circuit 1850 with the signal Ctrl0 at "L" level. In a high speed system, however, a level of the internal power source potential can also be fixed at the external power source potential. That is, it is only required that in a high speed system, a potential level of the gate of the transistor TP51 of FIG. 96 is fixed at 0 V placing the transistor TN51 into a conductive state to cause a level of the internal power source potential VDC to assume the external power source potential Ext. Vdd.

With a configuration as described above adopted, it becomes possible that the internal power source potential level is altered according to a clock frequency to reduce power consumption.

Figure 97:
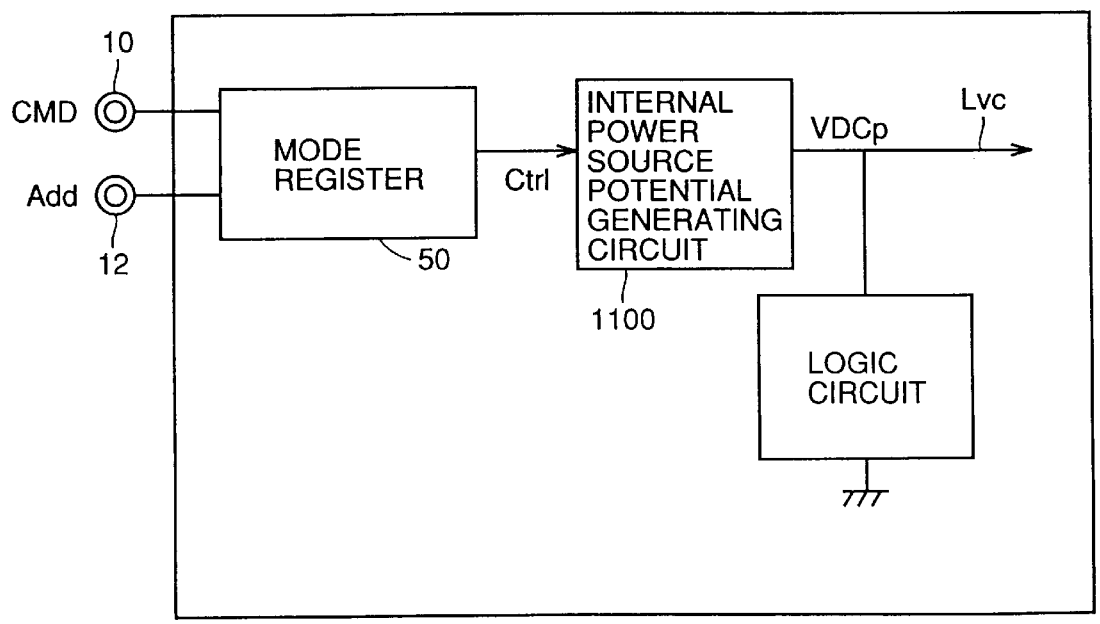
FIG. 97 is a schematic block diagram representing another configuration for controlling an internal power source potential.

FIG. 97 is a schematic block diagram representing another configuration for controlling the internal power source potential.

In FIGS. 91 to 96, the frequency detecting circuit 1800 is provided and a potential level outputted by the internal power source potential generating circuit 1100 is changed according to a detection result of the frequency detecting circuit.

As contrasted with this, in FIG. 97 the control signal Ctrl for the internal source circuit 1100 is controlled by giving a command signal and an address signal to the mode register 50 from the outside, and according to the signal Ctrl, a level of the internal power source is altered. The other points in configuration are the same as corresponding points in configuration of FIG. 91.

In operating modes of three kinds including a low speed, a medium speed and a high speed, if available, for example, three kinds of mode registers are assigned to the respective modes to control the mode registers and further, a level of the internal power source level.

In a high speed system, for example, control is possible such that a level of the internal power source potential is high. Note that in this case as well, it is also possible that in the high speed system, a potential level of the gate of the transistor TP51 of FIG. 96 is fixed at 0 V placing the transistor TN51 into a conductive state to cause a level of the internal power source potential VDC to assume the external power source potential Ext. Vdd.

Note that the logic section and the DRAM section may be configured so as to be separately controlled similar to the case shown in FIG. 92.

With a configuration as described above adopted, a level of the internal power source potential generated can be altered according to a control signal.

Figure 98:
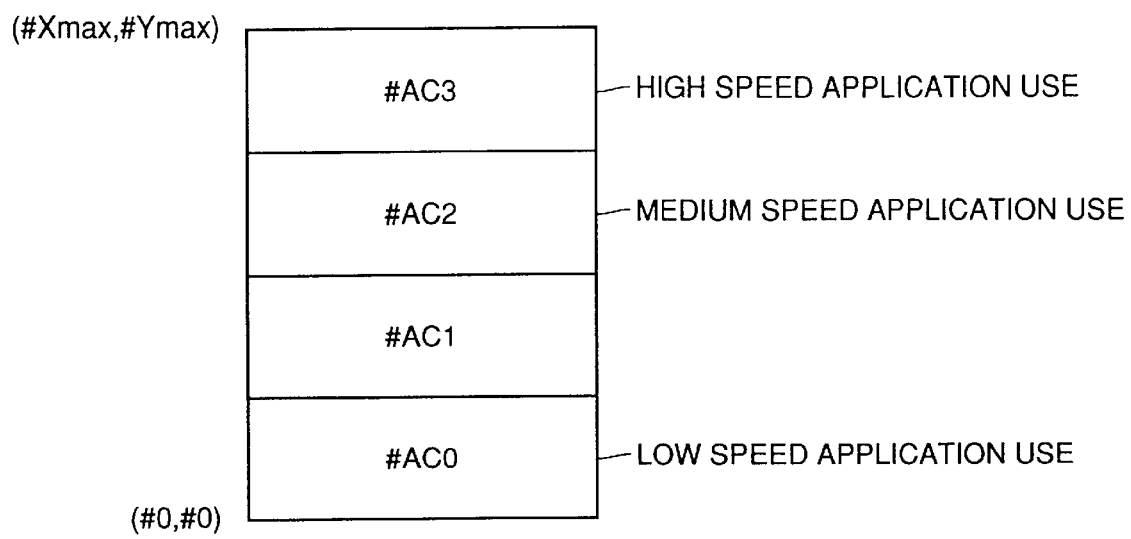
FIG. 98 is a memory map for describing one example of assignment in a memory space when a plural kinds of operating speed modes exist.

FIG. 98 is a memory map for describing one example of assignment in a memory space when a plural kinds of operating speed modes exist.

In the example shown in FIG. 98, a memory space is divided into applications for a low speed, a medium speed and a high speed in advance.

For example, an application assigned to a space #AC0 of FIG. 98 is for a low speed use and when access is performed to the space, a level of the internal power source is set low.

As contrasted with this, a memory space #AC3 is for a high speed use and the internal power source potential is set high according to selection of the memory space.

A memory space #AC2 is for a medium speed use and the internal power source potential is set to an intermediate value between those of the memory spaces #AC0 and #AC3 according to selection of the memory space.

Such a classification of a memory space can be set by the mode register 50. Furthermore, such a classification of a memory space can be originally specified in the stage of manufacture of a device.

Alternatively, the classification of a memory space can also be assigned for each bank.

In any of the cases above described, a column address is assigned to the lower address and the minimum unit of the memory space is adopted as a row address, whereby judgment on which of the low, medium and high speeds are specified becomes possible by checking a row address when an act command is inputted.

Figure 99:
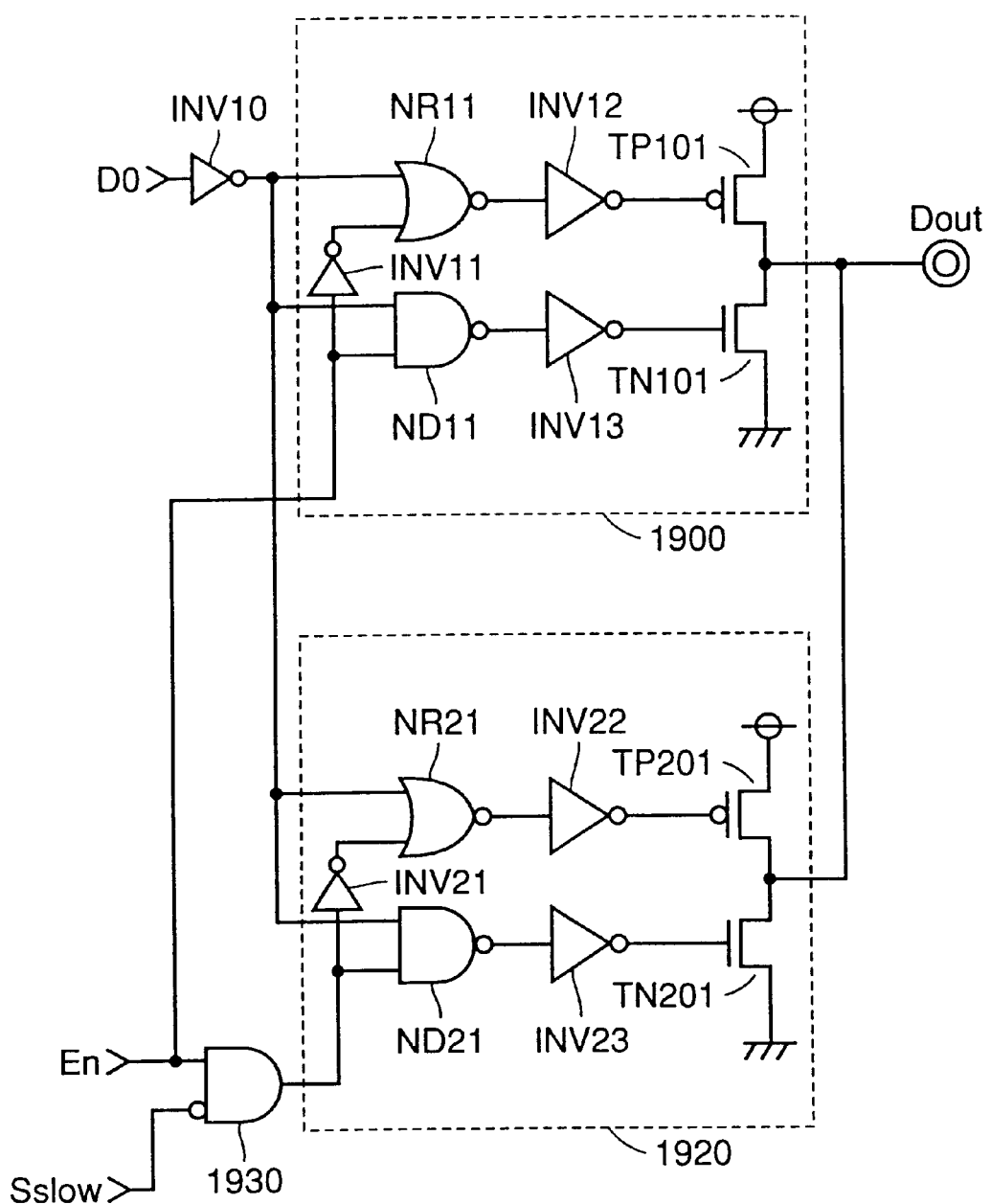
FIG. 99 is a schematic block diagram for describing a configuration of a drive circuit in an I/O buffer 52.

FIG. 99 is a schematic block diagram for describing a configuration of a drive circuit in an I/O buffer 52 shown in FIG. 76.

Corresponding to an output terminal Dout, provided are a driver circuit 1900 with a small current drive ability and a driver circuit 1920 with a large current drive ability.

A current drive ability can be set to a desired value by changing a transistor size of a driver transistor.

When a signal Sslow is at "H" level, then the driver circuit 1920 is deactivated and thereby a total drive ability of the driver circuits can be reduced. On the other hand, when the signal Sslow is at "L" level, then both of the driver circuits 1900 and 1920 are activated.

Therefore, when a frequency of the clock signal clkM is low and the signal Sslow is at "H" level, the driver circuit 1920 becomes deactivated.

On the other hand, when a frequency of the clock signal clkM is high and the signal Sslow is at "L," both of the driver circuits 1900 and 1920 becomes activated.

Therefore, when a frequency of the clock signal clkM is low, output data drive is performed with a small drive ability, whereas when a frequency of the clock signal cklM is high, output data drive can be performed with a high drive ability.

With a configuration as described above adopted, setting of the signal Sslow can be switched by a mode register set command for the mode register 50 and further, another configuration can also be adopted in which a specific address space is assigned for control use to switch setting of the signal Sslow.

A drive circuit shown in FIG. 99 includes: an inverter INV10 receiving and inverting a signal D0 to be outputted; and a logic gate circuit 1930 outputting a logical product between an inverted signal of the signal Sslow and an output activation signal En.

The driver circuit 1900 includes: an inverter INV11 receiving the drive signal En; a NOR circuit NR11 receiving an output of the inverter INV10 at one input node thereof and an output of the inverter INV11 at the other input node thereof; an inverter INV12 receiving and inverting an output of the NOR circuit NR11; a NAND circuit ND11 receiving an output of the inverter INV10 at one input node thereof and the signal En at the other input node thereof; an inverter INV13 receiving an output of the NAND circuit ND11; and a P channel MOS transistor TP101 and an N channel MOS transistor TN101 connected in series between the power source potential and the ground potential.

The transistor TP101 receives an output of the inverter INV12 at its gate and the transistor TN101 receives an output of the inverter INV13 at its gate. A connection node between the transistors TP101 and TN101 is connected to the terminal Dout.

The driver circuit 1920 includes: an inverter INV21 receiving an output of the logic gate 1930; an NOR circuit NR21 receiving an output of the inverter INV10 at one input node thereof and an output of the inverter INV11 at the other input node thereof; an inverter INV22 receiving and inverting an output of the NOR circuit NR21; a NAND circuit ND21 receiving an output of the inverter INV10 at one input node thereof and an output of the logic gate 1930 at the other input node thereof; an inverter INV23 receiving an output of the NAND circuit ND21; and a P channel MOS transistor TP201 and an N channel MOS transistor TN201 connected in series between the power source potential and the ground potential.

The transistor TP201 receives an output of the inverter INV22 at its gate and the transistor TN201 receives an output of the inverter INV23 at its gate. A connection node between the transistors TP201 and TN201 is connected to the terminal Dout.

With a configuration as described above adopted, power consumption of an output buffer becomes variable according to a clock frequency and further reduction in power consumption can be possible.

Figure 100:
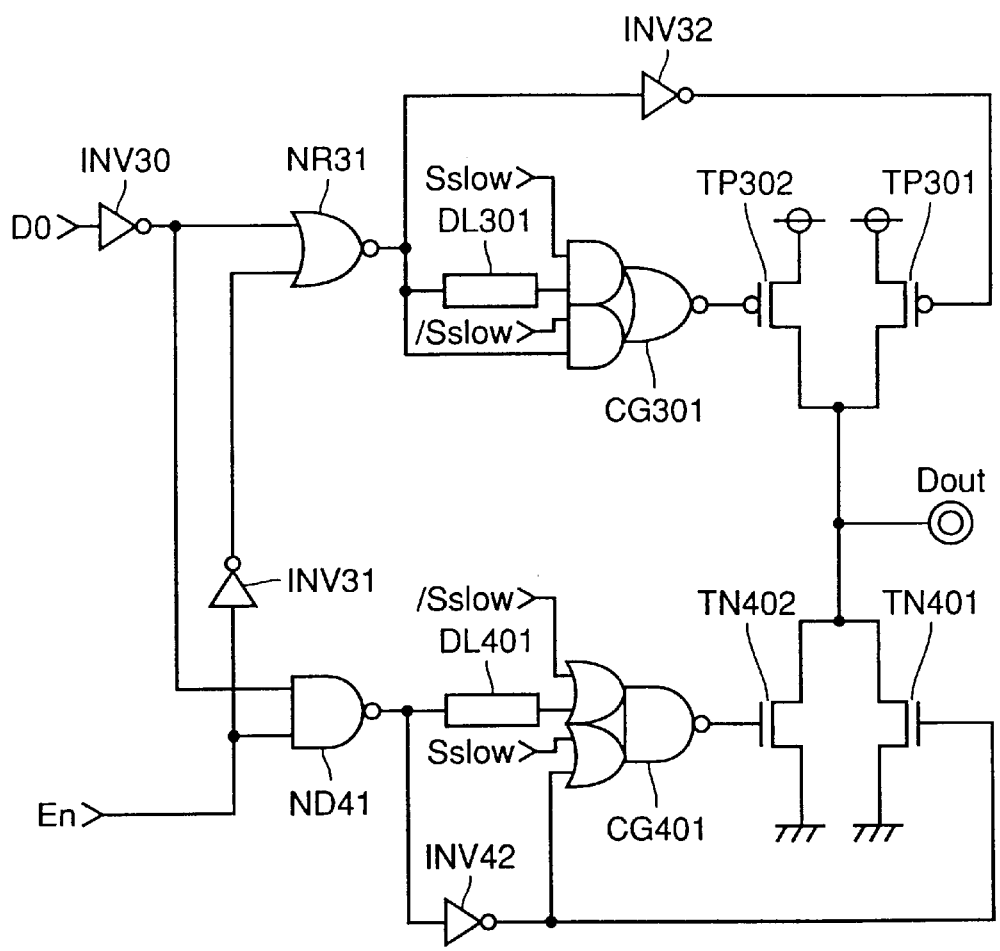
FIG. 100 is a schematic block diagram for describing another configuration of a drive circuit in the I/O buffer 52 shown in FIG. 76.
Figures 102, 103:
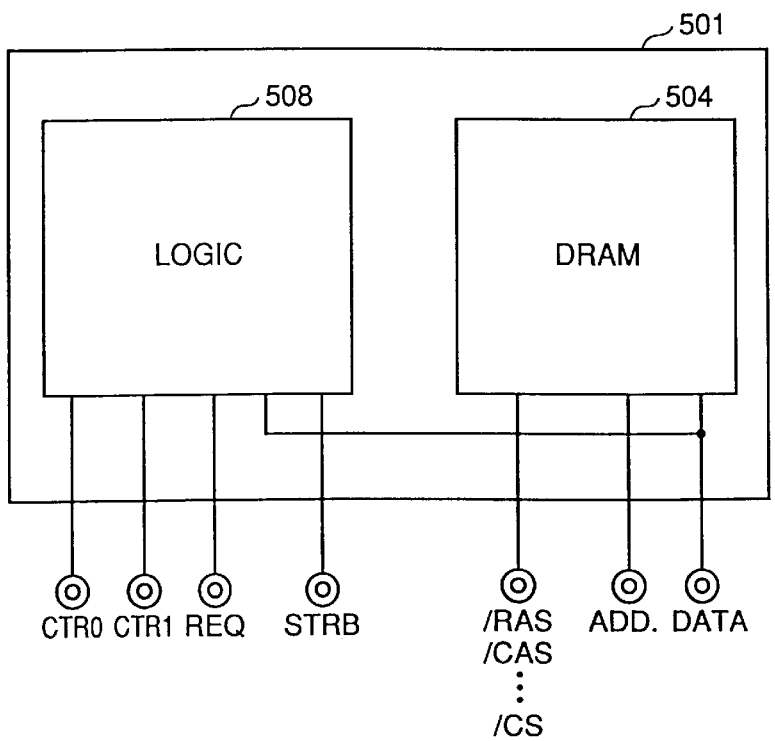
FIG. 102 is a table representing terminal names of SDRAM and their functions.
FIG. 103 is a block diagram representing a configuration of a prior art logic integrated DRAM.

FIG. 100 is a schematic block diagram for describing another configuration of a drive circuit in the I/O buffer 52 shown in FIG. 76.

The drive circuit shown in FIG. 100 includes: an inverter INV30 receiving and inverting a signal D0 to be outputted; an inverter INV31 receiving the drive signal En; an NOR circuit NR31 receiving an output of the inverter INV30 at one input node thereof and an output of the inverter INV31 at the other input node thereof; an inverter INV32 receiving and inverting an output of the NOR circuit NR31; a delay circuit DL301 receiving an output of the NOR circuit NR31 to delay the output by a prescribed time; and a composite logic gate CG301 receiving an output of the delay circuit DL301 and the signal Sslow, and an output of the NOR circuit NR31 and a signal /Sslow. The composite logic gate CG301 outputs a result of a NOT-OR operation between a first logical product between an output of the delay circuit DL301 and the signal Sslow and a second logical product between an output of the NOR circuit NR31 and the signal /Sslow.

A drive circuit shown in FIG. 100 further includes: a NAND circuit ND41 receiving an output of the inverter INV30 at one input node and the signal En at the other input node thereof; an inverter INV42 receiving and inverting an output of the NAND circuit ND41; a delay circuit DL401 receiving an output of the NAND circuit ND41 to delay the output by a prescribed time; and a composite logic gate CG401 receiving an output of the delay circuit DL401 and the signal /Sslow, and an output of the inverter INV42 and the signal Sslow. The composite logic gate CG401 outputs a result of a NOT-AND operation between a first logical sum between an output of the delay circuit DL401 and the signal /Sslow and a second logical sum between an output of the inverter INV42 and the signal Sslow.

The drive circuit shown in FIG. 100 further includes: a P channel MOS transistor TP301 and an N channel MOS transistor TN401 connected in series between the power source potential and the ground potential; and a P channel MOS transistor TP302 and an N channel MOS transistor TN402 connected in series between the power source potential and the ground potential. A connection node between the transistor TP301 and the transistor TN401 is coupled with the output terminal Dout and a connection node between the transistor TP302 and the transistor TN402 is also coupled with the output terminal Dout.

The transistor TP301 receives an output of the inverter INV32 at its gate and the transistor 401 receives an output of the inverter INV41 at its gate. On the other hand, the transistor TP302 receives an output of the composite logic gate CG301 at its gate and the transistor TP402 receives an output of the composite logic gate CG401 at its gate.

A size of the transistor TP302 is larger than a size of the transistor TP301 and a size of the transistor TN402 is larger than a size of the transistor TN401.

In the drive circuit shown in FIG. 100, when an operating frequency is low, and the signal Sslow is at "H" level and the signal /Sslow is at "L" level, the transistors TP302 and 402 are later in drive timing than the respective transistors TP301 and TN401 by delay times by the delay circuits DL301 and DL401.

As contrasted with this, when an operating frequency is high and the signal /Sslow is at "H," the transistors TP302 and 402 are almost the same as the respective transistors TP301 and TN401 in drive timing regardless of delay operations of the delay circuits DL301 and DL401.

With a configuration as described above adopted, as well, power consumption of an output buffer becomes variable according to a clock frequency and further reduction in power consumption can be possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a terminal group for receiving externally supplied control signal, address signal and data;
   an interface portion for receiving said control signal, said address signal and said data and selecting an object of instructions according to said address signal;
   a memory cell array, including a first and second areas designated by said address signal and transmitting/receiving said data, according to said control signal and said address signal transmitted via said interface portion, when said address signal specifies said second area; and
   logic circuitry for performing a data processing as an logic operation according to at least one of said control signal, said address signal and said data transmitted via said interface portion when said address signal specifies said first area, said logic circuitry processing either one of storage data already stored in said memory cell array and data transmitted via said interface portion and transmitting a result of said data processing to said memory cell array to store.

2. The semiconductor integrated circuit device according to claim 1, wherein said memory cell array, controlled by said logic circuitry, stores a result of said logic operation on said data supplied from said terminal group in an area of said memory cell array specified by said address signal.

3. The semiconductor integrated circuit device according to claim 2, wherein said semiconductor integrated circuit device is accessibly connected to a processor with a cache memory through said terminal group, and
   said result of said operation is stored in a predetermined area of said cache memory in an address space of said memory cell array.

4. The semiconductor integrated circuit device according to claim 1, wherein said logic circuitry, according to said control signal, reads out said storage data stored in a first area of said memory cell array specified by said address signal and transfers a result of said logic operation on said storage data into said first area.

5. The semiconductor integrated circuit device according to claim 4, wherein said semiconductor integrated circuit device is accessibly connected to a processor with a cache memory through said terminal group, and
   said data to be processed in said logic operation are read out from a predetermined area of said cache memory in an address space of said memory cell array.

6. The semiconductor integrated circuit device according to claim 1, wherein said logic circuitry, according to said control signal, reads out a specified data length of storage data sequentially from an area having said specified data length starting at a start address specified by said address signal and
   said memory cell array stores a result of said logic operation on said specified data length of storage data into said area having said specified data length.

7. The semiconductor integrated circuit device according to claim 6, wherein said semiconductor integrated circuit device is accessibly connected to a processor with a cache memory through said terminal group, and
   said data to be processed in said logic operation are read out from a predetermined area of said cache memory in an address space of said memory cell array.

8. The semiconductor integrated circuit device according to claim 1, wherein said logic circuitry, according to said control signal, reads out a specified data length of storage data sequentially from a first area of said memory cell array having said specified data length starting at a first address specified by said address signal and
   said memory cell array stores a result of said logic operation on said specified data length of storage data into a second area having said specified data length starting at a second address specified by said address signal.

9. The semiconductor integrated circuit device according to claim 1,
   wherein said logic circuitry comprises
   a data holding portion holding said instructions from said interface portion; and
   a data processing circuit performing an operation according to said instructions held in said data holding portion.

10. The semiconductor integrated circuit device according to claim 9, wherein said interface portion comprises an internal clock generating circuit receiving an external clock signal to generate a first internal clock signal serving as a reference for an operation of said memory cell array and a second internal clock signal serving as a reference for an operation of said logic circuitry.

11. The semiconductor integrated circuit device according to claim 10, wherein said second internal clock signal is a signal obtained by frequency dividing said external clock signal.

12. The semiconductor integrated circuit device according to claim 10, wherein said second internal clock signal is a signal obtained by multiplying said external clock signal.

13. The semiconductor integrated circuit device according to claim 9, wherein said instructions includes
   a command specifying an operation of said data processing circuit; and
   input data to be processed by said data processing circuit, and
   wherein said data holding portion comprises
      a first holding circuit holding said command;
      a second holding circuit holding said input data; and
      a third holding circuit holding a processing result obtained by an operation on said input data performed by said data processing circuit.

14. The semiconductor integrated circuit device according to claim 13, wherein said first holding circuit further comprises a flag area holding a flag indicating whether said data processing circuit completes the operation.

15. The semiconductor integrated circuit device according to claim 13, wherein said data processing circuit performs a cryptographic processing, and
   wherein said input data comprises a cryptographic key data.

16. The semiconductor integrated circuit device according to claim 13, wherein said logic circuitry, according to said control signal, performs said operation on storage data supplied from said terminal group to said second holding circuit and stored therein, and outputs a result of said operation to said third holding circuit and
      said third holding circuit outputs said result of said operation through said terminal group.

17. The semiconductor integrated circuit device according to claim 13, wherein said logic circuitry, according to said control signal, performs said operation on storage data supplied from said terminal group to said second holding circuit and stored therein, and outputs a result of said operation to said third holding circuit and
      said memory cell array stores a result of said operation stored in said third holding circuit into an area specified by said address signal.

18. The semiconductor integrated circuit device according to claim 9, wherein said instructions includes
   a command specifying an operation of said data processing circuit; and
   input data to be processed by said data processing circuit, and
   wherein said data holding portion comprises
      a first holding circuit holding said command; and
      a second holding circuit holding said input data and holding a processing result of an operation on said input data performed by said data processing circuit.

19. The semiconductor integrated circuit device according to claim 18, wherein said logic circuitry, according to said control signal, performs said operation on storage data supplied from said terminal group to said second holding circuit and stored therein, and outputs a result of said operation to said second holding circuit and
      said second holding circuit outputs said result of said operation through said terminal group.

20. The semiconductor integrated circuit device according to claim 18, wherein said logic circuitry, according to said control signal, performs said operation on storage data supplied from said terminal group to said second holding circuit and stored therein, and outputs a result of said operation to said second holding circuit and
      said memory cell array stores a result of said operation stored in said second holding circuit into an area specified by said address signal.

21. The semiconductor integrated circuit device according to claim 1, further comprising:
   a column select circuit for selecting a memory cell column in said memory cell array;
   a control circuit for generating a first control signal for defining timing to activate said column select circuit according to said address in synchronism with an external clock signal; and
   an interlock circuit, according to external instructions, generating a second control signal for activating said column select circuit when a prescribed time elapses after receiving said first control signal.

22. The semiconductor integrated circuit device according to claim 1, further comprising: a control circuit for controlling data communication with said memory cell array in a burst operation,
   wherein said control circuit comprises
      a burst control circuit for counting the number of external clock cycles corresponding to a specified burst length and detecting timing of an external clock at which a burst operation ends; and
      a precharge operation control circuit for instructing start of a precharge operation when a prescribed time elapses after said timing of said external clock is detected according to a detection result of said burst control circuit.

23. The semiconductor integrated circuit device according to claim 1, further comprising: a self-refresh control circuit for controlling a self-refresh operation on said memory cell array,
   wherein said memory cell array is divided into a plurality of banks and said self-refresh control circuit performs a refresh operation of said memory cell array by an externally instructed bunch of banks.

24. The semiconductor integrated circuit device according to claim 1, further comprising:
   a peripheral circuit portion for performing a select operation on said memory cell array and control of said select operation;
   an internal power source potential generating circuit for generating an internal power source potential supplied to said peripheral circuit portion and said memory cell array based on an external power source potential; and
   a control circuit for controlling an operation of said internal power source potential generating circuit,
   wherein said control circuit selectively ceases supply of said internal power source potential to said memory cell array according to an external instruction.

25. The semiconductor integrated circuit device according to claim 1, further comprising:
   a peripheral circuit portion operating according to an external clock signal and for performing a select operation on said memory cell array and control of said select operation;

an internal power source potential generating circuit for generating an internal power source potential supplied to said peripheral circuit portion and said memory cell array at a variable level based on an external power source potential; and a control circuit for controlling an operation of said internal power source potential generating circuit, wherein said control circuit alters a level of said internal power source potential according to a frequency of said external clock signal.

26. A semiconductor integrated circuit device comprising:

a terminal group having a predetermined number of pin terminals, said terminal group receiving externally supplied control signal, address signal and data;

a memory cell array, according to said control signal, storing storage data in an area specified by said address signal; and logic circuitry performing a logic operation according to at least one of said control signal, said address signal and said data supplied from said terminal group when said address signal specifies a predetermined area, said logic circuitry switching data to be processed in said logic operation according to said control signal between said storage data already stored in said memory cell array and data supplied from said terminal group, wherein said predetermined number is identical with the number of pin terminals of an available DRAM.

* * * * *